(12) United States Patent
Miyake et al.

(10) Patent No.: US 9,911,757 B2
(45) Date of Patent: Mar. 6, 2018

(54) SEMICONDUCTOR DEVICE AND DISPLAY DEVICE INCLUDING THE SEMICONDUCTOR DEVICE

(71) Applicant: Semiconductor Energy Laboratory Co., Ltd., Atsugi-shi, Kanagawa-ken (JP)

(72) Inventors: Hiroyuki Miyake, Kanagawa (JP); Kenichi Okazaki, Tochigi (JP); Yasuharu Hosaka, Tochigi (JP); Yukinori Shima, Gunma (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 15/386,649

(22) Filed: Dec. 21, 2016

(65) Prior Publication Data

US 2017/0186778 A1   Jun. 29, 2017

(30) Foreign Application Priority Data

Dec. 28, 2015 (JP) .................................. 2015-256694
Dec. 28, 2015 (JP) .................................. 2015-256849

(51) Int. Cl.
*H01L 29/786* (2006.01)
*H01L 27/12* (2006.01)
(Continued)

(52) U.S. Cl.
CPC ........ *H01L 27/1225* (2013.01); *H01L 27/127* (2013.01); *H01L 29/045* (2013.01);
(Continued)

(58) Field of Classification Search
CPC ........... H01L 27/1225; H01L 29/78645; H01L 29/7869
See application file for complete search history.

(56) References Cited

U.S. PATENT DOCUMENTS 5,731,856 A   3/1998   Kim et al.
5,744,864 A   4/1998   Cillessen et al.
(Continued)

FOREIGN PATENT DOCUMENTS

CN   101944506 A   1/2011
CN   102693755 A   9/2012
(Continued)

OTHER PUBLICATIONS

International Search Report (Application No. PCT/IB2016/057801) dated Apr. 4, 2017.
(Continued)

*Primary Examiner* — Thomas L Dickey
(74) *Attorney, Agent, or Firm* — Fish & Richardson P.C.

(57) ABSTRACT

Provided is a novel semiconductor device. The semiconductor device comprises a first transistor and a second transistor. The first transistor comprises a first gate electrode; a first insulating film over the first gate electrode; a first oxide semiconductor film over the first insulating film; a first source electrode and a first drain electrode over the first oxide semiconductor film; a second insulating film over the first oxide semiconductor film, the first source electrode, and the first drain electrode; and a second gate electrode over the second insulating film. The second transistor comprises a first drain electrode; the second insulating film over the second drain electrode; a second oxide semiconductor film over the second insulating film; a second source electrode and a second drain electrode over the second oxide semiconductor film; a third insulating film over the second oxide semiconductor film, the second source electrode, and the second drain electrode; and a third gate electrode over the third insulating film. The first oxide semiconductor film partly overlaps with the second oxide semiconductor film.

27 Claims, 72 Drawing Sheets

(51) Int. Cl.
*H01L 29/04* (2006.01)
*H01L 29/24* (2006.01)
*H01L 29/66* (2006.01)
*H01L 51/00* (2006.01)
H01L 27/32 (2006.01)

(52) U.S. Cl.
CPC ........ *H01L 29/24* (2013.01); *H01L 29/66969* (2013.01); *H01L 29/7869* (2013.01); *H01L 29/78606* (2013.01); *H01L 29/78648* (2013.01); *H01L 29/78696* (2013.01); *H01L 51/005* (2013.01); H01L 27/3262 (2013.01)

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,378,403 B2 | 2/2013 | Kato |
| 8,637,865 B2 | 1/2014 | Kato |
| 8,760,959 B2 | 6/2014 | Matsubayashi |
| 8,860,022 B2 | 10/2014 | Sasaki et al. |
| 8,981,367 B2 | 3/2015 | Yoneda et al. |
| 9,385,128 B2 | 7/2016 | Matsubayashi |
| 9,397,308 B2 | 7/2016 | Seo et al. |
| 9,472,680 B2 | 10/2016 | Yoneda et al. |
| 9,564,482 B2 | 2/2017 | Teraguchi et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0244029 A1* | 9/2010 | Yamazaki ........... H01L 27/1225 257/52 |
| 2011/0003418 A1 | 1/2011 | Sakata et al. |
| 2012/0112191 A1 | 5/2012 | Kato et al. |
| 2012/0236634 A1 | 9/2012 | Matsubayashi |
| 2013/0153890 A1 | 6/2013 | Yoneda |
| 2013/0214279 A1 | 8/2013 | Nishimura et al. |
| 2014/0138778 A1 | 5/2014 | Kato |
| 2016/0027851 A1 | 1/2016 | Yanagisawa et al. |
| 2016/0307901 A1 | 10/2016 | Matsubayashi |
| 2016/0322395 A1* | 11/2016 | Koezuka ............. H01L 27/1225 |
| 2017/0033130 A1 | 2/2017 | Yoneda et al. |

FOREIGN PATENT DOCUMENTS

| | | |
|---|---|---|
| CN | 102870220 A | 1/2013 |
| CN | 103201831 A | 7/2013 |
| EP | 1737044 A | 12/2006 |
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |

(56) References Cited

FOREIGN PATENT DOCUMENTS

| | | |
|---|---|---|
| JP | 2004-103957 A | 4/2004 |
| JP | 2004-273614 A | 9/2004 |
| JP | 2004-273732 A | 9/2004 |
| JP | 2011-029635 A | 2/2011 |
| JP | 2011-176152 A | 9/2011 |
| JP | 2012-114422 A | 6/2012 |
| JP | 2012-212499 A | 11/2012 |
| JP | 2013-138191 A | 7/2013 |
| JP | 2015-194577 A | 11/2015 |
| KR | 2011-0003265 A | 1/2011 |
| KR | 2012-0106642 A | 9/2012 |
| KR | 2013-0060200 A | 6/2013 |
| KR | 2013-0118893 A | 10/2013 |
| TW | 201110243 | 3/2011 |
| TW | 201250931 | 12/2012 |
| TW | 201304069 | 1/2013 |
| WO | WO-2004/114391 | 12/2004 |
| WO | WO-2011/135908 | 11/2011 |
| WO | WO-2012/060202 | 5/2012 |

OTHER PUBLICATIONS

Written Opinion (Application No. PCT/IB2016/057801) dated Apr. 4, 2017.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", Am-FPd '09 Digest of Technical Papers, Jul. 1, 2009, pp. 41-44.

Hayashi.R et al., "42.1: Invited Paper: Improved Amorphous In—Ga—Zn—O TFTs", SID Digest International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 1722.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest'09 : SID International Symposium Digest of Technical Papers, May 31, 2009, pp. 983-985.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2: Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YbFe2O4, and Yb2Fe3O7 Types of Structures for Compounds in the In2O3 and Sc2O3—A2O3—Bo Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits, 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED ", IDW'06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

(56) References Cited

OTHER PUBLICATIONS

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW'08 : Proceedings of the 6th International Display Workshops, Dec. 3, 2008, pp. 581-584.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn—Oxide TFTs With a Novel Passivation Layer", SID Digest '09 : SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", Am-FPd '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.

Osada.T et al., "Development of Driver-Integrated Panel Using Amorphous In—Ga—Zn-Oxide TFT", Am-FPd '09 Digest of Technical Papers, Jul. 1, 2009, pp. 33-36.

Park.J et al., "Amorphous Indium-Gallium-Zinc Oxide TFTs and Their Application for Large Size AMOLED", Am—FPd '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Park.S et al., "Challenge to Future Displays: Transparent AM-OLED Driven by Peald Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 SID : International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Sakata.J et al., "Development of 4.0-In. AMOLED Display With Driver Circuit Using Morphous In—Ga—Zn-Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner

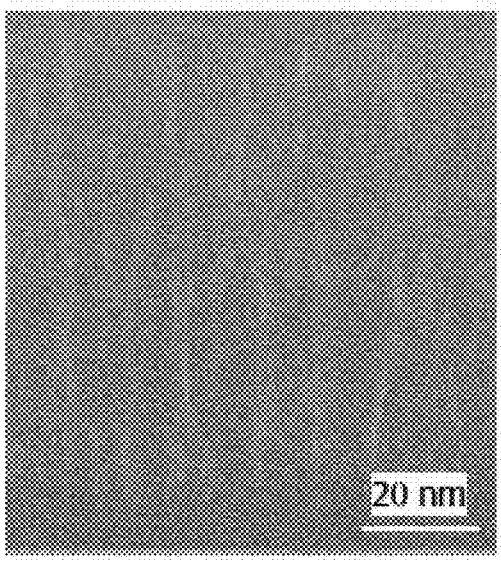 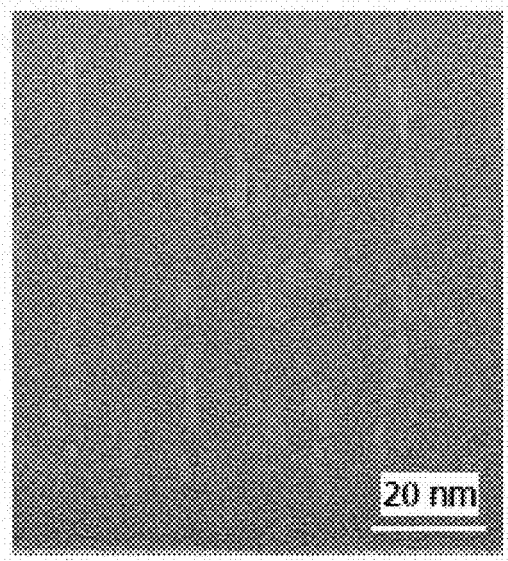

SEMICONDUCTOR DEVICE AND DISPLAY DEVICE INCLUDING THE SEMICONDUCTOR DEVICE

TECHNICAL FIELD

One embodiment of the present invention relates to a semiconductor device including an oxide semiconductor film and a display device including the semiconductor device.

Note that one embodiment of the present invention is not limited to the above technical field. The technical field of one embodiment of the present invention disclosed in this specification and the like relates to an object, a method, or a manufacturing method. The present invention relates to a process, a machine, manufacture, or a composition of matter. In particular, one embodiment of the present invention relates to a semiconductor device, a display device, a light-emitting device, a power storage device, a storage device, a driving method thereof, and a manufacturing method thereof.

In this specification and the like, a semiconductor device generally means a device that can function by utilizing semiconductor characteristics. A semiconductor element such as a transistor, a semiconductor circuit, an arithmetic device, and a memory device are each an embodiment of a semiconductor device. An imaging device, a display device, a liquid crystal display device, a light-emitting device, an electro-optical device, a power generation device (including a thin film solar cell, an organic thin film solar cell, and the like), and an electronic appliance may each include a semiconductor device.

BACKGROUND ART

Attention has been focused on a technique for forming a transistor using a semiconductor thin film formed over a substrate having an insulating surface (also referred to as a field-effect transistor (FET) or a thin film transistor (TFT)). Such a transistor is applied to a wide range of electronic devices such as an integrated circuit (IC) or an image display device (display device). A semiconductor material typified by silicon is widely known as a material for a semiconductor thin film that can be used for a transistor, and an oxide semiconductor has been attracting attention as well.

For example, Patent Document 1 discloses a technique to reduce the cell area by stacking a plurality of memory cells comprising a first transistor including an oxide semiconductor film and a second transistor including an oxide semiconductor film.

Patent Document 2 discloses a technique to reduce the area of a driver circuit portion in the vicinity of a pixel portion by stacking a first layer including the driver circuit portion for operating the plurality of pixels and a second layer including the pixel portion including a plurality of two-dimensionally arranged pixels.

REFERENCE

Patent Document

[Patent Reference 1]
[Patent Document 1] Japanese Published Patent Application No. 2013-138191
[Patent Document 2] Japanese Published Patent Application No. 2015-194577

DISCLOSURE OF INVENTION

The transistor area can be reduced by stacking a plurality of transistors as disclosed in Patent Documents 1 and 2. On the other hand, there is a problem in that the stacking of a plurality of transistors increases the number of masks or the number of fabrication steps.

In view of the above, an object of one embodiment of the present invention is to provide a semiconductor device including stacked transistors with as few masks or fabrication steps as possible. Another object of one embodiment of the present invention is to provide a semiconductor device including stacked transistors including oxide semiconductor films with the increase in the number of masks or fabrication steps suppressed. Another object of one embodiment of the present invention is to provide a novel semiconductor device.

Note that the description of the above object does not disturb the existence of other objects. In one embodiment of the present invention, there is no need to achieve all the objects. Objects other than the above objects will be apparent from and can be derived from the description of the specification and the like.

One embodiment of the present invention is a semiconductor device comprising a first transistor and a second transistor. The first transistor comprises a first gate electrode; a first insulating film over the first gate electrode; a first oxide semiconductor film over the first insulating film; a first source electrode over the first oxide semiconductor film; a first drain electrode over the first oxide semiconductor film; a second insulating film over the first oxide semiconductor film, the first source electrode, and the first drain electrode; and a second gate electrode over the second insulating film. The second transistor comprises one of the first source electrode and the first drain electrode; the second insulating film over the first drain electrode; a second oxide semiconductor film over the second insulating film; a second source electrode over the second oxide semiconductor film; a second drain electrode over the second oxide semiconductor film; a third insulating film over the second oxide semiconductor film, the second source electrode, and the second drain electrode; and a third gate electrode over the third insulating film. The first oxide semiconductor film partly overlaps with the second oxide semiconductor film.

Another embodiment of the present invention is a semiconductor device comprising a first transistor and a second transistor. The first transistor comprises a first gate electrode; a first insulating film over the first gate electrode; a first oxide semiconductor film over the first insulating film; a first source electrode over the first oxide semiconductor film; a first drain electrode over the first oxide semiconductor film; a second insulating film over the first oxide semiconductor film, the first source electrode, and the first drain electrode; and a second gate electrode over the second insulating film. The second transistor comprises a third gate electrode over the first insulating film; the second insulating film over the third gate electrode; a second oxide semiconductor film over the second insulating film and including a channel region, a source region, and a drain region; a third insulating film in contact with the channel region; a fourth gate electrode in contact with the third insulating film; a fourth insulating film in contact with the source region, the drain region, and the fourth gate electrode; a second source electrode electrically connected to the source region; and a second drain electrode electrically connected to the drain region. The first oxide semiconductor film partly overlaps with the second oxide semiconductor film.

In the above embodiment, the first gate electrode and the second gate electrode are preferably connected to each other in an opening of the first insulating film and the second insulating film and include a region located outward from a side end portion of the first oxide semiconductor film.

In the above embodiment, the first oxide semiconductor film and/or the second oxide semiconductor film preferably contains oxygen, In, Zn, and M (M is Al, Ga, Y, or Sn).

In the above embodiment, it is preferable that the atomic ratio be in a neighborhood of In:M:Zn=4:2:3, and that when In is 4, M be greater than or equal to 1.5 and less than or equal to 2.5 and Zn be greater than or equal to 2 and less than or equal to 4.

In the above embodiment, it is preferable that one or both of the first oxide semiconductor film and the second oxide semiconductor film contain a crystal part, and that the crystal part has c-axis alignment.

Another embodiment of the present invention is a semiconductor device comprising a first transistor and a second transistor. The first transistor comprises a first oxide semiconductor film; a first insulating film over the first oxide semiconductor film; a first conductive film including a region overlapping with the first oxide semiconductor film with the first insulating film therebetween; a second insulating film over the first oxide semiconductor film and the first conductive film; a second conductive film over the first oxide semiconductor film; a third conductive film over the first oxide semiconductor film; and a third insulating film over the first oxide semiconductor film, the second conductive film, and the third conductive film. The second transistor comprises the third conductive film; the third insulating film over the third conductive film; a second oxide semiconductor film over the third insulating film; a fourth conductive film over the second oxide semiconductor film; and a fifth conductive film over the second oxide semiconductor film. The first oxide semiconductor film includes a channel region in contact with the first insulating film, a source region in contact with the second insulating film, and a drain region in contact with the second insulating film. The first oxide semiconductor film partly overlaps with the second oxide semiconductor film.

Another embodiment of the present invention is a semiconductor device comprising a first transistor and a second transistor. The first transistor comprises a first oxide semiconductor film; a first insulating film over the first oxide semiconductor film; a first conductive film including a region overlapping with the first oxide semiconductor film with the first insulating film therebetween; a second insulating film over the first oxide semiconductor film and the first conductive film; a second conductive film over the first oxide semiconductor film; a third conductive film over the first oxide semiconductor film; and a third insulating film over the first oxide semiconductor film, the second conductive film, and the third conductive film. The second transistor comprises the third conductive film; the third insulating film over the third conductive film; a second oxide semiconductor film over the third insulating film; a fourth conductive film over the second oxide semiconductor film; a fifth conductive film over the second oxide semiconductor film; a fourth insulating film over the second oxide semiconductor film, the fourth conductive film, and the fifth conductive film; and a sixth conductive film including a region overlapping with the second oxide semiconductor film with the fourth insulating film therebetween. The first oxide semiconductor film includes a channel region in contact with the first insulating film, a source region in contact with the second insulating film, and a drain region in contact with the second insulating film. The first oxide semiconductor film partly overlaps with the second oxide semiconductor film.

Another embodiment of the present invention is a semiconductor device comprising a first transistor and a second transistor. The first transistor comprises a first oxide semiconductor film; a first insulating film over the first oxide semiconductor film; a first conductive film including a region overlapping with the first oxide semiconductor film with the first insulating film therebetween; a second insulating film over the first oxide semiconductor film and the first conductive film; a second conductive film over the first oxide semiconductor film; a third conductive film over the first oxide semiconductor film; and a third insulating film over the first oxide semiconductor film, the second conductive film, and the third conductive film. The first oxide semiconductor film includes a channel region in contact with the first insulating film, a source region in contact with the second insulating film, and a drain region in contact with the second insulating film. The second transistor comprises the third conductive film; the third insulating film over the third conductive film; a second oxide semiconductor film over the third insulating film; a fourth conductive film over the second oxide semiconductor film; a fifth conductive film over the second oxide semiconductor film; a fourth insulating film over the second oxide semiconductor film; a sixth conductive film including a region overlapping with the second oxide semiconductor film with the fourth insulating film therebetween; and a fifth insulating film over the second oxide semiconductor film and the sixth conductive film. The second oxide semiconductor film includes a channel region in contact with the fourth insulating film, a source region in contact with the fifth insulating film, and a drain region in contact with the fifth insulating film. The first oxide semiconductor film partly overlaps with the second oxide semiconductor film.

In the above embodiments, the first oxide semiconductor film and/or the second oxide semiconductor film preferably contain/contains oxygen, In, M (M is Al, Ga, Y, or Sn), and Zn.

In the above embodiments, it is preferable that the oxide semiconductor film have an atomic ratio in a neighborhood of In:M:Zn=4:2:3, and that when the proportion of In is 4, the proportion of M be greater than or equal to 1.5 and less than or equal to 2.5 and the proportion of Zn be greater than or equal to 2 and less than or equal to 4.

In the above embodiments, the first oxide semiconductor film and/or the second oxide semiconductor film preferably include/includes a crystal part, and the crystal part preferably has c-axis alignment.

Another embodiment of the present invention is a display device including the semiconductor device according to any one of the above embodiments and a light-emitting element. The light-emitting element preferably includes an organic compound, and the organic compound preferably includes a high molecular compound.

Another embodiment of the present invention is a display module including the display device and a touch sensor. Another embodiment of the present invention is an electronic device including the semiconductor device according to any one of the above embodiments, the display device, or the display module; and an operation key or a battery.

According to one embodiment of the present invention, a semiconductor device including stacked transistors using as few masks or fabrication steps as possible can be provided. According to one embodiment of the present invention, a semiconductor device including stacked transistors including oxide semiconductor films using as few masks or fabrication steps as possible can be provided. According to one embodiment of the present invention, a novel semiconductor device can be provided.

Note that the description of these effects does not preclude the existence of other effects. One embodiment of the present invention does not necessarily achieve all the effects listed above. Other effects will be apparent from and can be derived from the description of the specification, the drawings, the claims, and the like.

BRIEF DESCRIPTION OF DRAWINGS

FIGS. 63A and 63B show cross-sectional TEM images of an a-like OS.

BEST MODE FOR CARRYING OUT THE INVENTION

Figure 1A:
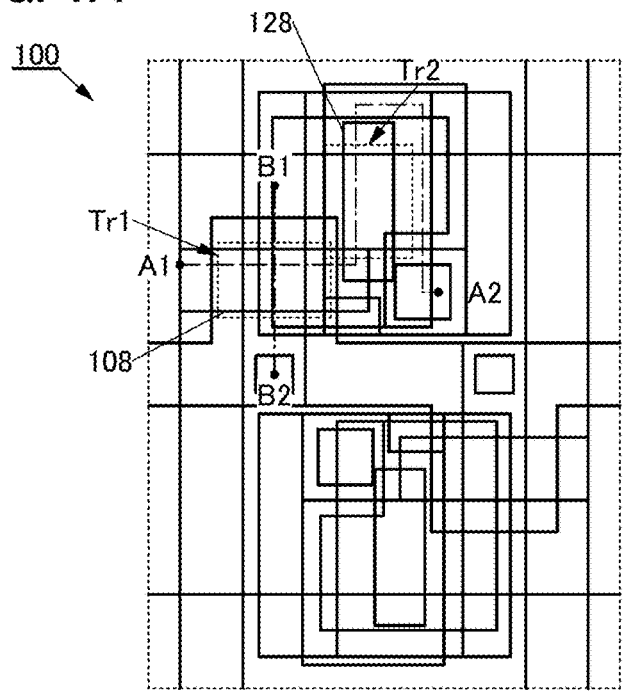
FIGS. 1A and 1B are a top view and cross-sectional views of a semiconductor device.

Embodiments will be hereinafter described with reference to drawings. Note that the embodiments can be implemented in many different modes. It will be readily appreciated by those skilled in the art that modes and details can be changed in various ways without departing from the spirit and scope of the present invention. Therefore, the present invention should not be interpreted as being limited to the description in the following embodiments.

In the drawings, the size, the layer thickness, or the region is exaggerated for clarity in some cases. Therefore, embodiments of the present invention are not limited to such a scale. Note that the drawings are schematic views showing ideal examples, and embodiments of the present invention are not limited to shapes or values shown in the drawings.

Ordinal numbers such as "first," "second," and "third" in this specification are used in order to avoid confusion among components, and the terms do not limit the components numerically.

In this specification, terms for describing arrangement, such as "over" and "under," are used for convenience for describing the positional relation between components with reference to drawings. The positional relation between components is changed as appropriate in accordance with a direction in which each component is described. Thus, there is no limitation on terms used in this specification, and description can be made appropriately depending on the situation.

In this specification and the like, a transistor is an element having at least three terminals of a gate, a drain, and a source. The transistor includes a channel region between the drain (a drain terminal, a drain region, or a drain electrode) and the source (a source terminal, a source region, or a source electrode) and current can flow through the drain, the channel region, and the source. Note that in this specification and the like, a channel region refers to a region through which current mainly flows.

Functions of a "source" and a "drain" are sometimes replaced with each other when a transistor of opposite polarity is used or when the direction of current flowing is changed in circuit operation, for example. Therefore, the terms "source" and "drain" can be replaced with each other in this specification and the like.

In this specification and the like, the term "electrically connected" includes the case where components are connected through an object having any electric function. There is no particular limitation on an "object having any electric function" as long as electric signals can be transmitted and received between components that are connected through the object. Examples of an "object having any electric function" include a switching element such as a transistor, a resistor, an inductor, a capacitor, and an element with a variety of functions, as well as an electrode and a wiring.

In this specification and the like, the term "parallel" indicates that the angle formed between two straight lines is greater than or equal to −10° and less than or equal to 10°, and accordingly also includes the case where the angle is greater than or equal to −5° and less than or equal to 5°. In addition, the term "perpendicular" indicates that the angle formed between two straight lines is greater than or equal to 80° and less than or equal to 100°, and accordingly also includes the case where the angle is greater than or equal to 85° and less than or equal to 95°.

In this specification and the like, the terms "film" and "layer" can be interchanged with each other. For example, the term "conductive layer" can be changed into the term "conductive film" in some cases. Also, the term "insulating film" can be changed into the term "insulating layer" in some cases.

Unless otherwise specified, the off-state current in this specification and the like refers to a drain current of a transistor in the off state (also referred to as non-conduction state and cutoff state). Unless otherwise specified, the off state of an n-channel transistor means that the voltage between its gate and source ($V_{gs}$: gate-source voltage) is lower than the threshold voltage $V_{th}$, and the off state of a p-channel transistor means that the gate-source voltage $V_{gs}$ is higher than the threshold voltage $V_{th}$. For example, the off-state current of an n-channel transistor sometimes refers to a drain current that flows when the gate-source voltage $V_{gs}$ is lower than the threshold voltage $V_{th}$.

The off-state current of a transistor depends on $V_{gs}$ in some cases. Thus, "the off-state current of a transistor is lower than or equal to I" may mean there is $V_{gs}$ at which the off-state current of the transistor is lower than or equal to I. The off-state current of a transistor may refer to off-state current at a given $V_{gs}$, at $V_{gs}$ in a given range, or at $V_{gs}$ at which sufficiently low off-state current is obtained, for example.

As an example, the assumption is made of an n-channel transistor where the threshold voltage $V_{th}$ is 0.5 V and the drain current is $1\times10^{-9}$ A at $V_{gs}$ of 0.5 V, $1\times10^{-13}$ A at $V_{gs}$ of 0.1 V, $1\times10^{-19}$ A at $V_{gs}$ of −0.5 V, and $1\times10^{-22}$ A at $V_{gs}$ of −0.8 V. The drain current of the transistor is $1\times10^{-19}$ A or lower at $V_{gs}$ of −0.5 V or at $V_{gs}$ in the range of −0.8 V to −0.5 V; therefore, it can be said that the off-state current of the transistor is $1\times10^{-19}$ A or lower. Since there is $V_{gs}$ at which the drain current of the transistor is $1\times10^{-22}$ A or lower, it may be said that the off-state current of the transistor is $1\times10^{-22}$ A or lower.

In this specification and the like, the off-state current of a transistor with a channel width W is sometimes represented by a current value per channel width W or by a current value per given channel width (e.g., 1 μm). In the latter case, the off-state current may be represented by current per length (e.g., A/μm).

The off-state current of a transistor depends on temperature in some cases. Unless otherwise specified, the off-state current in this specification may be an off-state current at room temperature, 60° C., 85° C., 95° C., or 125° C. Alternatively, the off-state current may be an off-state current at a temperature at which the reliability of a semiconductor device or the like including the transistor is ensured or a temperature at which the semiconductor device or the like is used (e.g., temperature in the range of 5° C. to 35° C.). The state in which the off-state current of a transistor is I or lower may indicate that the off-state current of the transistor at room temperature, 60° C., 85° C., 95° C., 125° C., a temperature at which the reliability of a semiconductor device or the like including the transistor is ensured, or a temperature at which the semiconductor device or the like is used (e.g., a temperature in the range of 5° C. to 35° C.) is I or lower at a certain $V_{gs}$.

The off-state current of a transistor depends on voltage $V_{ds}$ between its drain and source in some cases. Unless otherwise specified, the off-state current in this specification may be an off-state current at $V_{ds}$ of 0.1 V, 0.8 V, 1 V, 1.2 V, 1.8 V, 2.5 V, 3 V, 3.3 V, 10 V, 12 V, 16 V, or 20 V. Alternatively, the off-state current may be an off-state current at $V_{ds}$ at which the reliability of a semiconductor device or the like including the transistor is ensured or $V_{ds}$ used in the semiconductor device or the like. The state in which the off-state current of a transistor is lower than or equal to I may indicate that the off-state current of the transistor at $V_{ds}$ of 0.1 V, 0.8 V, 1 V, 1.2 V, 1.8 V, 2.5 V, 3 V, 3.3 V, 10 V, 12 V, 16 V, or 20 V, at $V_{ds}$ at which the reliability of a semiconductor device or the like including the transistor is ensured, or at $V_{ds}$ used in the semiconductor device or the like is lower than or equal to I at a certain $V_{gs}$.

In the above description of off-state current, a drain may be replaced with a source. That is, the off-state current sometimes refers to a current that flows through a source of a transistor in the off state.

In this specification and the like, the term "leakage current" sometimes expresses the same meaning as off-state current. In this specification and the like, the off-state current sometimes refers to a current that flows between a source and a drain when a transistor is off, for example.

In this specification and the like, the threshold voltage of a transistor refers to a gate voltage ($V_g$) at which a channel is formed in the transistor. Specifically, in a graph where the horizontal axis represents the gate voltage ($V_g$) and the vertical axis represents the square root of drain current ($I_d$), the threshold voltage of a transistor may refer to a gate voltage ($V_g$) at the intersection of the square root of drain current ($I_d$) of 0 ($I_d$=0 A) and an extrapolated straight line that is tangent with the highest inclination to a plotted curve ($V_g$-$\sqrt{I_d}$ characteristics). Alternatively, the threshold voltage of a transistor may refer to a gate voltage ($V_g$) at which the value of $I_d$ [A]×L [μm]/W [μm] is $1\times10^{-9}$ [A] where L is channel length and W is channel width.

In this specification and the like, a "semiconductor" includes characteristics of an "insulator" in some cases when the conductivity is sufficiently low, for example. Furthermore, a "semiconductor" and an "insulator" cannot be strictly distinguished from each other in some cases because a border between the "semiconductor" and the "insulator" is not clear. Accordingly, a "semiconductor" in this specification and the like can be called an "insulator" in some cases. Similarly, an "insulator" in this specification and the like can be called a "semiconductor" in some cases. Alternatively, an "insulator" in this specification and the like can be called a "semi-insulator" in some cases.

In this specification and the like, a "semiconductor" includes characteristics of a "conductor" in some cases when the conductivity is sufficiently high, for example. Furthermore, a "semiconductor" and a "conductor" cannot be strictly distinguished from each other in some cases because a border between the "semiconductor" and the "conductor" is not clear. Accordingly, a "semiconductor" in this specification and the like can be called a "conductor" in some cases. Similarly, a "conductor" in this specification and the like can be called a "semiconductor" in some cases.

In this specification and the like, an impurity in a semiconductor refers to an element that is not a main component of the semiconductor. For example, an element with a concentration lower than 0.1 atomic % is an impurity. If a semiconductor contains an impurity, the density of states (DOS) may be formed therein, the carrier mobility may be decreased, or the crystallinity may be decreased, for example. In the case where the semiconductor includes an oxide semiconductor, examples of an impurity which changes the characteristics of the semiconductor include Group 1 elements, Group 2 elements, Group 14 elements, Group 15 elements, and transition metals other than the main components; specific examples are hydrogen (also included in water), lithium, sodium, silicon, boron, phosphorus, carbon, and nitrogen. In an oxide semiconductor, an oxygen vacancy may be formed by entry of an impurity such as hydrogen. Furthermore, in the case where the semiconductor includes silicon, examples of an impurity which changes the characteristics of the semiconductor include oxygen, Group 1 elements except hydrogen, Group 2 elements, Group 13 elements, and Group 15 elements.

Embodiment 1

In this embodiment, a semiconductor device that is one embodiment of the present invention and a method of manufacturing the semiconductor device are described with reference to FIGS. 1A and 1B to FIGS. 17A and 17B.

1-1. Structure Example 1 of Semiconductor Device

Figure 1B:
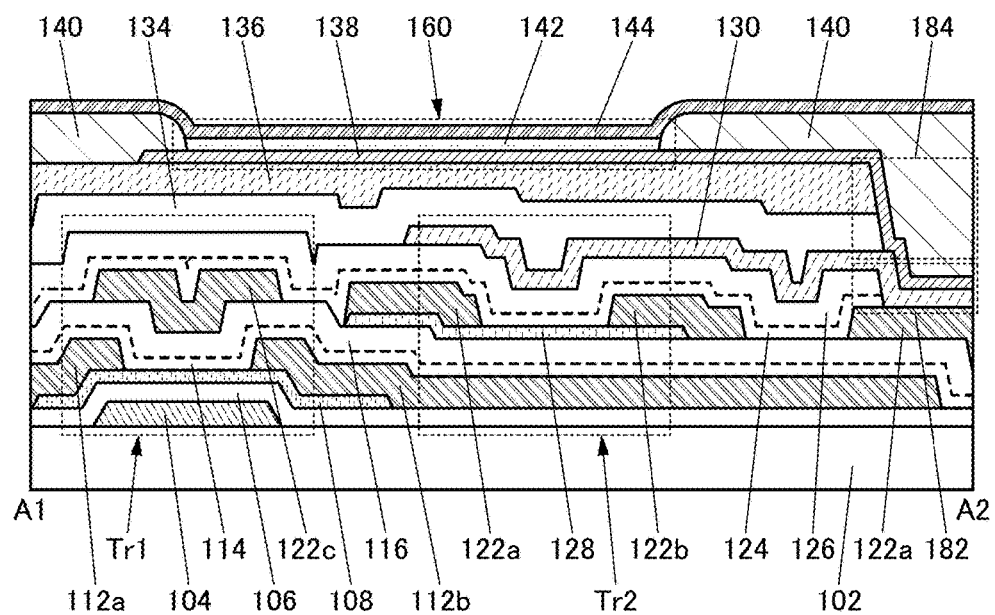

FIG. 1A is a top view of a semiconductor device 100 of one embodiment of the present invention. FIG. 1B is a cross-sectional view taken along dashed dotted line A1-A2 in FIG. 1A. Note that cross sections in a channel length (L) direction of a transistor Tr1 and in a channel length (L) direction of a transistor Tr2 are included in FIG. 1B.

Note that some components (e.g., an insulating film serving as a gate insulating film) of the semiconductor device 100 and some reference numerals of components are not illustrated in FIG. 1A to avoid complexity. Note that some components and some reference numerals of components are not illustrated as in FIG. 1A in some cases in top views of semiconductor devices described below.

The semiconductor device 100 illustrated in FIGS. 1A and 1B includes the transistor Tr1 and the transistor Tr2 which overlaps at least partly with the transistor Tr1. Note that the transistor Tr1 and the transistor Tr2 are bottom-gate transistors.

Since the transistor Tr1 overlaps at least partly with the transistor Tr2, the transistor area can be reduced.

The transistor Tr1 includes a conductive film 104 over a substrate 102, an insulating film 106 over the substrate 102 and the conductive film 104, an oxide semiconductor film 108 over the insulating film 106, a conductive film 112a over the oxide semiconductor film 108, a conductive film 112b over the oxide semiconductor film 108, an insulating film 114 over the oxide semiconductor film 108, the conductive film 112a, and the conductive film 112b, an insulating film 116 over the insulating film 114, and a conductive film 122c over the insulating film 116.

The transistor Tr2 includes the conductive film 112b, the insulating film 114 over the conductive film 112b, the insulating film 116 over the insulating film 114, an oxide semiconductor film 128 over the insulating film 116, a conductive film 122a over the oxide semiconductor film 128, a conductive film 122b over the oxide semiconductor film 128, an insulating film 124 over the oxide semiconductor film 128, the conductive film 122a, and the conductive film 122b, an insulating film 126 over the insulating film 124, and a conductive film 130 over the insulating film 126. Note that the conductive film 130 is connected to the conductive film 122a through an opening 182 provided in the insulating films 124 and 126.

As illustrated in FIGS. 1A and 1B, the oxide semiconductor film 108 and the oxide semiconductor film 128 partly overlap with each other. Note that it is preferable that, as illustrated in FIGS. 1A and 1B, a channel region formed in the oxide semiconductor film 108 of the transistor Tr1 not overlap with a channel region formed in the oxide semiconductor film 128 of the transistor Tr2.

If the channel region of the transistor Tr1 overlaps with the channel region of the transistor Tr2, one of the transistors which is active might adversely affect the other. In order to avoid the adverse effect, a structure in which the distance between the transistor Tr1 and the transistor Tr2 is increased, a structure in which a conductive film is provided between the transistor Tr1 and the transistor Tr2, or the like can be used. However, the thickness of the semiconductor device is increased when the former structure is used. Thus, for example, when the semiconductor device 100 is formed over a flexible substrate or the like, a problem might arise in the bendability and the like. When the latter structure is used, there is a problem in that a step of forming the conductive film is needed and the thickness of the semiconductor device is increased.

In the semiconductor device 100 of one embodiment of the present invention, however, the transistor Tr1 overlaps with the transistor Tr2 and their channel regions do not overlap with each other. In addition, since parts of their oxide semiconductor films where the channel regions are formed overlap with each other, the transistor area can be favorably reduced.

In addition, the oxide semiconductor film 108 and the oxide semiconductor film 128 each include In, M (M is Al, Ga, Y, or Sn), and Zn. Each of the oxide semiconductor film 108 and the oxide semiconductor film 128 preferably includes a region in which the atomic proportion of In is higher than the atomic proportion of M, for example. Note that the semiconductor device of one embodiment of the present invention is not limited thereto: each of them may include a region in which the atomic proportion of In is lower than the atomic proportion of M or may include a region in which the atomic proportion of In is equal to the atomic proportion of M.

It is preferable that the compositions of the oxide semiconductor film 108 and the oxide semiconductor film 128 be the same or substantially the same. When the compositions of the oxide semiconductor film 108 and the oxide semiconductor film 128 are the same, the manufacturing cost can be reduced. Note that the semiconductor device of one embodiment of the present invention is not limited thereto: the compositions of the oxide semiconductor film 108 and the oxide semiconductor film 128 may be different from each other.

When each of the oxide semiconductor film 108 and the oxide semiconductor film 128 includes a region in which the atomic proportion of In is larger than the atomic proportion of M, the field-effect mobilities of the transistor Tr1 and the transistor Tr2 can be increased. Specifically, one or both of the field-effect mobilities of the transistor Tr1 and the transistor Tr2 can exceed 10 cm$^2$/Vs, preferably 30 cm$^2$/Vs.

For example, when the transistor with high field-effect mobility is used for a gate driver of a display device that generates a gate signal, the display device can have a narrow frame. When the transistor with high field-effect mobility is used for a source driver (specifically, a demultiplexer connected to an output terminal of a shift register included in the source driver) that supplies a signal from a signal line included in a display device, the number of wirings connected to the display device can be reduced. In addition, when the transistor with high field-effect mobility is used as one or both of a selection transistor and a driver transistor of a pixel circuit included in the display device, the display quality of the display device can be increased.

The semiconductor device 100 shown in FIGS. 1A and 1B can be favorably used for a pixel circuit of a display device. The layout shown in FIGS. 1A and 1B can increase the pixel density of the display device. For example, even when the pixel density of a display device exceeds 1000 ppi (pixel per inch) or 2000 ppi, the aperture ratio of pixels can be increased owing to the structure shown in FIGS. 1A and 1B. Note that ppi is a unit for describing the number of pixels per inch.

1-2. Pixel Circuit of Display Device

An example in which the semiconductor device 100 shown in FIGS. 1A and 1B is used for a pixel circuit of a display device will be described with reference to FIG. 2.

Figure 2:
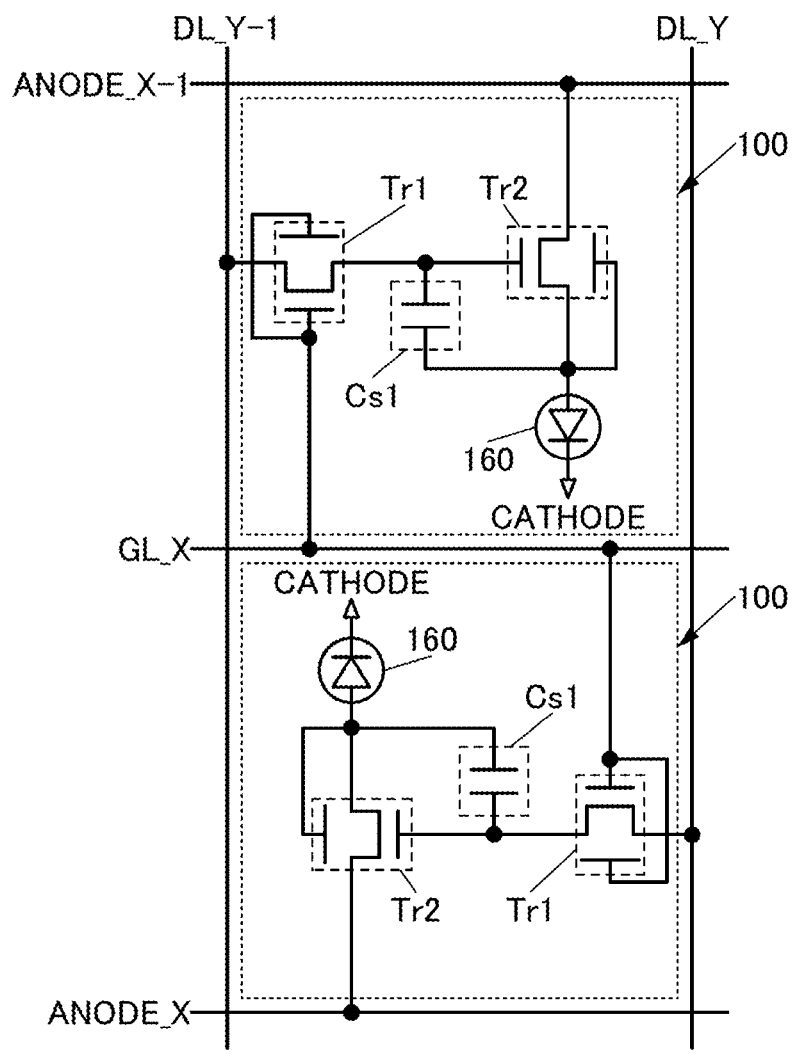
FIG. 2 illustrates a circuit of a semiconductor device.

FIG. 2 is a circuit diagram showing the example in which the semiconductor device 100 is used for a pixel circuit of a display device.

The semiconductor device 100 shown in FIG. 2 includes the transistor Tr1, the transistor Tr2, a capacitor Cs1, and a light-emitting element 160. Note that the example of FIG. 2 shows two semiconductor devices 100 adjacent to each other in a column direction. The semiconductor device 100 serves as a pixel (also referred to as a subpixel). Although the capacitor Cs1 is not illustrated in FIGS. 1A and 1B, the capacitor Cs1 can be formed using the parasitic capacitance between the conductive film 112b included in the transistor Tr1 and the conductive film 122b included in the transistor Tr2.

The circuit diagram of FIG. 2 includes a data line DL_Y-1 which inputs a data signal to a pixel, a data line DL_Y which inputs a data signal to the adjacent pixel, an anode line ANODE_X-1 which supplies a potential to a light-emitting element, an anode line ANODE_X which supplies a potential to the adjacent light-emitting element, and a scan line GL_X which supplies a scan signal to a pixel.

One of a source electrode and a drain electrode of the transistor Tr1 is electrically connected to the data line DL_Y-1. A first gate electrode and a second gate electrode of the transistor Tr1 is electrically connected to the scan line GL_X. The transistor Tr1 is turned on or off to control writing of a data signal.

One of a pair of electrodes of the capacitor Cs1 is electrically connected to the other of the source electrode and the drain electrode of the transistor Tr1. The other of the pair of electrodes of the capacitor Cs1 is electrically connected to a second gate electrode (also referred to as a back gate electrode) of the transistor Tr2. The capacitor Cs1 functions as a storage capacitor which stores written data.

One of a source electrode and a drain electrode of the transistor Tr2 is electrically connected to the anode line ANODE_X-1.

One of a pair of electrodes of the light-emitting element 160 is electrically connected to the other of the source electrode and the drain electrode of the transistor Tr2, and the other electrode of the light-emitting element 160 is electrically connected to a cathode line CATHODE. Note that the one of the pair of electrodes of the light-emitting element 160 is electrically connected to the other of the pair of electrodes of the capacitor Cs1.

The above structure is an example in which the semiconductor device 100 shown in FIGS. 1A and 1B is used for a pixel of a display device.

1-3. Structure of Semiconductor Device

The semiconductor device 100 shown in FIGS. 1A and 1B is described again. When the semiconductor device 100 shown in FIGS. 1A and 1B is used for a pixel of a display device, the channel length (L) and the channel width (W) of a transistor, the line widths of a wiring and an electrode connected to the transistor, and the like can be relatively large. The line width and the like can be larger when the transistor Tr1 and the transistor Tr2 overlap with each other at least partly as shown in FIGS. 1A and 1B than those when the transistor Tr1 and the transistor Tr2 are provided on the same plane, for example; thus, variations in processing size can be reduced.

In addition, one or both of a conductive film and an insulating film can be shared by the transistor Tr1 and the transistor Tr2; thus, the number of masks or steps can be reduced.

For example, in the transistor Tr1, the conductive film 104 serves as the first gate electrode, the conductive film 112a serves as the source electrode, the conductive film 112b serves as the drain electrode, and the conductive film 122c serves as the second gate electrode. In addition, in the transistor Tr1, the insulating film 106 serves as a first gate insulating film and the insulating films 114 and 116 serve as second gate insulating films. In the transistor Tr2, the conductive film 112b serves as the first gate electrode, the conductive film 122a serves as the source electrode, the conductive film 122b serves as the drain electrode, and the conductive film 130 serves as the second gate electrode. In addition, in the transistor Tr2, the insulating films 114 and 116 serve as first gate insulating films and the insulating films 124 and 126 serve as second gate insulating films.

Note that in this specification and the like, the insulating film 106 may be referred to as a first insulating film, the insulating films 114 and 116 may be collectively referred to as a second insulating film, and the insulating films 124 and 126 may be collectively referred to as a third insulating film.

An insulating film 134 is provided over the conductive film 130. An insulating film 136 is provided over the insulating film 134. An opening 184 is provided in the insulating films 134 and 136 so as to reach the conductive film 130. In addition, a conductive film 138 is provided over the insulating film 136. Note that the conductive film 138 is connected to the conductive film 130 in the opening 184.

In addition, an insulating film 140, an EL layer 142, and a conductive film 144 are provided over the conductive film 138. The insulating film 140 covers part of a side end portion of the conductive film 138 and prevents a short circuit of the conductive films 138 between adjacent pixels. The EL layer 142 emits light. The light-emitting element 160 is composed of the conductive film 138, the EL layer 142, and the conductive film 144. The conductive film 138 serves as one electrode of the light-emitting element 160. The conductive film 144 serves as the other electrode of the light-emitting element 160.

As described above, in the semiconductor device of one embodiment of the present invention, a plurality of transistors are stacked to be reduced in the transistor area. In addition, since one or both of an insulating film and a conductive film are shared by the plurality of transistors, the number of masks or steps can be reduced.

1-4. Structure of Gate Electrode

As shown in FIGS. 1A and 1B, each of the transistor Tr1 and the transistor Tr2 includes two gate electrodes.

Here, the effect of two gate electrodes is described with reference to FIGS. 1A and 1B and FIG. 3.

Figure 3:
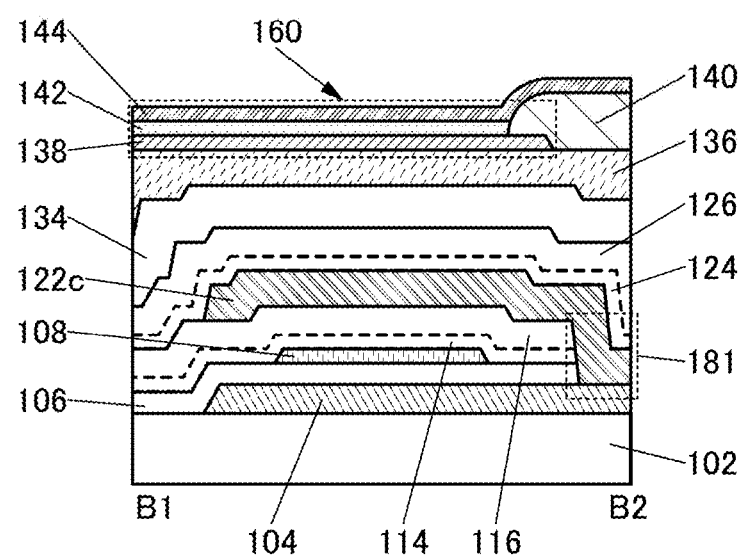
FIG. 3 is a cross-sectional view of a semiconductor device.

Note that FIG. 3 is a cross-sectional view taken along dashed dotted line B1-B2 in FIG. 1A. A cross section in a channel width (W) direction of the transistor Tr1 is included in FIG. 3.

As shown in FIG. 3, the conductive film 122c serving as the second gate electrode is electrically connected to the conductive film 104 serving as the first gate electrode in an opening 181. Accordingly, the conductive film 104 and the conductive film 122c are supplied with the same potential. In addition, as shown in FIG. 3, the oxide semiconductor film 108 faces the conductive film 104 and the conductive film 122c and is sandwiched between the conductive films serving as the two gate electrodes. The length in the channel width direction of each of the conductive film 104 and the conductive film 122c is greater than the length in the channel width direction of the oxide semiconductor film 108. The entire oxide semiconductor film 108 overlaps with the conductive film 104 and the conductive film 122c with the insulating films 106, 114, and 116 provided therebetween.

In other words, the conductive film 104 and the conductive film 122c are connected in the opening 181 which is provided in the insulating films 106, 114, and 116 and each include a region located outward from the side end portion of the oxide semiconductor film 108.

With such a structure, the oxide semiconductor film 108 included in the transistor Tr1 can be electrically enveloped by electric fields of the conductive film 104 and the conductive film 122c. A device structure of a transistor, like that of the transistor Tr1, in which electric fields of a first gate electrode and a second gate electrode electrically surround an oxide semiconductor film where a channel region is formed can be referred to as a surrounded-channel (S-channel) structure.

Since the transistor Tr1 has the S-channel structure, an electric field for inducing a channel can be effectively applied to the oxide semiconductor film 108 by the conductive film 104 functioning as a first gate electrode; therefore, the current drive capability of the transistor Tr1 can be improved and high on-state current characteristics can be obtained. In addition, since the on-state current can be high, it is possible to reduce the size of the transistor Tr1. In addition, since the transistor Tr1 has a structure in which the oxide semiconductor film 108 is surrounded by the conductive film 104 serving as the first gate electrode and the conductive film 122c serving as the second gate electrode, the mechanical strength of the transistor Tr1 can be increased.

Although the structure in which the first gate electrode is electrically connected to the second gate electrode is described above, one embodiment of the present invention is not limited thereto. For example, as in the transistor Tr2 shown in FIG. 1B, the conductive film 130 serving as the second gate electrode may be electrically connected to the conductive film 122a serving as the source electrode or the drain electrode of the transistor Tr2.

1-5. Components of Semiconductor Device

Next, components of the semiconductor device of this embodiment are described in detail.
[Substrate]

There is no particular limitation on the property of a material and the like of the substrate 102 as long as the material has at least heat resistance enough to withstand later-performed heat treatment. For example, a glass substrate, a ceramic substrate, a quartz substrate, or a sapphire substrate may be used as the substrate 102. A single crystal semiconductor substrate or a polycrystalline semiconductor substrate made of silicon, silicon carbide, or the like, a compound semiconductor substrate made of silicon germanium or the like, an SOI substrate, or the like may be used as the substrate 102. Any of these substrates provided with a semiconductor element may be used as the substrate 102. When a glass substrate is used as the substrate 102, a glass substrate having any of the following sizes can be used to manufacture a large-sized display device: the 6th generation (1500 mm×1850 mm), the 7th generation (1870 mm×2200 mm), the 8th generation (2200 mm×2400 mm), the 9th generation (2400 mm×2800 mm), and the 10th generation (2950 mm×3400 mm).

A flexible substrate may be used as the substrate 102, and the semiconductor device 100 and the like may be provided directly on the flexible substrate. A separation layer may be provided between the substrate 102 and the semiconductor device 100. The separation layer can be used when part or the whole of a semiconductor device formed over the separation layer is separated from the substrate 102 and transferred onto another substrate. In such a case, the semiconductor device 100 can be transferred to a substrate having low heat resistance or a flexible substrate as well.
[Conductive Film]

The conductive film 104, the conductive film 112a, the conductive film 112b, the conductive film 122a, the conductive film 122b, the conductive film 122c, the conductive film 130, the conductive film 138, and the conductive film 144 can each be formed using a metal element selected from chromium (Cr), copper (Cu), aluminum (Al), gold (Au), silver (Ag), zinc (Zn), molybdenum (Mo), tantalum (Ta), titanium (Ti), tungsten (W), manganese (Mn), nickel (Ni), iron (Fe), and cobalt (Co); an alloy including any of these metal element as its component; an alloy including a combination of any of these elements; or the like.

The conductive film 104, the conductive film 112a, the conductive film 112b, the conductive film 122a, the conductive film 122b, the conductive film 122c, the conductive film 130, the conductive film 138, and the conductive film 144 can each be formed using an oxide conductor such as an oxide including indium and tin, an oxide including tungsten and indium, an oxide including tungsten, indium, and zinc, an oxide including titanium and indium, an oxide including titanium, indium, and tin, an oxide including indium and zinc, an oxide including silicon, indium, and tin, an oxide including indium, gallium, and zinc.

The above-listed oxide conductors are particularly favorable as the conductive film 130. Oxide conductors are described here. The oxide conductor in this specification and the like may be referred to as OC. An oxide conductor is obtained as follows, for example. Oxygen vacancies are formed in an oxide semiconductor, and then hydrogen is added to the oxygen vacancies, so that a donor level is formed in the vicinity of the conduction band. As a result, the oxide semiconductor has increased conductivity to be a conductor. The oxide semiconductor which has become a conductor can be referred to as an oxide conductor. Oxide semiconductors generally transmit visible light because of their large energy gaps. An oxide conductor is an oxide semiconductor having a donor level in the vicinity of the conduction band. Therefore, the influence of absorption due to the donor level is small in an oxide conductor, and the oxide conductor has a visible light transmitting property comparable to that of an oxide semiconductor.

A Cu—X alloy film (X is Mn, Ni, Cr, Fe, Co, Mo, Ta, or Ti) may be used as the conductive film 104, the conductive film 112a, the conductive film 112b, the conductive film 122a, the conductive film 122b, the conductive film 122c, the conductive film 130, the conductive film 138, and the conductive film 144. The use of a Cu—X alloy film leads to lower fabrication costs because the film can be processed by wet etching.

The Cu—X alloy film can be favorably used as one of or a plurality of the conductive film 104, the conductive film 112a, the conductive film 112b, the conductive film 122a, the conductive film 122b, and the conductive film 122c. A Cu—Mn alloy film is particularly preferable as the Cu—X alloy film.

Among the above-described metal elements, one of or a plurality of aluminum, copper, titanium, tungsten, tantalum, and molybdenum is particularly favorable as a constituent of one of or a plurality of the conductive film 104, the conductive film 112a, the conductive film 112b, the conductive film 122a, the conductive film 122b, and the conductive film 122c.

A tantalum nitride film, which contains nitride and tantalum, is favorably used as one of or a plurality of the conductive film 104, the conductive film 112a, the conductive film 112b, the conductive film 122a, the conductive film 122b, and the conductive film 122c. The tantalum nitride film has conductivity and a high barrier property against copper and hydrogen. The tantalum nitride film can be used most preferably as a metal film in contact with the oxide semiconductor film 108 or a metal film in the vicinity of the oxide semiconductor film 108 because the amount of hydrogen released from the tantalum nitride film is small.

[Insulating Film]

As each of the insulating film 106, the insulating film 114, the insulating film 116, the insulating film 124, the insulating film 126, the insulating film 134, the insulating film 136, and the insulating film 140, an insulating layer including at least one of the following films formed by a plasma CVD method, a sputtering method, or the like can be used: a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, and a neodymium oxide film.

The insulating film 106 serves as a blocking film that inhibits penetration of oxygen. For example, when one of or a plurality of the insulating film 114, the insulating film 116, the oxide semiconductor film 108, the oxide semiconductor film 128, the insulating film 124, and the insulating film 126 include an oxygen-excess region, the insulating film 106 can inhibit penetration of oxygen.

Note that an insulating film that is in contact with one or both of the oxide semiconductor film 108 and the oxide semiconductor film 128 is preferably an oxide insulating film and preferably includes a region containing oxygen in excess of that in the stoichiometric composition (the oxygen-excess region). In other words, the oxide insulating film including the oxygen-excess region is an insulating film capable of releasing oxygen.

The oxygen-excess region of the oxide insulating film can be formed by any of the following methods, for example: an insulating film is formed in an oxygen atmosphere; an insulating film is formed, and then is subjected to heat treatment in an oxygen atmosphere; or an insulating film is formed, and then oxygen is added to the insulating film. Plasma treatment is preferable for adding oxygen into the formed insulating film.

The insulating film serving as the gate insulating film of each of the transistor Tr1 and the transistor Tr2 may be formed using hafnium oxide. When hafnium oxide is used for the insulating film serving as the gate insulating film, the following effects are obtained.

Hafnium oxide has a higher dielectric constant than silicon oxide and silicon oxynitride. Thus, the thickness of the insulating film formed using hafnium oxide can be larger than that of an insulating film formed using silicon oxide, so that leakage current due to tunnel current can be low. That is, a transistor with low off-state current can be fabricated. Moreover, hafnium oxide which has a crystal structure has a higher dielectric constant than hafnium oxide which has an amorphous structure. Therefore, it is preferable to use hafnium oxide which has a crystal structure in order to fabricate a transistor with low off-state current. Examples of the crystal structure include a monoclinic crystal structure and a cubic crystal structure. Note that one embodiment of the present invention is not limited to the above examples.

The insulating film serving as the gate insulating film of each of the transistor Tr1 and the transistor Tr2 may be formed using silicon nitride. When silicon nitride is used for the insulating film serving as the gate insulating film, the following effects are obtained. Silicon nitride has a higher dielectric constant than silicon oxide and needs a larger thickness to obtain capacitance equivalent to that of silicon oxide. Thus, the thickness of the gate insulating film can be increased. This makes it possible to prevent a decrease in withstand voltage of the transistor Tr1 and the transistor Tr2 and to increase the withstand voltage, thereby preventing electrostatic discharge of the transistor Tr1 and the transistor Tr2.

The insulating films 114, 116, 124, and 126 have a function of supplying oxygen to the oxide semiconductor film 108 and/or the oxide semiconductor film 128. That is, the insulating films 114, 116, 124, and 126 contain oxygen. The insulating films 114 and 124 are insulating films which allow passage of oxygen. Note that the insulating film 114 also functions as a film for relieving damage to the oxide semiconductor film 108 at the time of forming the insulating film 116 in a later step. The insulating film 124 also functions as a film for relieving damage to the oxide semiconductor film 128 at the time of forming the insulating film 126 in a later step.

A silicon oxide film, a silicon oxynitride film, or the like with a thickness greater than or equal to 5 nm and less than or equal to 150 nm, preferably greater than or equal to 5 nm and less than or equal to 50 nm can be used as the insulating films 114 and 124.

In addition, it is preferable that the number of defects in the insulating films 114 and 124 be small, and typically, the spin density of a signal that appears at g=2.001 due to a dangling bond of silicon be lower than or equal to $1 \times 10^{18}$ spins/cm$^3$ when measured by ESR measurement. This is because if the density of defects in each of the insulating films 114 and 124 is high, oxygen is bonded to the defects and the amount of oxygen that passes through the insulating film 114 is decreased.

The insulating films 114 and 124 can each be formed using an oxide insulating film having a low density of states due to nitrogen oxide. Note that the density of states due to nitrogen oxide can be formed between the energy of the valence band maximum ($E_{v\_os}$) and the energy of the conduction band minimum ($E_{c\_os}$) of the oxide semiconductor film. A silicon oxynitride film that releases less nitrogen oxide, an aluminum oxynitride film that releases less nitrogen oxide, and the like can be used as the above oxide insulating film.

Note that a silicon oxynitride film that releases less nitrogen oxide is a film of which the release amount of ammonia is larger than the release amount of nitrogen oxide in thermal desorption spectroscopy (TDS); the release amount of ammonia is typically greater than or equal to $1 \times 10^{18}$ cm$^{-3}$ and less than or equal to $5 \times 10^{19}$ cm$^{-3}$. Note that the release amount of ammonia is the total amount of ammonia released by heat treatment at a temperature in the range of 50° C. to 650° C. or the range of 50° C. to 550° C. in TDS. The release amount of ammonia is the total release amount of ammonia converted into ammonia molecules in TDS.

Nitrogen oxide (NO$_x$; x is greater than 0 and less than or equal to 2, preferably greater than or equal to 1 and less than or equal to 2), typically NO$_2$ or NO, forms a level in each of the insulating films 114 and 124. The level is located in the energy gap of the oxide semiconductor films 108 and 128. Therefore, when nitrogen oxide is diffused to the interface between the insulating film 114 and the oxide semiconductor film 108 or the interface between the insulating film 124 and the oxide semiconductor film 128, an electron might be trapped by the level on the insulating films 114 and 124 side. As a result, the trapped electron remains in the vicinity of the interface between the insulating film 114 and the oxide semiconductor film 108 or the interface between the insulating film 124 and the oxide semiconductor film 128; thus, the threshold voltage of the transistor is shifted in the positive direction.

Nitrogen oxide reacts with ammonia and oxygen in heat treatment. Since nitrogen oxide contained in the insulating films 114 and 124 reacts with ammonia contained in the insulating films 116 and 126 in heat treatment, nitrogen oxide contained in the insulating films 114 and 124 is reduced. Therefore, an electron is hardly trapped in the vicinity of the interface between the insulating film 114 and the oxide semiconductor film 108 or the interface between the insulating film 124 and the oxide semiconductor film 128.

By using such an oxide insulating film, the insulating films 114 and 124 can reduce the shift in the threshold voltage of the transistor, which leads to a smaller change in the electrical characteristics of the transistor.

Note that in ESR spectra at 100 K or lower of the insulating films 114 and 124, by heat treatment of a manufacturing process of the transistor, typically heat treatment at a temperature higher than or equal to 300° C. and lower than 350° C., a first signal that appears at a g-factor of greater than or equal to 2.037 and less than or equal to 2.039, a second signal that appears at a g-factor of greater than or equal to 2.001 and less than or equal to 2.003, and a third signal that appears at a g-factor of greater than or equal to 1.964 and less than or equal to 1.966 are observed. The split width of the first and second signals and the split width of the second and third signals that are obtained by ESR measurement using an X-band are each approximately 5 mT. The sum of the spin densities of the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 is lower than $1 \times 10^{18}$ spins/cm$^3$, typically higher than or equal to $1 \times 10^{17}$ spins/cm$^3$ and lower than $1 \times 10^{18}$ spins/cm$^3$.

In the ESR spectra at 100 K or lower, the sum of the spin densities of the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 corresponds to the sum of the spin densities of signals attributed to nitrogen oxide (NO$_x$; x is greater than 0 and less than or equal to 2, preferably greater than or equal to 1 and less than or equal to 2). Typical examples of the nitrogen oxide include nitrogen monoxide and nitrogen dioxide. It can be said that the lower the sum of the spin densities of the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 is, the lower the content of nitrogen oxide in the oxide insulating film is.

The nitrogen concentration of the above-described oxide insulating film measured by SIMS is lower than or equal to $6 \times 10^{20}$ atoms/cm$^3$.

The oxide insulating film can be formed to be dense and hard by a PECVD method at a substrate temperature higher than or equal to 220° C. and lower than or equal to 350° C. with the use of silane and dinitrogen monoxide.

The insulating films 116 and 126 are formed using an oxide insulating film whose oxygen content is higher than that in the stoichiometric composition. Part of oxygen is released by heating from the oxide insulating film whose oxygen content is higher than that in the stoichiometric composition. The oxide insulating film whose oxygen content is higher than that in the stoichiometric composition releases oxygen greater than or equal to $1.0 \times 10^{19}$ cm$^{-3}$, preferably greater than or equal to $3.0 \times 10^{20}$ cm$^{-3}$. Note that the release amount of oxygen is the total amount of oxygen released by heat treatment in a range of 50° C. to 650° C. or a range of 50° C. to 550° C. in TDS. The amount of released oxygen is the total release amount of oxygen converted into oxygen molecules in TDS.

A silicon oxide film, a silicon oxynitride film, or the like with a thickness greater than or equal to 30 nm and less than or equal to 500 nm, preferably greater than or equal to 50 nm and less than or equal to 400 nm can be used as each of the insulating films 116 and 126.

In addition, it is preferable that the number of defects in the insulating films 116 and 126 be small, and typically, the spin density of a signal that appears at g=2.001 due to a dangling bond of silicon be lower than $1.5 \times 10^{18}$ spins/cm$^3$, preferably lower than $1 \times 10^{18}$ spins/cm$^3$ when measured by ESR measurement.

Since the insulating films 114 and 116 and the insulating films 124 and 126 can be formed using insulating films including the same kinds of materials, a boundary between the insulating films 114 and 116 and a boundary between the insulating films 124 and 126 cannot be clearly observed in some cases. Thus, in this embodiment, the boundary between the insulating films 114 and 116 and the boundary between the insulating films 124 and 126 are shown by dashed lines.

The insulating film 134 serves as a protective insulating film of each of the transistor Tr1 and the transistor Tr2.

The insulating film 134 contains one or both of hydrogen and nitrogen. Alternatively, the insulating film 134 includes nitrogen and silicon. The insulating film 134 has a function of blocking oxygen, hydrogen, water, an alkali metal, an alkaline earth metal, or the like. It is possible to prevent outward diffusion of oxygen from the oxide semiconductor film 108 and the oxide semiconductor film 128, outward diffusion of oxygen included in the insulating films 114, 116, 124, and 126, and entry of hydrogen, water, or the like into the oxide semiconductor films 108 and 128 from the outside by providing the insulating film 134.

The insulating film 134 can be formed using a nitride insulating film, for example. The nitride insulating film is formed using silicon nitride, silicon nitride oxide, aluminum nitride, aluminum nitride oxide, or the like.

[Oxide Semiconductor Film]

The oxide semiconductor films 108 and 128 can be formed using the materials described above.

In the case where the oxide semiconductor films 108 and 128 each include In-M-Zn oxide, it is preferable that the atomic ratio of metal elements of a sputtering target used for forming the In-M-Zn oxide satisfy In≥M. The atomic ratio between metal elements in such a sputtering target is, for example, In:M:Zn=2:1:3, In:M:Zn=3:1:2, or In:M:Zn=4:2:4.1.

In the case where the oxide semiconductor film 108 and the oxide semiconductor film 128 each include an In-M-Zn oxide, the atomic ratio of metal elements in a sputtering target used for depositing the In-M-Zn oxide may satisfy In≤M. The atomic ratio of metal elements in such a sputtering target is, for example, In:M:Zn=1:1:1, In:M:Zn=1:1:1.2, In:M:Zn=1:3:2, In:M:Zn=1:3:4, or In:M:Zn=1:3:6.

In the case where the oxide semiconductor film 108 and the oxide semiconductor film 128 are each In-M-Zn oxide, it is preferable to use a target including polycrystalline In-M-Zn oxide as the sputtering target. The use of the target including polycrystalline In-M-Zn oxide facilitates formation of the oxide semiconductor films 108 and 128 having crystallinity. Note that the atomic ratio of metal elements in the formed oxide semiconductor films 108 and 128 varies from the above atomic ratios of metal elements of the sputtering targets in a range of ±40%. For example, when a sputtering target with an atomic ratio of In to Ga and Zn of 4:2:4.1 is used for the oxide semiconductor films 108 and 128, the atomic ratio of In to Ga and Zn in the oxide semiconductor films 108 and 128 may be 4:2:3 or in the vicinity of 4:2:3.

The energy gap of the oxide semiconductor films 108 and 128 is 2 eV or more, preferably 2.5 eV or more and further preferably 3 eV or more. With the use of an oxide semiconductor having such a wide energy gap, the off-state current of the transistors Tr1 and Tr2 can be reduced.

The thickness of the oxide semiconductor films 108 and 128 is greater than or equal to 3 nm and less than or equal to 200 nm, preferably greater than or equal to 3 nm and less than or equal to 100 nm, further preferably greater than or equal to 3 nm and less than or equal to 50 nm.

Hydrogen contained in the oxide semiconductor films 108 and 128 reacts with oxygen bonded to a metal atom to be water, and also causes an oxygen vacancy in a lattice from which oxygen is released (or a portion from which oxygen is released). Entry of hydrogen into the oxygen vacancy generates an electron serving as a carrier in some cases. Furthermore, in some cases, bonding of part of hydrogen to oxygen bonded to a metal atom causes generation of an electron serving as a carrier. Thus, a transistor including an oxide semiconductor film that contains hydrogen is likely to be normally on. Accordingly, it is preferable that hydrogen be reduced as much as possible in the oxide semiconductor films 108 and 128.

Specifically, in each of the oxide semiconductor films 108 and 128, the concentration of hydrogen which is measured by SIMS is lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, further preferably lower than or equal to $5\times10^{18}$ atoms/cm$^3$, further preferably lower than or equal to $1\times10^{18}$ atoms/cm$^3$, further preferably lower than or equal to $5\times10^{17}$ atoms/cm$^3$, and still further preferably lower than or equal to $1\times10^{16}$ atoms/cm$^3$.

When silicon or carbon, which is one of the elements belonging to Group 14, is contained in the oxide semiconductor films 108 and 128, oxygen vacancies are increased in the oxide semiconductor films 108 and 128, so that the oxide semiconductor films 108 and 128 become n-type films. Thus, the silicon concentration measured by SIMS in each of the oxide semiconductor films 108 and 128 is set to be lower than or equal to $2\times10^{18}$ atoms/cm$^3$, preferably lower than or equal to $2\times10^{17}$ atoms/cm$^3$. The carbon concentration measured by SIMS in each of the oxide semiconductor films 108 and 128 is set to be lower than or equal to $2\times10^{18}$ atoms/cm$^3$, preferably lower than or equal to $2\times10^{17}$ atoms/cm$^3$.

In addition, the concentration of alkali metal or alkaline earth metal of each of the oxide semiconductor film 108 and the oxide semiconductor film 128, which is measured by SIMS, is set to be lower than or equal to $1\times10^{18}$ atoms/cm$^3$, preferably lower than or equal to $2\times10^{16}$ atoms/cm$^3$. Alkali metal and alkaline earth metal might generate carriers when bonded to an oxide semiconductor, in which case the off-state current of the transistor might be increased. Thus, it is preferable to reduce the concentration of alkali metal or alkaline earth metal in the oxide semiconductor films 108 and 128.

The oxide semiconductor film 108 and the oxide semiconductor film 128c may have a non-single-crystal structure, for example. Examples of the non-single-crystal structure include a c-axis-aligned crystalline oxide semiconductor (CAAC-OS) which is described later, a polycrystalline structure, a microcrystalline structure, and an amorphous structure. Among the non-single crystal structure, the amorphous structure has the highest density of defect states, whereas CAAC-OS has the lowest density of defect states.

Note that the above-described films such as conductive films, insulating films, and oxide semiconductor films can be formed by a sputtering method, a plasma-enhanced chemical vapor deposition (PECVD) method, or a thermal CVD method. Examples of thermal CVD methods include a metal organic chemical vapor deposition (MOCVD) method and an atomic layer deposition (ALD) method.

A thermal CVD method is a deposition method without using plasma and thus has an advantage that no defect due to plasma damage is generated.

Deposition by a thermal CVD method may be performed in such a manner that a source gas and an oxidizer are supplied to the chamber at a time so that the pressure in a chamber is set to an atmospheric pressure or a reduced pressure, and react with each other in the vicinity of the substrate or over the substrate.

Deposition by an ALD method may be performed under the condition that the pressure in a chamber is set to an atmospheric pressure or a reduced pressure, and a source gas for reaction is used.

The above-described variety of films such as the conductive film, the insulating film, the oxide semiconductor film, and the metal oxide film in this embodiment can be formed by a thermal CVD method such as an MOCVD method or an ALD method. For example, an In—Ga—Zn—O film can be formed with trimethylindium, trimethylgallium, and dimethylzinc. Note that the chemical formula of trimethylindium is In(CH$_3$)$_3$. The chemical formula of trimethylgallium is Ga(CH$_3$)$_3$. The chemical formula of dimethylzinc is Zn(CH$_3$)$_2$. Without limitation to the above combination, triethylgallium (chemical formula: Ga(C$_2$H$_5$)$_3$) can be used instead of trimethylgallium and diethylzinc (chemical formula: Zn(C$_2$H$_5$)$_2$) can be used instead of dimethylzinc.

For example, in the case where a hafnium oxide film is formed by a deposition apparatus using an ALD method, two kinds of gases are used: ozone (O$_3$) as an oxidizer and a source gas which is obtained by vaporizing liquid containing a solvent and a hafnium precursor compound (hafnium alkoxide or hafnium amide such as tetrakis(dimethylamide) hafnium (TDMAH)). Note that the chemical formula of tetrakis(dimethylamide)hafnium is Hf[N(CH$_3$)$_2$]$_4$. Examples of another material liquid include tetrakis(ethylmethylamide)hafnium.

For example, in the case where an aluminum oxide film is formed by a deposition apparatus using an ALD method, two kinds of gases are used: $H_2O$ as an oxidizer and a source gas which is obtained by vaporizing a solvent and liquid containing an aluminum precursor compound (e.g., trimethylaluminum: TMA). Note that the chemical formula of trimethylaluminum is $Al(CH_3)_3$. Examples of another material liquid include tris(dimethylamide)aluminum, triisobutylaluminum, and aluminum tris(2,2,6,6-tetramethyl-3,5-heptanedionate).

For example, in the case where a silicon oxide film is formed by a deposition apparatus using ALD, hexachlorodisilane is adsorbed on a surface where a film is to be formed, chlorine contained in the adsorbate is removed, and radicals of an oxidizing gas (e.g., $O_2$ or dinitrogen monoxide) are supplied to react with the adsorbate.

For example, in the case where a tungsten film is formed using a deposition apparatus using an ALD method, a $WF_6$ gas and a $B_2H_6$ gas are used to form an initial tungsten film, and then a $WF_6$ gas and an $H_2$ gas are used to form a tungsten film. Note that an $SiH_4$ gas may be used instead of a $B_2H_6$ gas.

For example, in the case where an oxide semiconductor film, e.g., an In—Ga—Zn—O film is formed with a deposition apparatus employing ALD, an $In(CH_3)_3$ gas and an $O_3$ gas are sequentially introduced a plurality of times to form an In—O layer, then a $Ga(CH_3)_3$ gas and an $O_3$ gas are used to form a GaO layer, and then a $Zn(CH_3)_2$ gas and an $O_3$ gas are used to form a Zn—O layer. Note that the order of these layers is not limited to this example. A mixed compound layer such as an In—Ga—O layer, an In—Zn—O layer, or a Ga—Zn—O layer may be formed by mixing of these gases. An $H_2O$ gas which is obtained by bubbling with an inert gas such as Ar may be used instead of an $O_3$ gas, but it is preferable to use an $O_3$ gas, which does not contain H. Furthermore, instead of an $In(CH_3)_3$ gas, an $In(C_2H_5)_3$ gas may be used. Instead of a $Ga(CH_3)_3$ gas, a $Ga(C_2H_5)_3$ gas may be used. Further, a $Zn(CH_3)_2$ gas may be used.

1-6. Structure Example 2 of Semiconductor Device

Next, modification examples of the semiconductor device 100 shown in FIGS. 1A and 1B are described with reference to FIGS. 4A and 4B and FIG. 5.

Figure 4A:
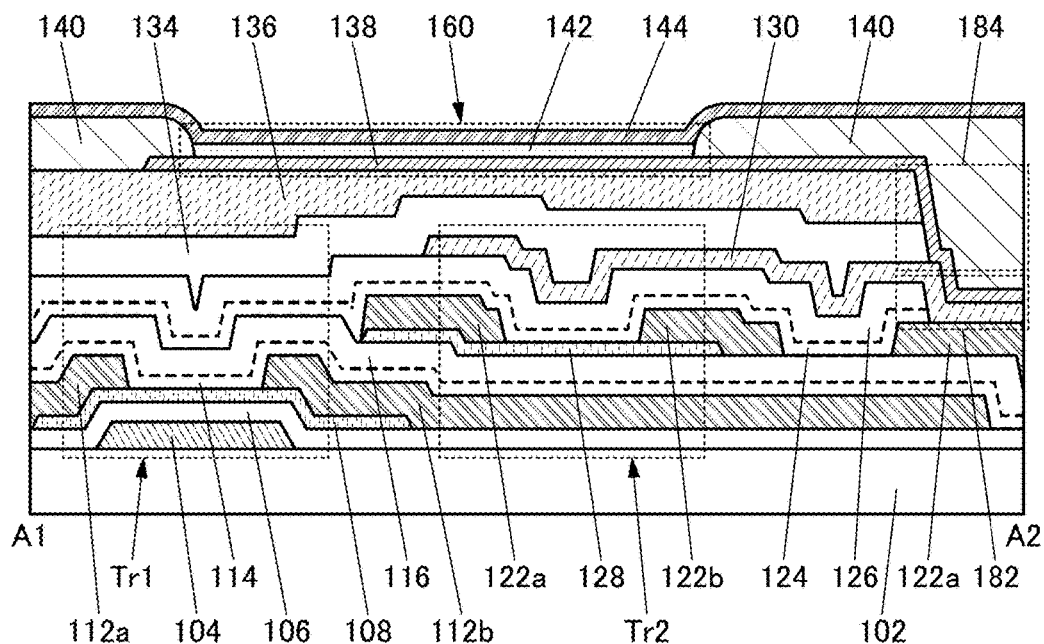
FIGS. 4A and 4B are cross-sectional views of a semiconductor device.

FIG. 4A is a cross-sectional view showing a modification example of the semiconductor device 100 shown in FIG. 1B. FIG. 4B is a cross-sectional view showing a modification example of the semiconductor device 100 shown in FIG. 1B. FIG. 5 is a cross-sectional view showing a modification example of the semiconductor device 100 shown in FIG. 1B.

FIG. 4A shows a structure without the conductive film 122c serving as the second gate electrode of the transistor Tr1 included in the semiconductor device 100.

Figure 4B:
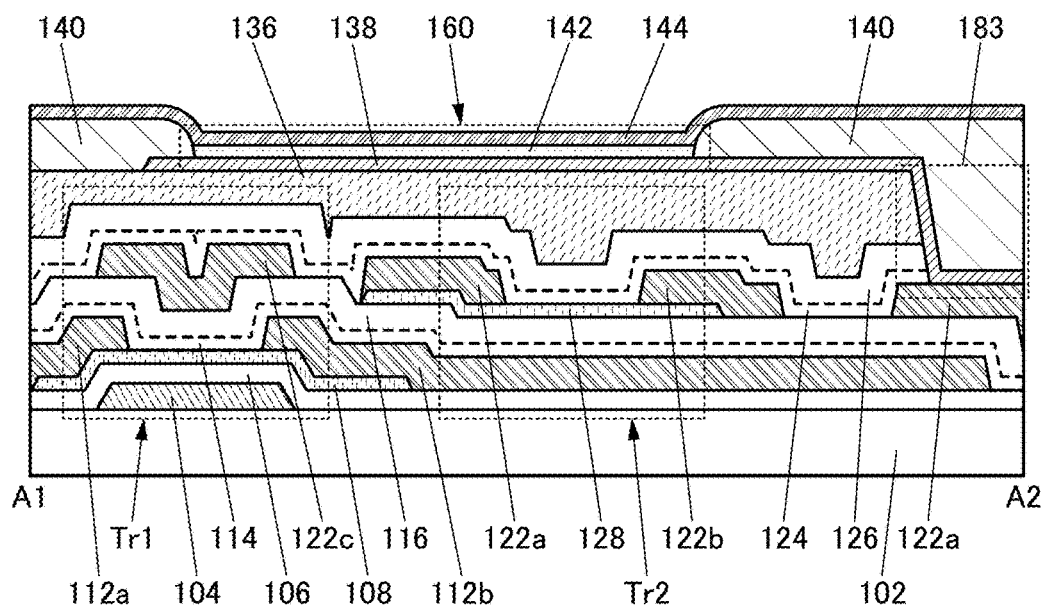

FIG. 4B shows a structure without the conductive film 130 serving as the second gate electrode of the transistor Tr2 included in the semiconductor device 100 and without the insulating film 134 over the conductive film 130. In addition, in the structure shown in FIG. 4B, an opening 183 is formed in the insulating film 124, the insulating film 126, and the insulating film 136 instead of the opening 182 formed in the insulating film 124 and the insulating film 126 and the opening 184 formed in the insulating film 134 and the insulating film 136. Such a structure including one opening is favorable because the manufacturing steps can be reduced.

Figure 5:
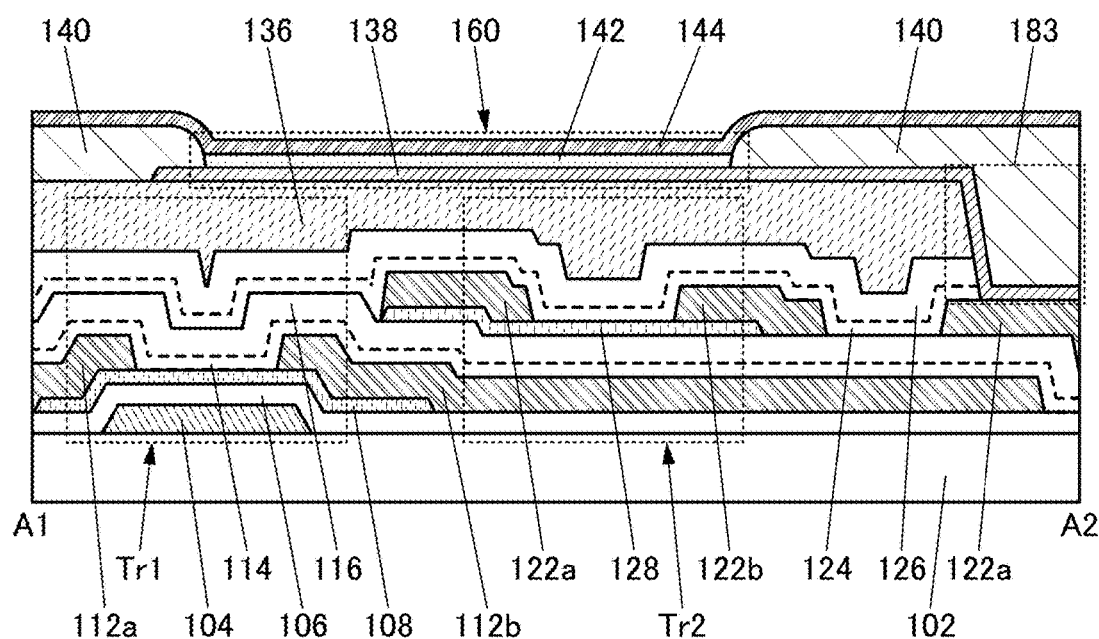
FIG. 5 is a cross-sectional view of a semiconductor device.

FIG. 5 shows a structure without the conductive film 122c serving as the second gate electrode of the transistor Tr1 included in the semiconductor device 100, the conductive film 130 serving as the second gate electrode of the transistor Tr2 included in the semiconductor device 100, and the insulating film 134 over the conductive film 130 included in the semiconductor device 100. In addition, as in FIG. 4B, the opening 183 is formed in the insulating film 124, the insulating film 126, and the insulating film 136.

1-7. Structure Example 3 of Semiconductor Device

Next, modification examples of the semiconductor device 100 in FIGS. 1A and 1B are described with reference to FIGS. 6A and 6B and FIGS. 7A and 7B.

A stacked-layer structure of an oxide semiconductor film is described below.

Figure 6A:
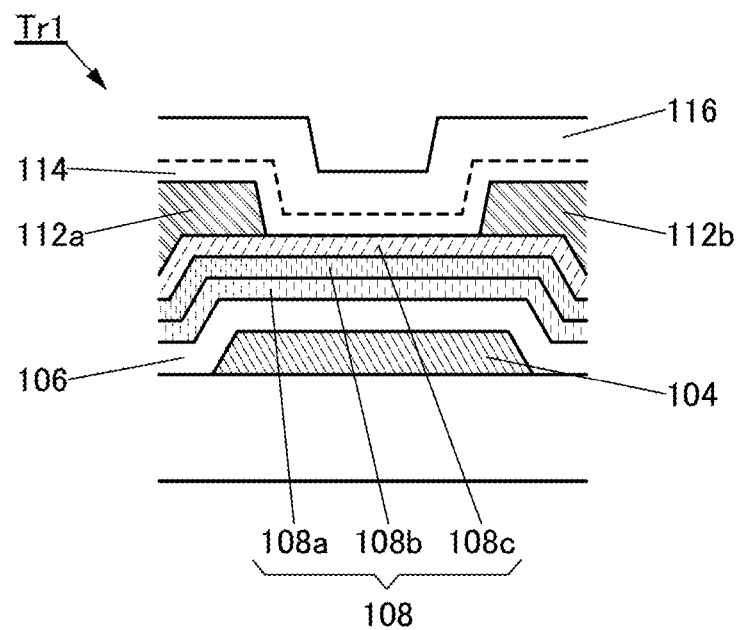
FIGS. 6A and 6B are cross-sectional views of a semiconductor device.
Figure 6B:
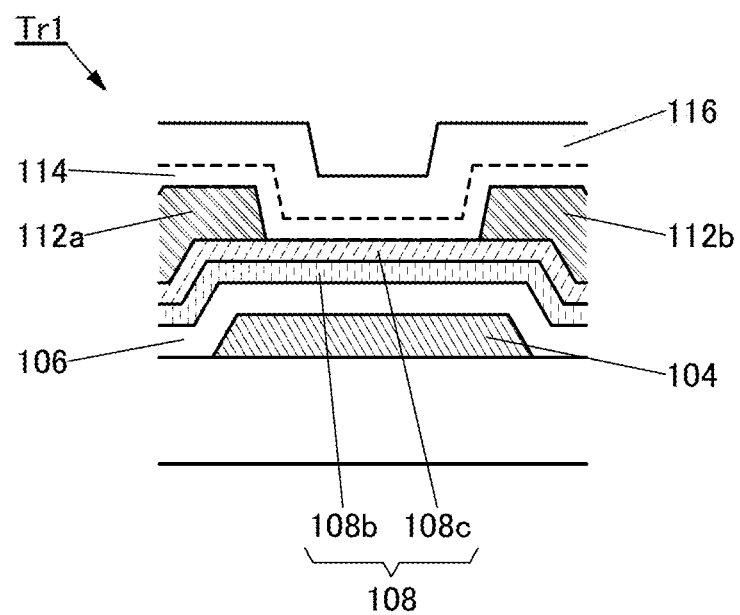

FIGS. 6A and 6B are cross-sectional views in the channel length (L) direction of the transistor Tr1 included in the semiconductor device 100.

FIG. 6A shows a structure in which the oxide semiconductor film 108 of the transistor Tr1 includes an oxide semiconductor film 108a, an oxide semiconductor film 108b over the oxide semiconductor film 108a, and an oxide semiconductor film 108c over the oxide semiconductor film 108b. That is, the oxide semiconductor film 108 has a three-layer structure.

FIG. 6B shows a structure in which the oxide semiconductor film 108 of the transistor Tr1 includes the oxide semiconductor film 108b and the oxide semiconductor film 108c over the oxide semiconductor film 108b. That is, the oxide semiconductor film has a two-layer structure.

Figure 7A:
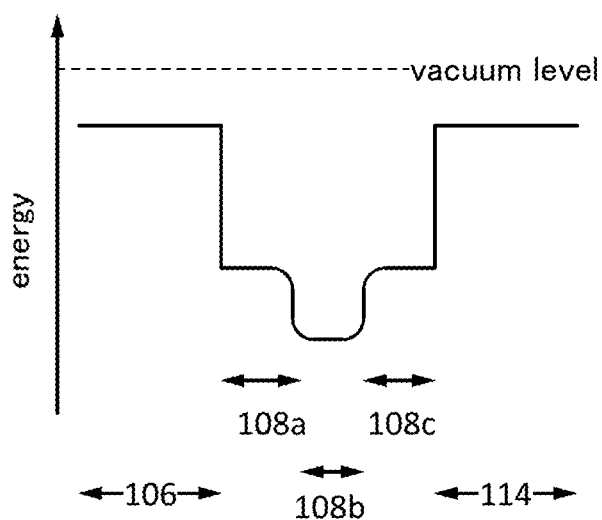
FIGS. 7A and 7B illustrate energy bands.
Figure 7B:
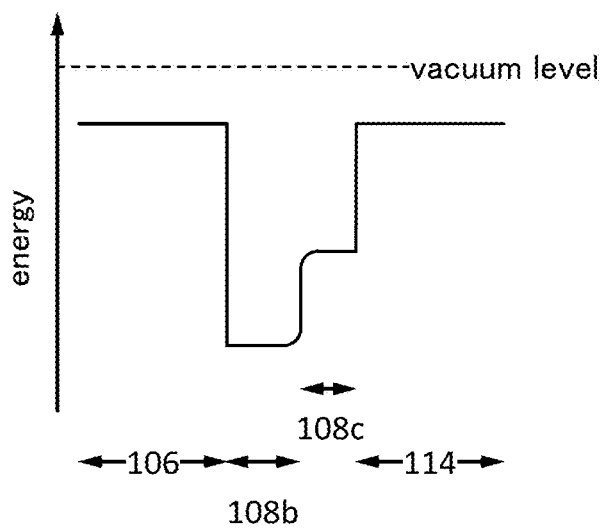
Figure 8A:
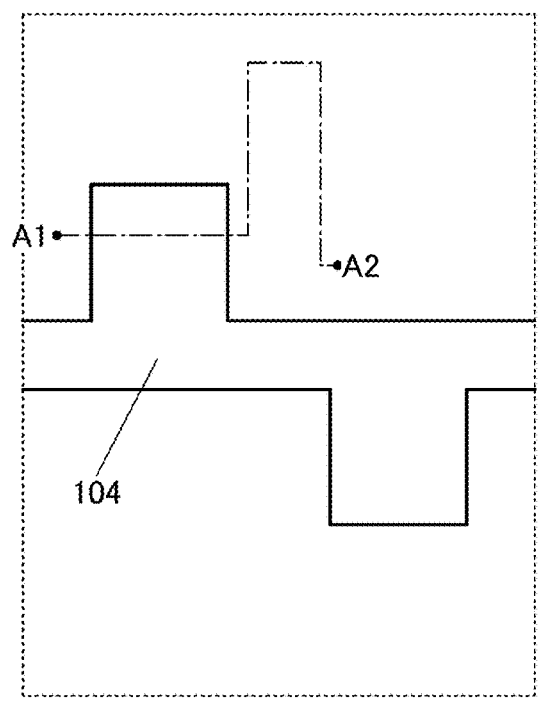
FIGS. 8A and 8B are a top view and a cross-sectional view illustrating a method for manufacturing a semiconductor device.
Figure 8B:
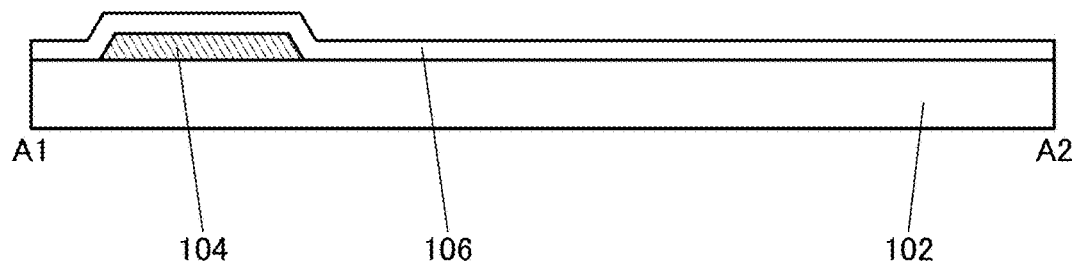

FIGS. 7A and 7B show examples of a band structure of the oxide semiconductor film 108 and an insulating film that is in contact with the oxide semiconductor film 108.

FIG. 7A shows an example of a band structure of a stack-layer structure in the thickness direction of including the insulating film 106, the oxide semiconductor films 108a, 108b, and 108c, and the insulating film 114. FIG. 7B shows an example of a band structure of a stacked-layer structure in the thickness direction including the insulating film 106, the oxide semiconductor films 108b and 108c, and the insulating film 114. For easy understanding, energy level of the conduction band minimum (Ec) of each of the insulating film 106, the oxide semiconductor films 108a, 108b, and 108c, and the insulating film 114 is shown in the band structures.

FIG. 7A is a band diagram of a structure in which a silicon oxide film is used as each of the insulating films 106 and 114, an oxide semiconductor film formed using a metal oxide target having an atomic ratio of metal elements of In:Ga:Zn=1:3:2 is used as the oxide semiconductor film 108a, an oxide semiconductor film formed using a metal oxide target having an atomic ratio of metal elements of In:Ga:Zn=4:2:4.1 is used as the oxide semiconductor film 108b, and an oxide semiconductor film formed using a metal oxide target having an atomic ratio of metal elements of In:Ga:Zn=1:3:2 is used as the oxide semiconductor film 108c.

FIG. 7B is a band diagram of a structure in which a silicon oxide film is used as each of the insulating films 106 and 114, an oxide semiconductor film formed using a metal oxide target having an atomic ratio of metal elements of In:Ga:Zn=4:2:4.1 is used as the oxide semiconductor film 108b, and a metal oxide film formed using a metal oxide target having an atomic ratio of metal elements of In:Ga:Zn=1:3:2 is used as the oxide semiconductor film 108c.

As illustrated in FIGS. 7A and 7B, the energy level of the conduction band minimum gradually varies between the oxide semiconductor film 108a and the oxide semiconductor film 108*b* and between the oxide semiconductor film 108*b* and the oxide semiconductor film 108*c*. In other words, the energy level at the bottom of the conduction band is continuously varied or continuously connected. To obtain such a band structure, there exists no impurity, which forms a defect state such as a trap center or a recombination center, at the interface between the oxide semiconductor film 108*a* and the oxide semiconductor film 108*b* or at the interface between the oxide semiconductor film 108*b* and the oxide semiconductor film 108*c*.

To form a continuous junction between the oxide semiconductor film 108*a* and the oxide semiconductor film 108*b* and between the oxide semiconductor film 108*b* and the oxide semiconductor film 108*c*, the films are formed successively without exposure to the air by using a multi-chamber deposition apparatus (sputtering apparatus) provided with a load lock chamber.

With the band structure of FIG. 7A or FIG. 7B, the oxide semiconductor film 108*b* serves as a well, and a channel region is formed in the oxide semiconductor film 108*b* in the transistor with the stacked-layer structure.

The provision of the oxide semiconductor film 108*a* and/or the oxide semiconductor film 108*c* enables the oxide semiconductor film 108*b* to be distanced away from trap states.

In addition, the trap states might be more distant from the vacuum level than the energy level of the conduction band minimum (Ec) of the oxide semiconductor film 108*b* functioning as a channel region, so that electrons are likely to be accumulated in the trap states. When the electrons are accumulated in the trap states, the electrons become negative fixed electric charge, so that the threshold voltage of the transistor is shifted in the positive direction. Therefore, it is preferable that the energy level of the trap states be closer to the vacuum level than the energy level of the conduction band minimum (Ec) of the oxide semiconductor film 108*b*. Such a structure inhibits accumulation of electrons in the trap states. As a result, the on-state current and the field-effect mobility of the transistor can be increased.

The energy level of the conduction band minimum of each of the oxide semiconductor films 108*a* and 108*c* is closer to the vacuum level than that of the oxide semiconductor film 108*b*.

Typically, a difference in energy level between the conduction band minimum of the oxide semiconductor film 108*b* and the conduction band minimum of each of the oxide semiconductor films 108*a* and 108*c* is 0.15 eV or more or 0.5 eV or more and 2 eV or less or 1 eV or less. That is, the difference between the electron affinity of each of the oxide semiconductor films 108*a* and 108*c* and the electron affinity of the oxide semiconductor film 108*b* is 0.15 eV or more or 0.5 eV or more and 2 eV or less or 1 eV or less.

In such a structure, the oxide semiconductor film 108*b* serves as a main path of current and functions as a channel region. In addition, since the oxide semiconductor films 108*a* and 108*c* each contain one or more metal elements that are the same as those contained in the oxide semiconductor film 108*b* in which a channel region is formed, interface scattering is less likely to occur at the interface between the oxide semiconductor film 108*a* and the oxide semiconductor film 108*b* or at the interface between the oxide semiconductor film 108*b* and the oxide semiconductor film 108*c*. Thus, the transistor can have high field-effect mobility because the movement of carriers is not hindered at the interface.

To prevent each of the oxide semiconductor films 108*a* and 108*c* from functioning as part of a channel region, a material having sufficiently low conductivity is used for the oxide semiconductor films 108*a* and 108*c*. Alternatively, a material which has a smaller electron affinity (a difference in energy level between the vacuum level and the conduction band minimum) than the oxide semiconductor film 108*b* and has a difference in energy level in the conduction band minimum from the oxide semiconductor film 108*b* (band offset) is used for the oxide semiconductor films 108*a* and 108*c*. Furthermore, to inhibit generation of a difference between threshold voltages due to the value of the drain voltage, it is preferable to form the oxide semiconductor films 108*a* and 108*c* using a material whose energy level of the conduction band minimum is closer to the vacuum level than that of the oxide semiconductor film 108*b*. For example, a difference in energy level between the conduction band minimum of the oxide semiconductor film 108*b* and the conduction band minimum of the oxide semiconductor films 108*a* and 108*c* is preferably 0.2 eV or more and further preferably 0.5 eV or more.

It is preferable that the oxide semiconductor films 108*a* and 108*c* not have a spinel crystal structure. This is because if the oxide semiconductor films 108*a* and 108*c* have a spinel crystal structure, constituent elements of the conductive films 112*a* and 112*b* might be diffused to the oxide semiconductor film 108*b* at the interface between the spinel crystal structure and another region. Note that each of the oxide semiconductor films 108*a* and 108*c* is preferably a CAAC-OS, which will be described later, in which case a higher blocking property against constituent elements of the conductive films 112*a* and 112*b*, for example, copper elements, is obtained.

The thickness of each of the oxide semiconductor films 108*a* and 108*c* is greater than or equal to a thickness that is capable of inhibiting diffusion of the constituent elements of the conductive films 112*a* and 112*b* to the oxide semiconductor film 108*b*, and less than a thickness that inhibits supply of oxygen from the insulating film 114 to the oxide semiconductor film 108*b*. For example, when the thickness of each of the oxide semiconductor films 108*a* and 108*c* is greater than or equal to 10 nm, diffusion of the constituent elements of the conductive films 112*a* and 112*b* to the oxide semiconductor film 108*b* can be inhibited. When the thickness of each of the oxide semiconductor films 108*a* and 108*c* is less than or equal to 100 nm, oxygen can be effectively supplied from the insulating film 114 to the oxide semiconductor film 108*b*.

When the oxide semiconductor films 108*a* and 108*c* are each an In-M-Zn oxide in which the atomic proportion of M (M is Al, Ga, Y, or Sn) is higher than that of In, the energy gap of each of the oxide semiconductor films 108*a* and 108*c* can be large and the electron affinity thereof can be small. Therefore, a difference in electron affinity between the oxide semiconductor film 108*b* and each of the oxide semiconductor films 108*a* and 108*c* may be controlled by the proportion of the element M. Furthermore, an oxygen vacancy is less likely to be generated in the oxide semiconductor layer in which the atomic proportion of M is higher than that of In because M is a metal element that is strongly bonded to oxygen.

When an In-M-Zn oxide is used for the oxide semiconductor films 108*a* and 108*c*, the proportions of In and M, not taking Zn and O into consideration, are as follows: the atomic percentage of In is preferably less than 50 atomic % and the atomic percentage of M is greater than 50 atomic % and further preferably the atomic percentage of In is less than 25 atomic % and the atomic percentage of M is greater than 75 atomic %. Alternatively, a gallium oxide film may be used as each of the oxide semiconductor films 108a and 108c.

Furthermore, in the case where each of the oxide semiconductor films 108a, 108b, and 108c is an In-M-Zn oxide, the proportion of M atoms in each of the oxide semiconductor films 108a and 108c is higher than that in the oxide semiconductor film 108b. Typically, the proportion of M atoms in each of the oxide semiconductor films 108a and 108c is 1.5 or more times, preferably twice or more times, and further preferably three or more times as high as that in the oxide semiconductor film 108b.

Furthermore, in the case where the oxide semiconductor films 108a, 108b, and 108c are each an In-M-Zn oxide, when the oxide semiconductor film 108b has an atomic ratio of In:M:Zn=$x_1$:$y_1$:$z_1$ and the oxide semiconductor films 108a and 108c each have an atomic ratio of In:M:Zn=$x_2$:$y_2$:$z_2$, $y_2/x_2$ is larger than $y_1/x_1$, preferably $y_2/x_2$ is 1.5 or more times as large as $y_1/x_1$, further preferably, $y_2/x_2$ is two or more times as large as $y_1/x_1$, or still further preferably $y_2/x_2$ is three or more times or four or more times as large as $y_1/x_1$. In this case, it is preferable that in the oxide semiconductor film 108b, $y_1$ be higher than or equal to $x_1$ because a transistor including the oxide semiconductor film 108b can have stable electric characteristics. However, when $y_1$ is three or more times as large as $x_1$, the field-effect mobility of the transistor including the oxide semiconductor film 108b is reduced. Accordingly, $y_1$ is preferably smaller than three times $x_1$.

In the case where the oxide semiconductor film 108b is an In-M-Zn oxide and a target having the atomic ratio of metal elements of In:M:Zn=$x_1$:$y_1$:$z_1$ is used for depositing the oxide semiconductor film 108b, $x_1/y_1$ is preferably greater than or equal to ⅓ and less than or equal to 6, and further preferably greater than or equal to 1 and less than or equal to 6, and $z_1/y_1$ is preferably greater than or equal to ⅓ and less than or equal to 6, and further preferably greater than or equal to 1 and less than or equal to 6. Note that when $z_1/y_1$ is greater than or equal to 1 and less than or equal to 6, a CAAC-OS to be described later is easily formed as the oxide semiconductor film 108b. Typical examples of the atomic ratio of the metal elements of the target include In:M:Zn=4:2:4.1, In:M:Zn=1:1:1.2, and In:M:Zn=3:1:2.

In the case where the oxide semiconductor films 108a and 108c are each an In-M-Zn oxide and a target having an atomic ratio of metal elements of In:M:Zn=$x_2$:$y_2$:$z_2$ is used for depositing the oxide semiconductor films 108a and 108c, $x_2/y_2$ is preferably less than $x_1/y_1$, and $z_2/y_2$ is preferably greater than or equal to ⅓ and less than or equal to 6, and further preferably greater than or equal to 1 and less than or equal to 6. When the atomic proportion of M is higher than that of indium, the energy gap of the oxide semiconductor films 108a and 108c can be large and the electron affinity thereof can be small; therefore, $y_2/x_2$ is preferably higher than or equal to 3 or higher than or equal to 4. Typical examples of the atomic ratio of the metal elements of the target include In:M:Zn=1:3:2, In:M:Zn=1:3:4, In:M:Zn=1:3:5, InM:Zn=1:3:6, In:M:Zn=1:4:2, In:M:Zn=1:4:4, In:M:Zn=1:4:5, and In:M:Zn=1:5:5.

Furthermore, in the case where the oxide semiconductor films 108a and 108c are each an In-M oxide, when a divalent metal element (e.g., zinc) is not included as M, the oxide semiconductor films 108a and 108c which do not include a spinel crystal structure can be formed. As each of the oxide semiconductor films 108a and 108c, for example, an In—Ga oxide film can be used. The In—Ga film oxide can be formed by a sputtering method using an In—Ga metal oxide target (In:Ga=7:93), for example. To deposit the oxide semiconductor films 108a and 108c by a sputtering method using DC discharge, on the assumption that an atomic ratio of In:M is x:y, it is preferable that y/(x+y) be less than or equal to 0.96, and further preferably less than or equal to 0.95, for example, 0.93.

In each of the oxide semiconductor films 108a, 108b, and 108c, the proportions of the atoms in the above atomic proportion vary within a range of ±40% as an error.

The oxide semiconductor film 108 of the transistor Tr1 has a stacked-layer structure of two layers and a stacked-layer structure of three layers in FIGS. 6A and 6B, and the oxide semiconductor film 128 of the transistor Tr2 may have a similar structure.

As described above, in the semiconductor device of the present invention, the presence of the second gate electrode or the stacked-layer structures of the oxide semiconductor films can be changed. The structures of the transistors of this embodiment can be freely combined with each other.

1-8. Method for Manufacturing Semiconductor Device

Next, a method for manufacturing the semiconductor device 100 of one embodiment of the present invention is described with reference to FIGS. 8A and 8B to FIGS. 17A and 17B.

Note that FIGS. 8A, 9A, 10A, 11A, 12A, 13A, 14A, 15A, 16A, and 17A are top views illustrating the manufacturing method of the semiconductor device 100 and FIGS. 8B, 9B, 10B, 11B, 12B, 13B, 14B, 15B, 16B, and 17B are cross-sectional views illustrating the manufacturing method of the semiconductor device 100.

First, a conductive film is formed over the substrate 102 and processed through a lithography process and an etching process, whereby the conductive film 104 functioning as a first gate electrode is formed. Then, the insulating film 106 which functions as a first gate insulating film is formed over the conductive film 104 (see FIGS. 8A and 8B).

In this embodiment, a glass substrate is used as the substrate 102, and as the conductive film 104 functioning as a first gate electrode, a 100-nm-thick tungsten film is formed by a sputtering method. As the insulating film 106, a 400-nm-thick silicon nitride film and a 50-nm-thick silicon oxynitride film are formed by a PECVD method.

Note that the insulating film 106 can have a stacked-layer structure of silicon nitride films. Specifically, the silicon nitride film can have a three-layer structure of a first silicon nitride film, a second silicon nitride film, and a third silicon nitride film. An example of the three-layer structure is as follows.

For example, the first silicon nitride film can be formed to have a thickness of 50 nm under the conditions where silane at a flow rate of 200 sccm, nitrogen at a flow rate of 2000 sccm, and an ammonia gas at a flow rate of 100 sccm are supplied as a source gas to a reaction chamber of a PECVD apparatus, the pressure in the reaction chamber is controlled to 100 Pa, and the power of 2000 W is supplied using a 27.12 MHz high-frequency power source.

The second silicon nitride film can be formed to have a thickness of 300 nm under the conditions where silane at a flow rate of 200 sccm, nitrogen at a flow rate of 2000 sccm, and an ammonia gas at a flow rate of 2000 sccm are supplied as a source gas to the reaction chamber of the PECVD apparatus, the pressure in the reaction chamber is controlled to 100 Pa, and the power of 2000 W is supplied using a 27.12 MHz high-frequency power source.

The third silicon nitride film can be formed to have a thickness of 50 nm under the conditions where silane at a flow rate of 200 sccm and nitrogen at a flow rate of 5000 sccm are supplied as a source gas to the reaction chamber of the PECVD apparatus, the pressure in the reaction chamber is controlled to 100 Pa, and the power of 2000 W is supplied using a 27.12 MHz high-frequency power source.

Note that the first silicon nitride film, the second silicon nitride film, and the third silicon nitride film can each be formed at a substrate temperature of 350° C. or lower.

When the insulating film 106 has the three-layer structure of silicon nitride films, for example, in the case where a conductive film including Cu is used as the conductive film 104, the following effect can be obtained.

The first silicon nitride film can inhibit diffusion of a copper (Cu) element from the conductive film 104. The second silicon nitride film has a function of releasing hydrogen and can improve withstand voltage of the insulating film functioning as a gate insulating film. The third silicon nitride film releases a small amount of hydrogen and can inhibit diffusion of hydrogen released from the second silicon nitride film.

Figure 9A:
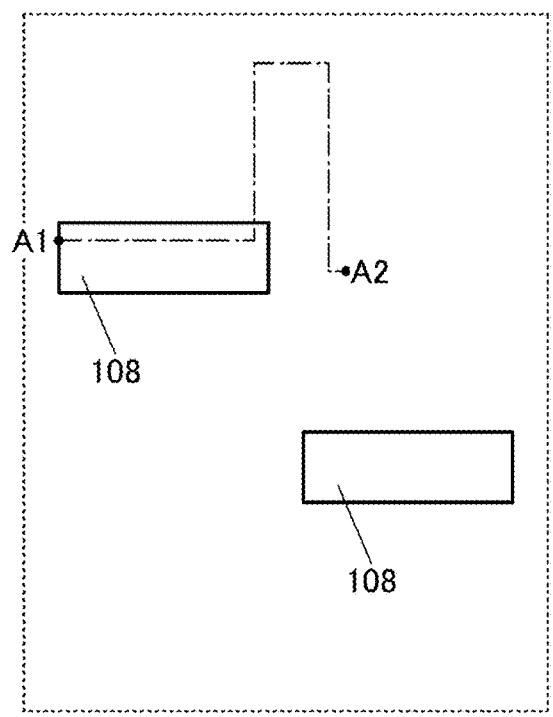
FIGS. 9A and 9B are a top view and a cross-sectional view illustrating a method for manufacturing a semiconductor device.
Figure 9B:
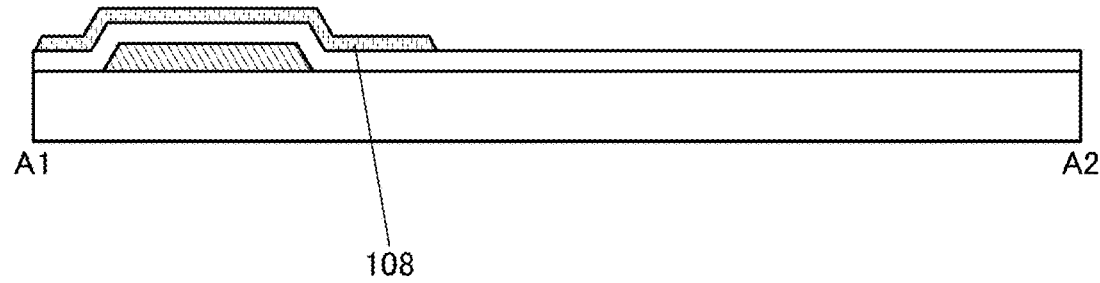
Figure 10A:
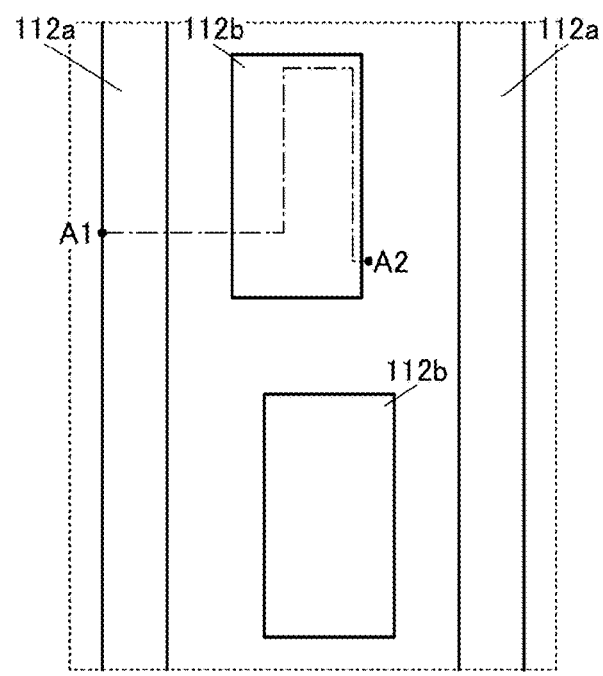
FIGS. 10A and 10B are a top view and a cross-sectional view illustrating a method for manufacturing a semiconductor device.
Figure 10B:
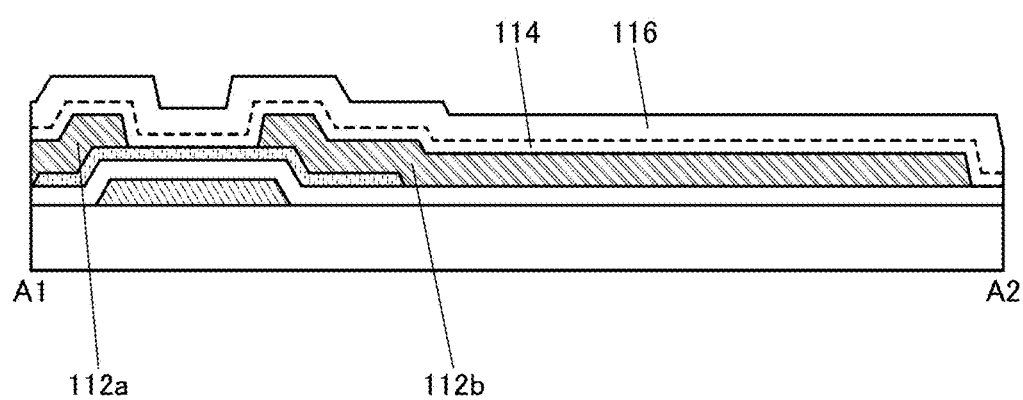

Next, the oxide semiconductor film 108 is formed over the insulating film 106 (see FIGS. 9A and 9B).

In this embodiment, an oxide semiconductor film is formed by a sputtering method using an In—Ga—Zn metal oxide target (In:Ga:Zn=4:2:4.1 [atomic ratio]). The substrate temperature at the time when the oxide semiconductor film is formed is 170° C. For the deposition gas for forming the oxide semiconductor film, an oxygen gas at a flow rate of 60 sccm and an argon gas at a flow rate of 140 sccm are used. Then, the oxide semiconductor film is processed into a desired shape, whereby the island-shaped oxide semiconductor film 108 is formed. Note that a wet-etching apparatus is used to form the oxide semiconductor film.

Next, a conductive film is formed over the insulating film 106 and the oxide semiconductor film 108 and processed into a desired shape, whereby the conductive films 112a and 112b are formed. Then, the insulating films 114 and 116 are formed over the insulating film 106, the oxide semiconductor film 108, and the conductive films 112a and 112b (see FIGS. 10A and 10B).

In this embodiment, as each of the conductive films 112a and 112b, a stacked film in which a 100-nm-thick aluminum film and a 50-nm-thick titanium film are sequentially stacked is formed by a sputtering method.

After the conductive films 112a and 112b are formed, a surface of the oxide semiconductor film 108 (on the back channel side) may be cleaned. The cleaning may be performed, for example, using an etchant such as a phosphoric acid solution. The cleaning can remove impurities (e.g., an element included in the conductive films 112a and 112b) attached to the surface of the oxide semiconductor film 108. Note that the cleaning is not necessarily performed, and thus the cleaning may be unnecessary.

In the step of forming the conductive films 112a and 112b and/or the cleaning step, the thickness of a region of the oxide semiconductor film 108 which is not covered by the conductive films 112a and 112b might be reduced.

In this embodiment, a 20-nm-thick silicon oxynitride film and a 200-nm-thick silicon oxynitride film are formed as the insulating film 114 and the insulating film 116, respectively, by a PECVD method.

Note that after the insulating film 114 is formed, the insulating film 116 is preferably formed successively without exposure to the air. After the insulating film 114 is formed, the insulating film 116 is formed in succession without exposure to the air while at least one of the flow rate of a source gas, pressure, a high-frequency power, and a substrate temperature is adjusted, whereby the concentration of impurities attributed to the atmospheric component at the interface between the insulating film 114 and the insulating film 116 can be reduced and oxygen in the insulating films 114 and 116 can be moved to the oxide semiconductor film 108; accordingly, the amount of oxygen vacancies in the oxide semiconductor film 108 can be reduced.

In this embodiment, a silicon oxynitride film is formed as the insulating film 114 by a PECVD method under the conditions where the substrate 102 is held at a temperature of 220° C., silane at a flow rate of 50 sccm and dinitrogen monoxide at a flow rate of 2000 sccm are used as a source gas, the pressure in the treatment chamber is 20 Pa, and a high-frequency power of 100 W at 13.56 MHz ($1.6 \times 10^{-2}$ W/cm$^2$ as the power density) is supplied to parallel-plate electrodes.

As the insulating film 116, a silicon oxide film or a silicon oxynitride film is formed under the following conditions: the substrate placed in the treatment chamber of the PECVD apparatus that is vacuum-evacuated is held at a temperature of higher than or equal to 180° C. and lower than or equal to 350° C., the pressure in the treatment chamber is higher than or equal to 100 Pa and lower than or equal to 250 Pa, preferably higher than or equal to 100 Pa and lower than or equal to 200 Pa, with introduction of a source gas into the treatment chamber, and a high-frequency power of greater than or equal to 0.17 W/cm$^2$ and less than or equal to 0.5 W/cm$^2$, preferably greater than or equal to 0.25 W/cm$^2$ and less than or equal to 0.35 W/cm$^2$ is supplied to an electrode provided in the treatment chamber.

As the deposition conditions of the insulating film 116, the high-frequency power having the above power density is supplied to the reaction chamber having the above pressure, whereby the degradation efficiency of the source gas in plasma is increased, oxygen radicals are increased, and oxidation of the source gas is promoted; thus, the oxygen content in the insulating film 116 becomes higher than that in the stoichiometric composition. In the film formed at a substrate temperature within the above temperature range, the bond between silicon and oxygen is weak, and accordingly, part of oxygen in the film is released by heat treatment in a later step. Thus, it is possible to form an oxide insulating film which contains more oxygen than that in the stoichiometric composition and from which part of oxygen is released by heating.

Note that the insulating film 114 functions as a protective film for the oxide semiconductor film 108 in the step of forming the insulating film 116. Therefore, the insulating film 116 can be formed using the high-frequency power having a high power density while damage to the oxide semiconductor film 108 is reduced.

Note that in the deposition conditions of the insulating film 116, when the flow rate of the deposition gas containing silicon with respect to the oxidizing gas is increased, the amount of defects in the insulating film 116 can be reduced. Typically, it is possible to form an oxide insulating film in which the amount of defects is small, i.e. the spin density of a signal which appears at g=2.001 due to a dangling bond of silicon, is lower than $6 \times 10^{17}$ spins/cm$^3$, preferably lower than or equal to $3 \times 10^{17}$ spins/cm$^3$, further preferably lower than or equal to $1.5 \times 10^{17}$ spins/cm$^3$ by ESR measurement. As a result, the reliability of the transistor Tr1 can be improved.

Heat treatment (hereinafter referred to as first heat treatment) is preferably performed after the insulating films 114 and 116 are formed. The first heat treatment can reduce nitrogen oxide included in the insulating films 114 and 116. By the first heat treatment, part of oxygen contained in the insulating films 114 and 116 can be transferred to the oxide semiconductor film 108, so that the amount of oxygen vacancies included in the oxide semiconductor film 108 can be reduced.

The temperature of the first heat treatment is typically lower than 400° C., preferably lower than 375° C., further preferably higher than or equal to 150° C. and lower than or equal to 350° C. The second heat treatment may be performed in an atmosphere of nitrogen, oxygen, ultra-dry air (air with a water content of less than or equal to 20 ppm, preferably less than or equal to 1 ppm, further preferably less than or equal to 10 ppb), or a rare gas (e.g., argon, helium). Note that it is preferable that hydrogen, water, and the like be not contained in the nitrogen, oxygen, ultra-dry air, or rare gas. An electric furnace, rapid thermal anneal (RTA), or the like can be used for the heat treatment.

Figure 11A:
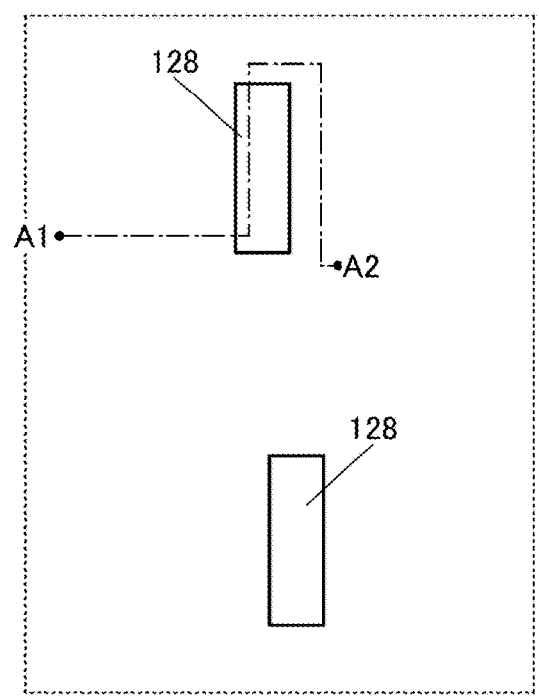
FIGS. 11A and 11B are a top view and a cross-sectional view illustrating a method for manufacturing a semiconductor device.
Figure 11B:
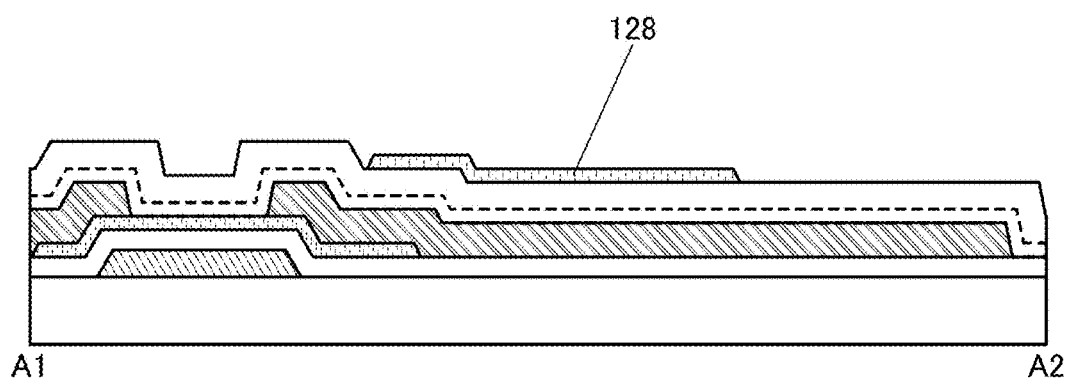
Figure 12A:
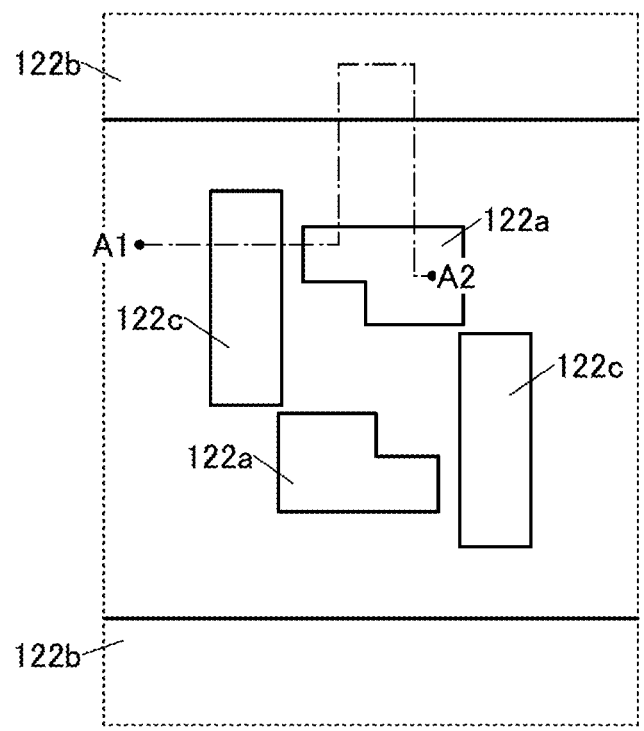
FIGS. 12A and 12B are a top view and a cross-sectional view illustrating a method for manufacturing a semiconductor device.
Figure 12B:
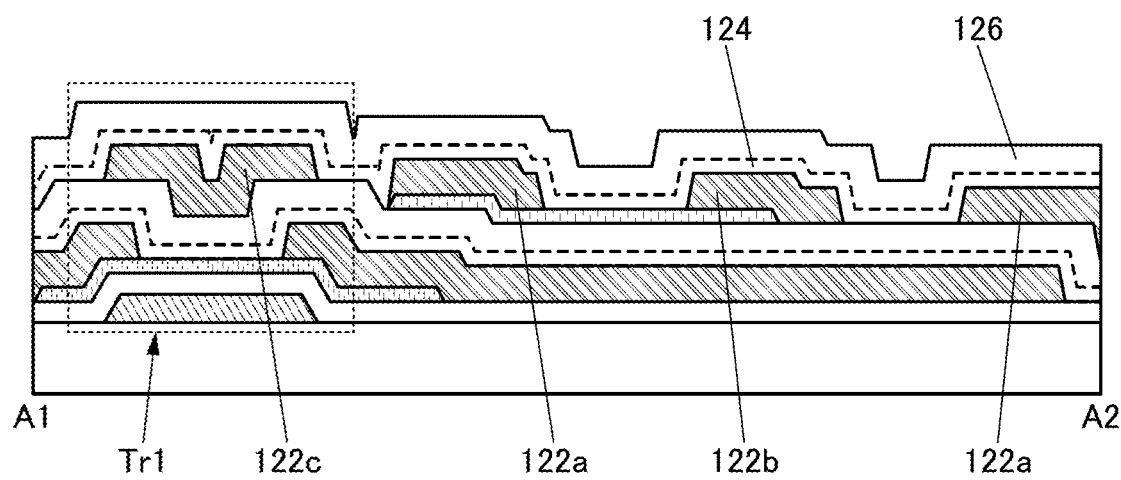
Figure 13A:
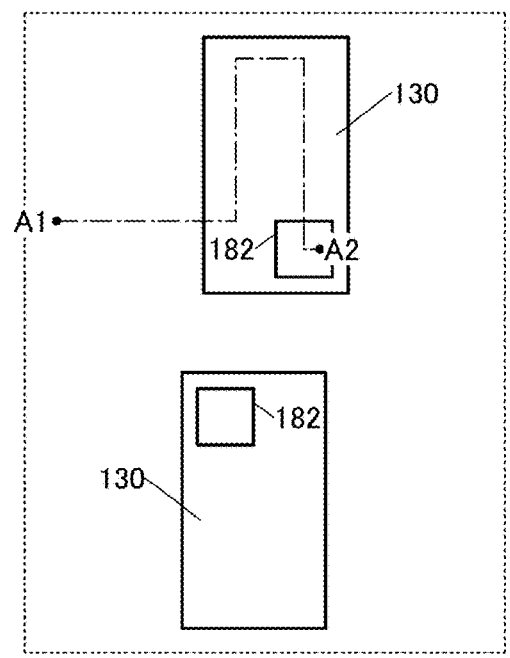
FIGS. 13A and 13B are a top view and a cross-sectional view illustrating a method for manufacturing a semiconductor device.
Figure 13B:
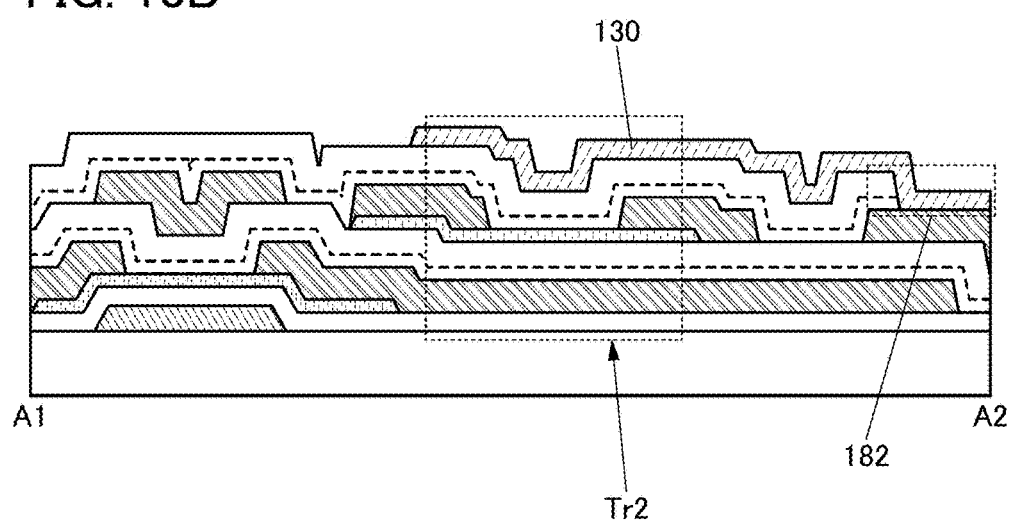
Figure 14A:
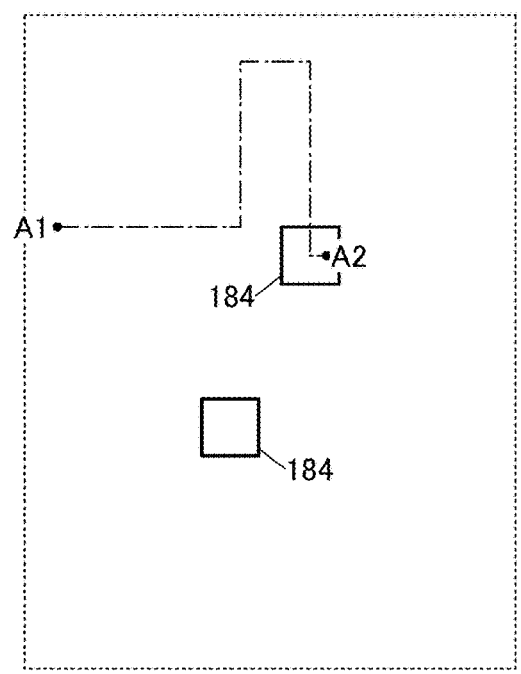
FIGS. 14A and 14B are a top view and a cross-sectional view illustrating a method for manufacturing a semiconductor device.
Figure 14B:
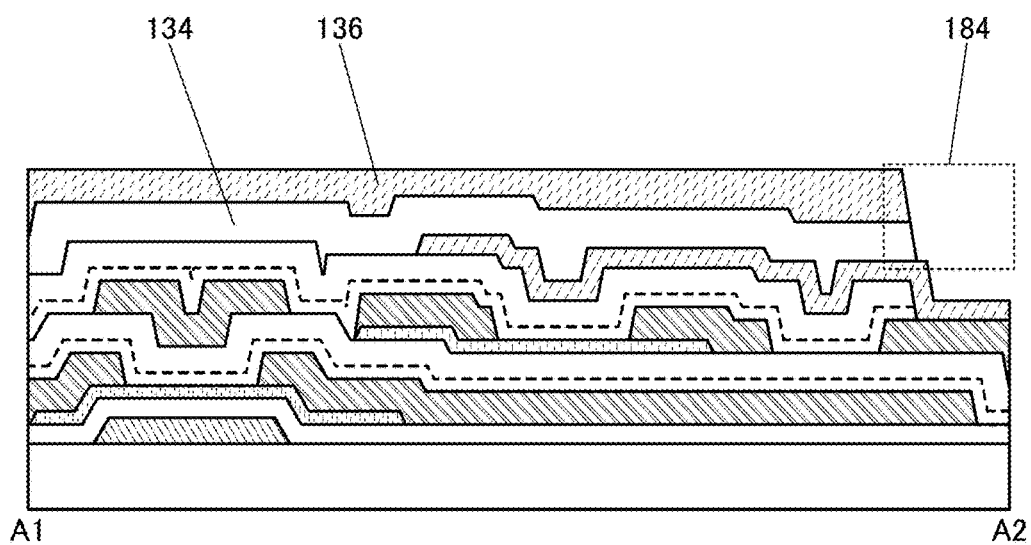

Next, the oxide semiconductor film 128 is formed over the insulating film 116 (see FIGS. 11A and 11B).

In this embodiment, an oxide semiconductor film is formed by a sputtering method using an In—Ga—Zn metal oxide target (In:Ga:Zn=4:2:4.1 [atomic ratio]). The substrate temperature at the time when the oxide semiconductor film is formed is 170° C. For the deposition gas for forming the oxide semiconductor film, an oxygen gas at a flow rate of 60 sccm and an argon gas at a flow rate of 140 sccm are used. Then, the oxide semiconductor film is processed into a desired shape, whereby the island-shaped oxide semiconductor film 108 is formed. Note that a wet-etching apparatus is used to form the oxide semiconductor film.

Next, the conductive films 122a, 122b, and 122c are formed over the insulating film 116 and the oxide semiconductor film 128. Then, the insulating films 124 and 126 are formed over the insulating film 116, the oxide semiconductor film 128, and the conductive films 122a, 122b, and 122c (see FIGS. 12A and 12B).

The conductive films 122a, 122b, and 122c can be formed in a manner similar to that of the conductive films 112a and 112b. The insulating films 124 and 126 can be formed in a manner similar to that of the insulating films 114 and 116.

Next, the opening 182 reaching the conductive film 122a is formed in a desired region of the insulating films 124 and 126. Then, the conductive film 130 is formed over the insulating film 126 and the conductive film 122a (see FIGS. 13A and 13B).

The opening 182 can be formed with a dry-etching apparatus or a wet-etching apparatus. A 100-nm-thick ITSO film is formed using a target of an oxide containing indium, tin, and silicon (also referred to as ITSO) ($In_2O_3$:$SnO_2$:$SiO_2$=85:10:5 [weight %]) and is processed into an island shape, whereby the conductive film 130 is obtained.

Next, a stacked film of insulating films to be the insulating films 134 and 136 is formed over the insulating film 126 and the conductive film 130. Then, the opening 184 reaching the conductive film 130 is formed in a desired region of the stacked film (see FIGS. 14A and 14B).

As the insulating film 134, a 200-nm-thick silicon oxynitride film is formed by a PECVD method. As the insulating film 136, a 1.5-μm-thick acrylic-based photosensitive organic resin film is formed.

The opening 184 is formed with a dry-etching apparatus or a wet-etching apparatus.

Figure 15A:
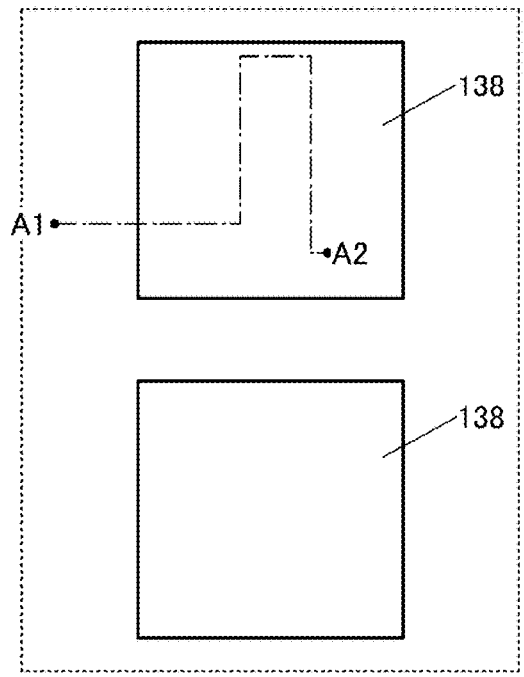
FIGS. 15A and 15B are a top view and a cross-sectional view illustrating a method for manufacturing a semiconductor device.
Figure 15B:
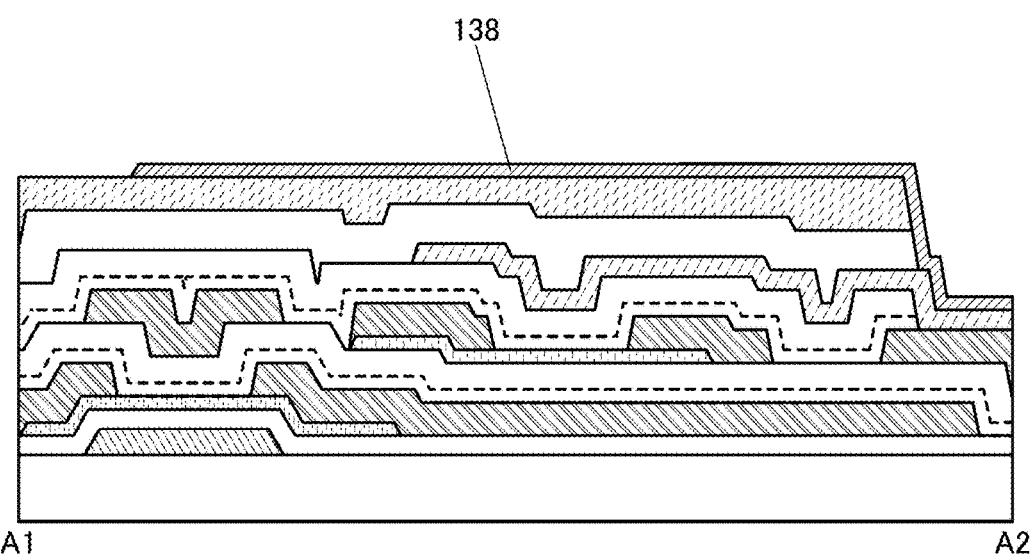

Next, a conductive film is formed over the insulating film 136 and the conductive film 130 and is processed into an island shape, whereby the conductive film 138 is formed (see FIGS. 15A and 15B).

For the conductive film 138 in this embodiment, a stacked film of a 10-nm-thick ITSO film, a 200-nm-thick reflective metal film (a metal film containing silver, palladium, and copper is used here), and a 10-nm-thick ITSO film is used. The stacked film is processed into the conductive film 138 with a wet-etching apparatus.

Figure 16A:
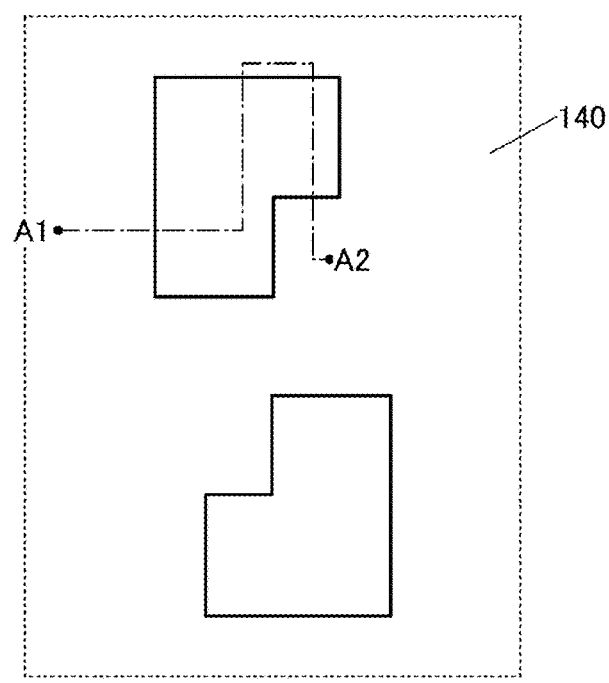
FIGS. 16A and 16B are a top view and a cross-sectional view illustrating a method for manufacturing a semiconductor device.
Figure 16B:
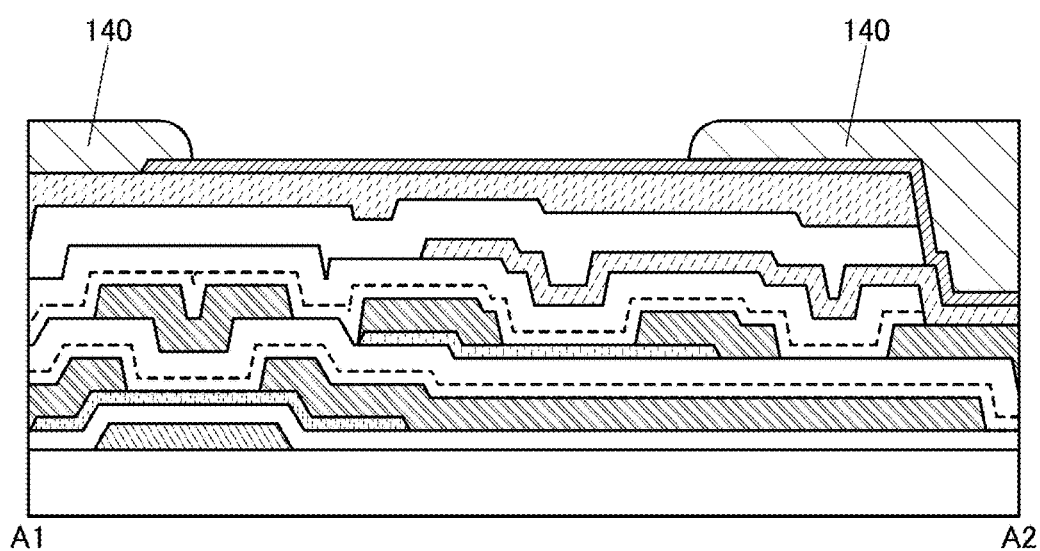

Next, the island-shaped insulating film 140 is formed over the insulating film 136 and the conductive film 138 (see FIGS. 16A and 16B).

As the insulating film 140, a 1.5-μm-thick polyimide-based photosensitive organic resin film is used.

Figure 17A:
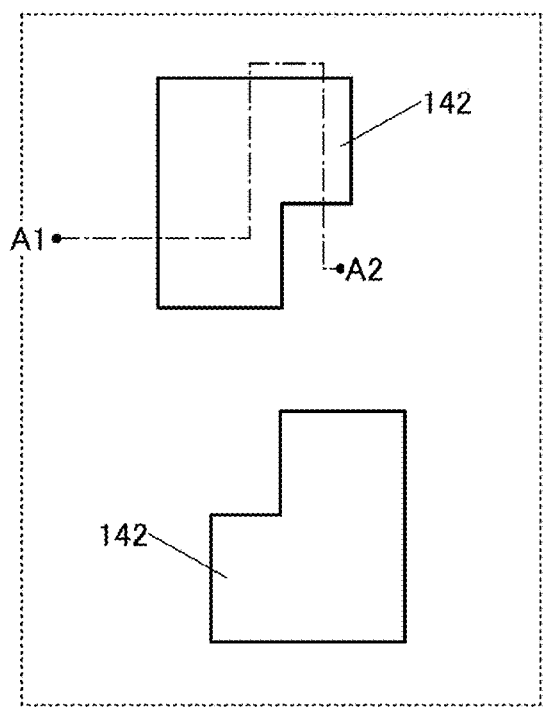
FIGS. 17A and 17B are a top view and a cross-sectional view illustrating a method for manufacturing a semiconductor device.
Figure 17B:
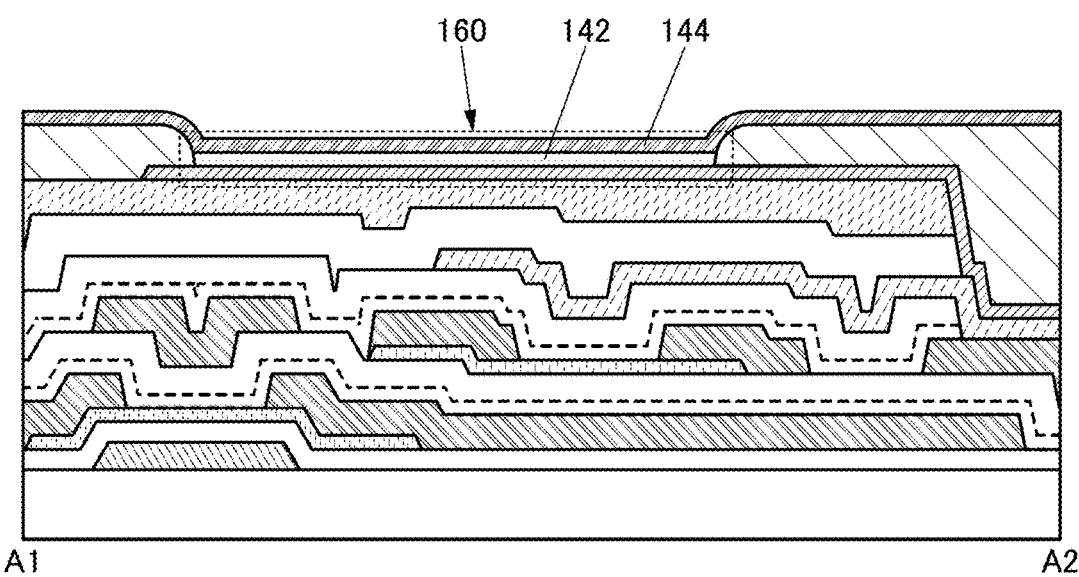

Next, the EL layer 142 is formed over the conductive film 138, and then, the conductive film 144 is formed over the insulating film 140 and the EL layer 142, whereby the light-emitting element 160 is obtained (see FIGS. 17A and 17B).

Note that a method for manufacturing the light-emitting element 160 is described in Embodiment 3.

Through the above manufacturing steps, the semiconductor device 100 shown in FIGS. 1A and 1B can be manufactured.

Note that the structure and method described in this embodiment can be used in appropriate combination with the structure and method described in any of the other embodiments.

Embodiment 2

Figure 18A:
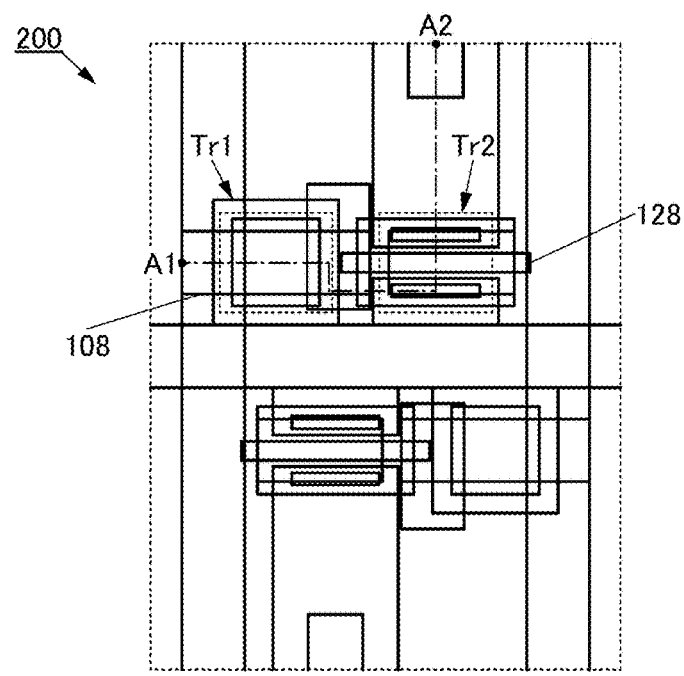
FIGS. 18A and 18B are a top view and a cross-sectional view illustrating a semiconductor device.
Figure 18B:
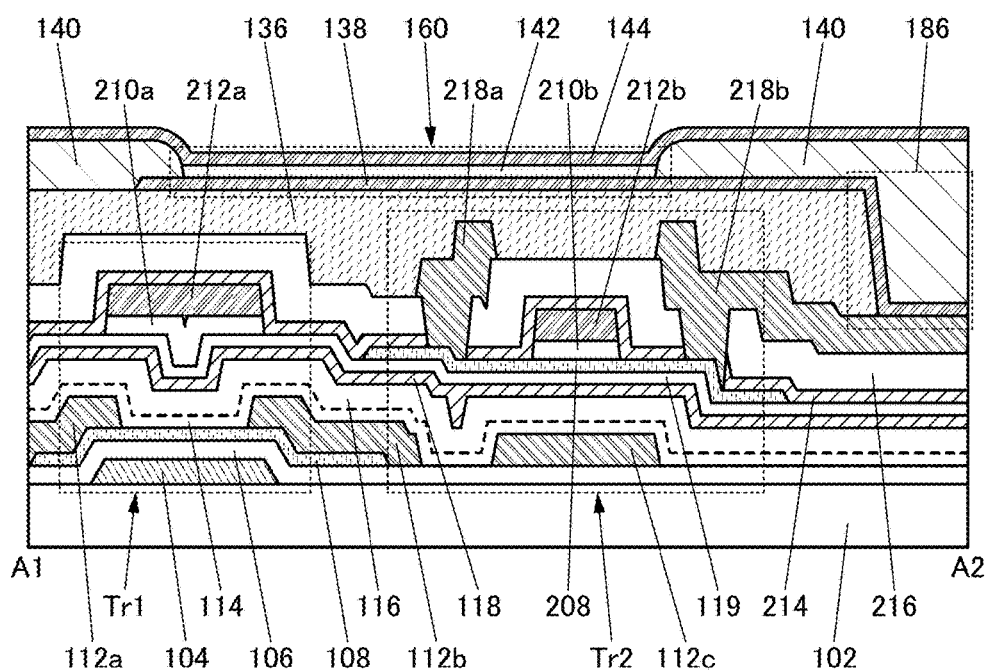
Figure 19A:
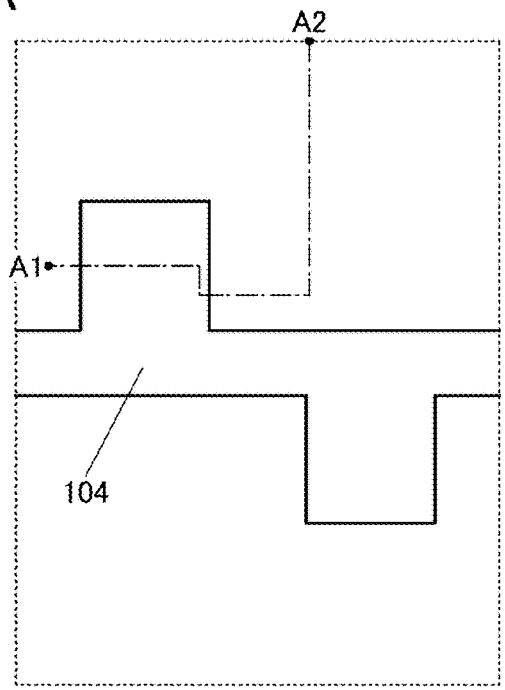
FIGS. 19A and 19B are a top view and a cross-sectional view illustrating a method for manufacturing a semiconductor device.
Figure 19B:
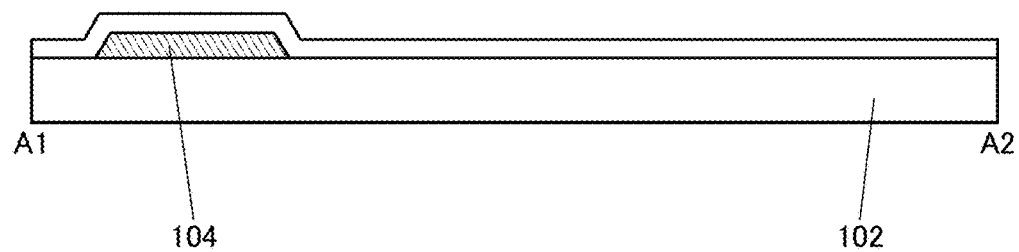

In this embodiment, a semiconductor device a method of manufacturing the semiconductor device of one embodiment of the present invention are described with reference to FIGS. 18A and 18B to FIGS. 29A and 29B 2-1. Structure Example 1 of Semiconductor Device FIG. 18A is a top view of a semiconductor device 200 of one embodiment of the present invention. FIG. 18B is a cross-sectional view taken along dashed dotted line A1-A2 in FIG. 18A. Note that cross sections in a channel length (L) direction of the transistor Tr1 and in a channel length (L) direction of the transistor Tr2 are included in FIG. 18B.

The semiconductor device 100 illustrated in FIGS. 18A and 18B includes the transistor Tr1 and the transistor Tr2 which overlaps at least partly with the transistor Tr1. Note that the transistor Tr1 and the transistor Tr2 are a bottom-gate transistor and a top-gate transistor, respectively.

Since the transistor Tr1 overlaps at least partly with the transistor Tr2, the transistor area can be reduced.

The transistor Tr1 includes the conductive film 104 over the substrate 102, the insulating film 106 over the substrate 102 and the conductive film 104, the oxide semiconductor film 108 over the insulating film 106, the conductive film 112a over the oxide semiconductor film 108, the conductive film 112b over the oxide semiconductor film 108, the insulating film 114 over the oxide semiconductor film 108, the conductive film 112a, and the conductive film 112b, the insulating film 116 over the insulating film 114, an insulating film 118 over the insulating film 116, an insulating film 119 over the insulating film 118, an insulating film 210a over the insulating film 119, and a conductive film 212a over the insulating film 210a.

The transistor Tr2 includes a conductive film 112c, the insulating film 114 over the conductive film 112c, the insulating film 116 over the insulating film 114, the insulating film 118 over the insulating film 116, the insulating film 119 over the insulating film 118, the oxide semiconductor film 208 over the insulating film 119, an insulating film 210b over the oxide semiconductor film 208, a conductive film 212b over the insulating film 210b, the insulating film 214 over the oxide semiconductor film 208 and the conductive film 212b, an insulating film 216 over the insulating film 214, a conductive film 218a electrically connected to the oxide semiconductor film 208 and over the insulating film 216, and a conductive film 218b electrically connected to the oxide semiconductor film 208 and over the insulating film 216.

Note that the oxide semiconductor film 108 and the oxide semiconductor film 208 partly overlap with each other as shown in FIGS. 18A and 18B.

The oxide semiconductor film 108 can have a structure similar to that described in Embodiment 1. The oxide semiconductor film 208 can have a structure similar to that of the oxide semiconductor film 128 described in Embodiment 1.

Specifically, one or both of the field-effect mobilities of the transistor Tr1 and the transistor Tr2 can exceed 10 cm$^2$/Vs, preferably 30 cm$^2$/Vs.

For example, when the transistor with high field-effect mobility is used for a gate driver of a display device that generates a gate signal, the display device can have a narrow frame. When the transistor with high field-effect mobility is used for a source driver (specifically, a demultiplexer connected to an output terminal of a shift register included in the source driver) that supplies a signal from a signal line included in a display device, the number of wirings connected to the display device can be reduced. In addition, when the transistor with high field-effect mobility is used as one or both of a selection transistor and a driver transistor of a pixel circuit included in the display device, the display quality of the display device can be increased.

The semiconductor device 100 shown in FIGS. 1A and 1B can be favorably used for a pixel circuit of a display device. The layout shown in FIGS. 1A and 1B can increase the pixel density of the display device. For example, even when the pixel density of a display device exceeds 1000 ppi or 2000 ppi, the aperture ratio of pixels can be increased owing to the structure shown in FIGS. 1A and 1B.

Note that when the semiconductor device 100 shown in FIGS. 18A and 18B is used in a pixel circuit of a display device, a structure similar to the pixel circuit shown in FIG. 2 can be used.

When the semiconductor device 100 shown in FIGS. 1A and 1B is used for a pixel of a display device, the channel length (L) and the channel width (W) of a transistor, the line widths of a wiring and an electrode connected to the transistor, and the like can be relatively large. The line width and the like can be larger when the transistor Tr1 and the transistor Tr2 overlap with each other at least partly as shown in FIGS. 1A and 1B than those when the transistor Tr1 and the transistor Tr2 are provided on the same plane, for example; thus, variations in processing size can be reduced.

In addition, one or both of a conductive film and an insulating film can be shared by the transistor Tr1 and the transistor Tr2; thus, the number of masks or steps can be reduced.

For example, in the transistor Tr1, the conductive film 104 serves as the first gate electrode, the conductive film 112a serves as the source electrode, the conductive film 112b serves as the drain electrode, and the conductive film 212a serves as the second gate electrode. In addition, in the transistor Tr1, the insulating film 106 serves as a first gate insulating film and the insulating films 114, 116, 118, 119, and 210a serve as second gate insulating films. In the transistor Tr2, the conductive film 112b serves as the first gate electrode, the conductive film 122a serves as the source electrode, the conductive film 218b serves as the drain electrode, and the conductive film 130 serves as the second gate electrode. In addition, in the transistor Tr2, the insulating films 114, 116, 118, and 119 serve as first gate insulating films and the insulating film 210b serves as a second gate insulating film.

Note that in this specification and the like, the insulating film 210a may be referred to as a fourth insulating film, and the insulating film 210b may be referred to as a fifth insulating film.

The insulating film 136 is provided over the insulating film 216 and the conductive films 218a and 218b. An opening 186 is provided in the insulating films 136 so as to reach the conductive film 130. In addition, the conductive film 138 is provided over the insulating film 136. Note that the conductive film 138 is connected to the conductive film 218b in the opening 186.

In addition, the insulating film 140, the EL layer 142, and the conductive film 144 are provided over the conductive film 138. The light-emitting element 160 is composed of the conductive film 138, the EL layer 142, and the conductive film 144.

As described above, one embodiment of the present invention can use a bottom-gate transistor and a top-gate transistor in combination.

Alternatively, each of the transistor Tr1 and the transistor Tr2 shown in FIGS. 18A and 18B may have the S-channel structure described in Embodiment 1, which is not illustrated in a drawing.

The transistor Tr1 and the transistor Tr2 which are included in the semiconductor device 200 in this embodiment can be combined with the transistor Tr1 and the transistor Tr2 which are included in the semiconductor device 100 in Embodiment 1.

As described above, in the semiconductor device of one embodiment of the present invention, a plurality of transistors are stacked to be reduced in the transistor area. In addition, since one or both of an insulating film and a conductive film are shared by the plurality of transistors, the number of masks or steps can be reduced.

2-2. Components of Semiconductor Device

Next, components of the semiconductor device of this embodiment are described in detail.

[Conductive Film]

The conductive films 212a, 212b, 218a, and 218b can be formed using the materials of the conductive films described in Embodiment 1 (the conductive film 104, the conductive film 112a, the conductive film 112b, the conductive film 122a, the conductive film 122b, the conductive film 122c, the conductive film 130, the conductive film 138, and the conductive film 144). In particular, an oxide conductive (OC) is preferably used for the conductive films 212a and 212b because oxygen can be added to the insulating films 210a and 210b.

[Insulating Films]

The insulating films 118, 119, 214, 216, 210a, and 210b can be formed using the materials of the insulating films described in Embodiment 1 (the insulating film 106, the insulating film 114, the insulating film 116, the insulating film 124, the insulating film 126, the insulating film 134, the insulating film 136, and the insulating film 140).

In particular, a silicon nitride film or a silicon nitride oxide film is preferably used as the insulating film 118, in which case entry of impurity into the transistor Tr1 can be prevented. Since the insulating film 119 is in contact with the oxide semiconductor film 208, an oxide insulating film, particularly a silicon oxide film or a silicon oxynitride film is preferably used as the insulating film 119. An oxide insulating film is preferably used as each of the insulating films 210a and 210b. Each of the insulating films 210a and 210b preferably includes a region containing oxygen in excess of that in the stoichiometric composition (oxygen-excess region). A silicon oxide film or a silicon oxynitride film is preferably used as each of the insulating film 210a and 210b.

The insulating film 214 contains one or both of hydrogen and nitrogen. Alternatively, the insulating film 214 contains nitrogen and silicon. The insulating film 214 has a function of blocking oxygen, hydrogen, water, alkali metal, alkaline earth metal, or the like. Since the oxide semiconductor film 208 is in contact with the insulating film 214, one or both of hydrogen and nitrogen in the insulating film 214 is transferred to the oxide semiconductor film 208, so that the oxide semiconductor film 208 is increased in carrier density. Accordingly, a region of the oxide semiconductor film 208 in contact with the insulating film 214 serves as a source region or a drain region.

[Oxide Semiconductor Film]

The oxide semiconductor film 208 can be formed using the materials of the oxide semiconductor films described in Embodiment 1 (the oxide semiconductor film 108 and the oxide semiconductor film 128).

2-3. Method for Manufacturing Semiconductor Device

Next, a method for manufacturing the semiconductor device 200 of one embodiment of the present invention is described with reference to FIGS. 19A and 19B to FIGS. 29A and 29B.

Note that FIGS. 19A, 20A, 21A, 22A, 23A, 24A, 25A, 26A, 27A, 28A, and 29A are top views illustrating the manufacturing method of the semiconductor device 200 and FIGS. 19B, 20B, 21B, 22B, 23B, 24B, 25B, 26B, 27B, 28B, and 29B are cross-sectional views illustrating the manufacturing method of the semiconductor device 200.

First, a conductive film is formed over the substrate 102 and processed by a lithography process and an etching process, whereby the conductive film 104 that functions as the first gate electrode is formed. Then, the insulating film 106 which functions as a first gate insulating film is formed over the conductive film 104 (see FIGS. 19A and 19B).

In this embodiment, a glass substrate and a 100-nm-thick tungsten film formed by a sputtering method are used as the substrate 102 and the conductive film 104 functioning as a first gate electrode, respectively. As the insulating film 106, a 400-nm-thick silicon nitride film and a 50-nm-thick silicon oxynitride film are formed by a PECVD method.

Figure 20A:
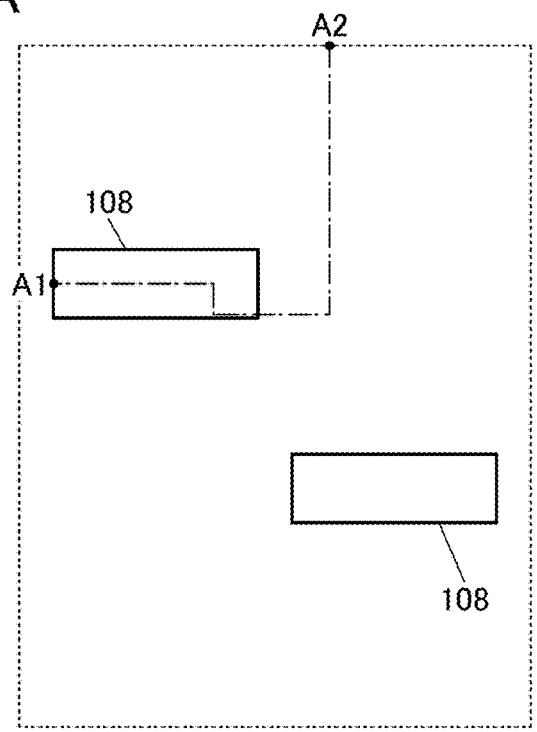
FIGS. 20A and 20B are a top view and a cross-sectional view illustrating a method for manufacturing a semiconductor device.
Figure 20B:
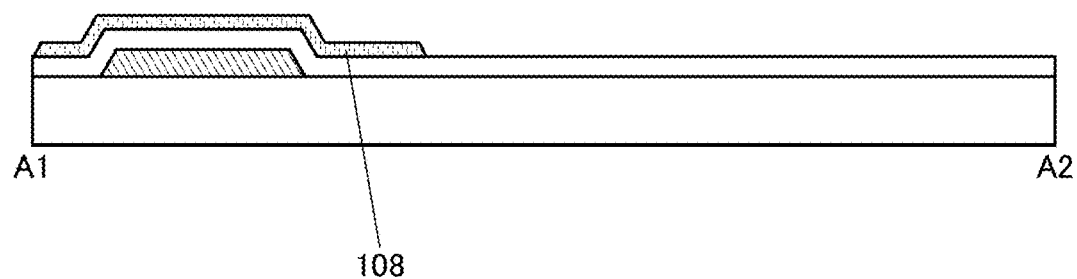
Figure 21A:
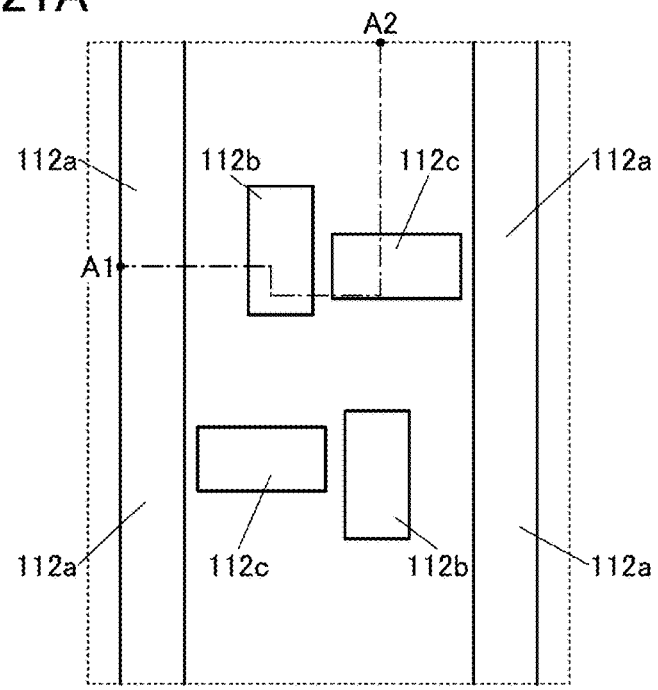
FIGS. 21A and 21B are a top view and a cross-sectional view illustrating a method for manufacturing a semiconductor device.
Figure 21B:
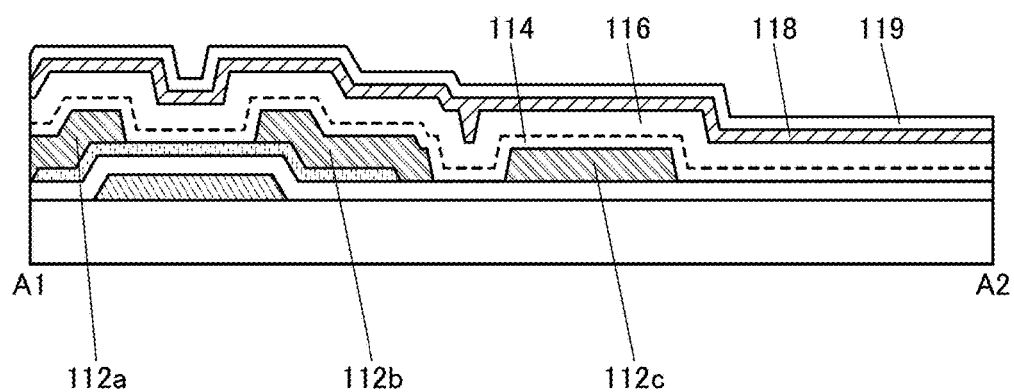

Then, the oxide semiconductor film 108 is formed over the insulating film 106 (see FIGS. 20A and 20B).

In this embodiment, an oxide semiconductor film is formed by a sputtering method using an In—Ga—Zn metal oxide target (In:Ga:Zn=4:2:4.1 [atomic ratio]). The substrate temperature at the time when the oxide semiconductor film is formed is 170° C. For the deposition gas for forming the oxide semiconductor film, an oxygen gas at a flow rate of 60 sccm and an argon gas at a flow rate of 140 sccm are used. Then, the oxide semiconductor film is processed into a desired shape, whereby the island-shaped oxide semiconductor film 108 is formed. Note that a wet-etching apparatus is used to form the oxide semiconductor film.

Next, a conductive film is formed over the insulating film 106 and the oxide semiconductor film 108 and processed into a desired shape, whereby the conductive films 112a and 112b are formed. Then, the insulating films 114, 116, 118, and 119 are formed over the insulating film 106, the oxide semiconductor film 108, and the conductive films 112a, 112b, and 112c (see FIGS. 21A and 21B).

In this embodiment, as each of the conductive films 112a, 112b, and 112c, a stacked film in which a 100-nm-thick aluminum film and a 50-nm-thick titanium film are sequentially stacked is formed by a sputtering method.

In this embodiment, a 20-nm-thick silicon oxynitride film, a 200-nm-thick silicon oxynitride film, a 100-nm-thick silicon nitride oxide film, and a 50-nm-thick silicon oxynitride film are formed as the insulating film 114, the insulating film 116, the insulating film 118, and the insulating film 119, respectively, by a PECVD method.

The first heat treatment is preferably performed after the insulating films 114, 116, 118, and 119 are formed. By the first heat treatment, part of oxygen contained in the insulating films 114 and 116 can be moved to the oxide semiconductor film 108, so that the amount of oxygen vacancies included in the oxide semiconductor film 108 can be reduced.

Figure 22A:
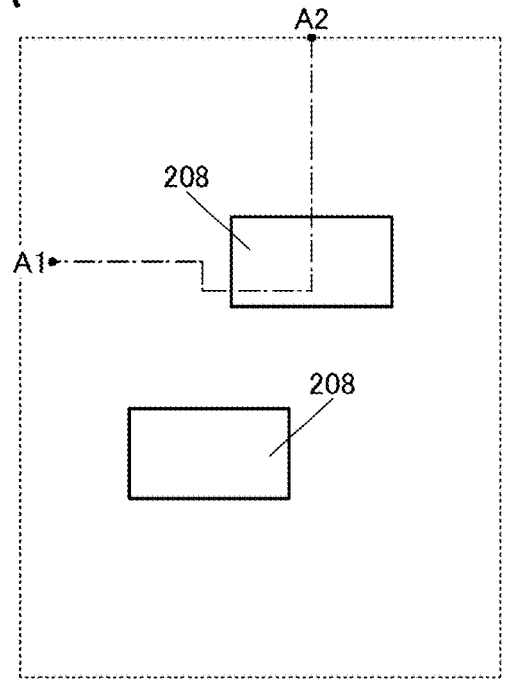
FIGS. 22A and 22B are a top view and a cross-sectional view illustrating a method for manufacturing a semiconductor device.
Figure 22B:
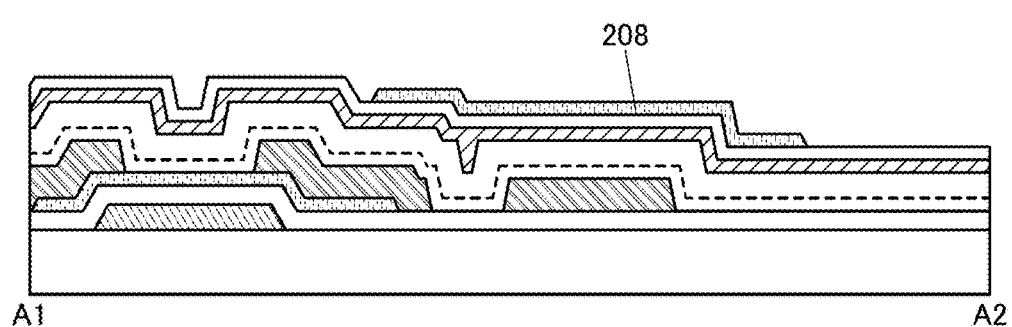
Figure 23A:
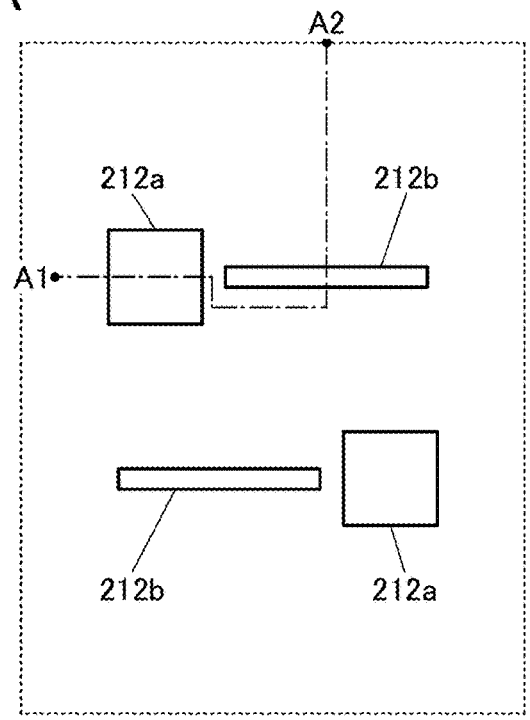
FIGS. 23A and 23B are a top view and a cross-sectional view illustrating a method for manufacturing a semiconductor device.
Figure 23B:
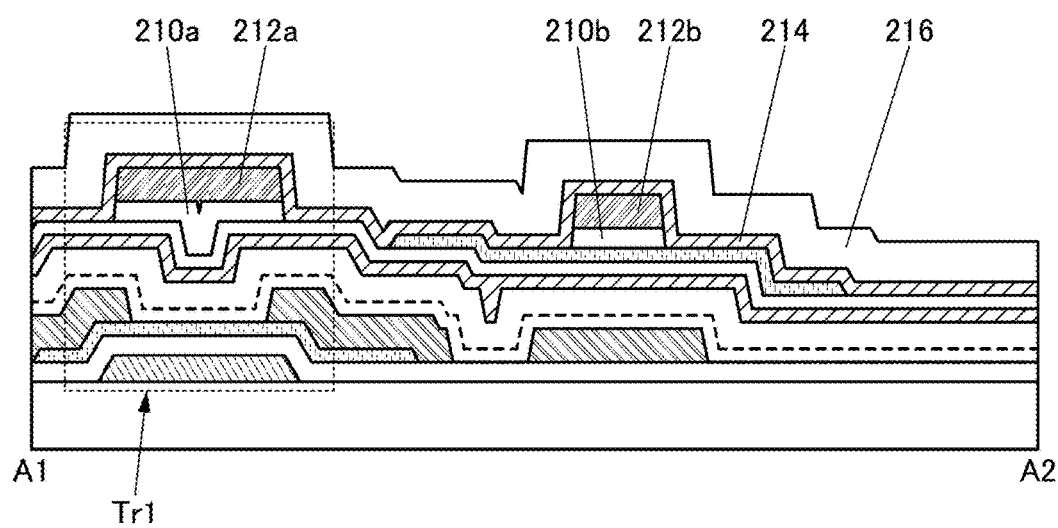

Next, the oxide semiconductor film 208 is formed over the insulating film 119 (see FIGS. 22A and 22B).

In this embodiment, an oxide semiconductor film is formed by a sputtering method using an In—Ga—Zn metal oxide target (In:Ga:Zn=4:2:4.1 [atomic ratio]). The substrate temperature at the time when the oxide semiconductor film is formed is 170° C. For the deposition gas for forming the oxide semiconductor film, an oxygen gas at a flow rate of 60 sccm and an argon gas at a flow rate of 140 sccm are used. Then, the oxide semiconductor film is processed into a desired shape, whereby the island-shaped oxide semiconductor film 208 is formed. Note that a wet-etching apparatus is used to form the oxide semiconductor film.

Next, a stacked-layer film including an insulating film and a conductive film is formed over the insulating film 119 and the oxide semiconductor film 208. Then, the stacked-layer film is processed into a desired shape to form the island-shaped insulating films 210a and 210b and the island-shaped conductive films 212a and 212b. Next, the insulating film 214 and 216 are formed over the insulating film 119, the oxide semiconductor film 208, and the conductive films 212a and 212b (see FIGS. 23A and 23B).

In this embodiment, a 50-nm-thick silicon oxynitride film is formed as the insulating films 210a and 210b with a PECVD apparatus. A 200-nm-thick oxide semiconductor film is formed as the conductive films 212a and 212b with a sputtering apparatus. Note that the composition of the oxide semiconductor film is the same as that of the oxide semiconductor film 208. As the insulating film 214, a 100-nm-thick silicon nitride film is formed with a PECVD apparatus. As the insulating film 216, a 200-nm-thick silicon oxynitride film is formed with a PECVD apparatus.

One or both of hydrogen and nitrogen in the insulating film 214 is transferred to part of the oxide semiconductor film 208 and the conductive films 212a and 212b are in contact with the insulating film 214 and thus become oxide conductors (OCs), the films.

Note that the insulating films 210a and 210b are formed in a self-aligned manner using the conductive films 212a and 212b as masks.

Figure 24A:
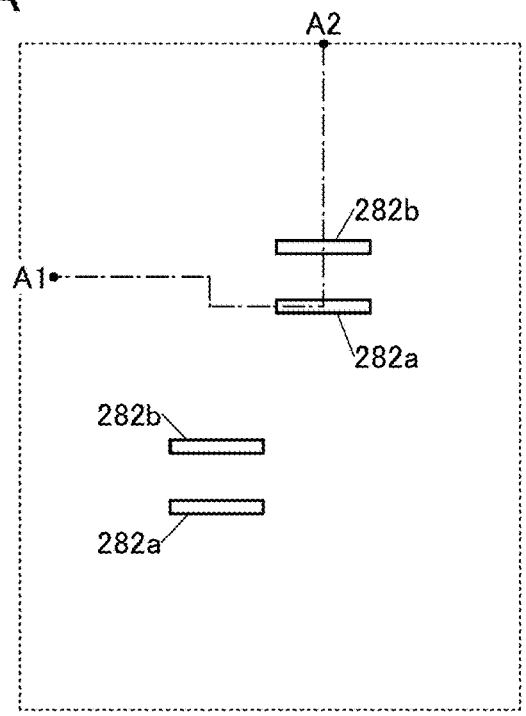
FIGS. 24A and 24B are a top view and a cross-sectional view illustrating a method for manufacturing a semiconductor device.
Figure 24B:
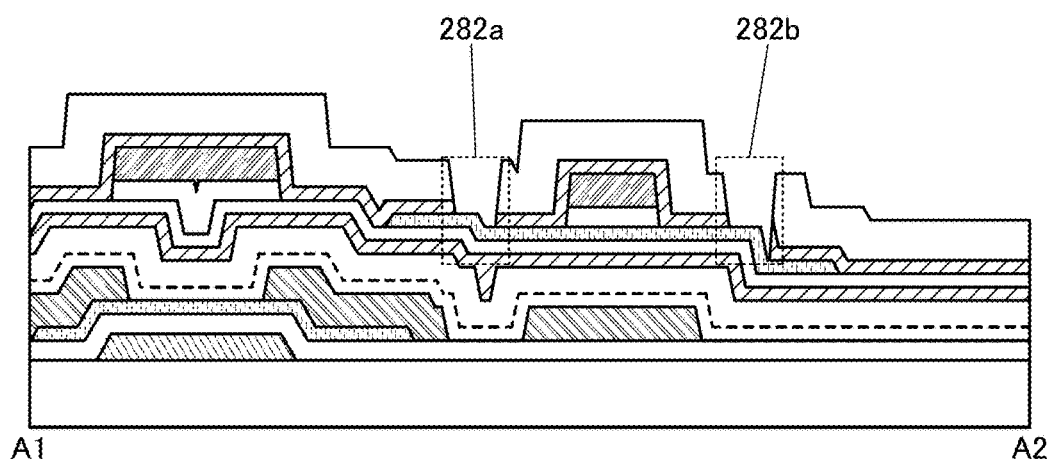

Next, openings 282a and 282b reaching the oxide semiconductor film 208 are formed in desired regions of the insulating films 214 and 216 (see FIGS. 24A and 24B).

The openings 282a and 282b are formed with a dry-etching apparatus or a wet-etching apparatus.

Figure 25A:
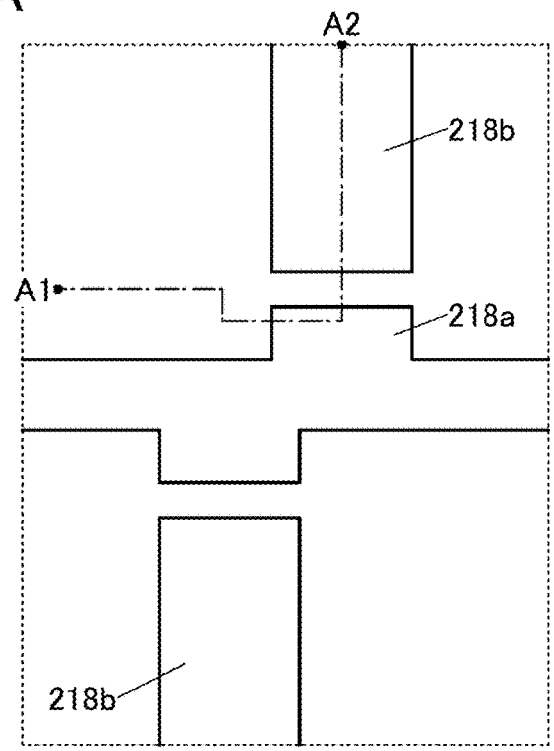
FIGS. 25A and 25B are a top view and a cross-sectional view illustrating a method for manufacturing a semiconductor device.
Figure 25B:
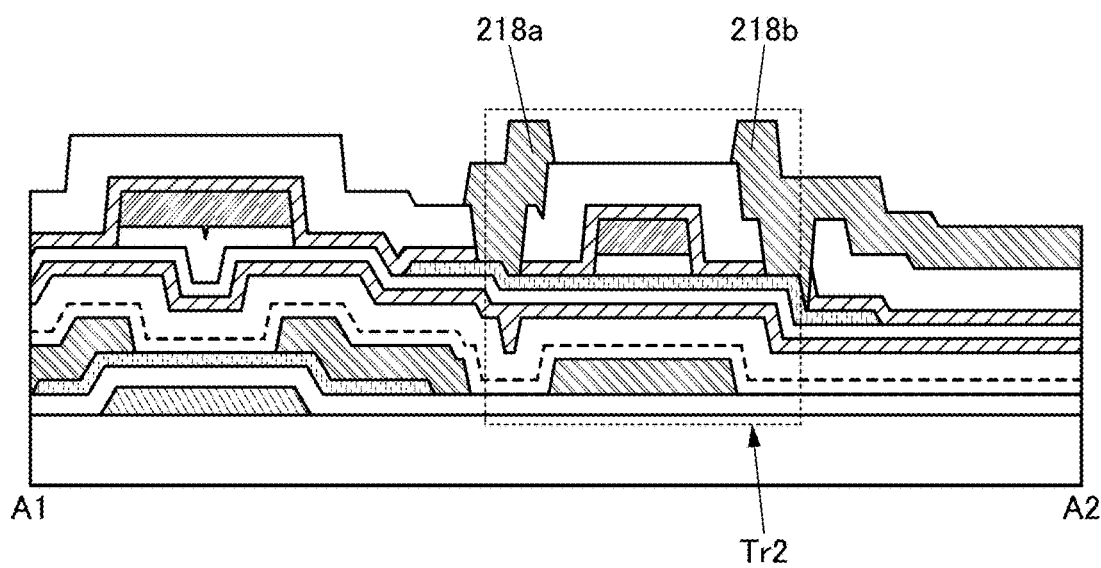
Figure 26A:
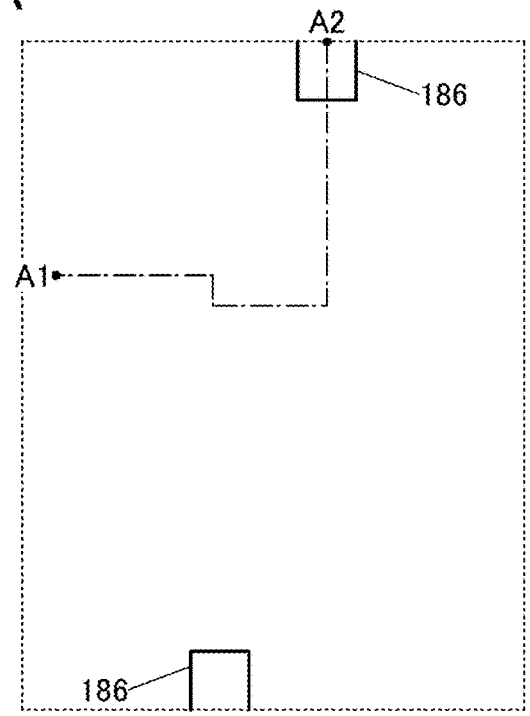
FIGS. 26A and 26B are a top view and a cross-sectional view illustrating a method for manufacturing a semiconductor device.
Figure 26B:
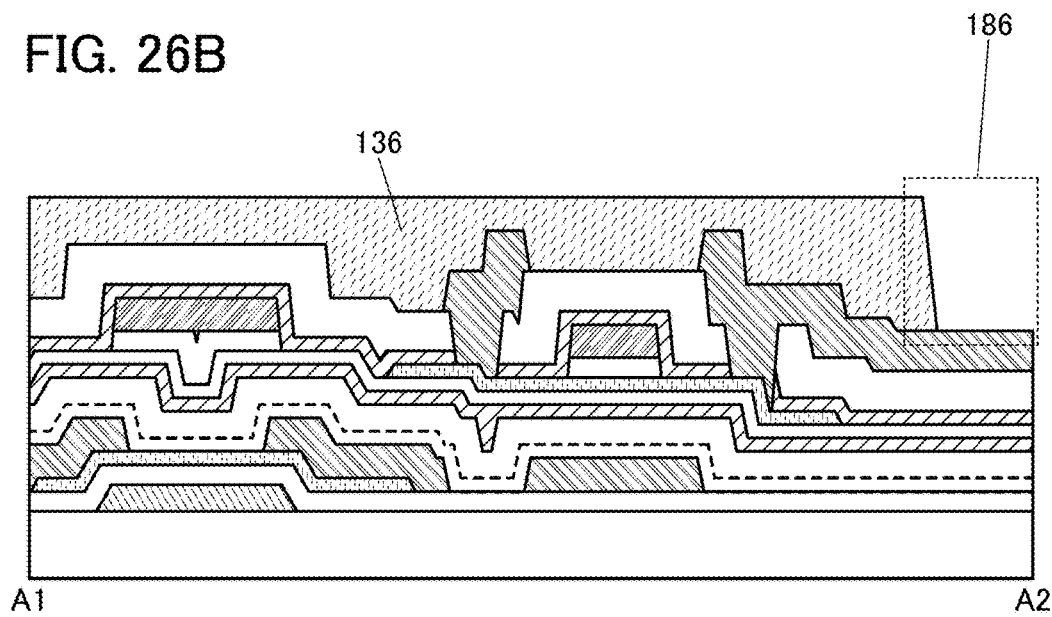

Next, a conductive film is formed over the insulating film 216 and the oxide semiconductor film 208 so as to fill the openings 282a and 282b and is processed into an island shape, so that the conductive films 218a and 218b are formed (see FIGS. 25A and 25B).

A 100-nm-thick tungsten film and a 200-nm-thick copper film are formed as the conductive films 218a and 218b by a sputtering method.

Next, the insulating film 136 is formed over the insulating film 216 and the conductive films 218a and 218b. Then, a desired region of the insulating film 136 is processed to form an opening 186 reaching the conductive film 218b (see FIGS. 26A and 26B).

In this embodiment, a 1.5-μm-thick acrylic-based photosensitive organic resin film is formed as the insulating film 136.

Figure 27A:
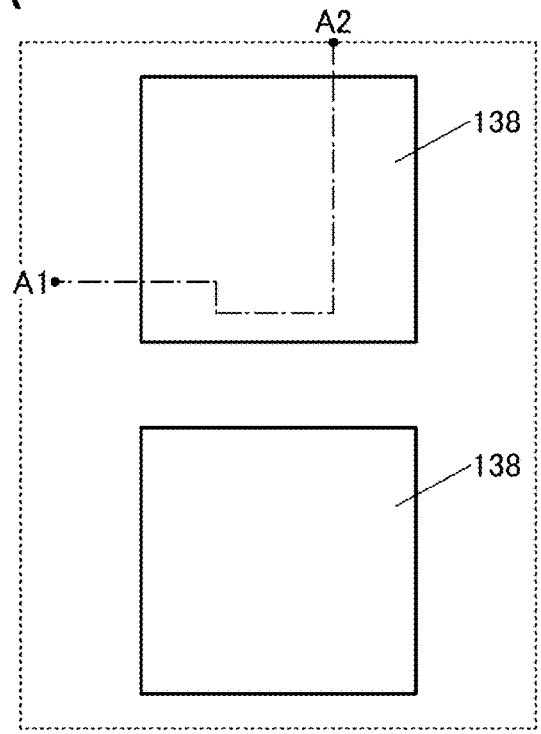
FIGS. 27A and 27B are a top view and a cross-sectional view illustrating a method for manufacturing a semiconductor device.
Figure 27B:
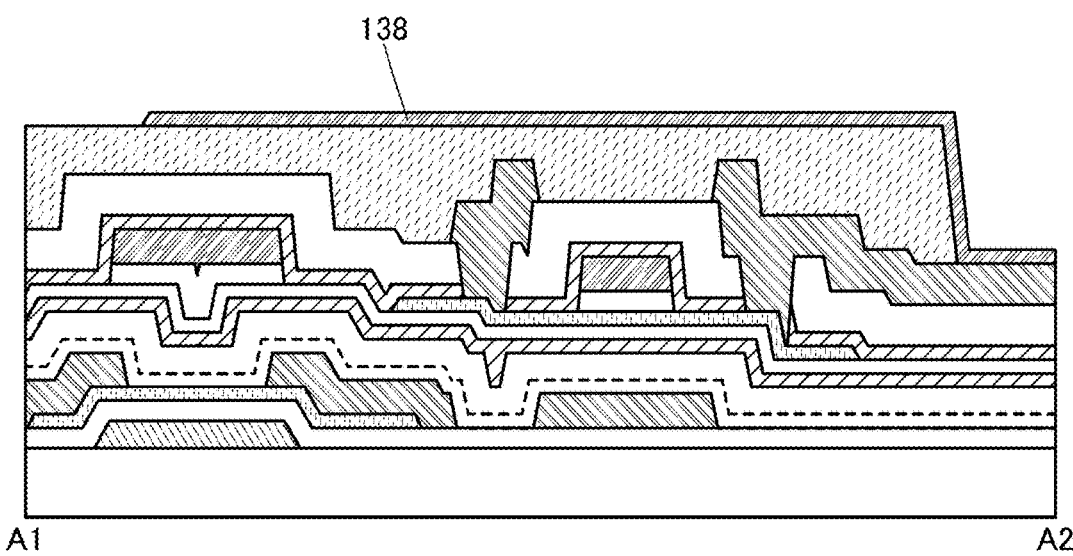

Next, a conductive film is formed over the insulating film 136 and the conductive film 218b and is processed into an island shape, whereby the conductive film 138 is formed (see FIGS. 27A and 27B).

For the conductive film 138 in this embodiment, a stacked film of a 10-nm-thick ITSO film, a 200-nm-thick reflective metal film (a metal film containing silver, palladium, and copper is used here), and a 10-nm-thick ITSO film is used. The stacked film is processed into the conductive film 130 with a wet-etching apparatus.

Figure 28A:
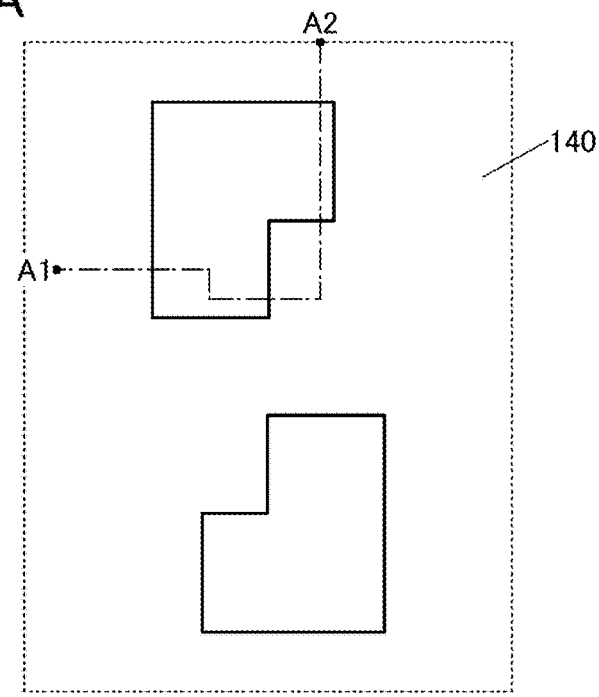
FIGS. 28A and 28B are a top view and a cross-sectional view illustrating a semiconductor device.
Figure 28B:
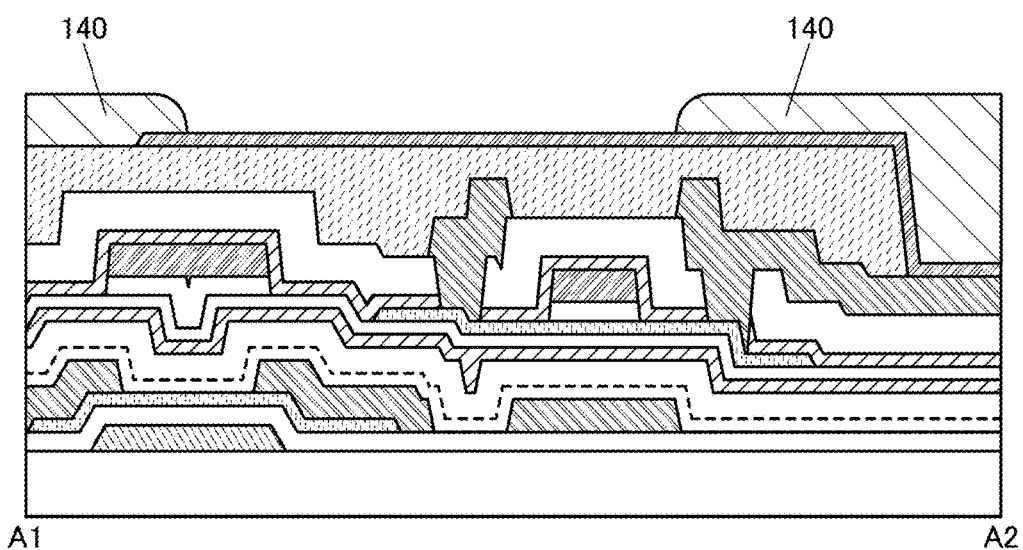

Next, the island-shaped insulating film 140 is formed over the insulating film 136 and the conductive film 138 (see FIGS. 28A and 28B).

Figure 29A:
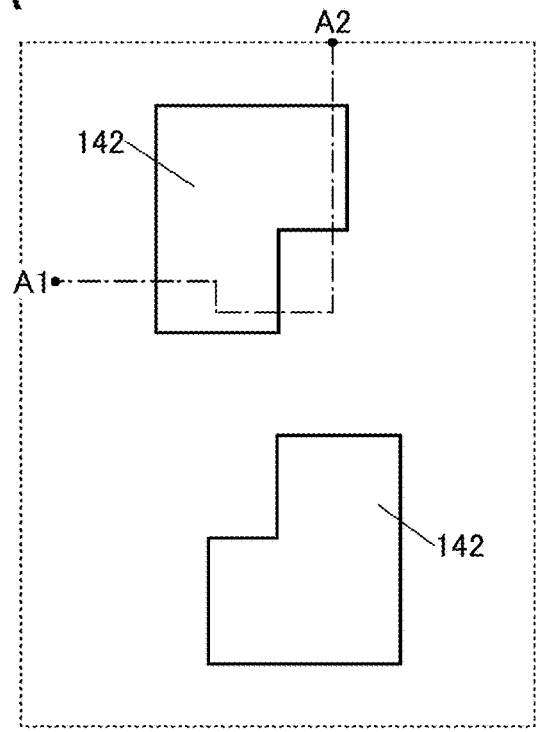
FIGS. 29A and 29B are a top view and a cross-sectional view illustrating a method for manufacturing a semiconductor device.
Figure 29B:
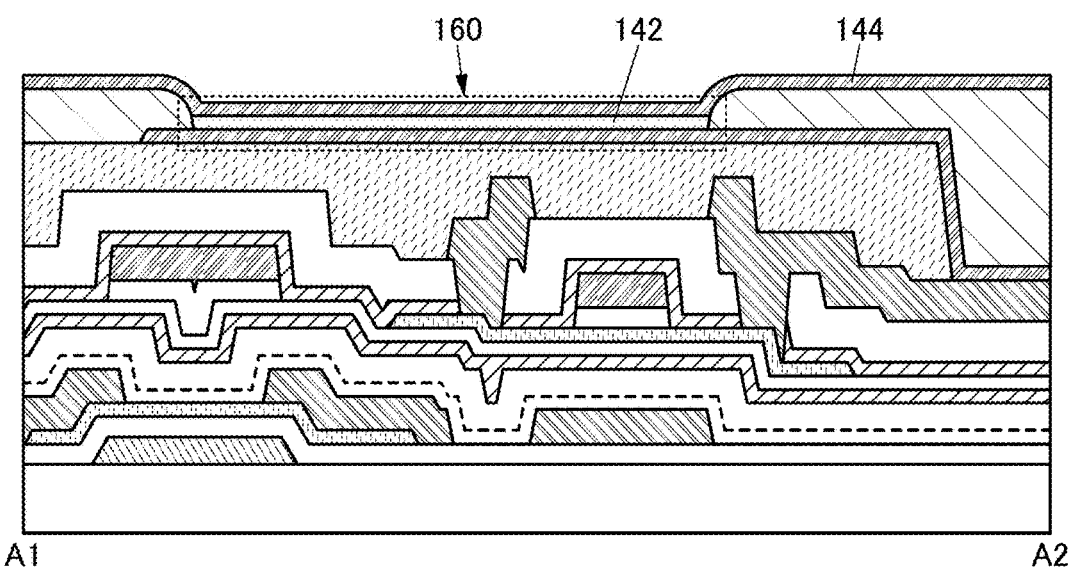

As the insulating film 140, a 1.5-μm-thick polyimide-based photosensitive organic resin film is used (see FIGS. 29A and 29B).

Next, the EL layer 142 is formed over the conductive film 138, and then, the conductive film 144 is formed over the insulating film 140 and the EL layer 142, whereby the light-emitting element 160 is obtained.

Note that a method for manufacturing the light-emitting element 160 is described in Embodiment 3.

Through the above manufacturing steps, the semiconductor device 200 shown in FIGS. 18A and 18B can be manufactured.

Note that the structure and method described in this embodiment can be used in appropriate combination with the structure and method described in any of the other embodiments.

Embodiment 3

In this embodiment, a semiconductor device that is one embodiment of the present invention and a method of manufacturing the semiconductor device are described with reference to FIGS. 30A and 30B to FIGS. 45A and 45B.

3-1. Structure Example 1 of Semiconductor Device

Figure 30A:
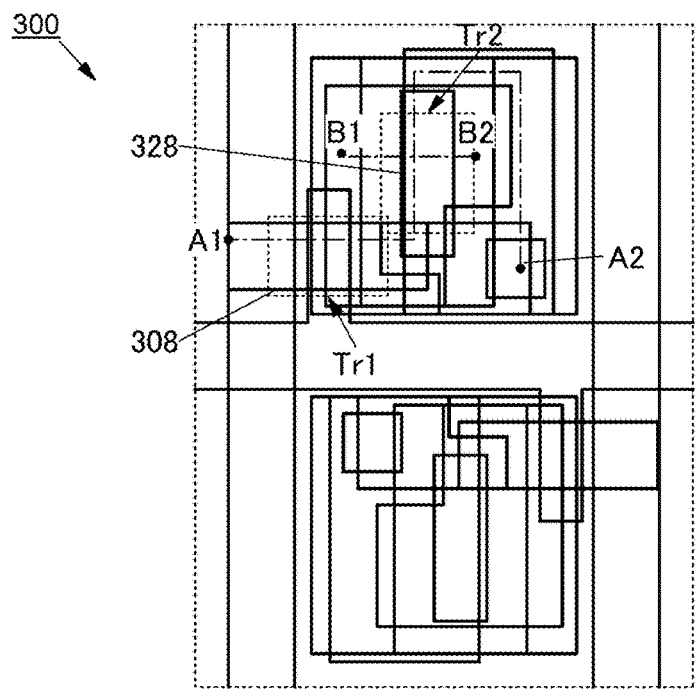
FIGS. 30A and 30B are a top view and a cross-sectional view illustrating a semiconductor device.
Figure 30B:
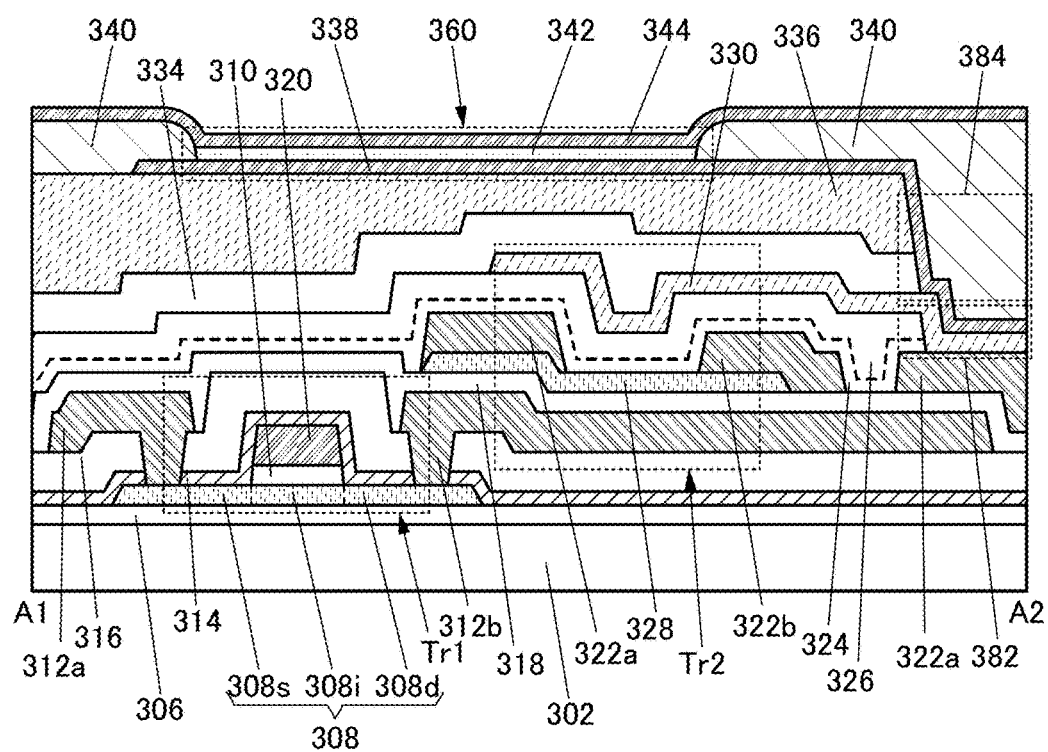

FIG. 30A is a top view of a semiconductor device 300 of one embodiment of the present invention. FIG. 30B is a cross-sectional view taken along dashed dotted line A1-A2 in FIG. 30A. Note that cross sections in a channel length (L) direction of a transistor Tr1 and in a channel length (L) direction of a transistor Tr2 are included in FIG. 30B.

Note that some components (e.g., an insulating film serving as a gate insulating film) of the semiconductor device 100 and some reference numerals of components are not illustrated in FIG. 30A to avoid complexity. Note that some components and some reference numerals of components are not illustrated as in FIG. 30A in some cases in top views of semiconductor devices described below.

The semiconductor device 100 illustrated in FIGS. 30A and 30B includes the transistor Tr1 and the transistor Tr2. The transistor Tr1 overlaps at least partly with the transistor Tr2. Note that the transistor Tr1 and the transistor Tr2 are a top-gate transistor and a bottom-gate transistor, respectively.

Since the transistor Tr1 overlaps at least partly with the transistor Tr2, the transistor area can be reduced.

The transistor Tr1 includes an insulating film 306 over a substrate 302, an oxide semiconductor film 308 over the insulating film 306, an insulating film 310 over the oxide semiconductor film 308, a conductive film 320 over the insulating film 310, and an insulating film 314 over the insulating film 306, the oxide semiconductor film 308, and the conductive film 320. The oxide semiconductor film 308 includes a channel region 308i overlapping with the conductive film 320 and in contact with the insulating film 314, a source region 308s in contact with the insulating film 314, and a drain region 308d in contact with the insulating film 314.

In addition, the transistor Tr1 includes an insulating film 316 over the insulating film 314, a conductive film 312a electrically connected to the source region 308s of the oxide semiconductor film 308 in an opening 341a that is formed in the insulating films 314 and 316, a conductive film 312b electrically connected to the drain region 308d of the oxide semiconductor film 308 in an opening 341b that is formed in the insulating films 314 and 316, and an insulating film 318 over the insulating film 316, the conductive film 312a, and the conductive film 312b.

The transistor Tr2 includes the conductive film 312b, the insulating film 318 over the conductive film 312b, an oxide semiconductor film 328 over the insulating film 318, a conductive film 322a over the oxide semiconductor film 328, a conductive film 322b over the oxide semiconductor film 328, an insulating film 324 over the oxide semiconductor film 328, the conductive film 322a, and the conductive film 322b, an insulating film 326 over the insulating film 324, and a conductive film 330 over the insulating film 326. Note that the conductive film 330 is connected to the conductive film 322a through an opening 382 provided in the insulating films 324 and 326.

As illustrated in FIGS. 30A and 30B, the oxide semiconductor film 308 and the oxide semiconductor film 328 partly overlap with each other. Note that it is preferable that, as illustrated in FIGS. 30A and 30B, a channel region formed in the oxide semiconductor film 308 of the transistor Tr1 not overlap with a channel region formed in the oxide semiconductor film 328 of the transistor Tr2.

If the channel region of the transistor Tr1 overlaps with the channel region of the transistor Tr2, one of the transistors which is active might adversely affect the other. In order to avoid the adverse effect, a structure in which the distance between the transistor Tr1 and the transistor Tr2 is increased, a structure in which a conductive film is provided between the transistor Tr1 and the transistor Tr2, or the like can be used. However, the thickness of the semiconductor device is increased when the former structure is used. Thus, for example, when the semiconductor device 300 is formed over a flexible substrate or the like, a problem might arise in the bendability and the like. When the latter structure is used, there is a problem in that a step of forming the conductive film is needed and the thickness of the semiconductor device is increased.

In the semiconductor device 300 of one embodiment of the present invention, however, the transistor Tr1 overlaps with the transistor Tr2 and their channel regions do not overlap with each other. In addition, since parts of their oxide semiconductor films where the channel regions are formed overlap with each other, the transistor area can be favorably reduced.

In addition, the oxide semiconductor film 308 and the oxide semiconductor film 328 each include In, M (M is Al, Ga, Y, or Sn), and Zn. Each of the oxide semiconductor film 308 and the oxide semiconductor film 328 preferably includes a region in which the atomic proportion of In is higher than the atomic proportion of M, for example. Note that the semiconductor device of one embodiment of the present invention is not limited thereto: each of them may include a region in which the atomic proportion of In is lower than the atomic proportion of M or may include a region in which the atomic proportion of In is equal to the atomic proportion of M.

It is preferable that the compositions of the oxide semiconductor film 308 and the oxide semiconductor film 328 be the same or substantially the same. When the compositions of the oxide semiconductor film 308 and the oxide semiconductor film 328 are the same, the manufacturing cost can be reduced. Note that the semiconductor device of one embodiment of the present invention is not limited thereto: the compositions of the oxide semiconductor film 308 and the oxide semiconductor film 328 may be different from each other.

When each of the oxide semiconductor film 308 and the oxide semiconductor film 328 includes a region in which the atomic proportion of In is larger than the atomic proportion of M, the field-effect mobilities of the transistor Tr1 and the transistor Tr2 can be increased. Specifically, one or both of the field-effect mobilities of the transistor Tr1 and the transistor Tr2 can exceed 10 cm$^2$/Vs, preferably 30 cm$^2$/Vs.

For example, when the transistor with high field-effect mobility is used for a gate driver of a display device that generates a gate signal, the display device can have a narrow frame. When the transistor with high field-effect mobility is used for a source driver (specifically, a demultiplexer connected to an output terminal of a shift register included in the source driver) that supplies a signal from a signal line included in a display device, the number of wirings connected to the display device can be reduced. In addition, when the transistor with high field-effect mobility is used as one or both of a selection transistor and a driver transistor of a pixel circuit included in the display device, the display quality of the display device can be increased.

The semiconductor device 300 shown in FIGS. 30A and 30B can be favorably used for a pixel circuit of a display device. The layout shown in FIGS. 30A and 30B can increase the pixel density of the display device. For example, even when the pixel density of a display device exceeds 1000 ppi (pixel per inch) or 2000 ppi, the aperture ratio of pixels can be increased owing to the structure shown in FIGS. 30A and 30B. Note that ppi is a unit for describing the number of pixels per inch.

3-2. Pixel Circuit of Display Device

An example in which the semiconductor device 300 shown in FIGS. 30A and 30B is used for a pixel circuit of a display device will be described with reference to FIG. 32.

Figure 31:
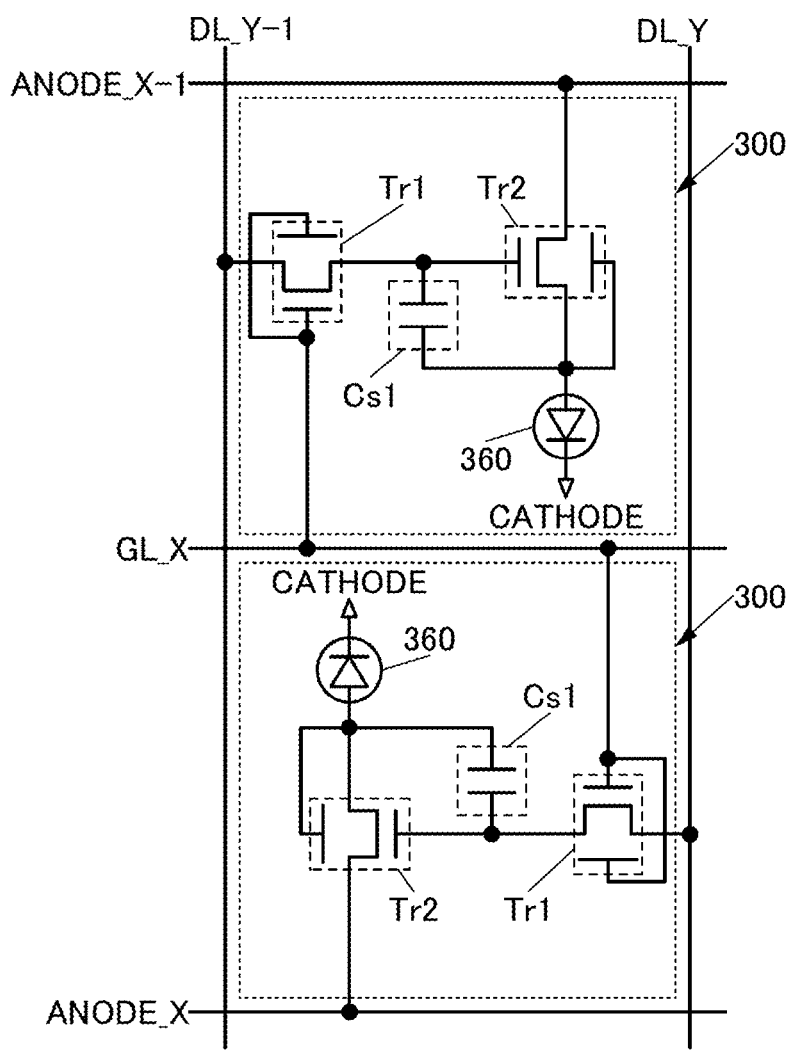
FIG. 31 illustrates a circuit of a semiconductor device.

FIG. 31 is a circuit diagram showing the example in which the semiconductor device 300 is used for a pixel circuit of a display device.

Figure 32:
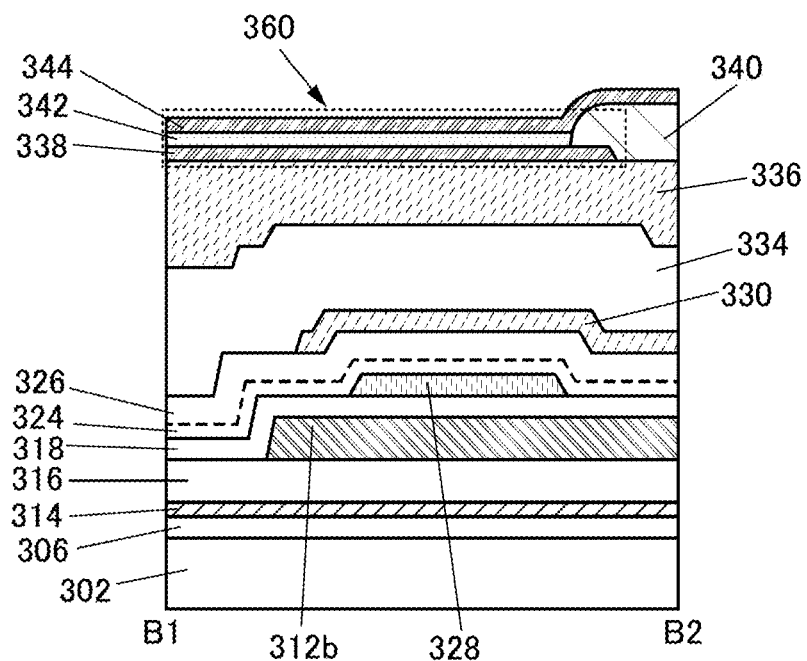
FIG. 32 is a cross-sectional view of a semiconductor device.

The semiconductor device 300 shown in FIG. 32 includes the transistor Tr1, the transistor Tr2, a capacitor Cs1, and a light-emitting element 360. Note that the example of FIG. 32 shows two semiconductor devices 300 adjacent to each other in a column direction. The semiconductor device 300 serves as a pixel (also referred to as a subpixel). Although the capacitor Cs1 is not illustrated in FIGS. 30A and 30B, the capacitor Cs1 can be formed using the parasitic capacitance between the conductive film 312b included in the transistor Tr1 and the conductive film 322b included in the transistor Tr2.

The circuit diagram of FIG. 2 includes a data line DL_Y−1 which inputs a data signal to a pixel, a data line DL_Y which inputs a data signal to the adjacent pixel, an anode line ANODE_X−1 which supplies a potential to a light-emitting element, an anode line ANODE_X which supplies a potential to the adjacent light-emitting element, and a scan line GL_X which supplies a scan signal to a pixel.

One of a source electrode and a drain electrode of the transistor Tr1 is electrically connected to the data line DL_Y−1. A first gate electrode and a second gate electrode of the transistor Tr1 is electrically connected to the scan line GL_X. The transistor Tr1 controls writing of a data signal.

One of a pair of electrodes of the capacitor Cs1 is electrically connected to the other of the source electrode and the drain electrode of the transistor Tr1. The other of the pair of electrodes of the capacitor Cs1 is electrically connected to a second gate electrode (also referred to as a back gate electrode) of the transistor Tr2. The capacitor Cs1 functions as a storage capacitor which stores written data.

One of a source electrode and a drain electrode of the transistor Tr2 is electrically connected to the anode line ANODE_X−1.

One of a pair of electrodes of the light-emitting element 360 is electrically connected to the other of the source electrode and the drain electrode of the transistor Tr2, and the other electrode of the light-emitting element 360 is electrically connected to a cathode line CATHODE. Note that the one of the pair of electrodes of the light-emitting element 360 is electrically connected to the other of the pair of electrodes of the capacitor Cs1.

The above structure is an example in which the semiconductor device 300 shown in FIGS. 30A and 30B is used for a pixel of a display device.

3-3. Structure of Semiconductor Device

The semiconductor device 300 shown in FIGS. 30A and 30B is described again. When the semiconductor device 300 shown in FIGS. 30A and 30B is used for a pixel of a display device, the channel length (L) and the channel width (W) of a transistor, the line widths of a wiring and an electrode connected to the transistor, and the like can be relatively large. The line width and the like can be larger when the transistor Tr1 and the transistor Tr2 overlap with each other at least partly as shown in FIGS. 30A and 30B than those when the transistor Tr1 and the transistor Tr2 are provided on the same plane, for example; thus, variations in processing size can be reduced.

In addition, one or both of a conductive film and an insulating film can be shared by the transistor Tr1 and the transistor Tr2; thus, the number of masks or steps can be reduced.

For example, in the transistor Tr1, the conductive film 320 serves as the gate electrode, the conductive film 312a serves as the source electrode, and the conductive film 312b serves as the drain electrode. In addition, in the transistor Tr1, the insulating film 310 serves as a gate insulating film. In the transistor Tr2, the conductive film 312b serves as the first gate electrode, the conductive film 322a serves as the source electrode, the conductive film 322b serves as the drain electrode, and the conductive film 330 serves as the second gate electrode. In addition, in the transistor Tr2, the insulating films 314 and 316 serve as first gate insulating films and the insulating films 324 and 326 serve as second gate insulating films.

Note that in this specification and the like, the insulating film 306 may be referred to as a first insulating film, the insulating films 314 and 316 may be collectively referred to as a second insulating film, and the insulating films 324 and 326 may be collectively referred to as a third insulating film.

An insulating film 334 is provided over the conductive film 330. An insulating film 336 is provided over the insulating film 334. An opening 384 is provided in the insulating films 334 and 336 so as to reach the conductive film 330. In addition, a conductive film 338 is provided over the insulating film 336. Note that the conductive film 338 is connected to the conductive film 330 in the opening 384.

In addition, an insulating film 340, an EL layer 342, and a conductive film 344 are provided over the conductive film 338. The insulating film 340 covers part of a side end portion of the conductive film 338 and prevents a short circuit of the conductive films 338 between adjacent pixels. The EL layer 342 emits light. The light-emitting element 360 is composed of the conductive film 338, the EL layer 342, and the conductive film 344. The conductive film 338 serves as one electrode of the light-emitting element 360. The conductive film 344 serves as the other electrode of the light-emitting element 360.

As described above, a top-gate transistor can be combined with a bottom-gate transistor in this embodiment.

As described above, in the semiconductor device of one embodiment of the present invention, a plurality of transistors are stacked to be reduced in the transistor area. In addition, since one or both of an insulating film and a conductive film are shared by the plurality of transistors, the number of masks or steps can be reduced.

3-4. Structure of Gate Electrode

As shown in FIGS. 30A and 30B, each of the transistor Tr1 and the transistor Tr2 includes two gate electrodes.

Here, the effect of two gate electrodes is described with reference to FIGS. 30A and 30B and FIG. 32.

Note that FIG. 32 is a cross-sectional view taken along dashed dotted line B1-B2 in FIG. 30A. A cross section in a channel width (W) direction of the transistor Tr2 is included in FIG. 32.

In addition, as shown in FIG. 32, the oxide semiconductor film 328 faces the conductive film 312b and the conductive film 330 and is sandwiched between the conductive films serving as the two gate electrodes. The length in the channel width direction of each of the conductive film 312b and the conductive film 330 is greater than the length in the channel width direction of the oxide semiconductor film 328. The entire oxide semiconductor film 328 is covered with the conductive film 312b and the conductive film 330 with the insulating films 318, 324, and 326 provided therebetween.

In other words, the conductive film 312b and the conductive film 330 include a region located outward from the side end portion of the oxide semiconductor film 328.

With such a structure, the oxide semiconductor film 328 included in the transistor Tr2 can be electrically enveloped by electric fields of the conductive film 312b and the conductive film 322c. A device structure of a transistor, like that of the transistor Tr2, in which electric fields of a first gate electrode and a second gate electrode electrically surround an oxide semiconductor film where a channel region is formed can be referred to as a surrounded-channel (S-channel) structure.

Since the transistor Tr2 has the S-channel structure, an electric field for inducing a channel can be effectively applied to the oxide semiconductor film 328 by the conductive film 312b functioning as a first gate electrode; therefore, the current drive capability of the transistor Tr2 can be improved and high on-state current characteristics can be obtained. In addition, since the on-state current can be high, it is possible to reduce the size of the transistor Tr2. In addition, since the transistor Tr2 has a structure in which the oxide semiconductor film 308 is surrounded by the conductive film 312b serving as the first gate electrode and the conductive film 330 serving as the second gate electrode, the mechanical strength of the transistor Tr2 can be increased.

Although in the transistor Tr2 shown in FIG. 30B, the conductive film 330 serving as the second gate electrode is electrically connected to the conductive film 322a serving as the source electrode or the drain electrode of the transistor Tr2, one embodiment of the present invention is not limited thereto. For example, the first gate electrode may be electrically connected to the second gate electrode. In that case, an opening is formed in the insulating films 318, 324, and 326, so that the conductive film 330 serving as the second gate electrode can be electrically connected to the conductive film 312b serving as the first gate electrode in the opening. Thus, the conductive film 312b and the conductive film 330 are supplied with the same potential.

3-5. Components of Semiconductor Device

Next, components of the semiconductor device of this embodiment are described in detail.

[Substrate]

There is no particular limitation on the property of a material and the like of the substrate 302 as long as the material has at least heat resistance enough to withstand later-performed heat treatment. For example, a glass substrate, a ceramic substrate, a quartz substrate, or a sapphire substrate may be used as the substrate 302. A single crystal semiconductor substrate or a polycrystalline semiconductor substrate made of silicon, silicon carbide, or the like, a compound semiconductor substrate made of silicon germanium or the like, an SOI substrate, or the like may be used as the substrate 302. Any of these substrates provided with a semiconductor element may be used as the substrate 302. When a glass substrate is used as the substrate 302, a glass substrate having any of the following sizes can be used to manufacture a large-sized display device: the 6th generation (1500 mm×1850 mm), the 7th generation (1870 mm×2200 mm), the 8th generation (2200 mm×2400 mm), the 9th generation (2400 mm×2800 mm), and the 10th generation (2950 mm×3400 mm).

A flexible substrate may be used as the substrate 302, and the semiconductor device 300 and the like may be provided directly on the flexible substrate. A separation layer may be provided between the substrate 302 and the semiconductor device 300. The separation layer can be used when part or the whole of a semiconductor device formed over the separation layer is separated from the substrate 302 and transferred onto another substrate. In such a case, the semiconductor device 300 can be transferred to a substrate having low heat resistance or a flexible substrate as well.

[Conductive Film]

The conductive film 312a, the conductive film 312b, the conductive film 320, the conductive film 322a, the conductive film 322b, the conductive film 330, the conductive film 338, and the conductive film 344 can each be formed using a metal element selected from chromium (Cr), copper (Cu), aluminum (Al), gold (Au), silver (Ag), zinc (Zn), molybdenum (Mo), tantalum (Ta), titanium (Ti), tungsten (W), manganese (Mn), nickel (Ni), iron (Fe), and cobalt (Co); an alloy including any of these metal element as its component; an alloy including a combination of any of these elements; or the like.

The conductive film 312a, the conductive film 312b, the conductive film 320, the conductive film 322a, the conductive film 322b, the conductive film 330, the conductive film 338, and the conductive film 344 can each be formed using an oxide conductor such as an oxide including indium and tin, an oxide including tungsten and indium, an oxide including tungsten, indium, and zinc, an oxide including titanium and indium, an oxide including titanium, indium, and tin, an oxide including indium and zinc, an oxide including silicon, indium, and tin, an oxide including indium, gallium, and zinc.

The above-listed oxide conductors are particularly favorable as the conductive films 320 and 330. Oxide conductors are described here. The oxide conductor in this specification and the like may be referred to as OC. An oxide conductor is obtained as follows, for example. Oxygen vacancies are formed in an oxide semiconductor, and then hydrogen is added to the oxygen vacancies, so that a donor level is formed in the vicinity of the conduction band. As a result, the oxide semiconductor has increased conductivity to be a conductor. The oxide semiconductor which has become a conductor can be referred to as an oxide conductor. Oxide semiconductors generally transmit visible light because of their large energy gaps. An oxide conductor is an oxide semiconductor having a donor level in the vicinity of the conduction band. Therefore, the influence of absorption due to the donor level is small in an oxide conductor, and the oxide conductor has a visible light transmitting property comparable to that of an oxide semiconductor.

A Cu—X alloy film (X is Mn, Ni, Cr, Fe, Co, Mo, Ta, or Ti) may be used as the conductive film 312a, the conductive film 312b, the conductive film 322a, the conductive film 322b, the conductive film 330, the conductive film 338, and the conductive film 344. The use of a Cu—X alloy film leads to lower fabrication costs because the film can be processed by wet etching.

The Cu—X alloy film can be favorably used as one of or a plurality of the conductive film 312a, the conductive film 312b, the conductive film 322a, the conductive film 322b, and the conductive film 330. A Cu—Mn alloy film is particularly preferable as the Cu—X alloy film.

Among the above-described metal elements, one of or a plurality of aluminum, copper, titanium, tungsten, tantalum, and molybdenum is particularly favorable as a constituent of one of or a plurality of the conductive film 312a, the conductive film 312b, the conductive film 322a, the conductive film 322b, and the conductive film 330.

A tantalum nitride film, which contains nitride and tantalum, is favorably used as one of or a plurality of the conductive film 312a, the conductive film 312b, the conductive film 322a, the conductive film 322b, and the conductive film 330. The tantalum nitride film has conductivity and a high barrier property against copper and hydrogen. The tantalum nitride film can be used most preferably as a metal film in contact with the oxide semiconductor film 308 or a metal film in the vicinity of the oxide semiconductor film 308 because the amount of hydrogen released from the tantalum nitride film is small.

[Insulating Film]

As each of the insulating film 306, the insulating film 314, the insulating film 316, the insulating film 318, the insulating film 324, the insulating film 326, the insulating film 334, the insulating film 336, and the insulating film 340, an insulating layer including at least one of the following films formed by a plasma CVD method, a sputtering method, or the like can be used: a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, and a neodymium oxide film.

The insulating film 306 serves as a blocking film that inhibits penetration of oxygen. For example, when one of or a plurality of the insulating film 314, the insulating film 316, the oxide semiconductor film 308, the oxide semiconductor film 328, the insulating film 324, and the insulating film 326 include an oxygen-excess region, the insulating film 306 can inhibit penetration of oxygen.

Note that an insulating film that is in contact with one or both of the oxide semiconductor film 308 and the oxide semiconductor film 328 is preferably an oxide insulating film and preferably includes a region containing oxygen in excess of that in the stoichiometric composition (the oxygen-excess region). In other words, the oxide insulating film including the oxygen-excess region is an insulating film capable of releasing oxygen.

The oxygen-excess region of the oxide insulating film can be formed by any of the following methods, for example: an insulating film is formed in an oxygen atmosphere; an insulating film is formed, and then is subjected to heat treatment in an oxygen atmosphere; or an insulating film is formed, and then oxygen is added to the insulating film. Plasma treatment is preferable for adding oxygen into the formed insulating film.

The insulating film serving as the gate insulating film of each of the transistor Tr1 and the transistor Tr2 may be formed using hafnium oxide. When hafnium oxide is used for the insulating film serving as the gate insulating film, the following effects are obtained.

Hafnium oxide has a higher dielectric constant than silicon oxide and silicon oxynitride. Thus, the thickness of the insulating film formed using hafnium oxide can be larger than that of an insulating film formed using silicon oxide, so that leakage current due to tunnel current can be low. That is, a transistor with low off-state current can be fabricated. Moreover, hafnium oxide which has a crystal structure has a higher dielectric constant than hafnium oxide which has an amorphous structure. Therefore, it is preferable to use hafnium oxide which has a crystal structure in order to fabricate a transistor with low off-state current. Examples of the crystal structure include a monoclinic crystal structure and a cubic crystal structure. Note that one embodiment of the present invention is not limited to the above examples.

The insulating film serving as the gate insulating film of each of the transistor Tr1 and the transistor Tr2 may be formed using silicon nitride. When silicon nitride is used for the insulating film serving as the gate insulating film, the following effects are obtained. Silicon nitride has a higher dielectric constant than silicon oxide and needs a larger thickness to obtain capacitance equivalent to that of silicon oxide. Thus, the thickness of the gate insulating film can be increased. This makes it possible to prevent a decrease in withstand voltage of the transistor Tr1 and the transistor Tr2 and to increase the withstand voltage, thereby preventing electrostatic discharge of the transistor Tr1 and the transistor Tr2.

The insulating films 310, 316, 318, 324, and 326 have a function of supplying oxygen to the oxide semiconductor film 308 and/or the oxide semiconductor film 328. That is, the insulating films 310, 316, 318, 324, and 326 contain oxygen. The insulating films 310 and 324 are insulating films which allow passage of oxygen. Note that the insulating film 310 also functions as a film for relieving damage to the oxide semiconductor film 308 at the time of forming the conductive film 320 in a later step. The insulating film 324 also functions as a film for relieving damage to the oxide semiconductor film 328 at the time of forming the insulating film 326 in a later step.

A silicon oxide film, a silicon oxynitride film, or the like with a thickness greater than or equal to 5 nm and less than or equal to 150 nm, preferably greater than or equal to 5 nm and less than or equal to 50 nm can be used as the insulating films 310 and 324.

In addition, it is preferable that the number of defects in the insulating films 310 and 324 be small, and typically, the spin density of a signal that appears at g=2.001 due to a dangling bond of silicon be lower than or equal to $1 \times 10^{18}$ spins/cm$^3$ when measured by ESR measurement. This is because if the density of defects in each of the insulating films 310 and 324 is high, oxygen is bonded to the defects and the amount of oxygen that passes through the insulating film 310 is decreased.

The insulating films 310 and 324 can each be formed using an oxide insulating film having a low density of states due to nitrogen oxide. Note that the density of states due to nitrogen oxide can be formed between the energy of the valence band maximum ($E_{v\_os}$) and the energy of the conduction band minimum ($E_{c\_os}$) of the oxide semiconductor film. A silicon oxynitride film that releases less nitrogen oxide, an aluminum oxynitride film that releases less nitrogen oxide, and the like can be used as the above oxide insulating film.

Note that a silicon oxynitride film that releases less nitrogen oxide is a film of which the release amount of ammonia is larger than the release amount of nitrogen oxide in thermal desorption spectroscopy (TDS); the release amount of ammonia is typically greater than or equal to $1 \times 10^{18}$ cm$^{-3}$ and less than or equal to $5 \times 10^{19}$ cm$^{-3}$. Note that the release amount of ammonia is the total amount of ammonia released by heat treatment at a temperature in the range of 50° C. to 650° C. or the range of 50° C. to 550° C. in TDS. The release amount of ammonia is the total release amount of ammonia converted into ammonia molecules in TDS.

Nitrogen oxide (NO$_x$; x is greater than 0 and less than or equal to 2, preferably greater than or equal to 1 and less than or equal to 2), typically NO$_2$ or NO, forms a level in each of the insulating films 310 and 324. The level is located in the energy gap of the oxide semiconductor films 308 and 328. Therefore, when nitrogen oxide is diffused to the interface between the insulating film 310 and the oxide semiconductor film 308 or the interface between the insulating film 324 and the oxide semiconductor film 328, an electron might be trapped by the level on the insulating films 310 and 324 side. As a result, the trapped electron remains in the vicinity of the interface between the insulating film 310 and the oxide semiconductor film 308 or the interface between the insulating film 324 and the oxide semiconductor film 328; thus, the threshold voltage of the transistor is shifted in the positive direction.

Nitrogen oxide reacts with ammonia and oxygen in heat treatment. Since nitrogen oxide contained in the insulating film 324 reacts with ammonia contained in the insulating film 326 in heat treatment, nitrogen oxide contained in the insulating film 324 is reduced. Therefore, an electron is hardly trapped in the vicinity of the interface between the insulating film 324 and the oxide semiconductor film 328.

By using such an oxide insulating film, the insulating films 310 and 324 can reduce the shift in the threshold voltage of the transistor, which leads to a smaller change in the electrical characteristics of the transistor.

Note that in ESR spectra at 100 K or lower of the insulating films 310 and 324, by heat treatment of a manufacturing process of the transistor, typically heat treatment at a temperature higher than or equal to 300° C. and lower than 350° C., a first signal that appears at a g-factor of greater than or equal to 2.037 and less than or equal to 2.039, a second signal that appears at a g-factor of greater than or equal to 2.001 and less than or equal to 2.003, and a third signal that appears at a g-factor of greater than or equal to 1.964 and less than or equal to 1.966 are observed. The split width of the first and second signals and the split width of the second and third signals that are obtained by ESR measurement using an X-band are each approximately 5 mT. The sum of the spin densities of the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 is lower than $1 \times 10^{18}$ spins/cm$^3$, typically higher than or equal to $1 \times 10^{17}$ spins/cm$^3$ and lower than $1 \times 10^{18}$ spins/cm$^3$.

In the ESR spectra at 100 K or lower, the sum of the spin densities of the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 corresponds to the sum of the spin densities of signals attributed to nitrogen oxide (NO$_x$; x is greater than 0 and less than or equal to 2, preferably greater than or equal to 1 and less than or equal to 2). Typical examples of the nitrogen oxide include nitrogen monoxide and nitrogen dioxide. It can be said that the lower the sum of the spin densities of the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 is, the lower the content of nitrogen oxide in the oxide insulating film is.

The nitrogen concentration of the above-described oxide insulating film measured by SIMS is lower than or equal to $6 \times 10^{20}$ atoms/cm$^3$.

The oxide insulating film can be formed to be dense and hard by a PECVD method at a substrate temperature higher than or equal to 220° C. and lower than or equal to 350° C. with the use of silane and dinitrogen monoxide.

The insulating film 314 contains nitrogen or hydrogen. As the insulating film 314, for example, a nitride insulating film can be used. The nitride insulating film can be formed using silicon nitride, silicon nitride oxide, silicon oxynitride, or the like. The hydrogen concentration in the insulating film 314 is preferably higher than or equal to $1\times10^{22}$ atoms/cm$^3$. Furthermore, the insulating film 314 is in contact with the source region 308s and the drain region 308d of the oxide semiconductor film 308. In addition, the insulating film 314 includes a region in contact with the conductive film 320. Therefore, the hydrogen concentrations in the source region 308s, the drain region 308d, and the conductive film 320 in contact with the insulating film 314 are increased; thus, the carrier densities in the source region 308s, the drain region 308d, and the conductive film 320 can be increased. Since the source region 308s, the drain region 308d, and the conductive film 320 are in contact with the insulating film 314, they have regions with the same hydrogen concentration in some cases.

The insulating films 316, 318, and 326 are formed using an oxide insulating film whose oxygen content is higher than that in the stoichiometric composition. Part of oxygen is released by heating from the oxide insulating film whose oxygen content is higher than that in the stoichiometric composition. The oxide insulating film whose oxygen content is higher than that in the stoichiometric composition releases oxygen greater than or equal to $1.0\times10^{19}$ cm$^{-3}$, preferably greater than or equal to $3.0\times10^{20}$ cm$^{-3}$. Note that the release amount of oxygen is the total amount of oxygen released by heat treatment in a range of 50° C. to 650° C. or a range of 50° C. to 550° C. in TDS. The amount of released oxygen is the total release amount of oxygen converted into oxygen molecules in TDS.

A silicon oxide film, a silicon oxynitride film, or the like with a thickness greater than or equal to 30 nm and less than or equal to 500 nm, preferably greater than or equal to 50 nm and less than or equal to 400 nm can be used as each of the insulating films 316, 318, and 326.

In addition, it is preferable that the number of defects in the insulating films 316, 318, and 326 be small, and typically, the spin density of a signal that appears at g=2.001 due to a dangling bond of silicon be lower than $1.5\times10^{18}$ spins/cm$^3$, preferably lower than $1\times10^{18}$ spins/cm$^3$ when measured by ESR measurement.

Since the insulating films 324 and 326 can be formed using insulating films including the same kinds of materials, a boundary between the insulating films 324 and 326 cannot be clearly observed in some cases. Thus, in this embodiment, the boundary between the insulating films 324 and 326 is shown by dashed lines.

The insulating film 334 serves as a protective insulating film of each of the transistor Tr1 and the transistor Tr2.

The insulating film 334 contains one or both of hydrogen and nitrogen. Alternatively, the insulating film 334 includes nitrogen and silicon. The insulating film 334 has a function of blocking oxygen, hydrogen, water, an alkali metal, an alkaline earth metal, or the like. It is possible to prevent outward diffusion of oxygen from the oxide semiconductor film 308 and the oxide semiconductor film 328, outward diffusion of oxygen included in the insulating films 310, 316, 324, and 326, and entry of hydrogen, water, or the like into the oxide semiconductor films 308 and 328 from the outside by providing the insulating film 334.

The insulating film 334 can be formed using a nitride insulating film, for example. The nitride insulating film is formed using silicon nitride, silicon nitride oxide, aluminum nitride, aluminum nitride oxide, or the like.

[Oxide Semiconductor Film]

The oxide semiconductor films 308 and 328 can be formed using the materials described above.

In the case where the oxide semiconductor films 308 and 328 each includes In-M-Zn oxide, it is preferable that the atomic ratio of metal elements of a sputtering target used for forming the In-M-Zn oxide satisfy In>M. The atomic ratio between metal elements in such a sputtering target is, for example, In:M:Zn=2:1:3, In:M:Zn=3:1:2, or In:M:Zn=4:2:4.1.

In the case where the oxide semiconductor film 308 and the oxide semiconductor film 328 each include an In-M-Zn oxide, the atomic ratio of metal elements in a sputtering target used for depositing the In-M-Zn oxide may satisfy In≤M. The atomic ratio of metal elements in such a sputtering target is, for example, In:M:Zn=1:1:1, In:M:Zn=1:1:1.2, In:M:Zn=1:3:2, In:M:Zn=1:3:4, or In:M:Zn=1:3:6.

In the case where the oxide semiconductor film 308 and the oxide semiconductor film 328 are each In-M-Zn oxide, it is preferable to use a target including polycrystalline In-M-Zn oxide as the sputtering target. The use of the target including polycrystalline In-M-Zn oxide facilitates formation of the oxide semiconductor films 308 and 328 having crystallinity. Note that the atomic ratio of metal elements in the formed oxide semiconductor films 308 and 328 varies from the above atomic ratios of metal elements of the sputtering targets in a range of ±40%. For example, when a sputtering target with an atomic ratio of In to Ga and Zn of 4:2:4.1 is used for the oxide semiconductor films 308 and 328, the atomic ratio of In to Ga and Zn in the oxide semiconductor films 308 and 328 may be 4:2:3 or in the vicinity of 4:2:3.

The energy gap of the oxide semiconductor films 308 and 328 is 2 eV or more, preferably 2.5 eV or more and further preferably 3 eV or more. With the use of an oxide semiconductor having such a wide energy gap, the off-state current of the transistors Tr1 and Tr2 can be reduced.

The thickness of the oxide semiconductor films 308 and 328 is greater than or equal to 3 nm and less than or equal to 200 nm, preferably greater than or equal to 3 nm and less than or equal to 100 nm, further preferably greater than or equal to 3 nm and less than or equal to 50 nm.

Hydrogen contained in the oxide semiconductor films 308 and 328 reacts with oxygen bonded to a metal atom to be water, and also causes an oxygen vacancy in a lattice from which oxygen is released (or a portion from which oxygen is released). Entry of hydrogen into the oxygen vacancy generates an electron serving as a carrier in some cases. Furthermore, in some cases, bonding of part of hydrogen to oxygen bonded to a metal atom causes generation of an electron serving as a carrier. Thus, a transistor including an oxide semiconductor film that contains hydrogen is likely to be normally on. Accordingly, it is preferable that hydrogen be reduced as much as possible in the oxide semiconductor films 308 and 328.

Specifically, in each of the oxide semiconductor films 308 and 328, the concentration of hydrogen which is measured by SIMS is lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, further preferably lower than or equal to $5\times10^{18}$ atoms/cm$^3$, further preferably lower than or equal to $1\times10^{18}$ atoms/cm$^3$, further preferably lower than or equal to $5\times10^{17}$ atoms/cm$^3$, and still further preferably lower than or equal to $1\times10^{16}$ atoms/cm$^3$.

When silicon or carbon, which is one of the elements belonging to Group 14, is contained in the oxide semiconductor films 308 and 328, oxygen vacancies are increased in the oxide semiconductor films 308 and 328, so that the oxide semiconductor films 308 and 328 become n-type films. Thus, the silicon concentration measured by SIMS in each of the oxide semiconductor films 308 and 328 is set to be lower than or equal to $2\times10^{18}$ atoms/cm$^3$, preferably lower than or equal to $2\times10^{17}$ atoms/cm$^3$. The carbon concentration measured by SIMS in each of the oxide semiconductor films 308 and 328 is set to be lower than or equal to $2\times10^{18}$ atoms/cm$^3$, preferably lower than or equal to $2\times10^{17}$ atoms/cm$^3$.

In addition, the concentration of alkali metal or alkaline earth metal of each of the oxide semiconductor film 308 and the oxide semiconductor film 328, which is measured by SIMS, is set to be lower than or equal to $1\times10^{18}$ atoms/cm$^3$, preferably lower than or equal to $2\times10^{16}$ atoms/cm$^3$. Alkali metal and alkaline earth metal might generate carriers when bonded to an oxide semiconductor, in which case the off-state current of the transistor might be increased. Thus, it is preferable to reduce the concentration of alkali metal or alkaline earth metal in the oxide semiconductor films 308 and 328.

The oxide semiconductor film 308 and the oxide semiconductor film 328c may have a non-single-crystal structure, for example. Examples of the non-single-crystal structure include a c-axis-aligned crystalline oxide semiconductor (CAAC-OS) which is described later, a polycrystalline structure, a microcrystalline structure, and an amorphous structure. Among the non-single crystal structure, the amorphous structure has the highest density of defect states, whereas CAAC-OS has the lowest density of defect states.

Note that the above-described films such as conductive films, insulating films, and oxide semiconductor films can be formed by a sputtering method, a plasma-enhanced chemical vapor deposition (PECVD) method, or a thermal CVD method. Examples of thermal CVD methods include a metal organic chemical vapor deposition (MOCVD) method and an atomic layer deposition (ALD) method.

A thermal CVD method is a deposition method without using plasma and thus has an advantage that no defect due to plasma damage is generated.

Deposition by a thermal CVD method may be performed in such a manner that a source gas and an oxidizer are supplied to the chamber at a time so that the pressure in a chamber is set to an atmospheric pressure or a reduced pressure, and react with each other in the vicinity of the substrate or over the substrate.

Deposition by an ALD method may be performed under the condition that the pressure in a chamber is set to an atmospheric pressure or a reduced pressure, and a source gas for reaction is used.

The above-described variety of films such as the conductive film, the insulating film, the oxide semiconductor film, and the metal oxide film in this embodiment can be formed by a thermal CVD method such as an MOCVD method or an ALD method. For example, an In—Ga—Zn—O film can be formed with trimethylindium, trimethylgallium, and dimethylzinc. Note that the chemical formula of trimethylindium is In(CH$_3$)$_3$. The chemical formula of trimethylgallium is Ga(CH$_3$)$_3$. The chemical formula of dimethylzinc is Zn(CH$_3$)$_2$. Without limitation to the above combination, triethylgallium (chemical formula: Ga(C$_2$H$_5$)$_3$) can be used instead of trimethylgallium and diethylzinc (chemical formula: Zn(C$_2$H$_5$)$_2$) can be used instead of dimethylzinc.

For example, in the case where a hafnium oxide film is formed by a deposition apparatus using an ALD method, two kinds of gases are used: ozone (O$_3$) as an oxidizer and a source gas which is obtained by vaporizing liquid containing a solvent and a hafnium precursor compound (hafnium alkoxide or hafnium amide such as tetrakis(dimethylamide) hafnium (TDMAH)). Note that the chemical formula of tetrakis(dimethylamide)hafnium is Hf[N(CH$_3$)$_2$]$_4$. Examples of another material liquid include tetrakis(ethylmethylamide)hafnium.

For example, in the case where an aluminum oxide film is formed by a deposition apparatus using an ALD method, two kinds of gases are used: H$_2$O as an oxidizer and a source gas which is obtained by vaporizing a solvent and liquid containing an aluminum precursor compound (e.g., trimethylaluminum: TMA). Note that the chemical formula of trimethylaluminum is Al(CH$_3$)$_3$. Examples of another material liquid include tris(dimethylamide)aluminum, triisobutylaluminum, and aluminum tris(2,2,6,6-tetramethyl-3,5-heptanedionate).

For example, in the case where a silicon oxide film is formed by a deposition apparatus using ALD, hexachlorodisilane is adsorbed on a surface where a film is to be formed, chlorine contained in the adsorbate is removed, and radicals of an oxidizing gas (e.g., O$_2$ or dinitrogen monoxide) are supplied to react with the adsorbate.

For example, in the case where a tungsten film is formed using a deposition apparatus using an ALD method, a WF$_6$ gas and a B$_2$H$_6$ gas are used to form an initial tungsten film, and then a WF$_6$ gas and an H$_2$ gas are used to form a tungsten film. Note that an SiH$_4$ gas may be used instead of a B$_2$H$_6$ gas.

For example, in the case where an oxide semiconductor film, e.g., an In—Ga—Zn—O film is formed with a deposition apparatus employing ALD, an In(CH$_3$)$_3$ gas and an O$_3$ gas are sequentially introduced a plurality of times to form an In—O layer, then a Ga(CH$_3$)$_3$ gas and an O$_3$ gas are used to form a GaO layer, and then a Zn(CH$_3$)$_2$ gas and an O$_3$ gas are used to form a Zn—O layer. Note that the order of these layers is not limited to this example. A mixed compound layer such as an In—Ga—O layer, an In—Zn—O layer, or a Ga—Zn—O layer may be formed by mixing of these gases. An H$_2$O gas which is obtained by bubbling with an inert gas such as Ar may be used instead of an O$_3$ gas, but it is preferable to use an O$_3$ gas, which does not contain H. Furthermore, instead of an In(CH$_3$)$_3$ gas, an In(C$_2$H$_5$)$_3$ gas may be used. Instead of a Ga(CH$_3$)$_3$ gas, a Ga(C$_2$H$_5$)$_3$ gas may be used. Further, a Zn(CH$_3$)$_2$ gas may be used.

3-6. Structure Example 2 of Semiconductor Device

Next, modification examples of the semiconductor device 300 shown in FIGS. 30A and 30B are described with reference to FIG. 33.

Figure 33:
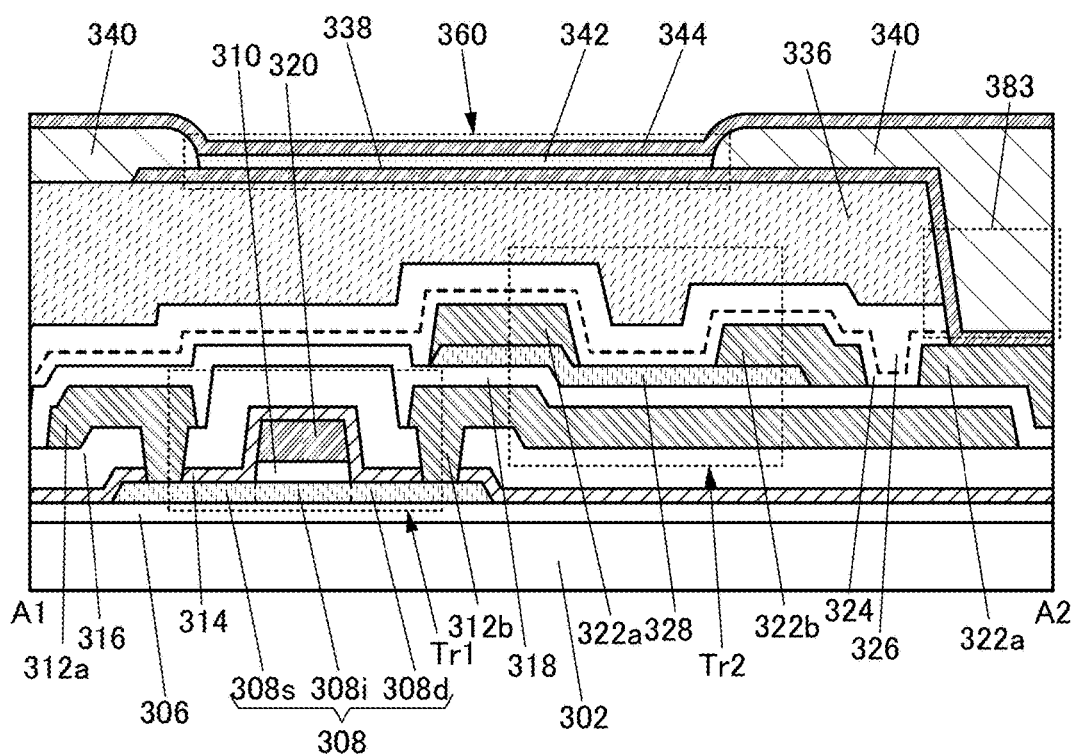
FIG. 33 is a cross-sectional view of a semiconductor device.

FIG. 33 is a cross-sectional view of a modification example of the semiconductor device 300 shown in FIG. 30B.

FIG. 33 shows a structure without the conductive film 330 serving as the second gate electrode of the transistor Tr2 included in the semiconductor device 300 and without the insulating film 334 over the conductive film 330. In addition, in the structure shown in FIG. 33, an opening 383 is formed in the insulating film 324, the insulating film 326, and the insulating film 336 instead of the opening 382 formed in the insulating film 324 and the insulating film 326 and the opening 384 formed in the insulating film 334 and the insulating film 336. Such a structure including one opening is favorable because the manufacturing steps can be reduced.

3-7. Structure Example 3 of Semiconductor Device

Next, modification examples of the semiconductor device 300 in FIGS. 30A and 30B are described with reference to FIGS. 34A and 34B and FIGS. 35A and 35B.

A stacked-layer structure of an oxide semiconductor film is described below.

Figure 34A:
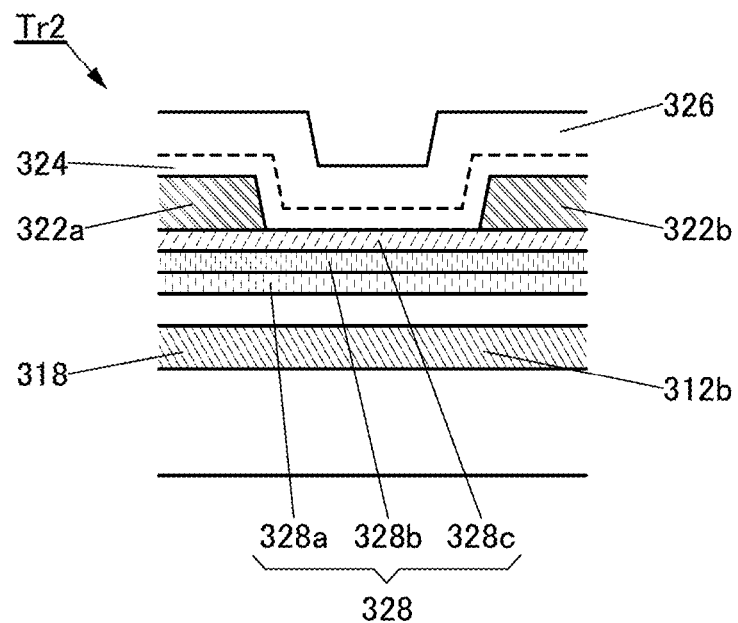
FIGS. 34A and 34B are cross-sectional views of a semiconductor device.
Figure 34B:
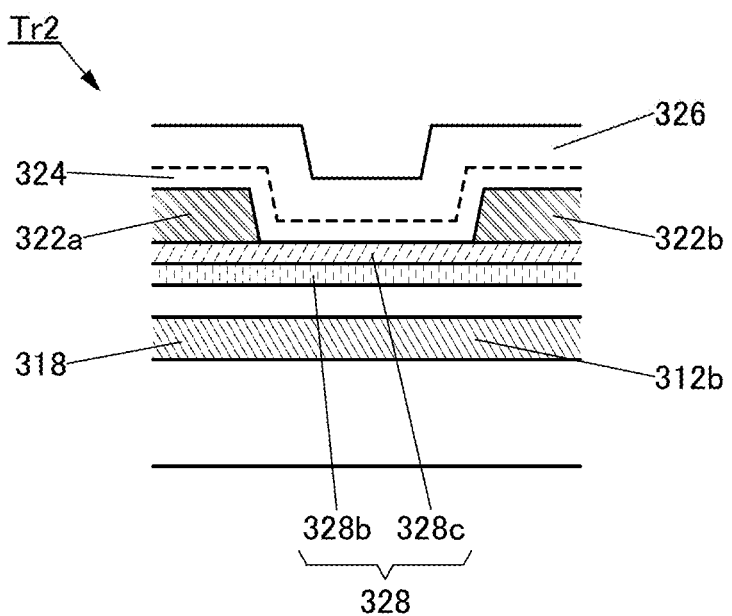

FIGS. 34A and 34B are cross-sectional views in the channel length (L) direction of the transistor Tr2 included in the semiconductor device 300.

FIG. 34A shows a structure in which the oxide semiconductor film 328 of the transistor Tr2 includes an oxide semiconductor film 328a, an oxide semiconductor film 328b over the oxide semiconductor film 328a, and an oxide semiconductor film 328c over the oxide semiconductor film 328b. That is, the oxide semiconductor film 328 has a three-layer structure.

FIG. 34B shows a structure in which the oxide semiconductor film 328 of the transistor Tr2 includes the oxide semiconductor film 328b and the oxide semiconductor film 328c over the oxide semiconductor film 328b. That is, the oxide semiconductor film has a two-layer structure.

Figure 35A:
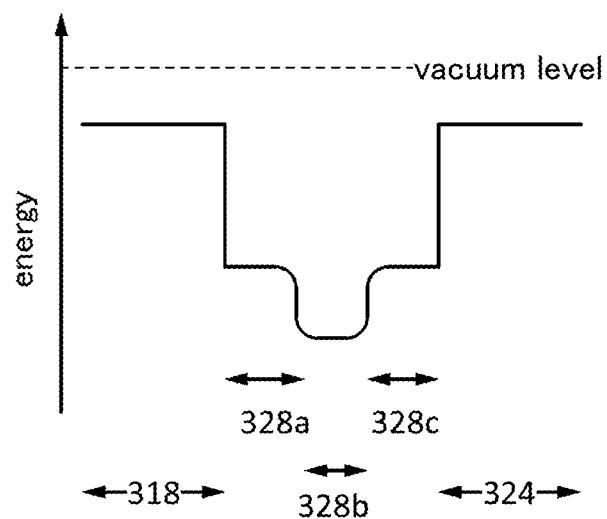
FIGS. 35A and 35B illustrate energy bands.
Figure 35B:
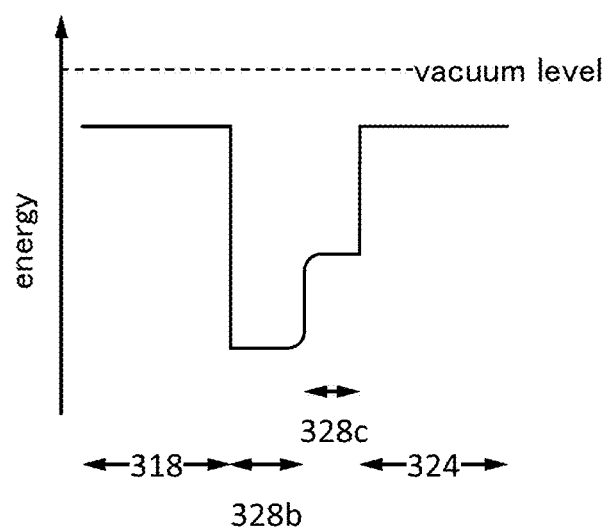
Figure 36A:
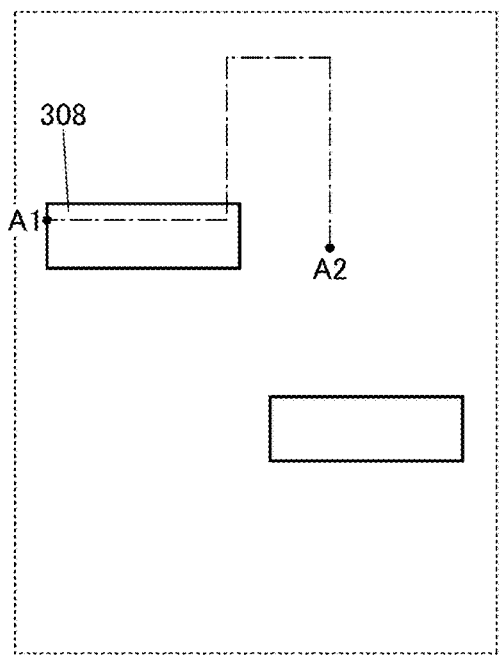
FIGS. 36A and 36B are a top view and a cross-sectional view illustrating a method for manufacturing a semiconductor device.
Figure 36B:
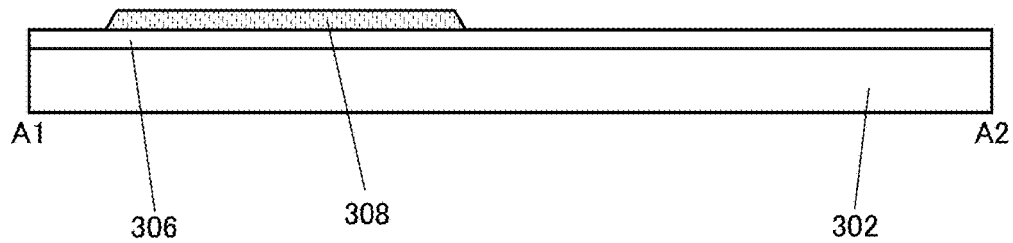

FIGS. 35A and 35B show examples of a band structure of the oxide semiconductor film 328 and an insulating film that is in contact with the oxide semiconductor film 328.

FIG. 35A shows an example of a band structure a stack-layer structure in the thickness direction of including the insulating film 318, the oxide semiconductor films 328a, 328b, and 328c, and the insulating film 324. FIG. 35B shows an example of a band structure of a stacked-layer structure in the thickness direction including the insulating film 318, the oxide semiconductor films 328b and 328c, and the insulating film 324. For easy understanding, energy level of the conduction band minimum (Ec) of each of the insulating film 318, the oxide semiconductor films 328a, 328b, and 328c, and the insulating film 324 is shown in the band structures.

FIG. 35A is a band diagram of a structure in which a silicon oxide film is used as each of the insulating films 318 and 324, an oxide semiconductor film formed using a metal oxide target having an atomic ratio of metal elements of In:Ga:Zn=1:3:2 is used as the oxide semiconductor film 328a, an oxide semiconductor film formed using a metal oxide target having an atomic ratio of metal elements of In:Ga:Zn=4:2:4.1 is used as the oxide semiconductor film 328b, and an oxide semiconductor film formed using a metal oxide target having an atomic ratio of metal elements of In:Ga:Zn=1:3:2 is used as the oxide semiconductor film 328c.

FIG. 35B is a band diagram of a structure in which a silicon oxide film is used as each of the insulating films 318 and 324, an oxide semiconductor film formed using a metal oxide target having an atomic ratio of metal elements of In:Ga:Zn=4:2:4.1 is used as the oxide semiconductor film 328b, and a metal oxide film formed using a metal oxide target having an atomic ratio of metal elements of In:Ga:Zn=1:3:2 is used as the oxide semiconductor film 328c.

As illustrated in FIGS. 35A and 35B, the energy level of the conduction band minimum gradually varies between the oxide semiconductor film 328a and the oxide semiconductor film 328b and between the oxide semiconductor film 328b and the oxide semiconductor film 328c. In other words, the energy level at the bottom of the conduction band is continuously varied or continuously connected. To obtain such a band structure, there exists no impurity, which forms a defect state such as a trap center or a recombination center, at the interface between the oxide semiconductor film 328a and the oxide semiconductor film 328b or at the interface between the oxide semiconductor film 328b and the oxide semiconductor film 328c.

To form a continuous junction between the oxide semiconductor film 328a and the oxide semiconductor film 328b and between the oxide semiconductor film 328b and the oxide semiconductor film 328c, the films are formed successively without exposure to the air by using a multi-chamber deposition apparatus (sputtering apparatus) provided with a load lock chamber.

With the band structure of FIG. 35A or FIG. 35B, the oxide semiconductor film 328b serves as a well, and a channel region is formed in the oxide semiconductor film 328b in the transistor with the stacked-layer structure.

The provision of the oxide semiconductor film 328a and/or the oxide semiconductor film 328c enables the oxide semiconductor film 328b to be distanced away from trap states.

In addition, the trap states might be more distant from the vacuum level than the energy level of the conduction band minimum (Ec) of the oxide semiconductor film 328b functioning as a channel region, so that electrons are likely to be accumulated in the trap states. When the electrons are accumulated in the trap states, the electrons become negative fixed electric charge, so that the threshold voltage of the transistor is shifted in the positive direction. Therefore, it is preferable that the energy level of the trap states be closer to the vacuum level than the energy level of the conduction band minimum (Ec) of the oxide semiconductor film 328b. Such a structure inhibits accumulation of electrons in the trap states. As a result, the on-state current and the field-effect mobility of the transistor can be increased.

The energy level of the conduction band minimum of each of the oxide semiconductor films 328a and 328c is closer to the vacuum level than that of the oxide semiconductor film 328b. Typically, a difference in energy level between the conduction band minimum of the oxide semiconductor film 328b and the conduction band minimum of each of the oxide semiconductor films 328a and 328c is 0.15 eV or more or 0.5 eV or more and 2 eV or less or 1 eV or less. That is, the difference between the electron affinity of each of the oxide semiconductor films 328a and 328c and the electron affinity of the oxide semiconductor film 328b is 0.15 eV or more or 0.5 eV or more and 2 eV or less or 1 eV or less.

In such a structure, the oxide semiconductor film 328b serves as a main path of current and functions as a channel region. In addition, since the oxide semiconductor films 328a and 328c each contain one or more metal elements that are the same as those contained in the oxide semiconductor film 328b in which a channel region is formed, interface scattering is less likely to occur at the interface between the oxide semiconductor film 328a and the oxide semiconductor film 328b or at the interface between the oxide semiconductor film 328b and the oxide semiconductor film 328c. Thus, the transistor can have high field-effect mobility because the movement of carriers is not hindered at the interface.

To prevent each of the oxide semiconductor films 328a and 328c from functioning as part of a channel region, a material having sufficiently low conductivity is used for the oxide semiconductor films 328a and 328c. Alternatively, a material which has a smaller electron affinity (a difference in energy level between the vacuum level and the conduction band minimum) than the oxide semiconductor film 328b and has a difference in energy level in the conduction band minimum from the oxide semiconductor film 328b (band offset) is used for the oxide semiconductor films 328a and 328c. Furthermore, to inhibit generation of a difference between threshold voltages due to the value of the drain voltage, it is preferable to form the oxide semiconductor films 328a and 328c using a material whose energy level of the conduction band minimum is closer to the vacuum level than that of the oxide semiconductor film 328b. For example, a difference in energy level between the conduction band minimum of the oxide semiconductor film 328b and the conduction band minimum of the oxide semiconductor films 328a and 328c is preferably 0.2 eV or more and further preferably 0.5 eV or more.

It is preferable that the oxide semiconductor films 328a and 328c not have a spinel crystal structure. This is because if the oxide semiconductor films 328a and 328c have a spinel crystal structure, constituent elements of the conductive films 322a and 322b might be diffused to the oxide semiconductor film 328b at the interface between the spinel crystal structure and another region. Note that each of the oxide semiconductor films 328a and 328c is preferably a CAAC-OS, which will be described later, in which case a higher blocking property against constituent elements of the conductive films 322a and 322b, for example, copper elements, is obtained.

The thickness of each of the oxide semiconductor films 328a and 328c is greater than or equal to a thickness that is capable of inhibiting diffusion of the constituent elements of the conductive films 322a and 322b to the oxide semiconductor film 328b, and less than a thickness that inhibits supply of oxygen from the insulating film 324 to the oxide semiconductor film 328b. For example, when the thickness of each of the oxide semiconductor films 328a and 328c is greater than or equal to 10 nm, diffusion of the constituent elements of the conductive films 322a and 322b to the oxide semiconductor film 328b can be inhibited. When the thickness of each of the oxide semiconductor films 328a and 328c is less than or equal to 100 nm, oxygen can be effectively supplied from the insulating film 324 to the oxide semiconductor film 328b.

When the oxide semiconductor films 328a and 328c are each an In-M-Zn oxide in which the atomic proportion of M (M is Al, Ga, Y, or Sn) is higher than that of In, the energy gap of each of the oxide semiconductor films 328a and 328c can be large and the electron affinity thereof can be small. Therefore, a difference in electron affinity between the oxide semiconductor film 328b and each of the oxide semiconductor films 328a and 328c may be controlled by the proportion of the element M. Furthermore, an oxygen vacancy is less likely to be generated in the oxide semiconductor layer in which the atomic proportion of M is higher than that of In because M is a metal element that is strongly bonded to oxygen.

When an In-M-Zn oxide is used for the oxide semiconductor films 328a and 328c, the proportions of In and M, not taking Zn and O into consideration, are as follows: the atomic percentage of In is preferably less than 50 atomic % and the atomic percentage of M is greater than 50 atomic % and further preferably the atomic percentage of In is less than 25 atomic % and the atomic percentage of M is greater than 75 atomic %. Alternatively, a gallium oxide film may be used as each of the oxide semiconductor films 328a and 328c.

Furthermore, in the case where each of the oxide semiconductor films 328a, 328b, and 328c is an In-M-Zn oxide, the proportion of M atoms in each of the oxide semiconductor films 328a and 328c is higher than that in the oxide semiconductor film 328b. Typically, the proportion of M atoms in each of the oxide semiconductor films 328a and 328c is 1.5 or more times, preferably twice or more times, and further preferably three or more times as high as that in the oxide semiconductor film 328b.

Furthermore, in the case where the oxide semiconductor films 328a, 328b, and 328c are each an In-M-Zn oxide, when the oxide semiconductor film 328b has an atomic ratio of In:M:Zn=$x_1$:$y_1$:$z_1$ and the oxide semiconductor films 328a and 328c each have an atomic ratio of In:M:Zn=$x_2$:$y_2$:$z_2$, $y_2/x_2$ is larger than $y_1/x_1$, preferably $y_2/x_2$ is 1.5 or more times as large as $y_1/x_1$, further preferably, $y_2/x_2$ is two or more times as large as $y_1/x_1$, or still further preferably $y_2/x_2$ is three or more times or four or more times as large as $y_1/x_1$. In this case, it is preferable that in the oxide semiconductor film 328b, $y_1$ be higher than or equal to $x_1$ because a transistor including the oxide semiconductor film 328b can have stable electric characteristics. However, when $y_1$ is three or more times as large as $x_1$, the field-effect mobility of the transistor including the oxide semiconductor film 328b is reduced. Accordingly, $y_1$ is preferably smaller than three times $x_1$.

In the case where the oxide semiconductor film 328b is an In-M-Zn oxide and a target having the atomic ratio of metal elements of In:M:Zn=$x_1$:$y_1$:$z_1$ is used for depositing the oxide semiconductor film 328b, $x_1/y_1$ is preferably greater than or equal to ⅓ and less than or equal to 6, and further preferably greater than or equal to 1 and less than or equal to 6, and $z_1/y_1$ is preferably greater than or equal to ⅓ and less than or equal to 6, and further preferably greater than or equal to 1 and less than or equal to 6. Note that when $z_1/y_1$ is greater than or equal to 1 and less than or equal to 6, a CAAC-OS to be described later is easily formed as the oxide semiconductor film 328b. Typical examples of the atomic ratio of the metal elements of the target include In:M:Zn=4:2:4.1, In:M:Zn=1:1:1.2, and In:M:Zn=3:1:2.

In the case where the oxide semiconductor films 328a and 328c are each an In-M-Zn oxide and a target having an atomic ratio of metal elements of In:M:Zn=$x_2$:$y_2$:$z_2$ is used for depositing the oxide semiconductor films 328a and 328c, $x_2/y_2$ is preferably less than $x_1/y_1$, and $z_2/y_2$ is preferably greater than or equal to ⅓ and less than or equal to 6, and further preferably greater than or equal to 1 and less than or equal to 6. When the atomic proportion of M is higher than that of indium, the energy gap of the oxide semiconductor films 328a and 328c can be large and the electron affinity thereof can be small; therefore, $y_2/x_2$ is preferably higher than or equal to 3 or higher than or equal to 4. Typical examples of the atomic ratio of the metal elements of the target include In:M:Zn=1:3:2, In:M:Zn=1:3:4, In:M:Zn=1:3:5, InM:Zn=1:3:6, In:M:Zn=1:4:2, In:M:Zn=1:4:4, In:M:Zn=1:4:5, and In:M:Zn=1:5:5.

Furthermore, in the case where the oxide semiconductor films 328a and 328c are each an In-M oxide, when a divalent metal element (e.g., zinc) is not included as M, the oxide semiconductor films 328a and 328c which do not include a spinel crystal structure can be formed. As each of the oxide semiconductor films 328a and 328c, for example, an In—Ga oxide film can be used. The In—Ga oxide can be formed by a sputtering method using an In—Ga metal oxide target (In:Ga=7:93), for example. To deposit the oxide semiconductor films 328a and 328c by a sputtering method using DC discharge, on the assumption that an atomic ratio of In:M is x:y, it is preferable that y/(x+y) be less than or equal to 0.96, and further preferably less than or equal to 0.95, for example, 0.93.

In each of the oxide semiconductor films 328a, 328b, and 328c, the proportions of the atoms in the above atomic proportion vary within a range of ±40% as an error.

The oxide semiconductor film 328 of the transistor Tr2 has a stacked-layer structure of two layers and a stacked-layer structure of three layers in FIGS. 6A and 6B, and the oxide semiconductor film 128 of the transistor Tr2 may have a similar structure.

As described above, in the semiconductor device of the present invention, the presence of the second gate electrode or the stacked-layer structures of the oxide semiconductor films can be changed. The structures of the transistors of this embodiment can be freely combined with each other.

3-8. Method for Manufacturing Semiconductor Device

Next, a method for manufacturing the semiconductor device 300 of one embodiment of the present invention is described with reference to FIGS. 36A and 36B to FIGS. 45A and 45B.

Note that FIGS. 36A, 37A, 38A, 39A, 40A, 41A, 42A, 43A, 44A, and 45A are top views illustrating the manufacturing method of the semiconductor device 100 and FIGS. 36B, 37B, 38B, 39B, 40B, 41B, 42B, 43B, 44B, and 45B are cross-sectional views illustrating the manufacturing method of the semiconductor device 300.

First, the insulating film 306 is formed over the substrate 102, and an oxide semiconductor film is formed over the insulating film 306. Then, the oxide semiconductor film is processed into an island shape, whereby the oxide semiconductor film 308 is formed (see FIGS. 36A and 36B).

In this embodiment, a glass substrate can be used as the substrate 302.

The insulating film 306 can be formed by a sputtering method, a CVD method, an evaporation method, a pulsed laser deposition (PLD) method, a printing method, a coating method, or the like as appropriate. In this embodiment, as the insulating film 306, a 400-nm-thick silicon nitride film and a 50-nm-thick silicon oxynitride film are formed with a PECVD apparatus.

After the insulating film 306 is formed, oxygen may be added to the insulating film 306. As oxygen added to the insulating film 306, an oxygen radical, an oxygen atom, an oxygen atomic ion, an oxygen molecular ion, or the like may be used. Oxygen can be added by an ion doping method, an ion implantation method, a plasma treatment method, or the like. Alternatively, a film that suppresses oxygen release may be formed over the insulating film 306, and then, oxygen may be added to the insulating film 306 through the film.

The above film that suppresses oxygen release can be formed using the following conductive material: a metal element selected from indium, zinc, gallium, tin, aluminum, chromium, tantalum, titanium, molybdenum, nickel, iron, cobalt, and tungsten; an alloy containing the metal element as a component; an alloy containing any of the metal elements in combination; a metal nitride containing the metal element; a metal oxide containing the metal element; a metal nitride oxide containing the metal element; or the like.

In the case where oxygen is added by plasma treatment in which oxygen is excited by a microwave to generate high-density oxygen plasma, the amount of oxygen added to the insulating film 306 can be increased.

The oxide semiconductor film 308 can be formed by a sputtering method, a coating method, a pulsed laser deposition method, a laser ablation method, a thermal CVD method, or the like. Note that the oxide semiconductor film can be processed into the oxide semiconductor film 308 in the following manner: a mask is formed over the oxide semiconductor film by a lithography process, and then, the oxide semiconductor film is partly etched using the mask.

Alternatively, the isolated oxide semiconductor film 308 may be directly formed over the insulating film 306 by a printing method.

As a power supply device for generating plasma when the oxide semiconductor film is formed by a sputtering method, an RF power supply device, an AC power supply device, a DC power supply device, or the like can be used as appropriate. As a sputtering gas for forming the oxide semiconductor film, a rare gas (typically argon), oxygen, or a mixed gas of a rare gas and oxygen is used as appropriate. In the mixed gas of a rare gas and oxygen, the proportion of oxygen to the rare gas is preferably increased.

To increase the crystallinity of the oxide semiconductor film formed by a sputtering method, for example, the oxide semiconductor film is preferably deposited at a substrate temperature higher than or equal to 150° C. and lower than or equal to 750° C., higher than or equal to 150° C. and lower than or equal to 450° C., or higher than or equal to 200° C. and lower than or equal to 350° C.

In this embodiment, as the oxide semiconductor film 308, a 40-nm-thick oxide semiconductor film is deposited with a sputtering apparatus using an In—Ga—Zn metal oxide (In:Ga:Zn=4:2:4.1 [atomic ratio]) as a sputtering target.

After the oxide semiconductor film 308 is formed, the oxide semiconductor film 308 may be dehydrated or dehydrogenated by heat treatment. The temperature of the heat treatment is typically higher than or equal to 150° C. and lower than the strain point of the substrate, higher than or equal to 250° C. and lower than or equal to 450° C., or higher than or equal to 300° C. and lower than or equal to 450° C.

The heat treatment can be performed in an inert gas atmosphere containing nitrogen or a rare gas such as helium, neon, argon, xenon, or krypton. Alternatively, the heat treatment may be performed in an inert gas atmosphere first, and then, in an oxygen atmosphere. It is preferable that the above inert gas atmosphere and the above oxygen atmosphere do not contain hydrogen, water, and the like. The treatment time may be longer than or equal to 3 minutes and shorter than or equal to 24 hours.

An electric furnace, an RTA apparatus, or the like can be used for the heat treatment. With the use of an RTA apparatus, the heat treatment can be performed at a temperature higher than or equal to the strain point of the substrate if the heating time is short. Therefore, the heat treatment time can be shortened.

By depositing the oxide semiconductor film while it is heated or by performing heat treatment after the formation of the oxide semiconductor film, the hydrogen concentration in the oxide semiconductor film, which is measured by secondary ion mass spectrometry, can be $5\times10^{19}$ atoms/cm$^3$ or lower, $1\times10^{19}$ atoms/cm$^3$ or lower, $5\times10^{18}$ atoms/cm$^3$ or lower, $1\times10^{18}$ atoms/cm$^3$ or lower, $5\times10^{17}$ atoms/cm$^3$ or lower, or $1\times10^{16}$ atoms/cm$^3$ or lower.

Figure 37A:
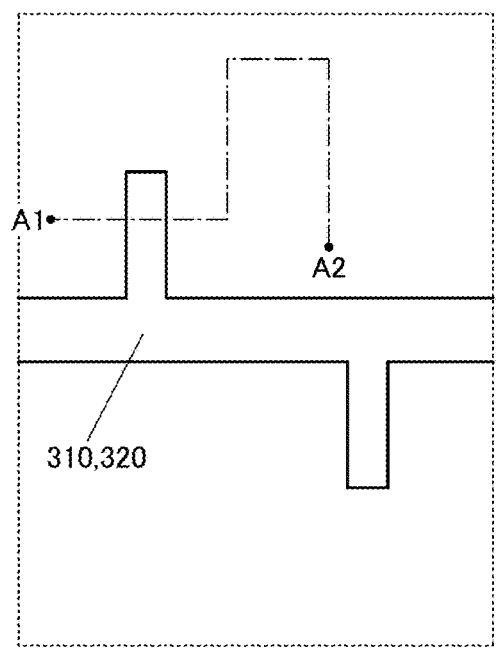
FIGS. 37A and 37B are a top view and a cross-sectional view illustrating a method for manufacturing a semiconductor device.
Figure 37B:
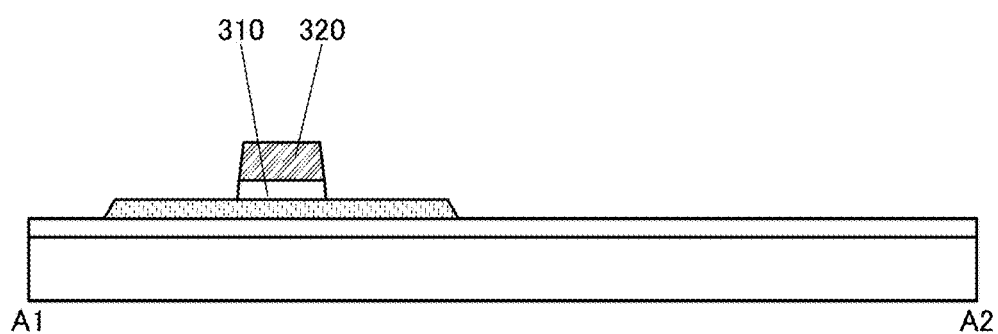

Next, an insulating film and a conductive film are formed over the insulating film 306 and the oxide semiconductor film 308 and are processed into an island shape, whereby the insulating film 310 and the conductive film 320 are formed (see FIGS. 37A and 37B).

As the insulating film 310, a silicon oxide film or a silicon oxynitride film can be formed by a PECVD method. In this case, a deposition gas containing silicon and an oxidizing gas are preferably used as a source gas. Typical examples of the deposition gas containing silicon include silane, disilane, trisilane, and silane fluoride. As examples of the oxidizing gas, oxygen, ozone, dinitrogen monoxide, and nitrogen dioxide can be given.

A silicon oxynitride film having few defects can be formed as the insulating film 310 by a PECVD method under the conditions that the flow rate of the oxidizing gas is more than 20 times and less than 100 times, or more than or equal to 40 times and less than or equal to 80 times the flow rate of the deposition gas and that the pressure in a treatment chamber is lower than 100 Pa or lower than or equal to 50 Pa.

As the insulating film 310, a dense silicon oxide film or a dense silicon oxynitride film can be formed under the following conditions: the substrate placed in a vacuum-evacuated treatment chamber of a PECVD apparatus is held at a temperature higher than or equal to 280° C. and lower than or equal to 400° C., the pressure in the treatment chamber into which a source gas is introduced is set to be higher than or equal to 20 Pa and lower than or equal to 250 Pa, preferably higher than or equal to 100 Pa and lower than or equal to 250 Pa, and a high-frequency power is supplied to an electrode provided in the treatment chamber.

The insulating film 310 may be formed by a plasma CVD method using a microwave. A microwave refers to a wave in the frequency range of 300 MHz to 300 GHz. In a microwave, electron temperature is low and electron energy is low. Furthermore, in supplied power, the proportion of power used for acceleration of electrons is low, and therefore, power can be used for dissociation and ionization of more molecules. Thus, plasma with high density (high-density plasma) can be excited. Therefore, a deposition surface and a deposit are less damaged by plasma, and the insulating film 310 with few defects can be formed.

Alternatively, the insulating film 310 can also be formed by a CVD method using an organosilane gas. As the organosilane gas, the following silicon-containing compound can be used: tetraethyl orthosilicate (TEOS) (chemical formula: $Si(OC_2H_5)_4$), tetramethylsilane (TMS) (chemical formula: $Si(CH_3)_4$), tetramethylcyclotetrasiloxane (TMCTS), octamethylcyclotetrasiloxane (OMCTS), hexamethyldisilazane (HMDS), triethoxysilane ($SiH(OC_2H_5)_3$), trisdimethylaminosilane ($SiH(N(CH_3)_2)_3$), or the like. By a CVD method using an organosilane gas, the insulating film 310 having high coverage can be formed.

In this embodiment, as the insulating film 310, a 150-nm-thick silicon oxynitride film is formed with a PECVD apparatus.

An oxide conductor (OC) is preferably used for the conductive film 320. When the conductive film 320 is formed, oxygen is transferred from the conductive film 320 to the insulating film 310.

The oxide conductive film 320 is formed preferably by a sputtering method in an atmosphere containing an oxygen gas. Formation of the conductive film 320 in an atmosphere containing an oxygen gas allows suitable addition of oxygen to the insulating film 310.

Note that the conductive film 320 can be formed using a material similar to that of the oxide semiconductor film 308 described above.

In this embodiment, as the conductive film 320, a 20-nm-thick conductive film is deposited with a sputtering apparatus using an In—Ga—Zn metal oxide (In:Ga:Zn=5:1:7 [atomic ratio]) as a sputtering target.

In this embodiment, the conductive film 320 and the insulating film 310 are processed by a dry etching method.

In the processing into the conductive film 320 and the insulating film 310, the thickness of the oxide semiconductor film 308 in a region not overlapping with the conductive film 320 is decreased in some cases.

Next, an impurity element is added from above the insulating film 306, the oxide semiconductor film 308, and the conductive film 320.

The impurity element can be added by an ion doping method, an ion implantation method, a plasma treatment method, or the like. In a plasma treatment method, an impurity element can be added using plasma generated in a gas atmosphere containing the impurity element. A dry etching apparatus, an ashing apparatus, a plasma CVD apparatus, a high-density plasma CVD apparatus, or the like can be used to generate plasma.

As a source gas of the impurity element, at least one of $B_2H_6$, $PH_3$, $CH_4$, $N_2$, $NH_3$, $AlH_3$, $AlCl_3$, $SiH_4$, $Si_2H_6$, $F_2$, HF, $H_2$, and a rare gas can be used. Alternatively, at least one of $B_2H_6$, $PH_3$, $N_2$, $NH_3$, $AlH_3$, $AlCl_3$, $F_2$, HF, and $H_2$ which are diluted with a rare gas can be used. At least one of $B_2H_6$, $PH_3$, $N_2$, $NH_3$, $AlH_3$, $AlCl_3$, $F_2$, HF, and $H_2$ which are diluted with a rare gas is used to add the impurity element to the oxide semiconductor film 308 and the conductive film 320, whereby at least one of a rare gas, hydrogen, boron, carbon, nitrogen, fluorine, phosphorus, sulfur, and chlorine can be added to the oxide semiconductor film 308 and the conductive film 320.

Alternatively, after being added to the oxide semiconductor film 308 and the conductive film 320 with the use of a rare gas, the impurity element may be added thereto with the use of at least one of $B_2H_6$, $PH_3$, $CH_4$, $N_2$, $NH_3$, $AlH_3$, $AlCl_3$, $SiH_4$, $Si_2H_6$, $F_2$, HF, and $H_2$ as a source gas.

Alternatively, after being added to the oxide semiconductor film 308 and the conductive film 320 with the use of at least one of $B_2H_6$, $PH_3$, $CH_4$, $N_2$, $NH_3$, $AlH_3$, $AlCl_3$, $SiH_4$, $Si_2H_6$, $F_2$, HF, and $H_2$ as a source gas, the impurity element may be added thereto with the use of a rare gas.

The addition of the impurity element may be controlled by appropriately setting the implantation conditions such as the accelerating voltage and the dose. For example, in the case where argon is added by an ion implantation method, the accelerating voltage may be higher than or equal to 10 kV and lower than or equal to 100 kV and the dose may be greater than or equal to $1\times10^{13}$ ions/cm$^2$ and less than or equal to $1\times10^{16}$ ions/cm$^2$, for example, $1\times10^{14}$ ions/cm$^2$. In the case where phosphorus ions are added by an ion implantation method, the accelerating voltage may be 30 kV and the dose may be greater than or equal to $1\times10^{13}$ ions/cm$^2$ and less than or equal to $5\times10^{16}$ ions/cm$^2$, for example, $1\times10^{15}$ ions/cm$^2$.

In this embodiment, argon is added to the oxide semiconductor film 308 and the conductive film 320 as the impurity element with a doping apparatus. Note that one embodiment of the present invention is not limited to the example described in this embodiment, in which argon is added as the impurity element; for example, nitrogen may be added or the step of adding impurity elements is not necessarily performed.

Next, the insulating film 314 is formed over the insulating film 306, the oxide semiconductor film 308, and the conductive film 320. Note that the oxide semiconductor film 308 is in contact with the insulating film 314 by formation of the insulating film 314 and serves as the source region 308s and the drain region 308d. The oxide semiconductor film 308 which is not in contact with the insulating film 314, i.e., the oxide semiconductor film 308 in contact with the insulating film 310 serves as the channel region 308i. Accordingly, the oxide semiconductor film 308 including the channel region 308i, the source region 308s, and the drain region 308d is formed (see FIGS. 38A and 38B).

Note that the insulating film 314 can be formed using a material which can be used for the insulating film 314. In this embodiment, as the insulating film 314, a 100-nm-thick silicon nitride film is formed with a PECVD apparatus.

With the silicon nitride film used as the insulating film 314, hydrogen and/or nitrogen in the silicon nitride film enters the conductive film 320, the source region 308s, and the drain region 308d in contact with the insulating film 314; consequently, the carrier densities in the conductive film 320, the source region 308s, and the drain region 308d can be increased.

Next, the insulating film 316 is formed over the insulating film 314.

The insulating film 316 can be formed using a material which can be used for the insulating film 316. In this embodiment, as the insulating film 316, a 300-nm-thick silicon oxynitride film is formed with a PECVD apparatus.

Figure 38A:
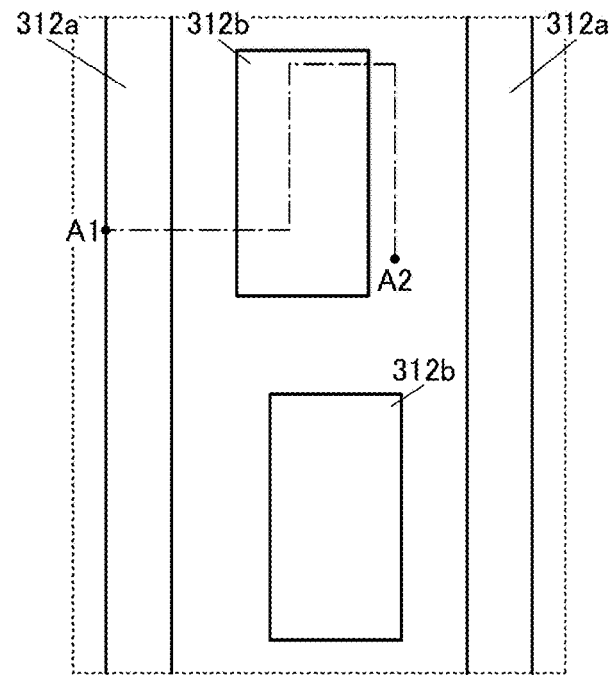
FIGS. 38A and 38B are a top view and a cross-sectional view illustrating a semiconductor device.
Figure 38B:
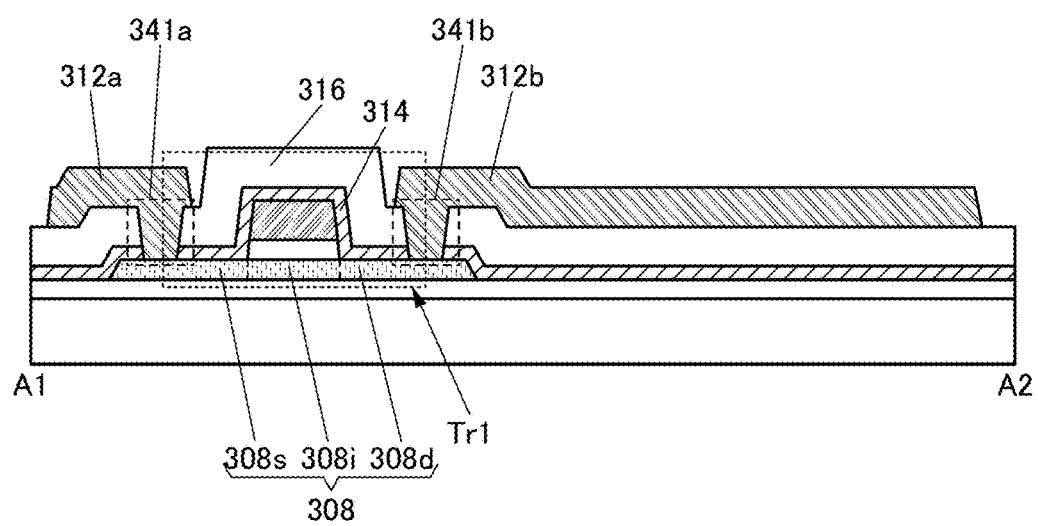

Subsequently, a mask is formed by a lithography process in a desired position over the insulating film 316, and then, the insulating film 316 and the insulating film 314 are partly etched, so that the opening 341a reaching the source region 308s and the opening 341b reaching the drain region 308d are formed (see FIGS. 38A and 38B).

As a method for etching the insulating film 316 and the insulating film 314, a wet etching method and/or a dry etching method can be used as appropriate. In this embodiment, the insulating film 316 and the insulating film 314 are processed by a dry etching method.

Next, a conductive film is formed over the insulating film 319 so as to fill the openings 341a and 341b, and masks are formed in desired regions by a lithography process. Then, part of the conductive film is etched to form the conductive films 312a and 312b (see FIGS. 38A and 38B).

The conductive films 312a and 312b can be formed using a material that can be used for the conductive films 312a and 312b. In this embodiment, as the conductive films 312a and 312b, a stack including a 50-nm-thick titanium film, a 400-nm-thick aluminum film, and a 100-nm-thick titanium film is formed with a sputtering apparatus.

As a method for processing the conductive film 312, a wet etching method and/or a dry etching method can be used as appropriate. In this embodiment, the conductive film 312 is processed into the conductive films 312a and 312b by a dry etching method.

Through the above steps, the transistor Tr1 can be manufactured.

Note that a film or a layer included in the transistor Tr1 (e.g., an insulating film, an oxide semiconductor film, or a conductive film) can be formed by a sputtering method, a chemical vapor deposition (CVD) method, a vacuum evaporation method, a pulsed laser deposition (PLD) method, or an atomic layer deposition (ALD) method. Alternatively, a coating method or a printing method can be used. Although a sputtering method and a plasma-enhanced chemical vapor deposition (PECVD) method are typical deposition methods, a thermal CVD method may also be used. As an example of a thermal CVD method, a metal organic chemical vapor deposition (MOCVD) method can be given.

Deposition by a thermal CVD method is performed in the following manner: a source gas and an oxidizer are supplied at a time to a chamber in which the pressure is set to an atmospheric pressure or a reduced pressure, and the source gas and the oxidizer react with each other in the vicinity of the substrate or over the substrate. As seen above, no plasma is generated during deposition by a thermal CVD method, which has an advantage in that no defect due to plasma damage is formed.

Deposition by an ALD method is performed in the following manner: a source gas for reaction is introduced into a chamber in which the pressure is set to an atmospheric pressure or a reduced pressure, and reaction is caused; then, this sequence is repeated. An inert gas (e.g., argon or nitrogen) may be introduced as a carrier gas together with the source gas. For example, two or more kinds of source gases may be sequentially supplied to the chamber. In this case, an inert gas is introduced between reaction of a first source gas and introduction of a second source gas to prevent the source gases from being mixed. Alternatively, the first source gas may be exhausted by vacuum evacuation instead of the introduction of the inert gas, and then, the second source gas may be introduced. The first source gas is adsorbed on the surface of the substrate and reaction is caused to form a first layer, and then, the second source gas is introduced and adsorption and reaction are caused to form a second layer over the first layer; in this manner, a thin film is formed. The sequence of the gas introduction is controlled and repeated plural times until a desired thickness is obtained, whereby a thin film with excellent step coverage can be formed. The thickness of the thin film can be precisely adjusted by the number of times the gas introduction is repeated; therefore, an ALD method is suitable for manufacturing a minute FET.

Films such as the conductive film, the insulating film, the oxide semiconductor film, and the metal oxide film can be formed by a thermal CVD method such as an MOCVD method. For example, in the case where an In—Ga—Zn—O film is deposited, trimethylindium ($In(CH_3)_3$), trimethylgallium ($Ga(CH_3)_3$), and dimethylzinc ($Zn(CH_3)_2$) are used. Without being limited to the above combination, triethylgallium ($Ga(C_2H_5)_3$) can be used instead of trimethylgallium, and diethylzinc ($Zn(C_2H_5)_2$) can be used instead of dimethylzinc.

For example, in the case where a hafnium oxide film is formed with a deposition apparatus employing an ALD method, two kinds of gases are used, namely, ozone ($O_3$) as an oxidizer and a source gas which is obtained by vaporizing liquid containing a solvent and a hafnium precursor (hafnium alkoxide or hafnium amide such as tetrakis(dimethylamide)hafnium (TDMAH, $Hf[N(CH_3)_2]_4$) or tetrakis(ethylmethylamide)hafnium).

For example, in the case where an aluminum oxide film is formed with a deposition apparatus employing an ALD method, two kinds of gases are used, namely, $H_2O$ as an oxidizer and a source gas which is obtained by vaporizing liquid containing a solvent and an aluminum precursor (e.g., trimethylaluminum (TMA, $Al(CH_3)_3$)). Examples of another material include tris(dimethylamide)aluminum, triisobutylaluminum, and aluminum tris(2,2,6,6-tetramethyl-3,5-heptanedionate).

For example, in the case where a silicon oxide film is formed with a deposition apparatus employing an ALD method, hexachlorodisilane is adsorbed on a surface on which a film is to be deposited, and radicals of an oxidizing gas ($O_2$ or dinitrogen monoxide) are supplied to react with the adsorbate.

For example, in the case where a tungsten film is formed with a deposition apparatus employing an ALD method, a $WF_6$ gas and a $B_2H_6$ gas are sequentially introduced to form an initial tungsten film, and then, a $WF_6$ gas and an $H_2$ gas are used to form a tungsten film. Note that an $SiH_4$ gas may be used instead of a $B_2H_6$ gas.

For example, in the case where an oxide semiconductor film such as an In—Ga—Zn—O film is formed with a deposition apparatus employing an ALD method, an In(CH$_3$)$_3$ gas and an O$_3$ gas are used to form an In—O layer, a Ga(CH$_3$)$_3$ gas and an O$_3$ gas are used to form a Ga—O layer, and then, a Zn(CH$_3$)$_2$ gas and an O$_3$ gas are used to form a Zn—O layer. Note that the order of these layers is not limited to this example. A mixed compound layer such as an In—Ga—O layer, an In—Zn—O layer, or a Ga—Zn—O layer may be formed using these gases. Although an H$_2$O gas which is obtained by bubbling water with an inert gas such as Ar may be used instead of an O$_3$ gas, it is preferable to use an O$_3$ gas, which does not contain H.

Next, the insulating film 318 is formed over the insulating film 316 and the conductive films 312a and 312b.

The insulating film 318 can be formed by a sputtering method, a CVD method, an evaporation method, a pulsed laser deposition (PLD) method, a printing method, a coating method, or the like as appropriate. In this embodiment, as the insulating film 318, a 400-nm-thick silicon nitride film and a 50-nm-thick silicon oxynitride film are formed with a PECVD apparatus.

After the insulating film 318 is formed, oxygen may be added to the insulating film 318. Examples of the oxygen that is added to the insulating film 318 include an oxygen radical, an oxygen atom, an oxygen atomic ion, an oxygen molecular ion, and the like. Oxygen can be added by an ion doping method, an ion implantation method, a plasma treatment method, or the like. Alternatively, after a film that suppresses release of oxygen is formed over the insulating film, oxygen may be added to the insulating film 318 through the film.

The above film that suppresses oxygen release can be formed using the following conductive material: a metal element selected from indium, zinc, gallium, tin, aluminum, chromium, tantalum, titanium, molybdenum, nickel, iron, cobalt, and tungsten; an alloy containing the metal element as a component; an alloy containing any of the metal elements in combination; a metal nitride containing the metal element; a metal oxide containing the metal element; a metal nitride oxide containing the metal element; or the like.

In the case where oxygen is added by plasma treatment, by making oxygen excited by a microwave to generate high-density oxygen plasma, the amount of oxygen added to the insulating film 318 can be increased.

Note that the insulating film 318 can have a stacked-layer structure of silicon nitride films. Specifically, the silicon nitride film can have a three-layer structure of a first silicon nitride film, a second silicon nitride film, and a third silicon nitride film. An example of the three-layer structure is as follows.

For example, the first silicon nitride film can be formed to have a thickness of 50 nm under the conditions where silane at a flow rate of 200 sccm, nitrogen at a flow rate of 2000 sccm, and an ammonia gas at a flow rate of 100 sccm are supplied as a source gas to a reaction chamber of a PECVD apparatus, the pressure in the reaction chamber is controlled to 100 Pa, and the power of 2000 W is supplied using a 27.12 MHz high-frequency power source.

The second silicon nitride film can be formed to have a thickness of 300 nm under the conditions where silane at a flow rate of 200 sccm, nitrogen at a flow rate of 2000 sccm, and an ammonia gas at a flow rate of 2000 sccm are supplied as a source gas to the reaction chamber of the PECVD apparatus, the pressure in the reaction chamber is controlled to 100 Pa, and the power of 2000 W is supplied using a 27.12 MHz high-frequency power source.

The third silicon nitride film can be formed to have a thickness of 50 nm under the conditions where silane at a flow rate of 200 sccm and nitrogen at a flow rate of 5000 sccm are supplied as a source gas to the reaction chamber of the PECVD apparatus, the pressure in the reaction chamber is controlled to 100 Pa, and the power of 2000 W is supplied using a 27.12 MHz high-frequency power source.

Note that the first silicon nitride film, the second silicon nitride film, and the third silicon nitride film can each be formed at a substrate temperature of 350° C. or lower.

When the insulating film 318 has the three-layer structure of silicon nitride films, for example, in the case where a conductive film including Cu is used as the conductive films 112a and 112b, the following effect can be obtained.

The first silicon nitride film can inhibit diffusion of a copper (Cu) element from the conductive films 112a and 112b. The second silicon nitride film has a function of releasing hydrogen and can improve withstand voltage of the insulating film functioning as a gate insulating film. The third silicon nitride film releases a small amount of hydrogen and can inhibit diffusion of hydrogen released from the second silicon nitride film.

Figure 39A:
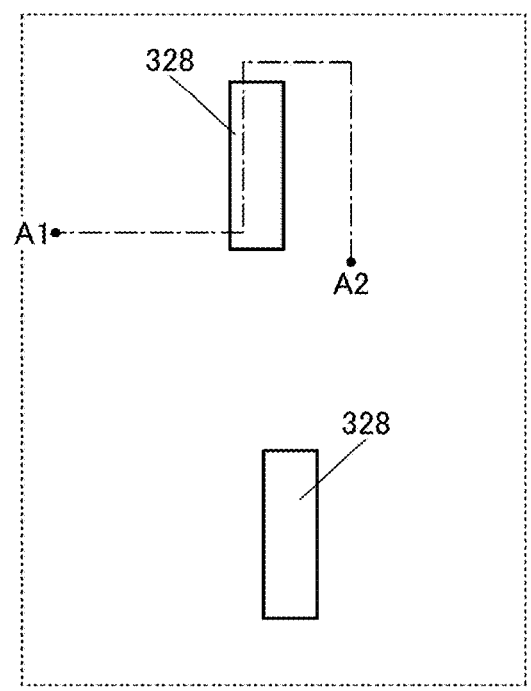
FIGS. 39A and 39B are a top view and a cross-sectional view illustrating a method for manufacturing a semiconductor device.
Figure 39B:
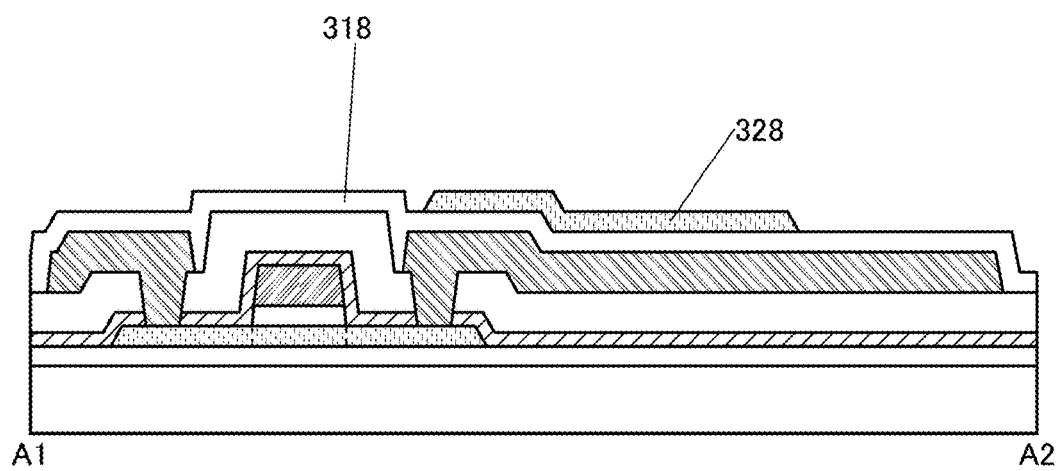
Figure 40A:
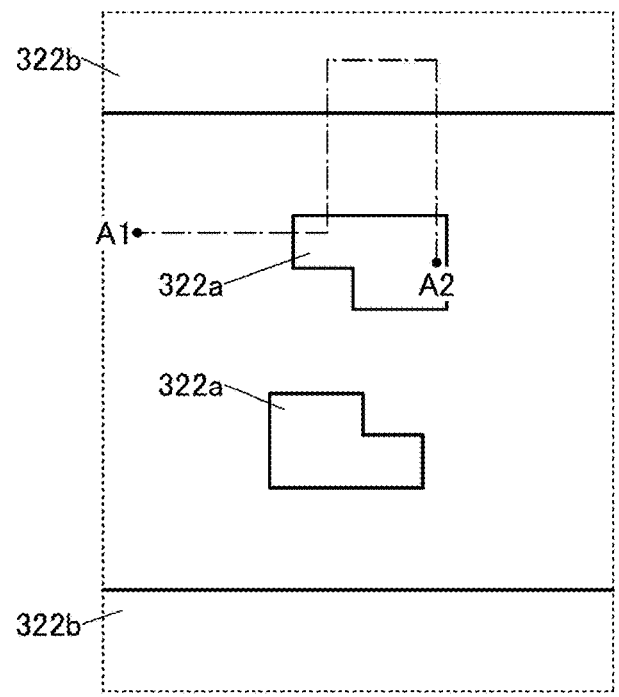
FIGS. 40A and 40B are a top view and a cross-sectional view illustrating a method for manufacturing a semiconductor device.
Figure 40B:
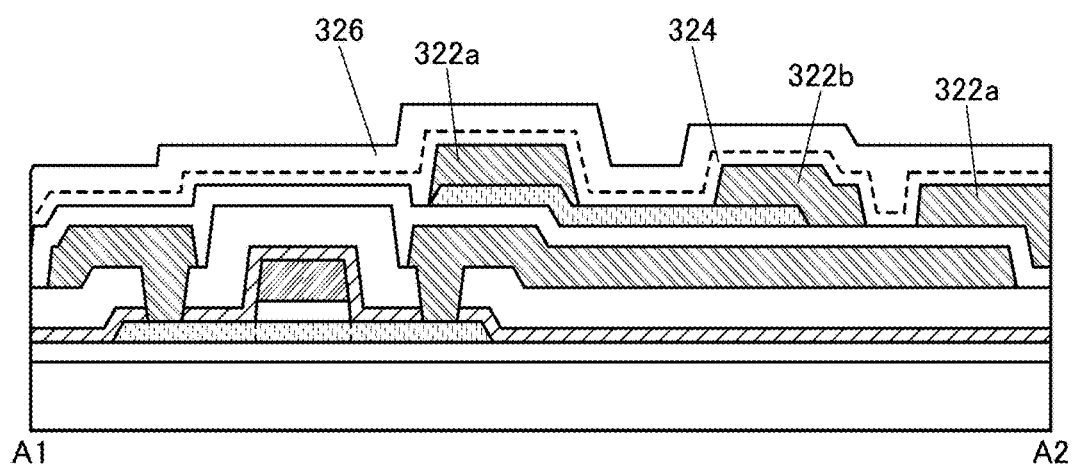
Figure 41A:
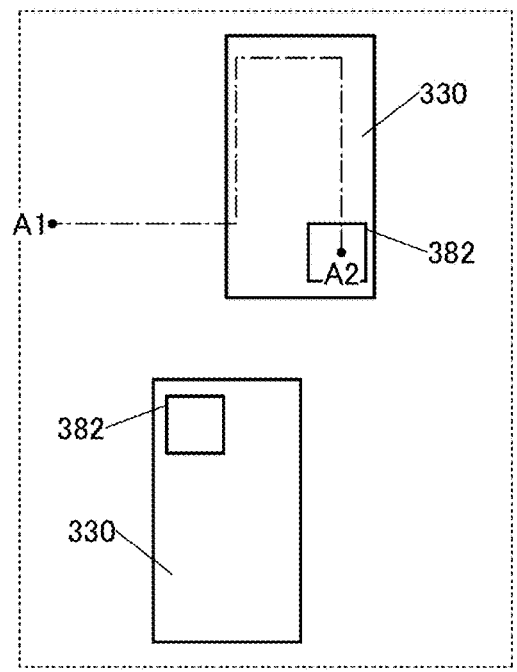
FIGS. 41A and 41B are a top view and a cross-sectional view illustrating a method for manufacturing a semiconductor device.
Figure 41B:
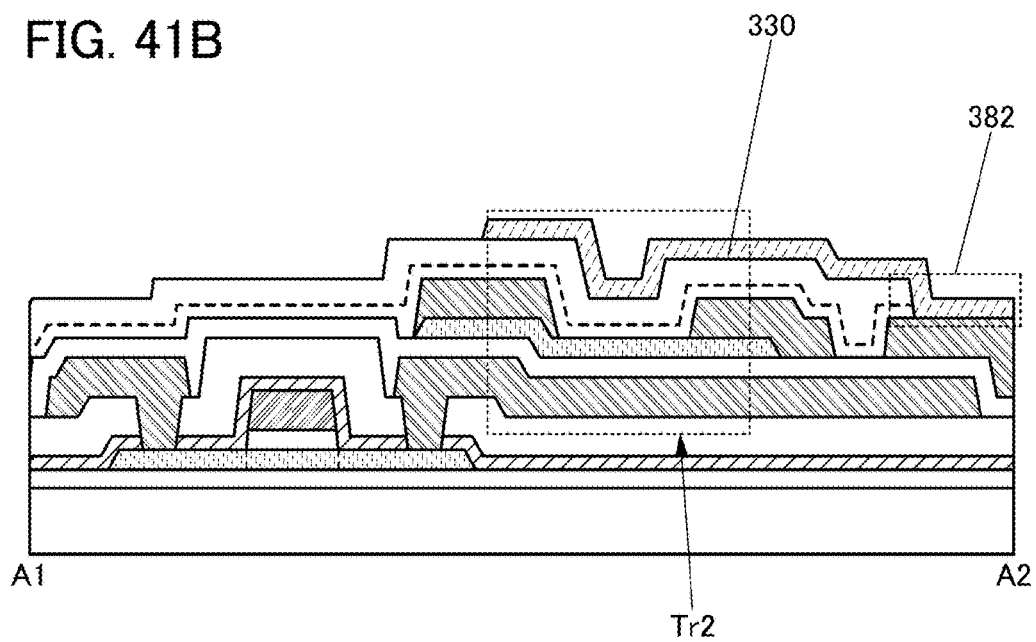
Figure 42A:
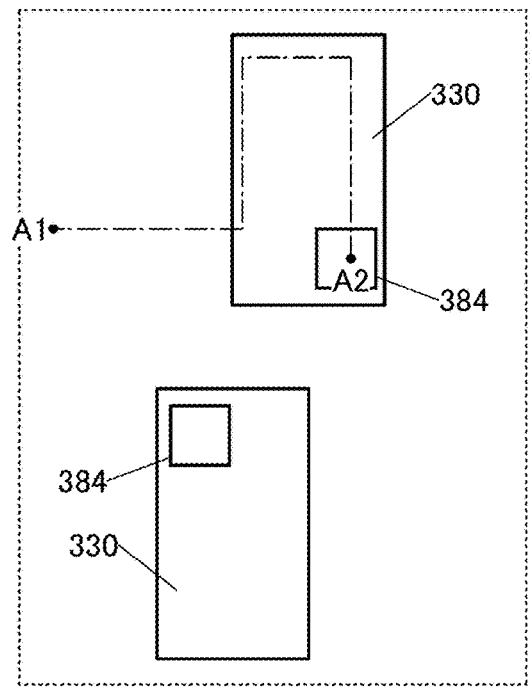
FIGS. 42A and 42B are a top view and a cross-sectional view illustrating a method for manufacturing a semiconductor device.
Figure 42B:
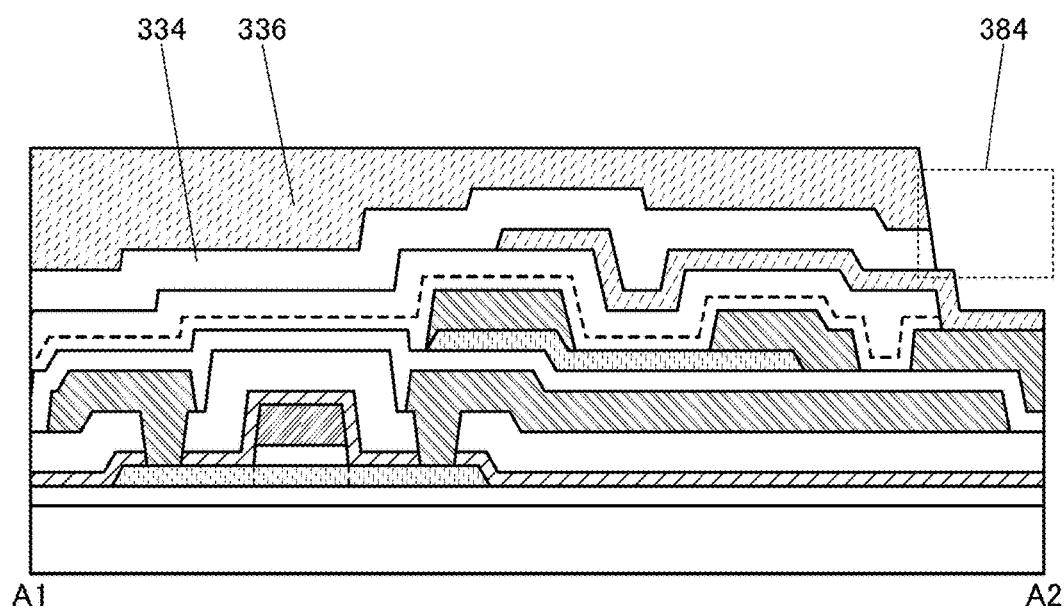

Next, the oxide semiconductor film 328 is formed over the insulating film 318 (see FIGS. 39A and 39B).

In this embodiment, an oxide semiconductor film is formed by a sputtering method using an In—Ga—Zn metal oxide target (In:Ga:Zn=4:2:4.1 [atomic ratio]). The substrate temperature at the time when the oxide semiconductor film is formed is 170° C. For the deposition gas for forming the oxide semiconductor film, an oxygen gas at a flow rate of 60 sccm and an argon gas at a flow rate of 140 sccm are used. Then, the oxide semiconductor film is processed into a desired shape, whereby the island-shaped oxide semiconductor film 328 is formed. Note that a wet-etching apparatus is used to form the oxide semiconductor film.

Next, a conductive film is formed over the insulating film 318 and the oxide semiconductor film 328 and processed into a desired shape, whereby the conductive films 112a and 112b are formed. Then, the insulating films 324 and 326 are formed over the insulating film 318, the oxide semiconductor film 328, and the conductive films 112a and 112b (see FIGS. 40A and 40B).

In this embodiment, as each of the conductive films 112a and 112b, a stacked film in which a 100-nm-thick aluminum film and a 50-nm-thick titanium film are sequentially stacked is formed by a sputtering method.

After the conductive films 112a and 112b are formed, a surface of the oxide semiconductor film 328 (on the back channel side) may be cleaned. The cleaning may be performed, for example, using an etchant such as a phosphoric acid solution. The cleaning can remove impurities (e.g., an element included in the conductive films 112a and 112b) attached to the surface of the oxide semiconductor film 328. Note that the cleaning is not necessarily performed, and thus the cleaning may be unnecessary.

In the step of forming the conductive films 112a and 112b and/or the cleaning step, the thickness of a region of the oxide semiconductor film 328 which is not covered by the conductive films 112a and 112b might be reduced.

In this embodiment, a 20-nm-thick silicon oxynitride film and a 200-nm-thick silicon oxynitride film are formed as the insulating film 324 and the insulating film 326, respectively, by a PECVD method.

Note that after the insulating film 324 is formed, the insulating film 326 is preferably formed successively without exposure to the air. After the insulating film 324 is formed, the insulating film 326 is formed in succession without exposure to the air while at least one of the flow rate of a source gas, pressure, a high-frequency power, and a substrate temperature is adjusted, whereby the concentration of impurities attributed to the atmospheric component at the interface between the insulating film 324 and the insulating film 326 can be reduced and oxygen in the insulating films 324 and 326 can be moved to the oxide semiconductor film 328; accordingly, the amount of oxygen vacancies in the oxide semiconductor film 328 can be reduced.

In this embodiment, a silicon oxynitride film is formed as the insulating film 324 by a PECVD method under the conditions where the substrate 102 is held at a temperature of 220° C., silane at a flow rate of 50 sccm and dinitrogen monoxide at a flow rate of 2000 sccm are used as a source gas, the pressure in the treatment chamber is 20 Pa, and a high-frequency power of 100 W at 13.56 MHz ($1.6 \times 10^{-2}$ W/cm$^2$ as the power density) is supplied to parallel-plate electrodes.

As the insulating film 326, a silicon oxide film or a silicon oxynitride film is formed under the following conditions: the substrate placed in the treatment chamber of the PECVD apparatus that is vacuum-evacuated is held at a temperature of higher than or equal to 180° C. and lower than or equal to 350° C., the pressure in the treatment chamber is higher than or equal to 100 Pa and lower than or equal to 250 Pa, preferably higher than or equal to 100 Pa and lower than or equal to 200 Pa, with introduction of a source gas into the treatment chamber, and a high-frequency power of greater than or equal to 0.17 W/cm$^2$ and less than or equal to 0.5 W/cm$^2$, preferably greater than or equal to 0.25 W/cm$^2$ and less than or equal to 0.35 W/cm$^2$ is supplied to an electrode provided in the treatment chamber.

As the deposition conditions of the insulating film 326, the high-frequency power having the above power density is supplied to the reaction chamber having the above pressure, whereby the degradation efficiency of the source gas in plasma is increased, oxygen radicals are increased, and oxidation of the source gas is promoted; thus, the oxygen content in the insulating film 326 becomes higher than that in the stoichiometric composition. In the film formed at a substrate temperature within the above temperature range, the bond between silicon and oxygen is weak, and accordingly, part of oxygen in the film is released by heat treatment in a later step. Thus, it is possible to form an oxide insulating film which contains more oxygen than that in the stoichiometric composition and from which part of oxygen is released by heating.

Note that the insulating film 324 functions as a protective film for the oxide semiconductor film 328 in the step of forming the insulating film 326. Therefore, the insulating film 326 can be formed using the high-frequency power having a high power density while damage to the oxide semiconductor film 328 is reduced.

Note that in the deposition conditions of the insulating film 326, when the flow rate of the deposition gas containing silicon with respect to the oxidizing gas is increased, the amount of defects in the insulating film 326 can be reduced. Typically, it is possible to form an oxide insulating film in which the amount of defects is small, i.e. the spin density of a signal which appears at g=2.001 due to a dangling bond of silicon, is lower than $6 \times 10^{17}$ spins/cm$^3$, preferably lower than or equal to $3 \times 10^{17}$ spins/cm$^3$, further preferably lower than or equal to $1.5 \times 10^{17}$ spins/cm$^3$ by ESR measurement. As a result, the reliability of the transistor Tr1 can be improved.

Heat treatment (hereinafter referred to as first heat treatment) is preferably performed after the insulating films 324 and 326 are formed. The first heat treatment can reduce nitrogen oxide included in the insulating films 324 and 326. By the first heat treatment, part of oxygen contained in the insulating films 324 and 326 can be transferred to the oxide semiconductor film 328, so that the amount of oxygen vacancies included in the oxide semiconductor film 328 can be reduced.

The temperature of the first heat treatment is typically lower than 400° C., preferably lower than 375° C., further preferably higher than or equal to 150° C. and lower than or equal to 350° C. The second heat treatment may be performed in an atmosphere of nitrogen, oxygen, ultra-dry air (air with a water content of less than or equal to 20 ppm, preferably less than or equal to 1 ppm, further preferably less than or equal to 10 ppb), or a rare gas (e.g., argon, helium). Note that it is preferable that hydrogen, water, and the like be not contained in the nitrogen, oxygen, ultra-dry air, or rare gas. An electric furnace, rapid thermal anneal (RTA), or the like can be used for the heat treatment.

Next, the opening 382 reaching the conductive film 322a is formed in a desired region of the insulating films 324 and 326. Then, the conductive film 330 is formed over the insulating film 326 and the conductive film 322a (see FIGS. 41A and 41B).

The opening 382 can be formed with a dry-etching apparatus or a wet-etching apparatus. A 100-nm-thick ITSO film is formed using a target of an oxide containing indium, tin, and silicon (also referred to as ITSO) (In$_2$O$_3$:SnO$_2$:SiO$_2$=85:10:5 [weight %]) and is processed into an island shape, whereby the conductive film 330 is obtained.

Through the above steps, the transistor Tr2 can be manufactured.

Next, a stacked film of insulating films to be the insulating films 334 and 336 is formed over the insulating film 326 and the conductive film 330. Then, the opening 384 reaching the conductive film 330 is formed in a desired region of the stacked film (see FIGS. 42A and 42B).

As the insulating film 334, a 200-nm-thick silicon oxynitride film is formed by a PECVD method. As the insulating film 336, a 1.5-μm-thick acrylic-based photosensitive resin film is formed.

The opening 384 is formed with a dry-etching apparatus or a wet-etching apparatus.

Figure 43A:
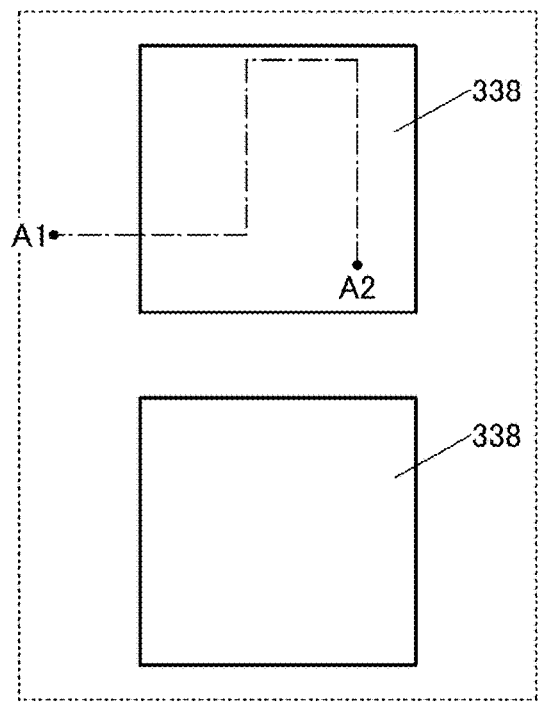
FIGS. 43A and 43B are a top view and a cross-sectional view illustrating a method for manufacturing a semiconductor device.
Figure 43B:
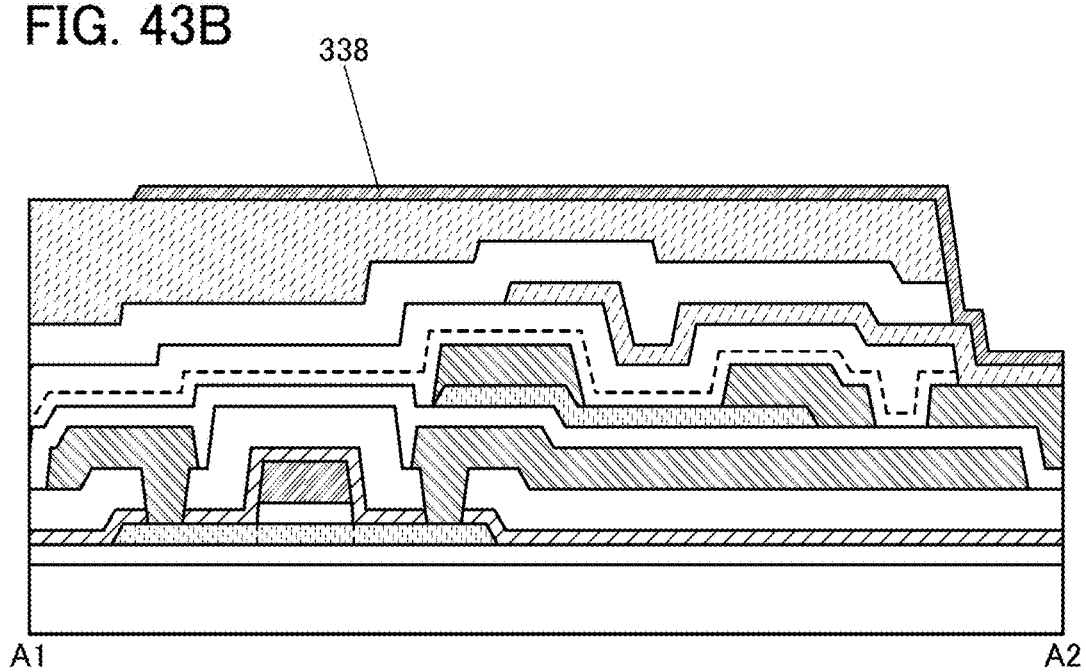

Next, a conductive film is formed over the insulating film 336 and the conductive film 330 and is processed into an island shape, whereby the conductive film 338 is formed (see FIGS. 43A and 43B).

For the conductive film 330 in this embodiment, a stacked film of a 10-nm-thick ITSO film, a 200-nm-thick reflective metal film (a metal film containing silver, palladium, and copper is used here), and a 10-nm-thick ITSO film is used. The stacked film is processed into the conductive film 330 with a wet-etching apparatus.

Figure 44A:
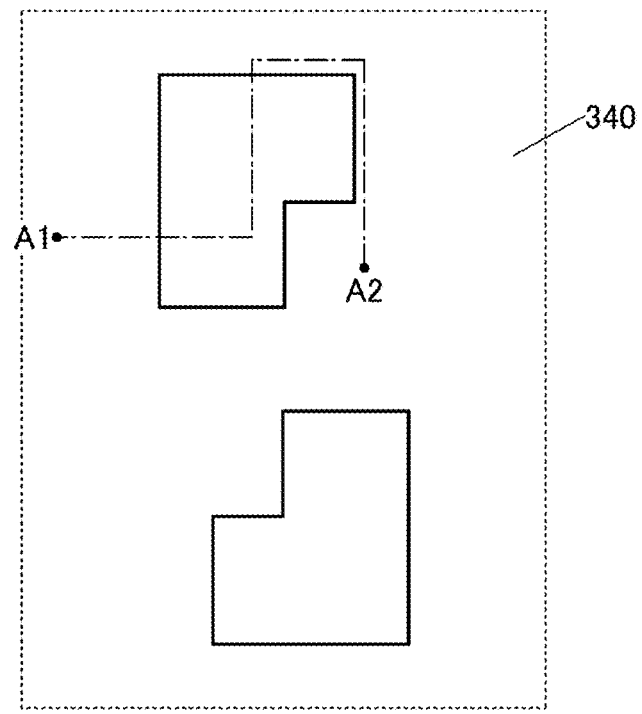
FIGS. 44A and 44B are a top view and a cross-sectional view illustrating a method for manufacturing a semiconductor device.
Figure 44B:
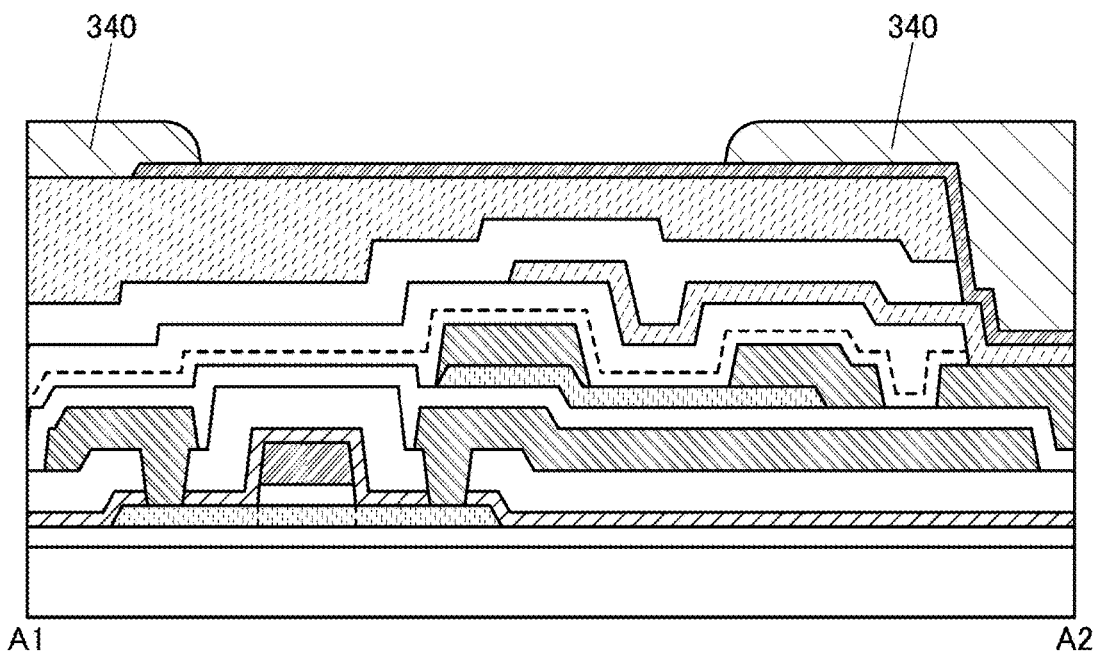

Next, the island-shaped insulating film 340 is formed over the insulating film 336 and the conductive film 330 (see FIGS. 44A and 44B).

As the insulating film 340, a 1.5-μm-thick polyimide-based photosensitive resin film is used.

Figure 45A:
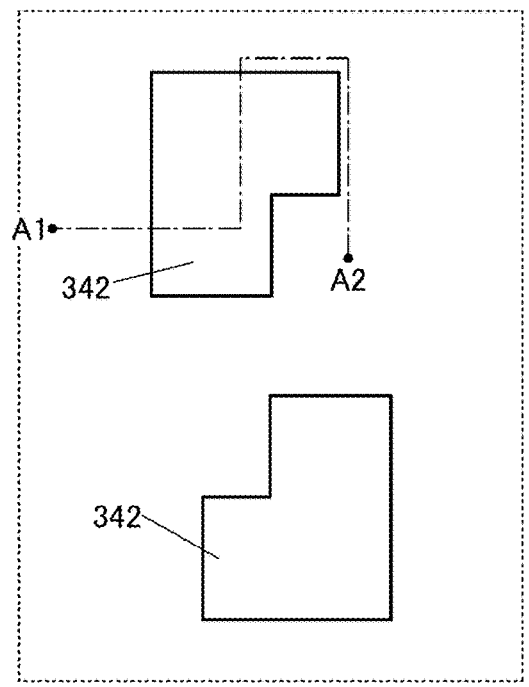
FIGS. 45A and 45B are a top view and a cross-sectional view illustrating a method for manufacturing a semiconductor device.
Figure 45B:
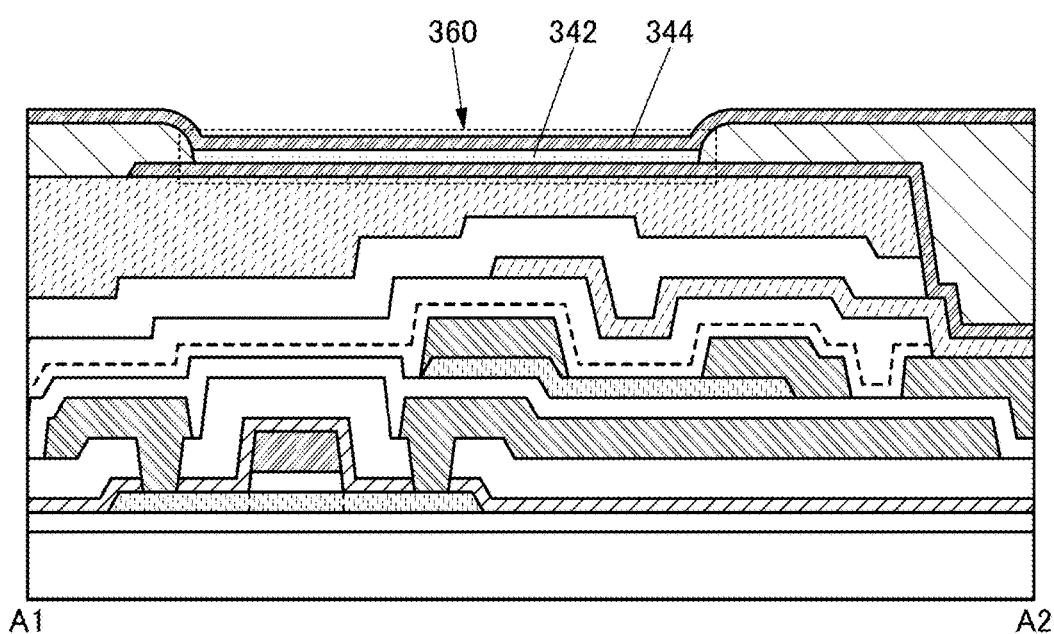

Next, the EL layer 342 is formed over the conductive film 330, and then, the conductive film 344 is formed over the insulating film 340 and the EL layer 342, whereby the light-emitting element 360 is obtained (see FIGS. 45A and 45B).

Note that a method for manufacturing the light-emitting element 360 is described in Embodiment 5.

Through the above manufacturing steps, the semiconductor device 300 shown in FIGS. 30A and 30B can be manufactured.

Note that the structure and method described in this embodiment can be used in appropriate combination with the structure and method described in any of the other embodiments.

Embodiment 4

In this embodiment, a semiconductor device that is one embodiment of the present invention and a method of manufacturing the semiconductor device are described with reference to FIGS. 46A and 46B to FIGS. 53A and 53B.

4-1. Structure Example 1 of Semiconductor Device

Figure 46A:
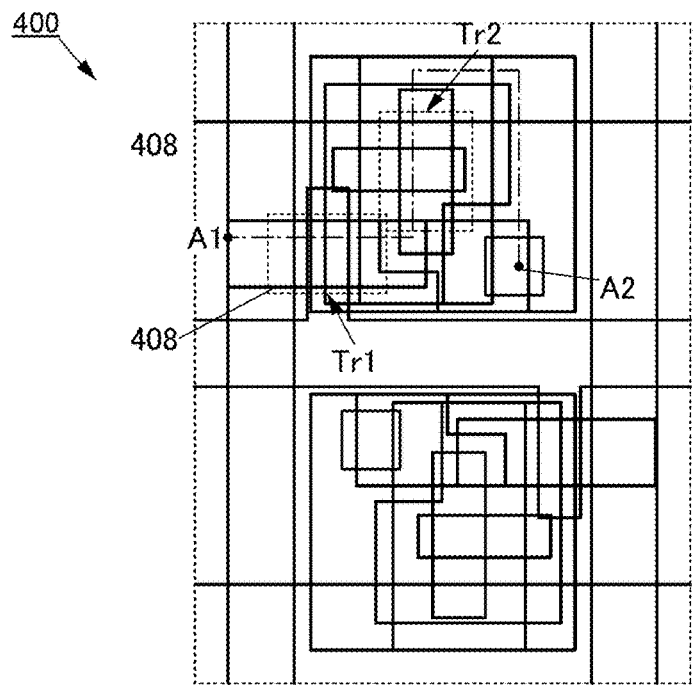
FIGS. 46A and 46B are a top view and a cross-sectional view illustrating a semiconductor device.
Figure 46B:
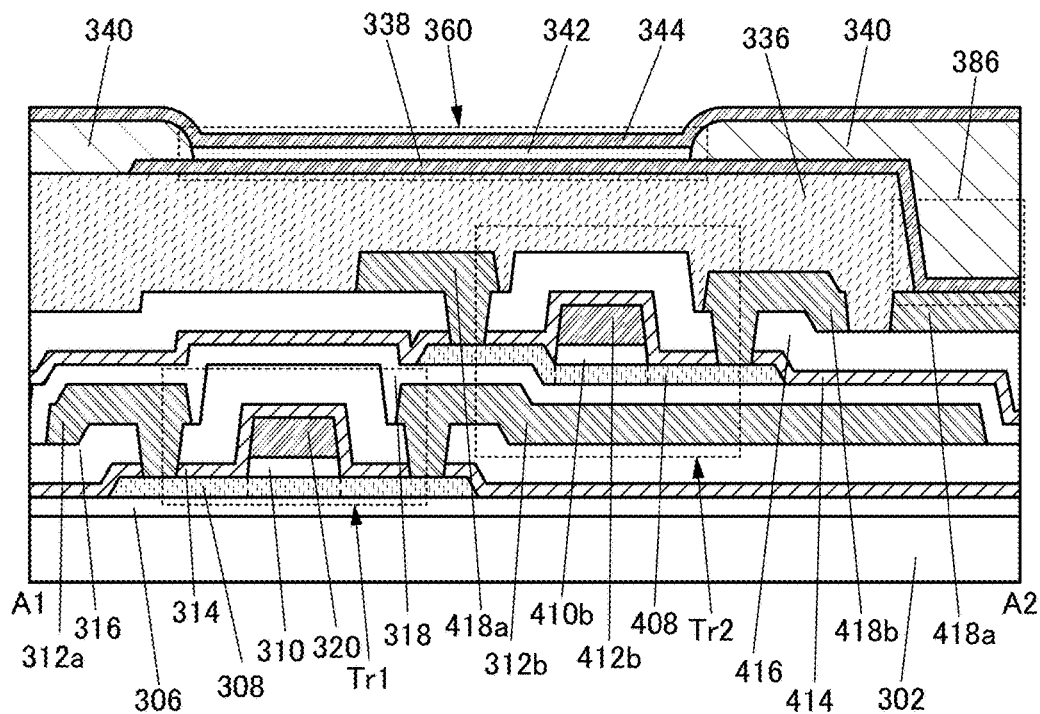

FIG. 46A is a top view of a semiconductor device 400 of one embodiment of the present invention. FIG. 46B is a cross-sectional view taken along dashed dotted line A1-A2 in FIG. 46A. Note that cross sections in a channel length (L) direction of the transistor Tr1 and in a channel length (L) direction of the transistor Tr2 are included in FIG. 46B.

The semiconductor device 400 illustrated in FIGS. 46A and 46B includes the transistor Tr1 and the transistor Tr2 which overlaps at least partly with the transistor Tr1. Note that the transistor Tr1 and the transistor Tr2 are top-gate transistors.

Since the transistor Tr1 overlaps at least partly with the transistor Tr2, the transistor area can be reduced.

The transistor Tr1 includes the insulating film 306 over the substrate 302, the oxide semiconductor film 308 over the insulating film 306, the insulating film 310 over the oxide semiconductor film 308, the conductive film 320 over the insulating film 310, and the insulating film 314 over the insulating film 306, the oxide semiconductor film 308, and the conductive film 320. Like in Embodiment 3, the oxide semiconductor film 308 includes the channel region 308$i$ overlapping with the conductive film 320 and in contact with the insulating film 314, the source region 308$s$ in contact with the insulating film 314, and the drain region 308$d$ in contact with the insulating film 314.

In addition, the transistor Tr1 includes the insulating film 316 over the insulating film 314, the conductive film 312$a$ electrically connected to the oxide semiconductor film 308 in the opening 341$a$ that is formed in the insulating films 314 and 316, the conductive film 312$b$ electrically connected to the oxide semiconductor film 308 in an opening 341$b$ that is formed in the insulating films 314 and 316, and the insulating film 318 over the insulating film 316, the conductive film 312$a$, and the conductive film 312$b$.

The transistor Tr2 includes the conductive film 312$b$, the insulating film 318 over the conductive film 312$b$, an oxide semiconductor film 408 over the insulating film 318, an insulating film 410$b$ over the oxide semiconductor film 408, a conductive film 412$b$ over the insulating film 410$b$, and an insulating film 414 over the oxide semiconductor film 408 and the conductive film 412$b$. Like the oxide semiconductor film 308, the oxide semiconductor film 408 includes a channel region 408$i$ overlapping with the conductive film 412$b$ and in contact with the insulating film 410$b$, the source region 408$s$ in contact with the insulating film 414, and the drain region 408$d$ in contact with the insulating film 414.

Furthermore, the transistor Tr2 includes an insulating film 416 over the insulating film 414, a conductive film 418$a$ provided over the insulating film 416 and electrically connected to the oxide semiconductor film 408, and a conductive film 418$b$ provided over the insulating film 416 and electrically connected to the oxide semiconductor film 408.

Note that as illustrated in FIGS. 46A and 46B, the oxide semiconductor film 308 and the oxide semiconductor film 408 partly overlap with each other.

The oxide semiconductor film 308 can have a structure similar to that described in Embodiment 3. The oxide semiconductor layer 308 can have a structure similar to that of the oxide semiconductor film 328 described in Embodiment 3.

Thus, one or both of the field-effect mobilities of the transistor Tr1 and the transistor Tr2 can exceed 10 cm$^2$/Vs, preferably 30 cm$^2$/Vs.

For example, when the transistor with high field-effect mobility is used for a gate driver of a display device that generates a gate signal, the display device can have a narrow frame. When the transistor with high field-effect mobility is used for a source driver (specifically, a demultiplexer connected to an output terminal of a shift register included in the source driver) that supplies a signal from a signal line included in a display device, the number of wirings connected to the display device can be reduced. In addition, when the transistor with high field-effect mobility is used as one or both of a selection transistor and a driver transistor of a pixel circuit included in the display device, the display quality of the display device can be increased.

The semiconductor device 400 shown in FIGS. 46A and 46B can be favorably used for a pixel circuit of a display device. The layout shown in FIGS. 46A and 46B can increase the pixel density of the display device. For example, even when the pixel density of a display device exceeds 1000 ppi (pixel per inch) or 2000 ppi, the aperture ratio of pixels can be increased owing to the structure shown in FIGS. 46A and 46B. Note that ppi is a unit for describing the number of pixels per inch.

Note that when the semiconductor device 400 shown in FIGS. 46A and 46B is used in a pixel circuit of a display device, a structure similar to the pixel circuit shown in FIG. 31 can be used.

When the semiconductor device 400 shown in FIGS. 46A and 46B is used for a pixel of a display device, the channel length (L) and the channel width (W) of a transistor, the line widths of a wiring and an electrode connected to the transistor, and the like can be relatively large. The line width and the like can be larger when the transistor Tr1 and the transistor Tr2 overlap with each other at least partly as shown in FIGS. 46A and 46B than those when the transistor Tr1 and the transistor Tr2 are provided on the same plane, for example; thus, variations in processing size can be reduced.

In addition, one or both of a conductive film and an insulating film can be shared by the transistor Tr1 and the transistor Tr2; thus, the number of masks or steps can be reduced.

For example, in the transistor Tr1, the conductive film 320 serves as the gate electrode, the conductive film 312$a$ serves as the source electrode, and the conductive film 312$b$ serves as the drain electrode. In addition, in the transistor Tr1, the insulating film 310 serves as a gate insulating film. In the transistor Tr2, the conductive film 312$b$ serves as the first gate electrode, the conductive film 418$a$ serves as the source electrode, the conductive film 418$b$ serves as the drain electrode, and the conductive film 412$b$ serves as the second gate electrode. In addition, in the transistor Tr2, the insulating film 318 serves as a first gate insulating film and the insulating film 410$b$ serves as a second gate insulating film.

Note that in this specification and the like, the insulating film 410$b$ may be referred to as a fourth insulating film.

An insulating film 336 is provided over the insulating film 416 and the conductive films 418a and 418b. An opening 386 is provided in the insulating film 336 so as to reach the conductive film 418b. In addition, a conductive film 338 is provided over the insulating film 336. Note that the conductive film 338 is connected to the conductive film 418a in the opening 386.

In addition, an insulating film 340, an EL layer 342, and a conductive film 344 are provided over the conductive film 338. The light-emitting element 360 is composed of the conductive film 338, the EL layer 342, and the conductive film 344.

Each of the transistor Tr1 and the transistor Tr2 shown in FIGS. 46A and 46B may have the S-channel structure described in Embodiment 3, which is not illustrated in a drawing.

The transistor Tr1 and the transistor Tr2 which are included in the semiconductor device 400 in this embodiment can be combined with the transistor Tr1 and the transistor Tr2 which are included in the semiconductor device 300 in Embodiment 3.

As described above, in the semiconductor device of one embodiment of the present invention, a plurality of transistors are stacked to be reduced in the transistor area. In addition, since one or both of an insulating film and a conductive film are shared by the plurality of transistors, the number of masks or steps can be reduced.

4-2. Components of Semiconductor Device

Next, components of the semiconductor device of this embodiment are described in detail.

[Conductive Film]

The conductive films 412b, 418a, and 418b can be formed using the materials of the conductive films described in Embodiment 3 (the conductive film 312a, the conductive film 312b, the conductive film 322a, the conductive film 322b, the conductive film 330, the conductive film 338, and the conductive film 344). In particular, an oxide conductive (OC) is preferably used for the conductive film 412b because oxygen can be added to the insulating film 410b.

[Insulating Films]

The insulating films 414, 416, and 410b can be formed using the materials of the insulating films described in Embodiment 3 (the insulating film 306, the insulating film 314, the insulating film 316, the insulating film 318, the insulating film 324, the insulating film 326, the insulating film 334, the insulating film 336, and the insulating film 340).

Since the insulating film 318 is in contact with the oxide semiconductor film 408, an oxide insulating film, particularly a silicon oxide film or a silicon oxynitride film is preferably used as the insulating film 318. An oxide insulating film is preferably used as each of the insulating film 410b. The insulating film 410b preferably includes a region containing oxygen in excess of that in the stoichiometric composition (oxygen-excess region). A silicon oxide film or a silicon oxynitride film is preferably used as each of the insulating film 210a and 210b.

The insulating film 414 contains one or both of hydrogen and nitrogen. Alternatively, the insulating film 414 contains nitrogen and silicon. The insulating film 414 has a function of blocking oxygen, hydrogen, water, alkali metal, alkaline earth metal, or the like. Since the oxide semiconductor film 408 is in contact with the insulating film 414, one or both of hydrogen and nitrogen in the insulating film 414 is transferred to the oxide semiconductor film 408, so that the oxide semiconductor film 408 is increased in carrier density. Accordingly, a region of the oxide semiconductor film 408 in contact with the insulating film 414 serves as a source region or a drain region.

[Oxide Semiconductor Film]

The oxide semiconductor film 408 can be formed using the materials of the oxide semiconductor films described in Embodiment 3 (the oxide semiconductor film 308 and the oxide semiconductor film 328).

4-3. Method for Manufacturing Semiconductor Device

Next, a method for manufacturing the semiconductor device 400 of one embodiment of the present invention is described with reference to FIGS. 47A and 47B to FIGS. 53A and 53B.

Note that FIGS. 47A, 48A, 49A, 50A, 51A, 52A, and 53A are top views illustrating the manufacturing method of the semiconductor device 400 and FIGS. 47B, 48B, 49B, 50B, 51B, 52B, and 53B are cross-sectional views illustrating the manufacturing method of the semiconductor device 400.

The method described in Embodiment 3 can be referred to for a method for manufacturing the transistor Tr1. Thus, Embodiment 3 and FIGS. 36A and 36B to FIGS. 38A and 38B can be referred to for methods for forming, over the substrate 302, the insulating film 306, the oxide semiconductor film 308, the insulating film 310, the conductive film 320, the insulating film 314, the conductive film 312a, the conductive film 312b, and the insulating film 318.

Then, the insulating film 318 is formed over the insulating film 316 and the conductive films 312a and 312b. The insulating film 318 can be formed by a method similar to the method described in Embodiment 3.

Figure 47A:
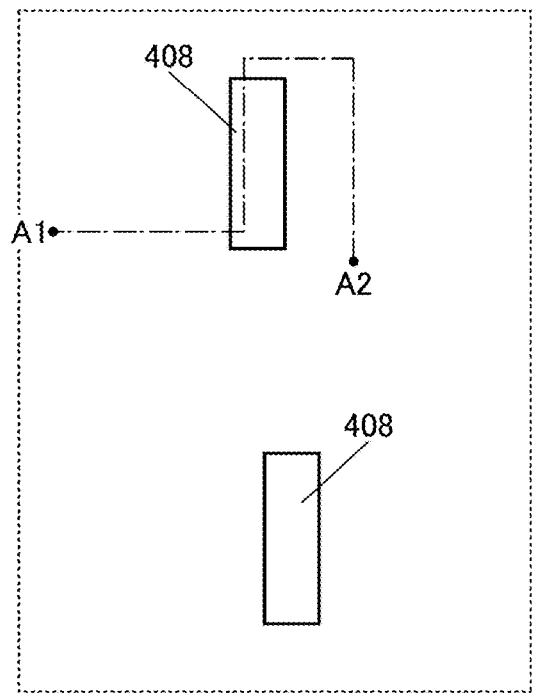
FIGS. 47A and 47B are a top view and a cross-sectional view illustrating a method for manufacturing a semiconductor device.
Figure 47B:
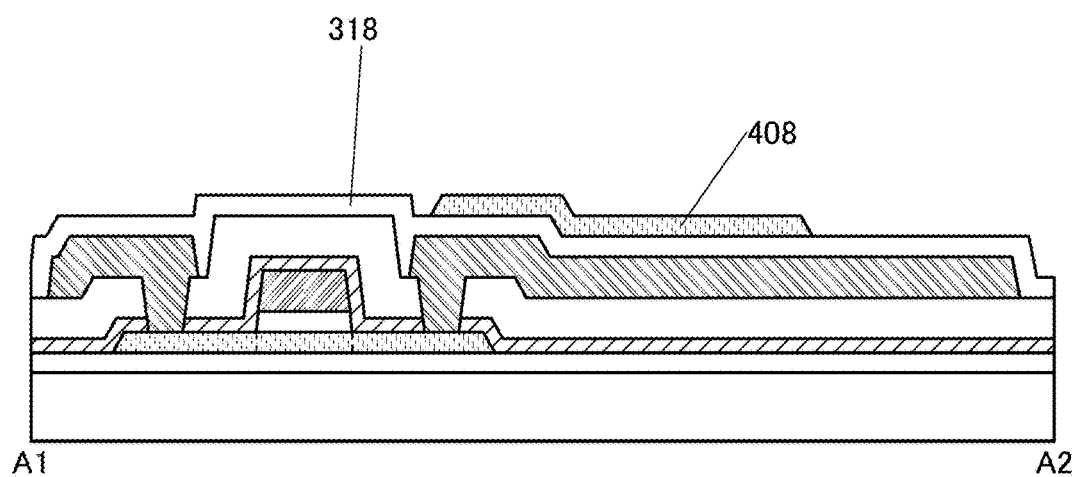
Figure 48A:
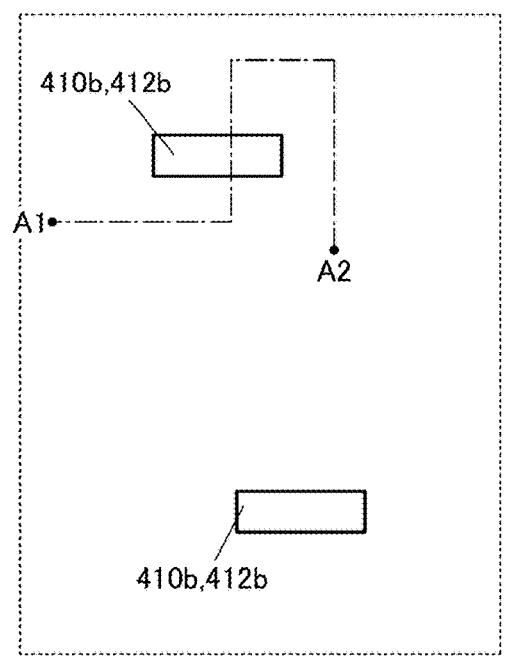
FIGS. 48A and 48B are a top view and a cross-sectional view illustrating a semiconductor device.
Figure 48B:
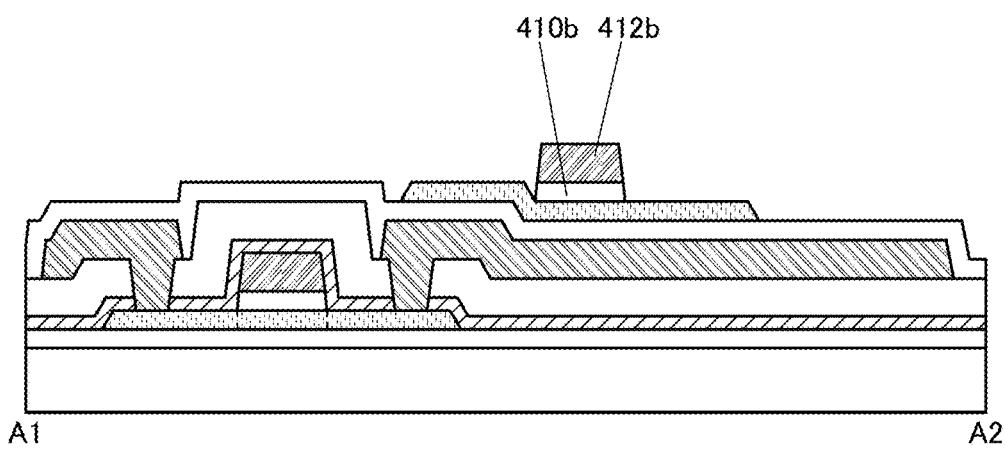

Then, the oxide semiconductor film 408 is formed over the insulating film 318 (see FIGS. 47A and 47B).

In this embodiment, an oxide semiconductor film is formed by a sputtering method using an In—Ga—Zn metal oxide target (In:Ga:Zn=4:2:4.1 [atomic ratio]). The substrate temperature at the time when the oxide semiconductor film is formed is 170° C. For the deposition gas for forming the oxide semiconductor film, an oxygen gas at a flow rate of 60 sccm and an argon gas at a flow rate of 140 sccm are used. Then, the oxide semiconductor film is processed into a desired shape, whereby the island-shaped oxide semiconductor film 408 is formed. Note that a wet-etching apparatus is used to form the oxide semiconductor film.

Next, a stacked-layer film including an insulating film and a conductive film is formed over the insulating film 318 and the oxide semiconductor film 408. Then, the stacked-layer film is processed into a desired shape to form the island-shaped insulating films 410a and 412b (see FIGS. 48A and 48B).

Next, the insulating film 414 and 416 are formed over the insulating film 318, the oxide semiconductor film 408, and the conductive films 412b. Note that the oxide semiconductor film 408 is in contact with the insulating film 414 by formation of the insulating film 414 and serves as the source region 408s and the drain region 408d. The oxide semiconductor film 408 which is not in contact with the insulating film 414, i.e., the oxide semiconductor film 408 in contact with the insulating film 410b serves as the channel region 408i. Accordingly, the oxide semiconductor film 408 including the channel region 408i, the source region 408s, and the drain region 408d is formed (see FIGS. 49A and 49B).

In this embodiment, a 50-nm-thick silicon oxynitride film is formed as the insulating film 412b with a PECVD apparatus. A 200-nm-thick oxide semiconductor film is formed as the conductive film 412b with a sputtering apparatus. Note that the composition of the oxide semiconductor film is the same as that of the oxide semiconductor film 408. As the insulating film 414, a 100-nm-thick silicon nitride film is formed with a PECVD apparatus. As the insulating film 416, a 200-nm-thick silicon oxynitride film is formed with a PECVD apparatus.

With the silicon nitride film used as the insulating film 414, one or both of hydrogen and nitrogen in the silicon nitride film is transferred to the conductive film 412b, the source region 408s, and the drain region 408d that are in contact with the insulating film 414, so that the carrier density of each of the conductive film 412b, the source region 408s, and the drain region 408d can be increased. As a result, part of the oxide semiconductor film 408 and the conductive film 412b become oxide conductors (OCs).

Note that the insulating film 410b is formed in a self-aligned manner using the conductive film 412b as a mask.

Figure 49A:
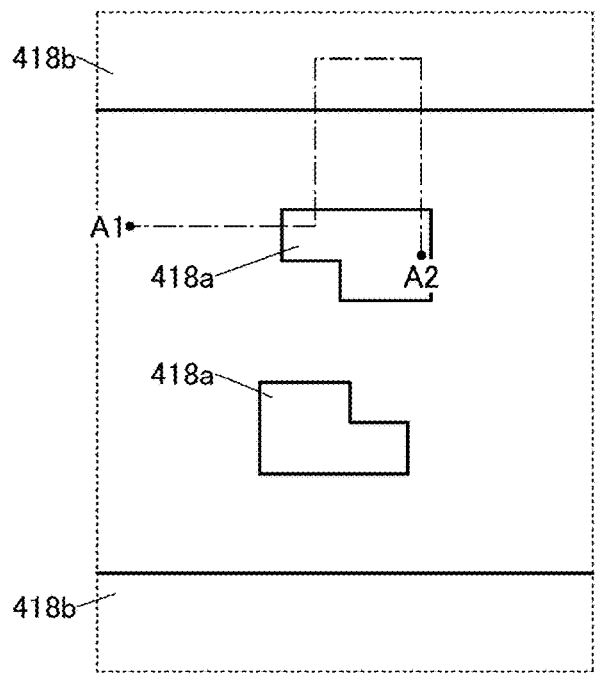
FIGS. 49A and 49B are a top view and a cross-sectional view illustrating a method for manufacturing a semiconductor device.
Figure 49B:
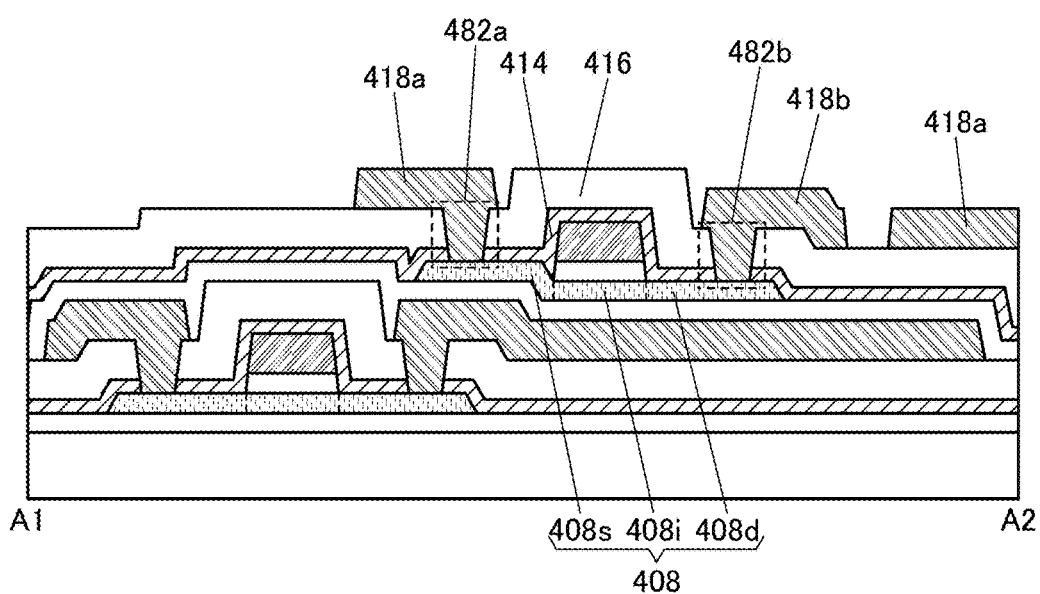
Figure 50A:
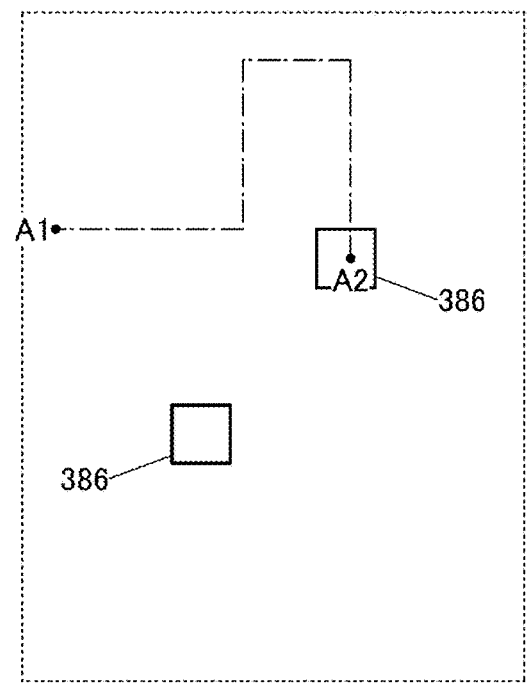
FIGS. 50A and 50B are a top view and a cross-sectional view illustrating a method for manufacturing a semiconductor device.
Figure 50B:
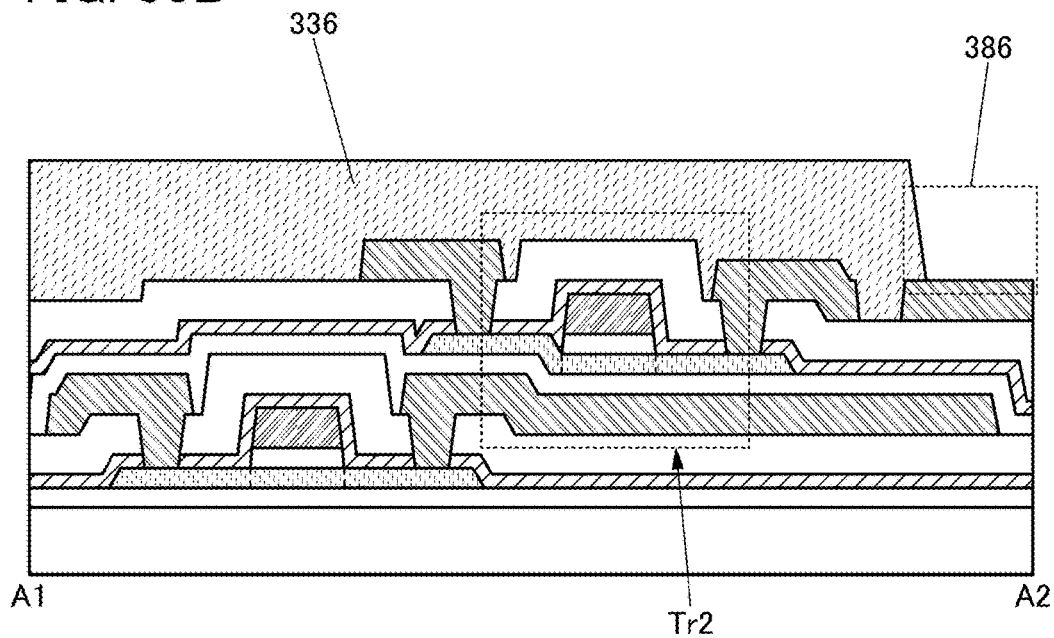

Next, openings 482a and 482b reaching the oxide semiconductor film 408 are formed in desired regions of the insulating films 414 and 416 (see FIGS. 49A and 49B).

The openings 482a and 482b are formed with a dry-etching apparatus or a wet-etching apparatus.

Next, a conductive film is formed over the insulating film 416 and the oxide semiconductor film 408 so as to fill the openings 482a and 482b and is processed into an island shape, so that the conductive films 418a and 418b are formed (see FIGS. 49A and 49B).

A 100-nm-thick tungsten film and a 200-nm-thick copper film are formed as the conductive films 418a and 418b by a sputtering method.

Through the process, the transistor Tr2 can be manufactured.

Next, the insulating film 336 is formed over the insulating film 416 and the conductive films 418a and 418b. Then, a desired region of the insulating film 336 is processed to form an opening 386 reaching the conductive film 418b (see FIGS. 50A and 50B).

In this embodiment, a 1.5-µm-thick acrylic-based photosensitive resin film is formed as the insulating film 336.

Figure 51A:
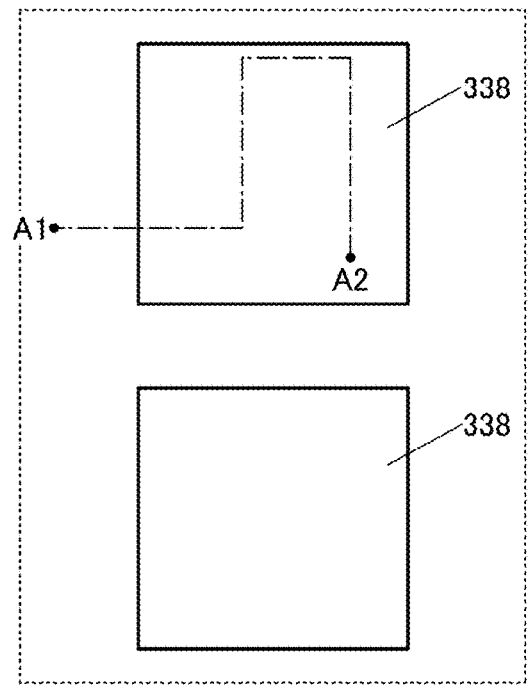
FIGS. 51A and 51B are a top view and a cross-sectional view illustrating a method for manufacturing a semiconductor device.
Figure 51B:
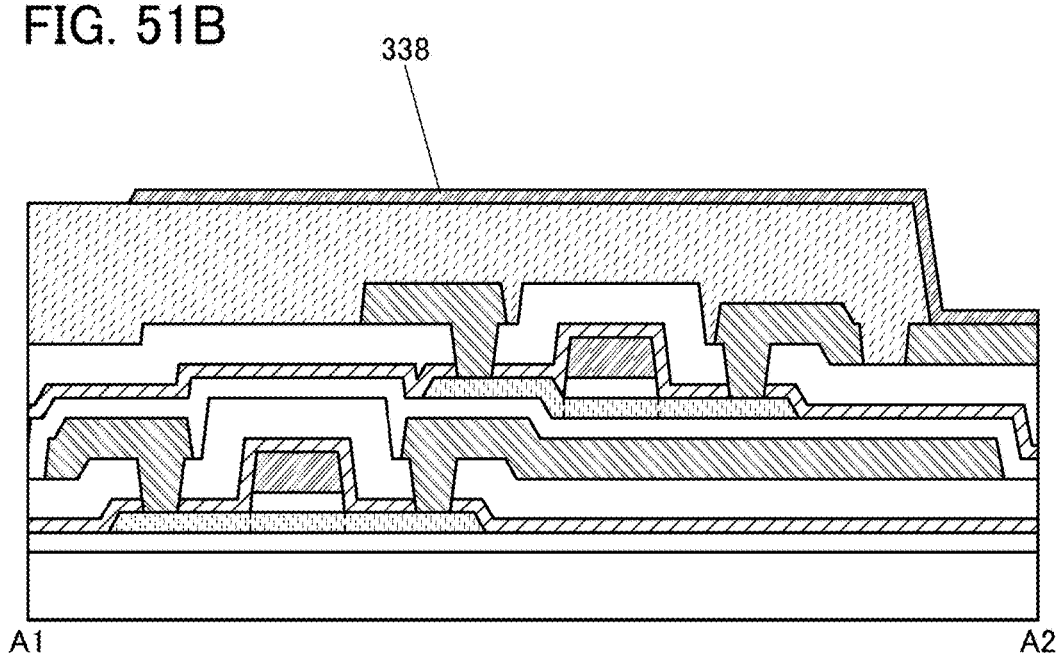

Next, a conductive film is formed over the insulating film 336 and the conductive film 418a and is processed into an island shape, whereby the conductive film 338 is formed (see FIGS. 51A and 51B).

For the conductive film 338 in this embodiment, a stacked film of a 10-nm-thick ITSO film, a 200-nm-thick reflective metal film (a metal film containing silver, palladium, and copper is used here), and a 10-nm-thick ITSO film is used. The stacked film is processed into the conductive film 338 with a wet-etching apparatus.

Figure 52A:
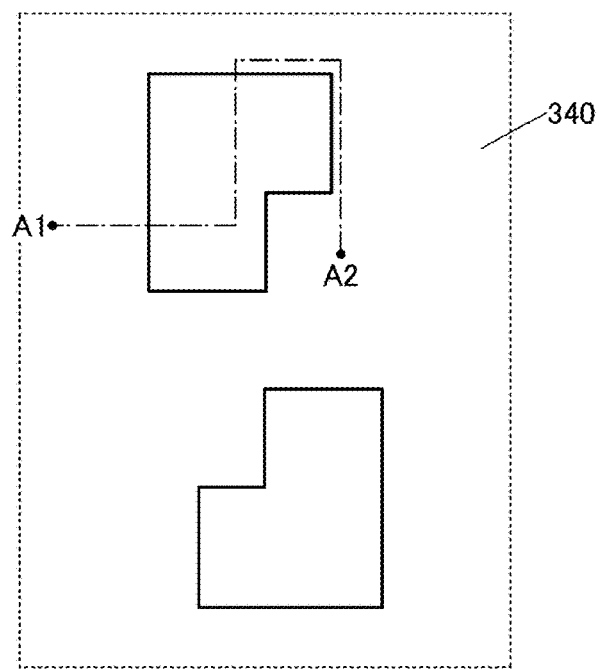
FIGS. 52A and 52B are a top view and a cross-sectional view illustrating a method for manufacturing a semiconductor device.
Figure 52B:
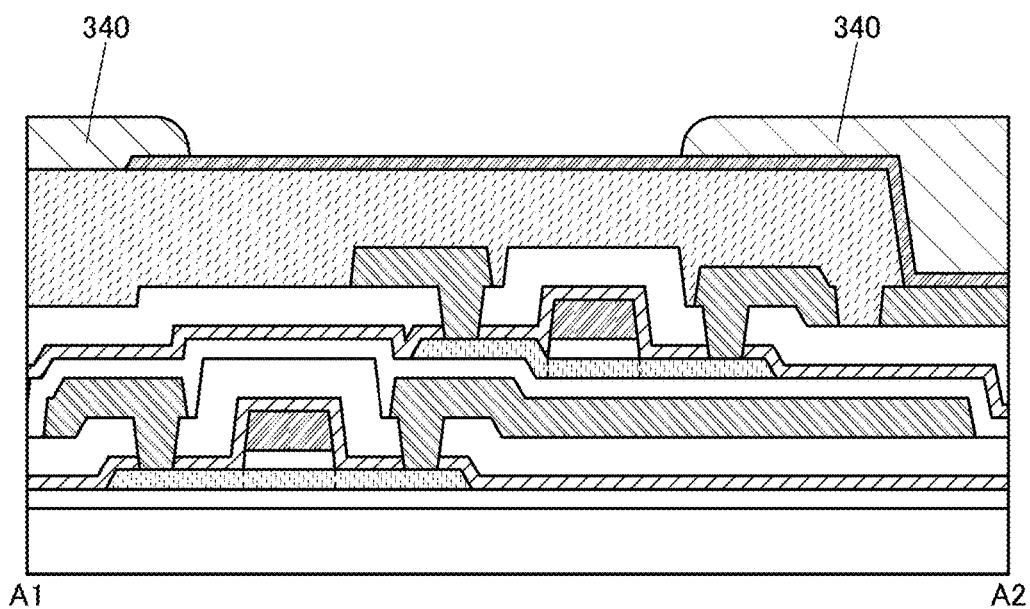

Next, the island-shaped insulating film 340 is formed over the insulating film 336 and the conductive film 338 (see FIGS. 52A and 52B).

As the insulating film 340, a 1.5-µm-thick polyimide-based photosensitive organic resin film is used.

Figure 53A:
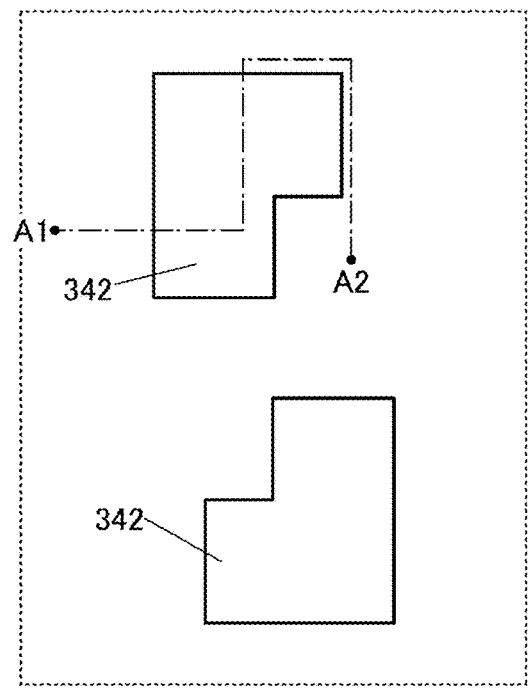
FIGS. 53A and 53B are a top view and a cross-sectional view illustrating a method for manufacturing a semiconductor device.
Figure 53B:
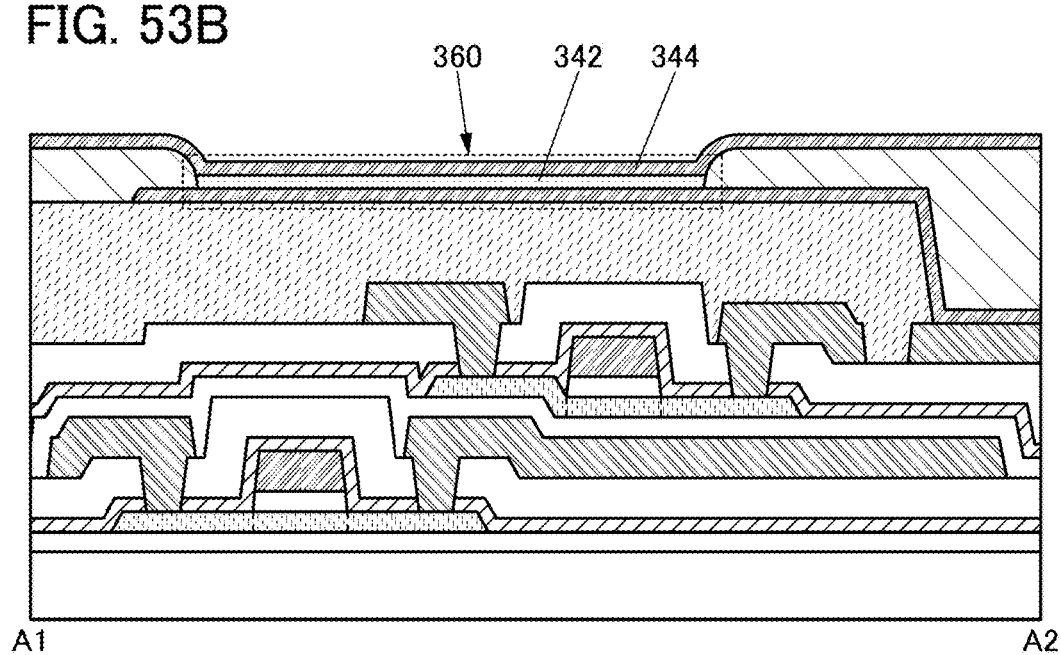

Next, the EL layer 342 is formed over the conductive film 330, and then, the conductive film 344 is formed over the insulating film 340 and the EL layer 342, whereby the light-emitting element 360 is obtained (see FIGS. 53A and 53B).

Note that a method for manufacturing the light-emitting element 360 is described in Embodiment 3.

Through the above manufacturing steps, the semiconductor device 400 shown in FIGS. 46A and 46B can be manufactured.

Note that the structure and method described in this embodiment can be used in appropriate combination with the structure and method described in any of the other embodiments.

Embodiment 5

In this embodiment, a light-emitting element that can be used for a semiconductor device of one embodiment of the present invention is described with reference to FIG. 54, FIGS. 55A to 55D, and FIG. 56.

5-1. Structure Example of Light-Emitting Element

Figure 54:
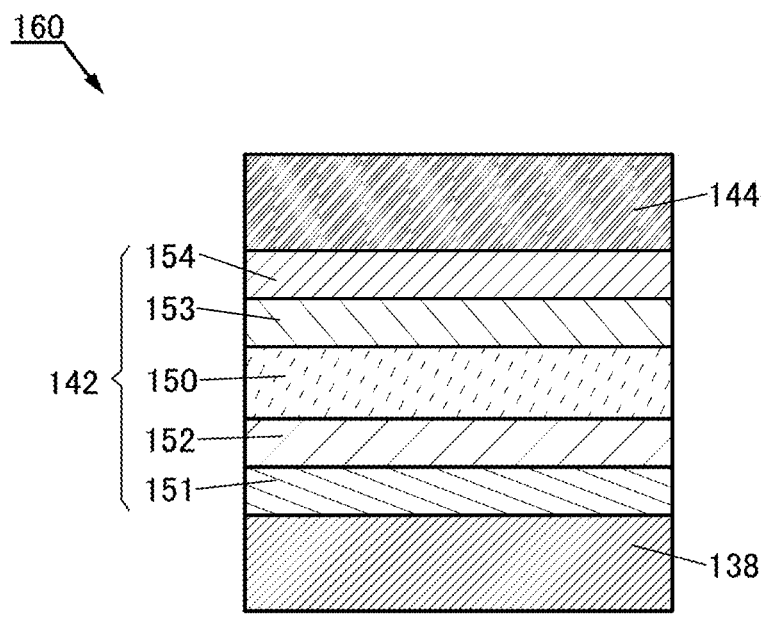
FIG. 54 is a cross sectional schematic view of a light emitting element.

First, a structure of a light-emitting element which can be used for a semiconductor device of one embodiment of the present invention will be described with reference to FIG. 54. FIG. 54 is a cross-sectional view of the light-emitting element 160.

Note that one or both of an inorganic compound and an organic compound can be used for the light-emitting element 160. As the organic compound used for the light-emitting element 160, a low molecular compound or a high molecular compound can be used. The high molecular compound is preferable because it is thermally stable and can easily form a thin film with excellent uniformity by a coating method or the like.

The light-emitting element 160 shown in FIG. 54 includes a pair of electrodes (the conductive film 138 and the conductive film 144) and the EL layer 142 between the pair of electrodes. The EL layer 142 includes at least a light-emitting layer 150.

The EL layer 142 illustrated in FIG. 54 includes the light-emitting layer 150 and functional layers such as a hole-injection layer 151, a hole-transport layer 152, an electron-transport layer 153, and an electron-injection layer 154.

In this embodiment, description is given assuming that the conductive film 138 and the conductive film 144 of the pair of electrodes serve as an anode and a cathode, respectively, but the structure of the light-emitting element 160 is not limited thereto. For example, a structure in which the conductive film 138 and the conductive film 144 serve as a cathode and an anode, respectively, and the layers between the electrodes are stacked in the reverse order may be used. In other words, the layers may be stacked from the anode side in the following order: the hole-injection layer 151, the hole-transport layer 152, the light-emitting layer 150, the electron-transport layer 153, and the electron-injection layer 154.

The structure of the EL layer 142 is not limited to the structure illustrated in FIG. 54, and another structure may be used as long as the structure includes the light-emitting layer 150 and at least one of the hole-injection layer 151, the hole-transport layer 152, the electron-transport layer 153, and the electron-injection layer 154. The EL layer 142 may include a functional layer that is capable of lowering a hole- or electron-injection barrier, improving a hole- or electron-transport property, inhibiting a hole- or electron-transport property, or suppressing a quenching phenomenon by an electrode, for example. Note that the functional layers may be a single layer or stacked layers.

A low molecular compound or a high molecular compound can be used for the light-emitting layer 150.

In this specification and the like, a high molecular compound refers to a polymer that has molecular weight distribution and an average molecular weight of $1 \times 10^3$ to $1 \times 10^8$.

A low molecular compound refers to a compound which does not have molecular weight distribution and has a molecular weight of less than or equal to $1\times10^4$.

The high molecular compound refers to a compound in which one or a plurality of constituent units is polymerized. In other words, the constituent unit refers to a unit at least one of which is included in the high molecular compound.

The high molecular compound may refer to a block copolymer, a random copolymer, an alternating copolymer, a graft copolymer, or the like.

In the case where an end group of the high molecular compound includes a polymerization active group, the light emission characteristics and luminance lifetime of the light-emitting element might be reduced. For this reason, the end group of the high molecular compound is preferably a stable end group. As the stable end group, a group which is covalently bonded to a main chain is preferable. In particular, a group which is bonded to an aryl group or a heterocycle group through a carbon-carbon bond is preferable.

When the low molecular compound is used for the light-emitting layer 150, a light-emitting low molecular compound is preferably contained as a guest material in addition to a low molecular compound serving as a host material. In the light-emitting layer 150, the weight percentage of the host material is larger than that of the guest material, and the guest material is dispersed in the host material.

A light-emitting organic compound can be used as the guest material. A substance capable of emitting fluorescence (hereinafter also referred to as a fluorescent compound) or capable of emitting phosphorescence (hereinafter also referred to as a phosphorescent compound) can be used as the light-emitting organic compound.

In the light-emitting element 160 of one embodiment of the present invention, voltage application between a pair of electrodes (the conductive film 138 and the conductive film 144) causes electrons and holes to be injected from the cathode and the anode, respectively, into the EL layer 142, whereby a current flows. By recombination of the injected electrons and holes, excitons are formed. The ratio of singlet excitons to triplet excitons (hereinafter referred to as exciton generation probability) which are generated by the carrier (electrons and holes) recombination is approximately 1:3 according to the statistically obtained probability.

Accordingly, in a light-emitting element that contains a fluorescent compound, the probability of generation of singlet excitons, which contribute to light emission, is 25% and the probability of generation of triplet excitons, which do not contribute to light emission, is 75%. In the light-emitting element containing a phosphorescent compound, both of the singlet excitons and triplet excitons can contribute to light emission. Therefore, a light-emitting element containing a phosphorescent compound has higher light emission efficiency than a light-emitting element containing a fluorescent compound and thus is preferable.

Note that the term "exciton" refers to a pair of carriers (an electron and a hole). Since excitons have energy, a material where excitons are generated is brought into an excited state.

When a high molecular compound is used for the light-emitting layer 150, it is preferable that the high molecular compound include, as its constituent unit, a skeleton having a function of transporting holes (a hole-transport property) and a skeleton having a function of transporting electrons (an electron-transport property). Alternatively, it is preferable that the high molecular compound include a π-electron deficient heteroaromatic skeleton and at least one of a π-electron rich heteroaromatic skeleton and an aromatic amine skeleton. The skeletons are bonded to each other directly or through another skeleton.

When the high molecular compound includes the skeleton having a hole-transport property and the skeleton having an electron-transport property, the carrier balance can be easily controlled. Thus, a carrier recombination region can also be controlled easily. In view of this, it is preferable that the composition ratio of the skeleton having a hole-transport property to the skeleton having an electron-transport property be in the range of 1:9 to 9:1 (molar ratio). It is further preferable that the skeleton having an electron-transport property be contained at a higher proportion than the skeleton having a hole-transport property.

The high molecular compound may include, as its constituent unit, a light-emitting skeleton, in addition to the skeleton having a hole-transport property and the skeleton having an electron-transport property. When the high molecular compound includes a light-emitting skeleton, the composition ratio of the light-emitting skeleton to all the constituent units of the high molecular compound is preferably low, specifically higher than or equal to 0.1 mol % and lower than or equal to 10 mol %, further preferably higher than or equal to 0.1 mol % and lower than or equal to 5 mol %.

Note that the constituent units of the high molecular compound used for the light-emitting element 160 may have different bonding directions, bonding angles, bonding lengths, and the like. In addition, the constituent units may have different substituents, and may have different skeletons therebetween. In addition, the polymerization methods of constituent units may differ.

The light-emitting layer 150 may include a light-emitting low molecular material as a guest material, in addition to the high molecular compound serving as a host material. In that case, the light-emitting low molecular compound is dispersed as a guest material into the high molecular compound serving as a host material, and the weight percentage of the high molecular compound is higher than that of at least the light-emitting low molecular compound. The weight percentage of the light-emitting low molecular compound to the high molecular compound is preferably higher than or equal to 0.1 wt % and lower than or equal to 10 wt %, further preferably higher than or equal to 0.1 wt % and lower than or equal to 5 wt %.

Next, components of a light-emitting element of one embodiment of the present invention are described in detail.

[Light-Emitting Layer]

Described below is a material that can be used for the light-emitting layer 150.

Although not particularly limited, the high molecular compound which can be used for the light-emitting layer 150 preferably contains at least one of a heteroaromatic skeleton and an aromatic hydrocarbon skeleton. It is preferable that these skeletons be bonded to each other directly or with an arylene group or an alkylene group. Note that the group between which the skeletons are bonded to each other is not limited to an arylene group and an alkylene group.

The high molecular compound preferably includes one or more of the heteroaromatic skeletons selected from a furan skeleton, a thiophene skeleton, and a pyrrole skeleton because these skeletons have high stability and reliability. A pyridine skeleton, a diazine skeleton (a pyrazine skeleton, a pyrimidine skeleton, and a pyridazine skeleton), and a triazine skeleton are preferable, particularly the diazine skeleton and the triazine skeleton are preferable because of their high reliability and stability. For example, a furan skeleton, a benzofuran skeleton, a dibenzofuran skeleton, a benzodifuran skeleton, a thiophene skeleton, a benzothiophene skeleton, a dibenzothiophene skeleton, a benzodithiophene skeleton, a thienothiophene skeleton, a dithienothiophene skeleton, a dithienofuran skeleton, a dithienoselenophene skeleton, a cyclopentadithiophene skeleton, a dithienosilole skeleton, a thienopyrrole skeleton, a dithienopyrrole skeleton, a thienoindole skeleton, a thienopyridine skeleton, a thienopyrazine skeleton, a thiazole skeleton, a thiadiazole skeleton, a benzothiazole skeleton, a benzodithiazole skeleton, an oxazole skeleton, an oxadiazole skeleton, a benzoxazole skeleton, a benzodioxazole skeleton, a selenophene skeleton, a benzoselenophene skeleton, a dibenzoselenophene skeleton, a benzodiselenophene skeleton, a selenoloselenophene skeleton, an indacenothiophene skeleton, an indacenodithiophene skeleton, an indacenoselenophene skeleton, an indacenodiselenophene skeleton, a pyrrole skeleton, an indole skeleton, a carbazole skeleton, an indolocarbazole skeleton, a bicarbazole skeleton, a pyrrolopyrrole skeleton, an acridan skeleton, an acridon skeleton, a phenoxazine skeleton, a phenothiazine skeleton, a phenazine skeleton, a phenazasiline skeleton, an azepine skeleton, a julolidine skeleton, and the like can be used. For example, a quinoline skeleton, a naphthyridine skeleton, a quinoxaline skeleton, a quinazoline skeleton, a phthalazine skeleton, a cinnoline skeleton, a pteridine skeleton, an acridine skeleton, a phenanthridine skeleton, a phenanthroline skeleton, a benzoquinoline skeleton, a benzoquinoxaline skeleton, a benzoquinazoline skeleton, a dibenzoquinoline skeleton, a dibenzoquinoxaline skeleton, a dibenzoquinazoline skeleton, an imidazole skeleton, a pyrazole skeleton, a triazole skeleton, a benzoimidazole skeleton, an imidazopyridine skeleton, a purine skeleton, a triazolopyrimidine skeleton, a triazolopyridine skeleton, an indazole skeleton, and the like can be used.

An aromatic hydrocarbon skeleton may be used instead of any of the heteroaromatic skeletons. Examples of the aromatic hydrocarbon skeleton include a biphenyl skeleton, a naphthalene skeleton, an anthracene skeleton, a chrysene skeleton, a phenanthrene skeleton, a triphenylene skeleton, a fluorine skeleton, a spilofluorene skeleton, an indacene skeleton, and a dibenzosilole skeleton.

An aromatic amine skeleton can be included in the high molecular compound, and secondary amine skeleton or tertiary amine skeleton are preferred. A triarylamine skeleton is particularly preferable. As aryl groups of the triarylamine skeleton, substituted or unsubstituted aryl groups having 6 to 13 carbon atoms that form rings are preferable and examples thereof include phenyl groups, naphthyl groups, and fluorenyl groups. For example, a triphenylamine skeleton, a phenylenediamine skeleton, a naphthalenediamine skeleton, a benzidine skeleton, and the like can be given.

A ketone skeleton, an alkoxy skeleton, or the like can be included in the high molecular compound.

When the aromatic amine skeletons, heteroaromatic skeletons, aromatic hydrocarbon skeletons bond with an arylene group or an alkenyle group, examples of the arylene group and the alkenyle group include a phenylene group, a biphenyldiyl group, a terphenyldiyl group, a naphthalenediyl group, a fluorenediyl group, an anthracenediyl group, a 9,10-dihydro anthracenediyl group, a phenanthrenediyl group, a pyrenediyl group, a perylenediyl group, a chrysenediyl group, an alkoxyphenylene group, an arylenevinylene group (a phenylenevinylene group or the like), and a vinylene group. An ether bonding, a thioether bonding, an ester bonding, and the like may be used.

Each of the above-described aromatic amine skeletons, heteroaromatic skeletons, aromatic hydrocarbon skeletons, arylene groups, and alkenylene groups may include a substituent. As the substituent, an alkyl group, an alkoxy group, or an alkylthio group having 1 to 20 carbon atoms, a cycloalkyl group having 3 to 20 carbon atoms, a substituted or unsubstituted aryl group or aryloxy group having 6 to 18 carbon atoms, or a heterocyclic compound group having 4 to 14 carbon atoms can be selected. Specific examples of the alkyl group having 1 to 20 carbon atoms include a methyl group, an ethyl group, a propyl group, an isopropyl group, a butyl group, an isobutyl group, a tert-butyl group, a pentyl group, a hexyl group, a heptyl group, an octyl group, a decyl group, a lauryl group, a 2-ethylhexyl group, a 3-methy-butyl group, and the like. In addition, specific examples of the alkoxy group having 1 to 20 carbon atoms include a methoxy group, an ethoxy group, a butoxy group, a pentyloxy group, a hexyloxy group, a heptyloxy group, an octyloxy group, a decyloxy group, a lauryloxy group, a 2-ethylhexyloxy group, a 3-methylbutoxy group, an isopropyloxy group, and the like. In addition, specific examples of the alkylthio group having 1 to 20 carbon atoms include a methylthio group, an ethylthio group, a butylthio group, a pentylthio group, a hexylthio group, a heptylthio group, an octylthio group, a decylthio group, a laurylthio group, a 2-ethyl-hexylthio group, a 3-methyl-butylthio group, an isopropylthio group, and the like. Specific examples of the cycloalkyl group having 3 to 20 carbon atoms include a cyclopropyl group, a cyclobutyl group, a cyclopentyl group, a cyclohexyl group, a norbornyl group, a noradamantyl group, an adamantyl group, a homoadamantyl group, a tricyclodecanyl group, and the like. Specific examples of the aryl group having 6 to 18 carbon atoms include a substituted or unsubstituted phenyl group, naphthyl group, biphenyl group, fluorenyl group, anthracenyl group, pyrenyl group, and the like. In addition, specific examples of an aryloxy group having 6 to 18 carbon atoms include a substituted or unsubstituted alkoxyphenoxy group, alkylphenoxy group, naphthyloxy group, anthracenyloxy group, pyrenyloxy group, and the like. Specific examples of the heterocyclic compound group having 4 to 14 carbon atoms include a substituted or unsubstituted thienyl group, pyrrolyl group, furyl group, pyridyl group, and the like. The above substituents may be bonded to each other to form a ring. For example, in the case where a carbon atom at the 9-position in a fluorene skeleton has two phenyl groups as substituents, the phenyl groups are bonded to form a spirofluorene skeleton. Note that an unsubstituted group has an advantage in easy synthesis and an inexpensive raw material.

Examples of the high molecular compound include a polyphenylenevinylene (PPV) derivative such as poly[2-methoxy-5-(2-ethylhexyloxy)-1,4-phenylenevinylene] (abbreviation: MEH-PPV) or poly(2,5-dioctyl-1,4-phenylenevinylene); a polyfluorene derivative such as poly(9,9-di-n-octylfluorenyl-2,7-diyl) (abbreviation: PF8), poly[(9,9-di-n-octylfluorenyl-2,7-diyl)-alt-(benzo[2,1,3]thiadiazole-4,8-diyl)] (abbreviation: $F_8BT$), poly[(9,9-di-n-octylfluorenyl-2,7-diyl)-alt-(2,2'-bithiophene-5,5'-diyl)] (abbreviation: $F_8T2$), poly[(9,9-dioctyl-2,7-divinylenefluorenylene)-alt-(9,10-anthracene)], or poly[(9,9-dihexylfluorene-2,7-diyl)-alt-(2,5-dimethyl-1,4-phenylene)]; a polyalkylthiophene (PAT) derivative such as poly(3-hexylthiophene-2,5-diyl) (abbreviation: P3HT); and a polyphenylene derivative. These high molecular compounds, poly(9-vinylcarbazole) (abbreviation: PVK), poly(2-vinylnaphthalene), poly[bis(4-phenyl)(2,4,6-trimethylphenyl)amine] (abbreviation: PTAA), or the like may be doped with a light-emitting low molecular compound and used for the light-emitting layer.

The fluorescent compound that can be used for the light-emitting layer 150 is preferably, but not particularly limited to, an anthracene derivative, a tetracene derivative, a chrysene derivative, a phenanthrene derivative, a pyrene derivative, a perylene derivative, a stilbene derivative, an acridone derivative, a coumarin derivative, a phenoxazine derivative, a phenothiazine derivative, or the like. For example, a substituted or unsubstituted material of any of the following materials can be used. As the substituent, any of the above-described substituents can be used. The substituent is preferably aliphatic hydrocarbon group, further preferably an alkyl group, still further preferably a branched alkyl group.

The examples include 5,6-bis[4-(10-phenyl-9-anthryl) phenyl]-2,2'-bipyridine (abbreviation: PAP2BPy), 5,6-bis [4'-(10-phenyl-9-anthryl)biphenyl-4-yl]-2,2'-bipyridine (abbreviation: PAPP2BPy), N,N'-diphenyl-N,N'-bis[4-(9-phenyl-9H-fluoren-9-yl)phenyl]pyrene-1,6-diamine (abbreviation: 1,6FLPAPrn), N,N'-bis(3-methylphenyl)-N,N'-bis[3-(9-phenyl-9H-fluoren-9-yl)phenyl]pyrene-1,6-diamine (abbreviation: 1,6mMemFLPAPrn), N,N'-bis[4-(9-phenyl-9H-fluoren-9-yl)phenyl]-N,N'-bis(4-tert-butylphenyl)pyrene-1,6-diamine (abbreviation: 1,6tBu-FLPAPrn), N,N'-bis[4-(9-phenyl-9H-fluoren-9-yl)phenyl] N,N'-diphenyl-3,8-dicyclohexylpyrene-1,6-diamine (abbreviation: ch-1,6FLPAPrn), N,N'-bis[4-(9H-carbazol-9-yl) phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazol-3-amine (abbreviation: PCAPA), perylene, 2,5,8,11-tetra(tert-butyerylene (abbreviation: TBP), 4-(10-phenyl-9-anthryl)-4'-(9-phenyl-9H-carbazol-3-yl)triphenylamine (abbreviation: PCBAPA), N,N''-(2-tert-butylanthracene-9,10-diyldi-4,1-phenylene)bis[N,N',N'-triphenyl-1,4-phenylenediamine] (abbreviation: DPABPA), N,9-diphenyl-N-[4-(9,10-diphenyl-2-anthryl)phenyl]-9H-carbazol-3-amine (abbreviation: 2PCAPPA), N-[4-(9,10-diphenyl-2-anthryl)phenyl]-N,N',N'-triphenyl-1,4-phenylenediamine (abbreviation: 2DPAPPA), N,N,N',N,N'',N'',N''',N'''-octaphenyldibenzo[g,p]chrysene-2,7,10,15-tetraamine (abbreviation: DBC1), coumarin 30, N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N,N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), 9,10-bis(1,1'-biphenyl-2-yl)-N-[4-(9H-carbazol-9-yl)phenyl]-N-phenylanthracen-2-amine (abbreviation: 2YGABPhA), N,N,9-triphenylanthracen-9-amine (abbreviation: DPhAPhA), coumarin 6, coumarin 545T, N,N'-diphenylquinacridone (abbreviation: DPQd), rubrene, 2,8-di-tert-butyl-5,11-bis(4-tert-butylphenyl)-6,12-diphenyltetracene (abbreviation: TBRb), Nile red, 5,12-bis(1,1'-biphenyl-4-yl)-6,11-diphenyltetracene (abbreviation: BPT), 2-(2-{2-[4-(dimethylamino)phenyl]ethenyl}-6-methyl-4H-pyran-4-ylidene)propanedinitrile (abbreviation: DCM1), 2-{2-methyl-6-[2-(2,3,6,7-tetrahydro-1H,5H-benzo[ij]quinolizin-9-yl)ethenyl]-4H-pyran-4-ylidene}propanedinitrile (abbreviation: DCM2), N,N,N',N'-tetrakis(4-methylphenyl) tetracene-5,11-diamine (abbreviation: p-mPhTD), 7,14-diphenyl-N,N,N',N'-tetrakis(4-methylphenyl)acenaphtho[1,2-a]fluoranthene-3,10-diamine (abbreviation: p-mPhAFD), 2-{2-isopropyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTI), 2-{2-tert-butyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTB), 2-(2,6-bis{2-[4-(dimethylamino)phenyl]ethenyl}-4H-pyran-4-ylidene)propanedinitrile (abbreviation: BisDCM), 2-{2,6-bis[2-(8-methoxy-1,1,7,7-tetramethyl-2,3,6,7-tetrahydro-1H,5H-benzo[ij]quinolizin-9-yl) ethenyl]-4H-pyran-4-ylidene}propanedinitrile (abbreviation: BisDCJTM), and 5,10,15,20-tetraphenylbisbenzo[5,6]indeno[1,2,3-cd:1',2', 3'-lm]perylene.

Although there is no particular limitation on a light-emitting skeleton that can be used for the high molecular compound, a structure in which one or two hydrogen atoms are removed from an aromatic ring of a skeleton of anthracene, tetracene, chrysene, phenanthrene, pyrene, perylene, stilbene, acridone, coumarin, phenoxazine, phenothiazine, or the like is preferably used as the constituent unit. As the substituent, any of the above-described substituents can be used. An aliphatic hydrocarbon group, preferably an alkyl group, further preferably a branched alkyl group may be introduced as the substituent.

As the phosphorescent compound, an iridium-, rhodium-, or platinum-based organometallic complex or metal complex can be used; in particular, an organoiridium complex such as an iridium-based ortho-metalated complex is preferable. As an ortho-metalated ligand, a 4H-triazole ligand, a 1H-triazole ligand, an imidazole ligand, a pyridine ligand, a pyrimidine ligand, a pyrazine ligand, an isoquinoline ligand, or the like can be given. As the metal complex, a platinum complex having a porphyrin ligand or the like can be given. For example, any of the following substituted or unsubstituted materials can be used. As the substituent, any of the above-described substituents can be used.

Examples of the substance that has an emission peak in the blue or green wavelength range include organometallic iridium complexes having a 4H-triazole skeleton, such as tris {2-[5-(2-methylphenyl)-4-(2,6-dimethylphenyl)-4H-1, 2,4-triazol-3-yl-κN2]phenyl-κC}iridium(III) (abbreviation: Ir(mpptz-dmp)$_3$), tris(5-methyl-3,4-diphenyl-4H-1,2,4-triazolato)iridium(III) (abbreviation: Ir(Mptz)$_3$), tris[4-(3-biphenyl)-5-isopropyl-3-phenyl-4H-1,2,4-triazolato]iridium (III) (abbreviation: Ir(iPrptz-3b)$_3$), and tris[3-(5-biphenyl)-5-isopropyl-4-phenyl-4H-1,2,4-triazolato]iridium(III) (abbreviation: Ir(iPr5btz)$_3$); organometallic iridium complexes having a 1H-triazole skeleton, such as tris[3-methyl-1-(2-methylphenyl)-5-phenyl-1H-1,2,4-triazolato]iridium (III) (abbreviation: Ir(Mptz1-mp)$_3$) and tris(1-methyl-5-phenyl-3-propyl-1H-1,2,4-triazolato)iridium(III) (abbreviation: Ir(Prptz1-Me)$_3$); organometallic iridium complexes having an imidazole skeleton, such as fac-tris[1-(2, 6-diisopropylphenyl)-2-phenyl-1H-imidazole]iridium(III) (abbreviation: Ir(iPrpmi)$_3$) and tris[3-(2,6-dimethylphenyl)-7-methylimidazo[1,2-f]phenanthridinato]iridium(III) (abbreviation: Ir(dmpimpt-Me)$_3$); and organometallic iridium complexes in which a phenylpyridine derivative having an electron-withdrawing group is a ligand, such as bis[2-(4',6'-difluorophenyl)pyridinato-N,C$^{2'}$]iridium(III) tetrakis(1-pyrazolyl)borate (abbreviation: FIr6), bis[2-(4',6'-difluorophenyl)pyridinato-N,C$^{2'}$]iridium(III) picolinate (abbreviation: FIrpic), bis {2-[3',5'-bis(trifluoromethyl)phenyl]pyridinato-N,C$^{2'}$}iridium(III)picolinate (abbreviation: Ir(CF$_3$ppy)$_2$(pic)), and bis[2-(4',6'-difluorophenyl)pyridinato-N,C$^{2'}$]iridium(III) acetylacetonate (abbreviation: FIr(a- cac)). Among the substances given above, the organometallic iridium complex having a 4H-triazole skeleton has a high reliability and a high emission efficiency and is thus especially preferable.

Examples of the substance that has an emission peak in the green or yellow wavelength range include organometallic iridium complexes having a pyrimidine skeleton, such as tris(4-methyl-6-phenylpyrimidinato)iridium(III) (abbreviation: Ir(mppm)$_3$), tris(4-t-butyl-6-phenylpyrimidinato) iridium(III) (abbreviation: Ir(tBuppm)$_3$), (acetylacetonato) bis(6-methyl-4-phenylpyrimidinato)iridium(III) (abbreviation: Ir(mppm)$_2$(acac)), (acetylacetonato)bis(6-tert-butyl-4-phenylpyrimidinato)iridium(III) (abbreviation: Ir(tBuppm)$_2$(acac)), (acetylacetonato)bis[4-(2-norbornyl)-6-phenylpyrimidinato]iridium(III) (abbreviation: Ir(nbppm)$_2$ (acac)), (acetylacetonato)bis[5-methyl-6-(2-methylphenyl)-4-phenylpyrimidinato]iridium(III) (abbreviation: Ir(mpmppm)$_2$(acac)), (acetylacetonato)bis{4,6-dimethyl-2-[6-(2,6-di methylphenyl)-4-pyrimidinyl-κN3]phenyl-κC}iridium(III) (abbreviation: Ir(dmppm-dmp)$_2$(acac)), (acetylacetonato)bis(4,6-diphenylpyrimidinato)iridium(III) (abbreviation: Ir(dppm)$_2$(acac)); organometallic iridium complexes having a pyrazine skeleton, such as (acetylacetonato)bis(3,5-dimethyl-2-phenylpyrazinato)iridium(III) (abbreviation: Ir(mppr-Me)$_2$(acac)) and (acetylacetonato)bis (5-isopropyl-3-methyl-2-phenylpyrazinato)iridium(III) (abbreviation: Ir(mppr-iPr)$_2$(acac)); organometallic iridium complexes having a pyridine skeleton, such as tris(2-phenylpyridinato-N,C$^{2'}$)iridium(III) (abbreviation: Ir(ppy)$_3$), bis(2-phenylpyridinato-N,C$^{2'}$)iridium(III) acetyl acetonate (abbreviation: Ir(ppy)$_2$(acac)), bis(benzo[h]quinolinato) iridium(III) acetylacetonate (abbreviation: Ir(bzq)$_2$(acac)), tris(benzo[h]quinolinato)iridium(III) (abbreviation: Ir(bzq)$_3$), tris(2-phenylquinolinato-N,C$^{2'}$)iridium(III) (abbreviation: Ir(pq)$_3$), and bis(2-phenylquinolinato-N,C$^{2'}$)iridium (III) acetylacetonate (abbreviation: Ir(pq)$_2$(acac)); organometallic iridium complexes such as bis(2,4-diphenyl-1,3-oxazolato-N,C$^{2'}$)iridium(III) acetylacetonate (abbreviation: Ir(dpo)$_2$(acac)), bis{2-[4'-(perfluorophenyl)phenyl] pyridinato-N,C$^{2'}$}iridium(III) acetylacetonate (abbreviation: Ir(p-PF-ph)$_2$(acac)), and bis(2-phenylbenzothiazolato-N,C$^{2'}$)iridium(III) acetylacetonate (abbreviation: Ir(bt)$_2$ (acac)); and a rare earth metal complex such as tris(acetylacetonato) (monophenanthroline)terbium(III) (abbreviation: Tb(acac)$_3$(Phen)). Among the materials given above, the organometallic iridium complexes having a pyrimidine skeleton have distinctively high reliability and light emission efficiency and are thus particularly preferable.

Examples of the substance that has an emission peak in the yellow or red wavelength range include organometallic iridium complexes having a pyrimidine skeleton, such as (diisobutyrylmethanato)bis[4,6-bis(3-methylphenyl)pyrimidinato]iridium(III) (abbreviation: Ir(5mdppm)$_2$(dibm)), bis [4,6-bis(3-methylphenyl)pyrimidinato](dipivaloylmethanato)iridium(III) (abbreviation: Ir(5mdppm)$_2$(dpm)), and bis[4,6-di(naphthalen-1-yl)pyrimidinato] (dipivaloylmethanato)iridium(III) (abbreviation: Ir(dlnpm)$_2$(dpm)); organometallic iridium complexes having a pyrazine skeleton, such as (acetylacetonato)bis(2,3,5-triphenylpyrazinato)iridium (III) (abbreviation: Ir(tppr)$_2$(acac)), bis(2,3,5-triphenylpyrazinato) (dipivaloylmethanato)iridium(III) (abbreviation: Ir(tppr)$_2$(dpm)), and (acetylacetonato)bis[2,3-bis(4-fluorophenyl)quinoxalinato]iridium(III) (abbreviation: Ir(Fdpq)$_2$(acac)); organometallic iridium complexes having a pyridine skeleton, such as tris(1-phenylisoquinolinato-N,C$^{2'}$)iridium(III) (abbreviation: Ir(piq)$_3$) and bis(1-phenylisoquinolinato-N,C$^{2'}$)iridium(III) acetylacetonate (abbreviation: Ir(piq)$_2$(acac)); a platinum complex such as 2,3,7,8,12,13,17,18-octaethyl-21H,23H-porphyrin platinum(II) (abbreviation: PtOEP); and rare earth metal complexes such as tris(1,3-diphenyl-1,3-propanedionato) (monophenanthroline)europium(III) (abbreviation: Eu(DBM)$_3$(Phen)) and tris [1-(2-thenoyl)-3,3,3-trifluoroacetonato] (monophenanthroline)europium(III) (abbreviation: Eu(TTA)$_3$(Phen)). Among the materials given above, the organometallic iridium complexes having a pyrimidine skeleton have distinctively high reliability and light emission efficiency and are thus particularly preferable. Furthermore, the organometallic iridium complexes having a pyrazine skeleton can provide red light emission with favorable chromaticity.

The phosphorescent compound may be a high molecular compound, and for example, a high molecular compound including an iridium-, rhodium-, or platinum-based organometallic complex or metal complex as a structural unit is preferable. That is, a structure where one or two hydrogen atoms are removed from the iridium-, rhodium-, or platinum-based organometallic complex or metal complex is preferably used as the constituent unit.

As the organic compound included in the light-emitting layer 150, any material can be used as long as the substance can convert the triplet excitation energy into light emission. As an example of the substance that can convert the triplet excitation energy into light emission, a thermally activated delayed fluorescent (TADF) material can be given in addition to a phosphorescent compound. Therefore, the "phosphorescent compound" in the description can be replaced with the "thermally activated delayed fluorescence". Note that the thermally activated delayed fluorescence is a substance having a small difference between the triplet excitation energy level and the singlet excitation energy level and a function of converting triplet excitation energy into singlet excitation energy by reverse intersystem crossing. Thus, the TADF material can up-convert a triplet excited state into a singlet excited state (i.e., reverse intersystem crossing is possible) using a little thermal energy and efficiently exhibit light emission (fluorescence) from the singlet excited state. The TADF is efficiently obtained under the condition where the difference in energy between the triplet excitation energy level and the singlet excitation energy level is preferably larger than 0 eV and smaller than or equal to 0.2 eV, further preferably larger than 0 eV and smaller than or equal to 0.1 eV.

As the TADF material serving as the thermally activated delayed fluorescent emitter, for example, any of the following substances can be used.

First, a fullerene, a derivative thereof, an acridine derivative such as proflavine, eosin, and the like can be given. Other examples include a metal-containing porphyrin, such as a porphyrin containing magnesium (Mg), zinc (Zn), cadmium (Cd), tin (Sn), platinum (Pt), indium (In), or palladium (Pd). Examples of the metal-containing porphyrin include a protoporphyrin-tin fluoride complex (SnF$_2$(Proto IX)), a mesoporphyrin-tin fluoride complex (SnF$_2$(Meso IX)), a hematoporphyrin-tin fluoride complex (SnF$_2$(Hemato IX)), a coproporphyrin tetramethyl ester-tin fluoride complex (SnF$_2$(Copro III-4Me)), an octaethylporphyrin-tin fluoride complex (SnF$_2$(OEP)), an etioporphyrin-tin fluoride complex (SnF$_2$(Etio I)), and an octaethylporphyrin-platinum chloride complex (PtCl$_2$OEP).

As the thermally activated delayed fluorescence material composed of one kind of material, a heterocyclic compound including a π-electron rich heteroaromatic ring and a π-electron deficient heteroaromatic ring can also be used. Specifically, 2-(biphenyl-4-yl)-4,6-bis(12-phenylindolo[2,3-a]carbazol-11-yl)-1,3,5-triazine (abbreviation: PIC-TRZ), 2-{4-[3-(N-phenyl-9H-carbazol-3-yl)-9H-carbazol-9-yl]phenyl}-4,6-diphenyl-1,3,5-triazine (abbreviation: PCCzPTzn), 2-[4-(10H-phenoxazin-10-yl)phenyl]-4,6-diphenyl-1,3,5-triazine (abbreviation: PXZ-TRZ), 3-[4-(5-phenyl-5,10-dihydrophenazin-10-yl)phenyl]-4,5-diphenyl-1,2,4-triazole (abbreviation: PPZ-3TPT), 3-(9,9-dimethyl-9H-acridin-10-yl)-9H-xanthen-9-one (abbreviation: ACRXTN), bis[4-(9,9-dimethyl-9,10-dihydroacridine)phenyl]sulfone (abbreviation: DMAC-DPS), or 10-phenyl-10H,10'H-spiro[acridin-9,9'-anthracen]-10'-one (abbreviation: ACRSA) can be used. The heterocyclic compound is preferably used because of the π-electron rich heteroaromatic ring and the π-electron deficient heteroaromatic ring, for which the electron-transport property and the hole-transport property are high. Note that a substance in which the π-electron rich heteroaromatic ring is directly bonded to the π-electron deficient heteroaromatic ring is particularly preferably used because the donor property of the π-electron rich heteroaromatic ring and the acceptor property of the π-electron deficient heteroaromatic ring are both increased and the difference between the level of the singlet excitation energy and the level of the triplet excitation energy becomes small.

As a material exhibiting thermally activated delayed fluorescence, a combination of two kinds of materials which form exciplexes may be used. As the combination of two kinds of materials, a combination of the above-described hole-transport material and electron-transport material is preferable. Specifically, a zinc- or aluminum-based metal complex, an oxadiazole derivative, a triazole derivative, a benzimidazole derivative, a quinoxaline derivative, a dibenzoquinoxaline derivative, a dibenzothiophene derivative, a dibenzofuran derivative, a pyrimidine derivative, a triazine derivative, a pyridine derivative, a bipyridine derivative, a phenanthroline derivative, or the like can be used. Other examples are an aromatic amine and a carbazole derivative.

Another substance other than the compound serving as a host material and the compound serving as a light-emitting guest material may be contained in the light-emitting layer 150. For example, a substituted or unsubstituted material of any of the following hole-transport materials and electron-transport materials can be used. Note that as the substituent, any of the above-described substituents can be used.

A material having a property of transporting more holes than electrons can be used as the hole-transport material, and a material having a hole mobility of $1\times10^{-6}$ cm$^2$/Vs or higher is preferable. Specifically, an aromatic amine, a carbazole derivative, an aromatic hydrocarbon, a stilbene derivative, or the like can be used. Furthermore, the hole-transport material may be a high molecular compound. Furthermore, a high molecular compound including the hole-transport skeleton, the π-electron rich heteroaromatic skeleton, or the aromatic amine skeleton, which is included in the high molecular compound may be used.

Examples of the material having a high hole-transport property are aromatic amine compounds such as N,N'-di(p-tolyl)-N,N'-diphenyl-p-phenylenediamine (abbreviation: DTDPPA), 4,4'-bis[N-(4-diphenylaminophenyl)-N-phenylamino]biphenyl (abbreviation: DPAB), N,N'-bis[4-[bis(3-methylphenyl)amino]phenyl]-diphenyl-[1,1'-biphenyl]-4,4'-diamine (abbreviation: DNTPD), 1,3,5-tris[N-(4-diphenylaminophenyl)-N-phenylamino]benzene (abbreviation: DPA3B), and the like.

Specific examples of the carbazole derivative are 3-[N-(4-diphenylaminophenyl)-N-phenylamino]-9-phenylcarbazole (abbreviation: PCzDPA1), 3,6-bis[N-(4-diphenylaminophenyl)-N-phenylamino]-9-phenylcarbazole (abbreviation: PCzDPA2), 3,6-bis[N-(4-diphenylaminophenyl)-N-(1-naphthyl)amino]-9-phenylcarbazole (abbreviation: PCzTPN2), 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphthyl)-N-(9-phenylcarbazol-3-yl)amino]-9-phenylcarbazole (abbreviation: PCzPCN1), and the like.

Other examples of the carbazole derivative are 4,4'-di(N-carbazolyl)biphenyl (abbreviation: CBP), 1,3,5-tris[4-(N-carbazolyl)phenyl]benzene (abbreviation: TCPB), 9-[4-(10-phenyl-9-anthracenyl)phenyl]-9H-carbazole (abbreviation: CzPA), 1,4-bis[4-(N-carbazolyl)phenyl]-2,3,5,6-tetraphenylbenzene, and the like.

Examples of the aromatic hydrocarbon are 2-tert-butyl-9,10-di(2-naphthy)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 2-tert-butyl-9,10-bis[2-(1-naphthyl)phenyl]anthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, 2,5,8,11-tetra(tert-butyl)perylene, and the like. Other examples are pentacene, coronene, and the like. The aromatic hydrocarbon having a hole mobility of $1\times10^{-6}$ cm$^2$/Vs or higher and having 14 to 42 carbon atoms is particularly preferable.

The aromatic hydrocarbon may have a vinyl skeleton. As the aromatic hydrocarbon having a vinyl skeleton, the following are given for example: 4,4'-bis(2,2-diphenylvinyl)biphenyl (abbreviation: DPVBi); 9,10-bis[4-(2,2-diphenylvinyl)phenyl]anthracene (abbreviation: DPVPA); and the like.

Other examples are high molecular compounds such as poly(N-vinylcarbazole) (abbreviation: PVK), poly(-vinyltriphenylamine) (abbreviation: PVTPA), poly[N-(4-{N'-[4-(4-diphenylamino)phenyl]phenyl-N'-phenylamino}phenyl)methacrylamide] (abbreviation: PTPDMA), and poly[N,N'-bis(4-butylphenyl)-N,N'-bis(phenyenzidine] (abbreviation: poly-TPD).

Examples of the material having a high hole-transport property are aromatic amine compounds such as 4,4'-bis[N-(1-naphthyl)-N-phenylamino]biphenyl (abbreviation: NPB or α-NPD), N,N'-bis(3-methylphenyl)-N,N'-diphenyl-[1,1'-biphenyl]-4,4'-diamine (abbreviation: TPD), 4,4',4''-tris(carbazol-9-yl)triphenylamine (abbreviation: TCTA), 4,4',4''-tris[N-(1-naphthyl)-N-phenylamino]triphenylamine (abbreviation: 1'-TNATA), 4,4',4''-tris(N,N'-diphenylamino)triphenylamine (abbreviation: TDATA), 4,4',4''-tris[N-(3-methylphenyl)-N-phenylamino]triphenylamine (abbreviation: MTDATA), 4,4'-bis[N-(spiro-9,9'-bifluoren-2-yl)-N-phenylamino]biphenyl (abbreviation: BSPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), N-(9,9-dimethyl-9H-fluoren-2-yl)-N-{9,9-dimethyl-2-[N'-phenyl-N'-(9,9-dimethyl-9H-fluoren-2-yl)amino]-9H-fluoren-7-yl}phenylamine (abbreviation: DFLADFL), N-(9,9-dimethyl-2-diphenylamino-9H-fluoren-7-yl)diphenylamine (abbreviation: DPNF), 2-[N-(4-diphenylaminophenyl)-N-phenylamino]

spiro-9,9'-bifluorene (abbreviation: DPASF), 4-phenyl-4'-(9-phenyl-9H-carbazol-3-yl)triphenylamine (abbreviation: PCBA1BP), 4,4'-diphenyl-4"-(9-phenyl-9H-carbazol-3-yl) triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4"-(9-phenyl-9H-carbazol-3-yl)triphenylamine (abbreviation: PCBNBB), 4-phenyldiphenyl-(9-phenyl-9H-carbazol-3-yl)amine (abbreviation: PCA1BP), N,N'-bis(9-phenylcarbazol-3-yl)-N,N'-diphenylbenzene-1,3-diamine (abbreviation: PCA2B), N,N',N"-triphenyl-N,N,N"-tris(9-phenylcarbazol-3-yl)benzene-1,3,5-triamine (abbreviation: PCA3B), N-(4-biphenyl)-N-(9,9-dimethyl-9H-fluoren-2-yl)-9-phenyl-9H-carbazol-3-amine (abbreviation: PCBiF), N-(1,1'-biphenyl-4-yl)-N-[4-(9-phenyl-9H-carbazol-3-yl)phenyl]-9,9-dimethyl-9H-fluoren-2-amine (abbreviation: PCBBiF), 9,9-dimethyl-N-phenyl-N-[4-(9-phenyl-9H-carbazol-3-yl)phenyl] fluoren-2-amine (abbreviation: PCBAF), N-phenyl-N-[4-(9-phenyl-9H-carbazol-3-yl)phenyl]spiro-9,9'-bifluoren-2-amine (abbreviation: PCBASF), 2-[N-(9-phenylcarbazol-3-yl)-N-phenylamino]spiro-9,9'-bifluorene (abbreviation: PCASF), 2,7-bis[N-(4-diphenylaminophenyl)-N-phenylamino]-spiro-9,9'-bifluorene (abbreviation: DPA2SF), N-[4-(9H-carbazol-9-yl)phenyl]-N-(4-phenyl)phenylaniline (abbreviation: YGA1BP), and N,N'-bis[4-(carbazol-9-yl) phenyl]-N,N'-diphenyl-9,9-dimethylfluorene-2,7-diamine (abbreviation: YGA2F). Other examples are amine compounds, carbazole compounds, thiophene compounds, furan compounds, fluorene compounds; triphenylene compounds; phenanthrene compounds, and the like such as 3-[4-(1-naphthyl)-phenyl]-9-phenyl-9H-carbazole (abbreviation: PCPN), 3-[4-(9-phenanthryl)-phenyl]-9-phenyl-9H-carbazole (abbreviation: PCPPn), 3,3'-bis(9-phenyl-9H-carbazole) (abbreviation: PCCP), 1,3-bis(N-carbazolyl)benzene (abbreviation: mCP), 3,6-bis(3,5-diphenylphenyl)-9-phenylcarbazole (abbreviation: CzTP), 3,6-di(9H-carbazol-9-yl)-9-phenyl-9H-carbazole (abbreviation: PhCzGI), 2,8-di (9H-carbazol-9-yl)-dibenzothiophene (abbreviation: Cz2DBT), 4-{3-[3-(9-phenyl-9H-fluoren-9-yl)phenyl] phenyl}dibenzofuran (abbreviation: mmDBFFLBi-II), 4,4', 4"-(benzene-1,3,5-triyl)tri(dibenzofuran) (abbreviation: DBF3P-II), 1,3,5-tri(dibenzothiophen-4-yl)-benzene (abbreviated as DBT3P-II), 2,8-diphenyl-4-[4-(9-phenyl-9H-fluoren-9-yl)phenyl]dibenzothiophene (abbreviation: DBTFLP-III), 4-[4-(9-phenyl-9H-fluoren-9-yl)phenyl]-6-phenyldibenzothiophene (abbreviation: DBTFLP-IV), and 4-[3-(triphenylen-2-yl)phenyl]dibenzothiophene (abbreviation: mDBTPTp-II). The substances listed here are mainly ones that have a hole mobility of $1 \times 10^{-6}$ cm$^2$/Vs or higher. Note that any substance other than the substances listed here may be used as long as the hole-transport property is higher than the electron-transport property.

A material having a property of transporting more electrons than holes can be used as an electron-transport material, and a material having an electron mobility of $1 \times 10^{-6}$ cm$^2$/Vs or higher is preferable. A π-electron deficient heteroaromatic compound such as a nitrogen-containing heteroaromatic compound, a metal complex, or the like can be used as the material which easily accepts electrons (the material having an electron-transport property). Specific examples of the metal complex include a metal complex having a quinoline ligand, a benzoquinoline ligand, an oxazole ligand, and a thiazole ligand. In addition, an oxadiazole derivative, a triazole derivative, a phenanthroline derivative, a pyridine derivative, a bipyridine derivative, a pyrimidine derivative, and the like can be given. Furthermore, the electron-transport material may be a high molecular compound. Furthermore, a high molecular compound including the electron-transport skeleton or the π-electron deficient heteroaromatic skeleton, which is included in the high molecular compound may be used.

Examples include metal complexes having a quinoline or benzoquinoline skeleton, such as tris(8-quinolinolato)aluminum(III) (abbreviation: Alq), tris(4-methyl-8-quinolinolato) aluminum(III) (abbreviation: Almq$_3$), bis(10-hydroxybenzo [h]quinolinato)beryllium(II) (abbreviation: BeBq$_2$), bis(2-methyl-8-quinolinolato) (4-phenylphenolato)aluminum(III) (abbreviation: BAlq) and bis(8-quinolinolato)zinc(II) (abbreviation: Znq), and the like. Alternatively, a metal complex having an oxazole-based or thiazole-based ligand, such as bis[2-(2-benzoxazolyl)phenolato]zinc(II) (abbreviation: ZnPBO) or bis[2-(2-benzothiazolyl)phenolato]zinc(II) (abbreviation: ZnBTZ) can be used. Other than such metal complexes, any of the following can be used: heterocyclic compounds such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]-9H-carbazole (abbreviation: CO11), 3-(biphenyl-4-yl)-4-phenyl-5-(4-tert-butylphenyl)-1,2,4-triazole (abbreviation: TAZ), 9-[4-(4,5-diphenyl-4H-1,2,4-triazol-3-yl)phenyl]-9H-carbazole (abbreviation: CzTAZ1); 2,2',2"-(1,3,5-benzenetriyl)tris(1-phenyl-1H-benzimidazole) (abbreviation: TPBI), 2-[3-(dibenzothiophen-4-yl)phenyl]-1-phenyl-1H-benzimidazole (abbreviation: mDBTBIm-II), bathophenanthroline (abbreviation: BPhen), and bathocuproine (abbreviation: BCP); heterocyclic compounds having a diazine skeleton such as 2-[3-(dibenzothiophen-4-yl)phenyl] dibenzo[f,h]quinoxaline (abbreviation: 2mDBTPDBq-II), 2-[3'-(dibenzothiophen-4-yl)biphenyl-3-yl]dibenzo[f,h]quinoxaline (abbreviation: 2mDBTBPDBq-II), 2-[3'-(9H-carbazol-9-yl)biphenyl-3-yl]dibenzo[f,h]quinoxaline (abbreviation: 2mCzBPDBq), 2-[4-(3,6-diphenyl-9H-carbazol-9-yl)phenyl]dibenzo[f,h]quinoxaline (abbreviation: 2CzPDBq-III), 7-[3-(dibenzothiophen-4-yl)phenyl]dibenzo [f,h]quinoxaline (abbreviation: 7mDBTPDBq-II), 6-[3-(dibenzothiophen-4-yl)phenyl]dibenzo[f,h]quinoxaline (abbreviation: 6mDBTPDBq-II), 4,6-bis[3-(phenanthren-9-yl) phenyl]pyrimidine (abbreviation: 4,6mPnP2Pm), 2-[3-(3,9-bi-9H-carbazol-9-yl)phenyl]dibenzo[f,h]quinoxaline (abbreviation: 2mCzCzPDBq), 4,6-bis[3-(4-dibenzothienyl) phenyl]pyrimidine (abbreviation: 4,6mDBTP2Pm-II), and 4,6-bis[3-(9H-carbazol-9-yl)phenyl]pyrimidine (abbreviation: 4,6mCzP2Pm); heterocyclic compounds having a triazine skeleton such as 2-{4-[3-(N-phenyl-9H-carbazol-3-yl)-9H-carbazol-9-yl]phenyl}-4,6-diphenyl-1,3,5-triazine (abbreviation: PCCzPTzn); heterocyclic compounds having a pyridine skeleton such as 3,5-bis[3-(9H-carbazol-9-yl) phenyl]pyridine (abbreviation: 35DCzPPy); 1,3,5-tri[3-(3-pyridyl)phenyl]benzene (abbreviation: TmPyPB), and heteroaromatic compounds such as 4,4'-bis(5-methylbenzoxazol-2-yl)stilbene (abbreviation: BzOs). Among the heterocyclic compounds, the heterocyclic compounds having diazine skeletons (pyrimidine, pyrazine, pyridazine) or having a pyridine skeleton are highly reliable and stable and is thus preferably used. In addition, the heterocyclic compounds having the skeletons have a high electron-transport property to contribute to a reduction in drive voltage. Further alternatively, a high molecular compound such as poly(2,5-pyridinediyl) (abbreviation: PPy), poly[(9,9-dihexylfluorene-2,7-diyl)-co-(pyridine-3,5-diyl)] (abbreviation: PF-Py) or poly[(9,9-dioctylfluorene-2,7-diyl)-co-(2,2'-bipyridine-6,6'-diyl)] (abbreviation: PF-BPy) can be used. The substances listed here are mainly ones that have an electron mobility of $1\times10^{-6}$ cm$^2$/Vs or higher. However, any substance other than the above-described substances may be used as long as it is a substance whose electron-transport property is higher than the hole-transport property.

A high molecular compound may have a structure where one or two hydrogen atoms are removed from any of the above-described hole-transport materials and electron-transport materials.

Note that the light-emitting layer 150 can be formed by an evaporation method (including a vacuum evaporation method), an inkjet method, a coating method, a nozzle-printing method, gravure printing, or the like.

When a high molecular compound is used for the light-emitting layer 150, another material may be used for the light-emitting element 150 in addition to the high molecular compound. In that case, it is preferable that the material and the high molecular compound be dissolved in the same solvent.

Examples of a solvent which can be used in the case where the inkjet method, the coating method, the nozzle-printing method, the gravure printing method, or the like is used include: chlorine-based solvents such as dichloroethane, trichloroethane, chlorobenzene, and dichlorobenzene; ether-based solvents such as tetrahydrofuran, dioxane, anisole, and methylanisole; aromatic hydrocarbon-based solvents such as toluene, xylene, mesitylene, ethylbenzene, hexylbenzene, and cyclohexylbenzene; aliphatic hydrocarbon-based solvents such as cyclohexane, methylcyclohexane, pentane, hexane, heptane, octane, nonane, decane, dodecane, and bicyclohexyl; ketone-based solvents such as acetone, methyl ethyl ketone, cyclohexane, benzophenone, and acetophenone; ester-based solvents such as ethyl acetate, butyl acetate, ethyl cellosolve acetate, methyl benzoate, and phenyl acetate; polyalcohol-based solvents such as ethylene glycol, glycerin, and hexanediol; alcohol-based solvents such as isopropyl alcohol and cyclohexanol; a sulfoxide-based solvent such as dimethylsulfoxide; and amide-based solvents such as methylpyrrolidone and dimethylformamide. As the solvent, one or more materials can be used.

The light-emitting layer 150 can have a structure in which two or more layers are stacked. For example, in the case where the light-emitting layer 150 is formed by stacking a first light-emitting layer and a second light-emitting layer in this order from the hole-transport layer side, the first light-emitting layer is formed using a substance having a hole-transport property as the high molecular compound and the second light-emitting layer is formed using a substance having an electron-transport property as the high molecular compound.

[Hole-Injection Layer]

The hole-injection layer 151 has a function of reducing a barrier for hole injection from one of the pair of electrodes (the conductive films 138 and 144) to promote hole injection and is formed using a transition metal oxide, a phthalocyanine derivative, or an aromatic amine, for example. As the transition metal oxide, molybdenum oxide, vanadium oxide, ruthenium oxide, tungsten oxide, manganese oxide, or the like can be given. As the phthalocyanine derivative, phthalocyanine, metal phthalocyanine, or the like can be given. As the aromatic amine, a benzidine derivative, a phenylenediamine derivative, or the like can be given. It is also possible to use a high molecular compound such as polythiophene or polyaniline; a typical example thereof is poly(ethylenedioxythiophene)/poly(styrenesulfonic acid), which is self-doped polythiophene. In addition, polyvinylcarbazole and a derivative thereof, polyarylene including an aromatic amine skeleton or a π-electron rich heteroaromatic skeleton in a side chain or a main chain and a derivative thereof, and the like are given as examples.

As the hole-injection layer 151, a layer containing a composite material of a hole-transport material and a material having a property of accepting electrons from the hole-transport material can also be used. Alternatively, a stack of a layer containing a material having an electron accepting property and a layer containing a hole-transport material may also be used. In a steady state or in the presence of an electric field, electric charge can be transferred between these materials. As examples of the material having an electron accepting property, organic acceptors such as a quinodimethane derivative, a chloranil derivative, and a hexaazatriphenylene derivative can be given. A specific example is a compound having an electron-withdrawing group (a halogen group or a cyano group), such as 7,7,8,8-tetracyano-2,3,5,6-tetrafluoroquinodimethane (abbreviation: F$_4$-TCNQ), chloranil, or 2,3,6,7,10,11-hexacyano-1,4,5,8,9,12-hexaazatriphenylene (abbreviation: HAT-CN). Alternatively, a transition metal oxide such as an oxide of a metal from Group 4 to Group 8 can also be used. Specifically, vanadium oxide, niobium oxide, tantalum oxide, chromium oxide, molybdenum oxide, tungsten oxide, manganese oxide, rhenium oxide, or the like can be used. In particular, molybdenum oxide is preferable because it is stable in the air, has a low hygroscopic property, and is easily handled.

A material having a property of transporting more holes than electrons can be used as the hole-transport material, and a material having a hole mobility of $1\times10^{-6}$ cm$^2$/Vs or higher is preferable. Specifically, any of the aromatic amine, carbazole derivative, aromatic hydrocarbon, stilbene derivative, and the like described as examples of the hole-transport material that can be used in the light-emitting layer 150 can be used. Furthermore, the hole-transport material may be a high molecular compound.

[Hole-Transport Layer]

A hole-transport layer may be provided between the hole-injection layer 151 and the light-emitting layer 150. The hole-transport layer is a layer containing a hole-transport material and can be formed using any of the hole-transport materials given as examples of the material of the hole-injection layer 151. In order that the hole-transport layer 152 has a function of transporting holes injected into the hole-injection layer 151 to the light-emitting layer 150, the highest occupied molecular orbital (HOMO) level of the hole-transport layer 152 is preferably equal or close to the HOMO level of the hole-injection layer 151.

As the hole-transport material, a substance having a hole mobility of $1\times10^{-6}$ cm$^2$/Vs or higher is preferably used. Note that other than these substances, any substance that has a property of transporting more holes than electrons may be used. The layer including a substance having a high hole-transport property is not limited to a single layer, and two or more layers containing the aforementioned substances may be stacked.

[Electron-Transport Layer]

An electron-transport layer may be provided between the light-emitting layer 150 and the electron-injection layer. The electron-transport layer has a function of transporting, to the light-emitting layer 150, electrons injected from the other of the pair of electrodes (the conductive film 138 or the conductive film 144) through the electron-injection layer. A material having a property of transporting more electrons than holes can be used as an electron-transport material, and a material having an electron mobility of $1\times10^{-6}$ cm$^2$/Vs or higher is preferable. A π-electron deficient heteroaromatic compound such as a nitrogen-containing heteroaromatic compound, a metal complex, or the like can be used as the material which easily accepts electrons (the material having an electron-transport property). Specifically, there are metal complexes having a quinoline ligand, a benzoquinoline ligand, an oxazole ligand, and a thiazole ligand, which are described as the electron-transport materials that can be used in the light-emitting layer 150. In addition, an oxadiazole derivative, a triazole derivative, a phenanthroline derivative, a pyridine derivative, a bipyridine derivative, a pyrimidine derivative, and the like can be given. In addition, a high molecular compound such as polyphenylene, polyfluorene, and derivatives thereof may be used. A substance having an electron mobility of $1\times10^{-6}$ cm$^2$/Vs or higher is preferable. Note that a substance other than the above substances may be used as long as it has a higher electron-transport property than a hole-transport property. The electron-transport layer is not limited to a single layer and may include two or more stacking layers containing the above substances.

Between the electron-transport layer and the light-emitting layer 150, a layer that controls transfer of electron carriers may be provided. This is a layer formed by addition of a small amount of a substance having a high electron-trapping property to a material having a high electron-transport property as described above, and the layer is capable of adjusting carrier balance by suppressing transport of electron carriers. Such a structure is very effective in preventing a problem (such as a reduction in element lifetime) caused when electrons pass through the light-emitting layer.

[Electron-Injection Layer]

The electron-injection layer 154 has a function of reducing a barrier for electron injection from the conductive film 144 to promote electron injection and can be formed using a Group 1 metal or a Group 2 metal, or an oxide, a halide, or a carbonate of any of the metals, for example. Alternatively, a composite material containing an electron-transport material (described above) and a material having a property of donating electrons to the electron-transport material can also be used. As the material having an electron-donating property, a Group 1 metal, a Group 2 metal, an oxide of any of the metals, or the like can be given. Specifically, an alkali metal, an alkaline earth metal, or a compound thereof, such as lithium fluoride (LiF), sodium fluoride (NaF), cesium fluoride (CsF), calcium fluoride (CaF$_2$), or lithium oxide (LiO$_x$), can be used. Alternatively, a rare earth metal compound like erbium fluoride (ErF$_3$) can be used. Electride may also be used for the electron-injection layer 154. Examples of the electride include a substance in which electrons are added at high concentration to calcium oxide-aluminum oxide. The electron-injection layer 154 can be formed using the substance that can be used for the electron-transport layer.

A composite material in which an organic compound and an electron donor (donor) are mixed may also be used for the electron-injection layer 154. Such a composite material is excellent in an electron-injection property and an electron-transport property because electrons are generated in the organic compound by the electron donor. In this case, the organic compound is preferably a material that is excellent in transporting the generated electrons. Specifically, the aforementioned substances for forming the electron-transport layer (e.g., the metal complexes and heteroaromatic compounds) can be used, for example. As the electron donor, a substance showing an electron-donating property with respect to the organic compound may be used. Specifically, an alkali metal, an alkaline earth metal, and a rare earth metal are preferable, and lithium, sodium, cesium, magnesium, calcium, erbium, ytterbium, and the like are given. In addition, an alkali metal oxide or an alkaline earth metal oxide is preferable, and lithium oxide, calcium oxide, barium oxide, and the like are given. A Lewis base such as magnesium oxide can also be used. An organic compound such as tetrathiafulvalene (abbreviation: TTF) can also be used.

Note that the light-emitting layer, the hole-injection layer, the hole-transport layer, the electron-transport layer, and the electron-injection layer described above can each be formed by an evaporation method (including a vacuum evaporation method), an ink-jet method, a coating method, a nozzle-printing method, a gravure printing method, or the like. Besides the above-mentioned materials, an inorganic compound such as a quantum dot may be used in the light-emitting layer, the hole-injection layer, the hole-transport layer, the electron-transport layer, and the electron-injection layer.

Examples of a material forming a quantum dot include a single Group 14 element, a compound of a plurality of Group 14 elements, a single Group 15 element, a single Group 16 element, a compound of an element belonging to any of Groups 4 to 14 and a Group 16 element, a compound of a Group 2 element and a Group 16 element, a compound of a Group 13 element and a Group 15 element, a compound of a Group 13 element and a Group 17 element, a compound of a Group 14 element and a Group 15 element, a compound of a Group 11 element and a Group 17 element, iron oxides, titanium oxides, spinel chalcogenides, and semiconductor clusters.

Specific examples include, but are not limited to, cadmium selenide (CdSe); cadmium sulfide (CdS); cadmium telluride (CdTe); zinc selenide (ZnSe); zinc oxide (ZnO); zinc sulfide (ZnS); zinc telluride (ZnTe); mercury sulfide (HgS); mercury selenide (HgSe); mercury telluride (HgTe); indium arsenide (InAs); indium phosphide (InP); gallium arsenide (GaAs); gallium phosphide (GaP); indium nitride (InN); gallium nitride (GaN); indium antimonide (InSb); gallium antimonide (GaSb); aluminum phosphide (AlP); aluminum arsenide (AlAs); aluminum antimonide (AlSb); lead(II) selenide (PbSe); lead(II) telluride (PbTe); lead(II) sulfide (PbS); indium selenide (In$_2$Se$_3$); indium telluride (In$_2$Te$_3$); indium sulfide (In$_2$S$_3$); gallium selenide (Ga$_2$Se$_3$); arsenic(III) sulfide (As$_2$S$_3$); arsenic(III) selenide (As$_2$Se$_3$); arsenic(III) telluride (As$_2$Te$_3$); antimony(III) sulfide (Sb$_2$S$_3$); antimony(III) selenide (Sb$_2$Se$_3$); antimony(III) telluride (Sb$_2$Te$_3$); bismuth(III) sulfide (Bi$_2$S$_3$); bismuth(III) selenide (Bi$_2$Se$_3$); bismuth(III) telluride (Bi$_2$Te$_3$); silicon (Si); silicon carbide (SiC); germanium (Ge); tin (Sn); selenium (Se); tellurium (Te); boron (B); carbon (C); phosphorus (P); boron nitride (BN); boron phosphide (BP); boron arsenide (BAs); aluminum nitride (AlN); aluminum sulfide (Al$_2$S$_3$); barium sulfide (BaS); barium selenide (BaSe); barium telluride (BaTe); calcium sulfide (CaS); calcium selenide (CaSe); calcium telluride (CaTe); beryllium sulfide (BeS); beryllium selenide (BeSe); beryllium telluride (BeTe); magnesium sulfide (MgS); magnesium selenide (MgSe); germanium sulfide (GeS); germanium selenide (GeSe); germanium telluride (GeTe); tin(IV) sulfide (SnS$_2$); tin(II) sulfide (SnS); tin(II) selenide (SnSe); tin(II) telluride (SnTe); lead(II) oxide (PbO); copper(I) fluoride (CuF); copper(I) chloride (CuCl); copper(I) bromide (CuBr); copper(I) iodide (CuI); copper(I) oxide (Cu$_2$O); copper(I) selenide (Cu$_2$Se); nickel(II) oxide (NiO); cobalt(II) oxide (CoO); cobalt(II) sulfide (CoS); triiron tetraoxide ($Fe_3O_4$); iron(II) sulfide (FeS); manganese(II) oxide (MnO); molybdenum(IV) sulfide ($MoS_2$); vanadium(II) oxide (VO); vanadium(IV) oxide ($VO_2$); tungsten(IV) oxide ($WO_2$); tantalum (V) oxide ($Ta_2O_5$); titanium oxide (e.g., $TiO_2$, $Ti_2O_5$, $Ti_2O_3$, or $Ti_5O_9$); zirconium oxide ($ZrO_2$); silicon nitride ($Si_3N_4$); germanium nitride ($Ge_3N_4$); aluminum oxide ($Al_2O_3$); barium titanate ($BaTiO_3$); a compound of selenium, zinc, and cadmium (CdZnSe); a compound of indium, arsenic, and phosphorus (InAsP); a compound of cadmium, selenium, and sulfur (CdSeS); a compound of cadmium, selenium, and tellurium (CdSeTe); a compound of indium, gallium, and arsenic (InGaAs); a compound of indium, gallium, and selenium (InGaSe); a compound of indium, selenium, and sulfur (InSeS); a compound of copper, indium, and sulfur (e.g., $CuInS_2$); and combinations thereof. What is called an alloyed quantum dot, whose composition is represented by a given ratio, may be used. For example, an alloyed quantum dot represented by $CdS_xSe_{1-x}$ (where x is any number between 0 and 1 inclusive) is a means effective in obtaining blue light because the emission wavelength can be changed by changing x.

As the quantum dot, any of a core-type quantum dot, a core-shell quantum dot, a core-multishell quantum dot, and the like can be used. Note that when a core is covered with a shell formed of a second inorganic material having a wider band gap, the influence of defects and dangling bonds existing at the surface of a nanocrystal can be reduced. Since such a structure can significantly improve the quantum efficiency of light emission, it is preferable to use a core-shell or core-multishell quantum dot. Examples of the material of a shell include zinc sulfide (ZnS) and zinc oxide (ZnO).

Quantum dots have a high proportion of surface atoms and thus have high reactivity and easily cohere together. For this reason, it is preferable that a protective agent be attached to, or a protective group be provided at the surfaces of quantum dots. The attachment of the protective agent or the provision of the protective group can prevent cohesion and increase solubility in a solvent. It can also reduce reactivity and improve electrical stability. Examples of the protective agent (or the protective group) include polyoxyethylene alkyl ethers such as polyoxyethylene lauryl ether, polyoxyethylene stearyl ether, and polyoxyethylene oleyl ether; trialkylphosphines such as tripropylphosphine, tributylphosphine, trihexylphosphine, and trioctylphoshine; polyoxyethylene alkylphenyl ethers such as polyoxyethylene n-octylphenyl ether and polyoxylethylene n-nonylphenyl ether; tertiary amines such as tri(n-hexyl)amine, tri(n-octyl)amine, and tri(n-decyl)amine; organophosphorus compounds such as tripropylphosphine oxide, tributylphosphine oxide, trihexylphosphine oxide, trioctylphosphine oxide, and tridecylphosphine oxide; polyethylene glycol diesters such as polyethylene glycol dilaurate and polyethylene glycol distearate; organic nitrogen compounds such as nitrogen-containing aromatic compounds, e.g., pyridines, lutidines, collidines, and quinolines; aminoalkanes such as hexylamine, octylamine, decylamine, dodecylamine, tetradecylamine, hexadecylamine, and octadecylamine; dialkylsulfides such as dibutylsulfide; dialkylsulfoxides such as dimethylsulfoxide and dibutylsulfoxide; organic sulfur compounds such as sulfur-containing aromatic compounds, e.g., thiophene; higher fatty acids such as a palmitin acid, a stearic acid, and an oleic acid; alcohols; sorbitan fatty acid esters; fatty acid modified polyesters; tertiary amine modified polyurethanes; and polyethyleneimines.

The quantum dots may be quantum rods, which are rod-like shape quantum dots. A quantum rod emits directional light polarized in the c-axis direction; thus, quantum rods can be used as a light-emitting material to obtain a light-emitting element with higher external quantum efficiency.

In the case of using quantum dots as the light-emitting material in the light-emitting layer, the thickness of the light-emitting layer is set to 3 nm to 100 nm, preferably 10 nm to 100 nm, and the light-emitting layer is made to contain 1 volume % to 100 volume % of the quantum dots. Note that it is preferable that the light-emitting layer be composed of the quantum dots. To form a light-emitting layer in which the quantum dots are dispersed as light-emitting materials in host materials, the quantum dots may be dispersed in the host materials, or the host materials and the quantum dots may be dissolved or dispersed in an appropriate liquid medium, and then a wet process (e.g., a spin coating method, a casting method, a die coating method, blade coating method, a roll coating method, an ink-jet method, a printing method, a spray coating method, a curtain coating method, or a Langmuir-Blodgett method) may be employed.

An example of the liquid medium used for the wet process is an organic solvent of ketones such as methyl ethyl ketone and cyclohexanone; fatty acid esters such as ethyl acetate; halogenated hydrocarbons such as dichlorobenzene; aromatic hydrocarbons such as toluene, xylene, mesitylene, and cyclohexylbenzene; aliphatic hydrocarbons such as cyclohexane, decalin, and dodecane; dimethylformamide (DMF); dimethyl sulfoxide (DMSO); or the like.

[Pair of Electrodes]

The conductive films 138 and 144 function as an anode and a cathode of each light-emitting element. The conductive films 138 and 144 can be formed using a metal, an alloy, or a conductive compound, or a mixture or a stack thereof, for example.

In addition to the materials described in Embodiment 1, below-described materials may be used for the conductive film 138 and the conductive film 133.

One of the conductive films 138 and 144 is preferably formed using a conductive material having a function of reflecting light. Examples of the conductive material include aluminum (Al) and an alloy containing Al. Examples of the alloy containing Al include an alloy containing Al and L (L represents one or more of titanium (Ti), neodymium (Nd), nickel (Ni), and lanthanum (La)), such as an alloy containing Al and Ti and an alloy containing Al, Ni, and La. Aluminum has low resistance and high light reflectivity. Aluminum is included in earth's crust in large amount and is inexpensive; therefore, a light-emitting element with aluminum can be manufactured at low costs. Alternatively, silver (Ag), an alloy of Ag and N (N represents one or more of yttrium (Y), Nd, magnesium (Mg), ytterbium (Yb), Al, Ti, gallium (Ga), zinc (Zn), indium (In), tungsten (W), manganese (Mn), tin (Sn), iron (Fe), Ni, copper (Cu), palladium (Pd), iridium (Ir), or gold (Au)), or the like can be used. Examples of the alloy containing silver include an alloy containing silver, palladium, and copper, an alloy containing silver and copper, an alloy containing silver and magnesium, an alloy containing silver and nickel, an alloy containing silver and gold, an alloy containing silver and ytterbium, and the like. Besides, a transition metal such as tungsten, chromium (Cr), molybdenum (Mo), copper, or titanium can be used.

Light emitted from the light-emitting layer is extracted through the conductive film 138 and/or the conductive film 144. Thus, at least one of the conductive films 138 and 144 is preferably formed using a conductive material having a function of transmitting light. Examples of the conductive material include a conductive material having a visible light transmittance higher than or equal to 40% and lower than or equal to 100%, preferably higher than or equal to 60% and lower than or equal to 100%, and a resistivity lower than or equal to $1 \times 10^{-2}$ Ω·cm.

The conductive films 138 and 144 may each be formed using a conductive material having functions of transmitting light and reflecting light. Examples of the conductive material include a conductive material having a visible light reflectivity higher than or equal to 20% and lower than or equal to 80%, preferably higher than or equal to 40% and lower than or equal to 70%, and a resistivity lower than or equal to $1 \times 10^{-2}$ Ω·cm. For example, one or more kinds of conductive metals and alloys, conductive compounds, and the like can be used. Specifically, a metal oxide such as indium tin oxide (hereinafter, referred to as ITO), indium tin oxide containing silicon or silicon oxide (ITSO), indium oxide-zinc oxide (indium zinc oxide), indium oxide-tin oxide containing titanium, indium titanium oxide, or indium oxide containing tungsten oxide and zinc oxide can be used. A metal thin film having a thickness that allows transmission of light (preferably, a thickness greater than or equal to 1 nm and less than or equal to 30 nm) can also be used. As the metal, Ag, an alloy of Ag and Al, an alloy of Ag and Mg, an alloy of Ag and Au, an alloy of Ag and Yb, or the like can be used.

In this specification and the like, the material transmitting light may be a material that transmits visible light and has conductivity. Examples of the material include, in addition to the above-described oxide conductor typified by ITO, an oxide semiconductor and an organic conductor containing an organic substance. Examples of the organic conductor containing an organic substance include a composite material in which an organic compound and an electron donor (donor material) are mixed and a composite material in which an organic compound and an electron acceptor (acceptor material) are mixed. Alternatively, an inorganic carbon-based material such as graphene may be used. The resistivity of the material is preferably lower than or equal to $1 \times 10^5$ Ω·cm, further preferably lower than or equal to $1 \times 10^4$ Ω·cm.

Alternatively, the conductive film 138 and/or the conductive film 144 may be formed by stacking two or more of these materials.

Furthermore, to increase light extraction efficiency, a material having a higher refractive index than an electrode that has a function of transmitting light may be formed in contact with the electrode. Such a material may be a conductive material or a non-conductive material as long as having a function of transmitting visible light. For example, in addition to the above-described oxide conductor, an oxide semiconductor and an organic material are given as examples. As examples of the organic material, materials of the light-emitting layer, the hole-injection layer, the hole-transport layer, the electron-transport layer, and the electron-injection layer are given. Alternatively, an inorganic carbon-based material or a metal film thin enough to transmit light can be used. A plurality of layers each of which is formed using the material having a high refractive index and has a thickness of several nanometers to several tens of nanometers may be stacked.

In the case where the conductive film 138 or the conductive film 144 functions as the cathode, the electrode preferably contains a material having a low work function (lower than or equal to 3.8 eV). The examples include an element belonging to Group 1 or 2 of the periodic table (e.g., an alkali metal such as lithium, sodium, or cesium, an alkaline earth metal such as calcium or strontium, or magnesium), an alloy containing any of these elements (e.g., Ag—Mg or Al—Li), a rare earth metal such as europium (Eu) or Yb, an alloy containing any of these rare earth metals, and an alloy containing aluminum and silver.

In the case where the conductive film 138 or 144 is used as an anode, a material having a high work function (higher than or equal to 4.0 eV) is preferably used.

Alternatively, the conductive films 138 and 144 may each be a stack of a conductive material having a function of reflecting light and a conductive material having a function of transmitting light. Such a structure is preferable because the conductive films 138 and 144 can each have a function of adjusting the optical path length so that light of desired wavelength emitted from each light-emitting layer resonates and is intensified.

As the method for forming the conductive films 138 and 144, a sputtering method, an evaporation method, a printing method, a coating method, a molecular beam epitaxy (MBE) method, a CVD method, a pulsed laser deposition method, an atomic layer deposition (ALD) method, or the like can be used as appropriate.

5-2. Manufacturing Method of Light-Emitting Element

Here, a method for forming the EL layer 142 by a droplet discharge method is described with reference to FIGS. 55A to 55D. FIGS. 55A to 55D are cross-sectional views illustrating the method for forming the EL layer 142.

Figure 55A:
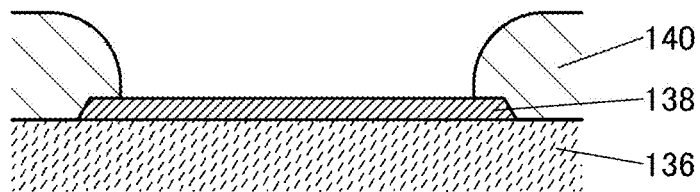
FIGS. 55A to 55D are schematic cross-sectional views illustrating a method for forming an EL layer.
Figure 55B:
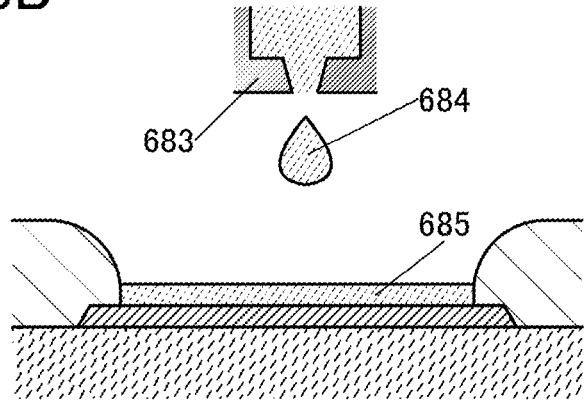

FIG. 55A illustrates a substrate over which the insulating film 136, the conductive film 138, and the insulating film 140 are formed.

First, in a portion where the conductive film 138 is exposed, which is an opening of the insulating film 140, a droplet 684 is discharged from a droplet discharge apparatus 683 to form a layer 685 containing a composition. The droplet 684 is a composition containing a solvent and is attached to the conductive film 138 (see FIG. 55B).

Note that the method for discharging the droplet 684 may be performed under reduced pressure.

Figure 55C:
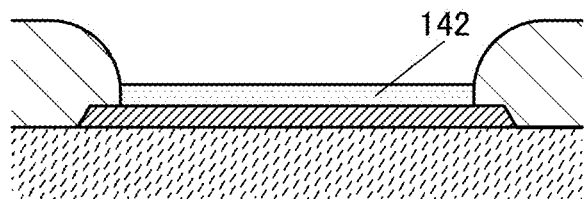

Then, the solvent is removed from the layer 685 containing the composition, and the resulting layer is solidified to form the EL layer 142 (see FIG. 55C).

The solvent may be removed by drying or heating.

Figure 55D:
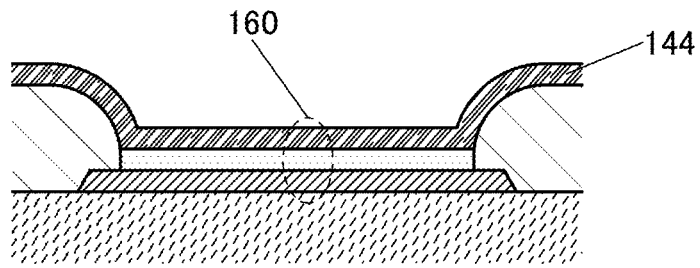

Next, the conductive film 144 is formed over the EL layer 142, whereby the light-emitting element 160 is formed (see FIG. 55D).

When the EL layer 142 is formed by a droplet discharging method as described above, the composition can be selectively discharged, and thus, waste of material can be reduced. Furthermore, a lithography process or the like for shaping is not needed, and thus, the process can be simplified and cost reduction can be achieved.

Note that FIGS. 55A to 55D illustrate a process for forming the EL layer 142 as a single layer. When the EL layer 142 includes functional layers in addition to the light-emitting layer 150 as shown in FIG. 54, the layers are formed sequentially from the conductive film 138 side. In that case, the hole-injection layer 151, the hole-transport layer 152, the light-emitting layer 150, the electron-transport layer 153, and the electron-injection layer 154 may be formed by a droplet discharging method. Alternatively, the hole-injection layer 151, the hole-transport layer 152, and the light-emitting layer 150 may be formed by a droplet discharging method, whereas the electron-transport layer 153 and the electron-injection layer 154 may be formed by an evaporation method or the like. The light-emitting layer may be formed by a combination of a droplet discharging method and an evaporation method or the like.

The hole-injection layer 151 can be formed using poly (ethylenedioxythiophene)/poly(styrenesulfonic acid) by a coating method, such as a droplet discharging method or a spin coating method, for example. The hole-transport layer 152 can be formed using a hole-transport material, e.g., polyvinylcarbazole, by a coating method, such as a droplet discharging method or a spin coating method, for example. After the formation of the hole-injection layer 151 and after the formation of the hole-transport layer 152, heat treatment may be performed under an air atmosphere or an inert gas atmosphere such as nitrogen.

The light-emitting layer 150 can be formed using a high molecular compound or a low molecular compound that emits at least one of violet light, blue light, blue green light, green light, yellow green light, yellow light, orange light, and red light. As the high molecular compound and the low molecular compound, a fluorescent or phosphorescent organic compound can be used. With the use of a solvent in which the high molecular compound and the low molecular compound are dissolved, the light-emitting layer 150 can be formed by a coating method, such as a droplet discharging method or a spin coating method. After the formation of the light-emitting layer 150, heat treatment may be performed under an air atmosphere or an inert gas atmosphere such as a nitrogen atmosphere. With the use of the fluorescent or phosphorescent organic compound as a guest material, the guest material may be dispersed into a high molecular compound or a low molecular compound that has higher excitation energy than the guest material. The light-emitting layer 150 may be deposited using a light-emitting organic compound alone. Alternatively, the light-emitting layer 150 may be deposited using a light-emitting organic compound mixed with another substance. The light-emitting layer 150 may have a two-layer structure. In that case, each layer of the two-layer light-emitting layer preferably contains a light-emitting organic compound whose emission color is different from that of the other layer. When the light-emitting layer 150 is formed using a low molecular compound, an evaporation method can be used.

The electron-transport layer 153 can be formed using a substance having a high electron-transport property. The electron-injection layer 154 can be formed using a substance having a high electron-injection property. Note that the electron-transport layer 153 and the electron-injection layer 154 can be formed by an evaporation method.

The conductive film 144 can be formed by an evaporation method. The conductive film 144 can be formed using a conductive film having a light-transmitting property. Alternatively, the conductive film 144 may have a stacked layer including a reflective conductive film and a light-transmitting conductive film.

The droplet discharge method described above is a general term for a means including a nozzle equipped with a composition discharge opening or a means to discharge droplets such as a head having one or a plurality of nozzles, such as an ink jet method or a nozzle printing method.

5-3. Droplet Discharge Apparatus

Figure 56:
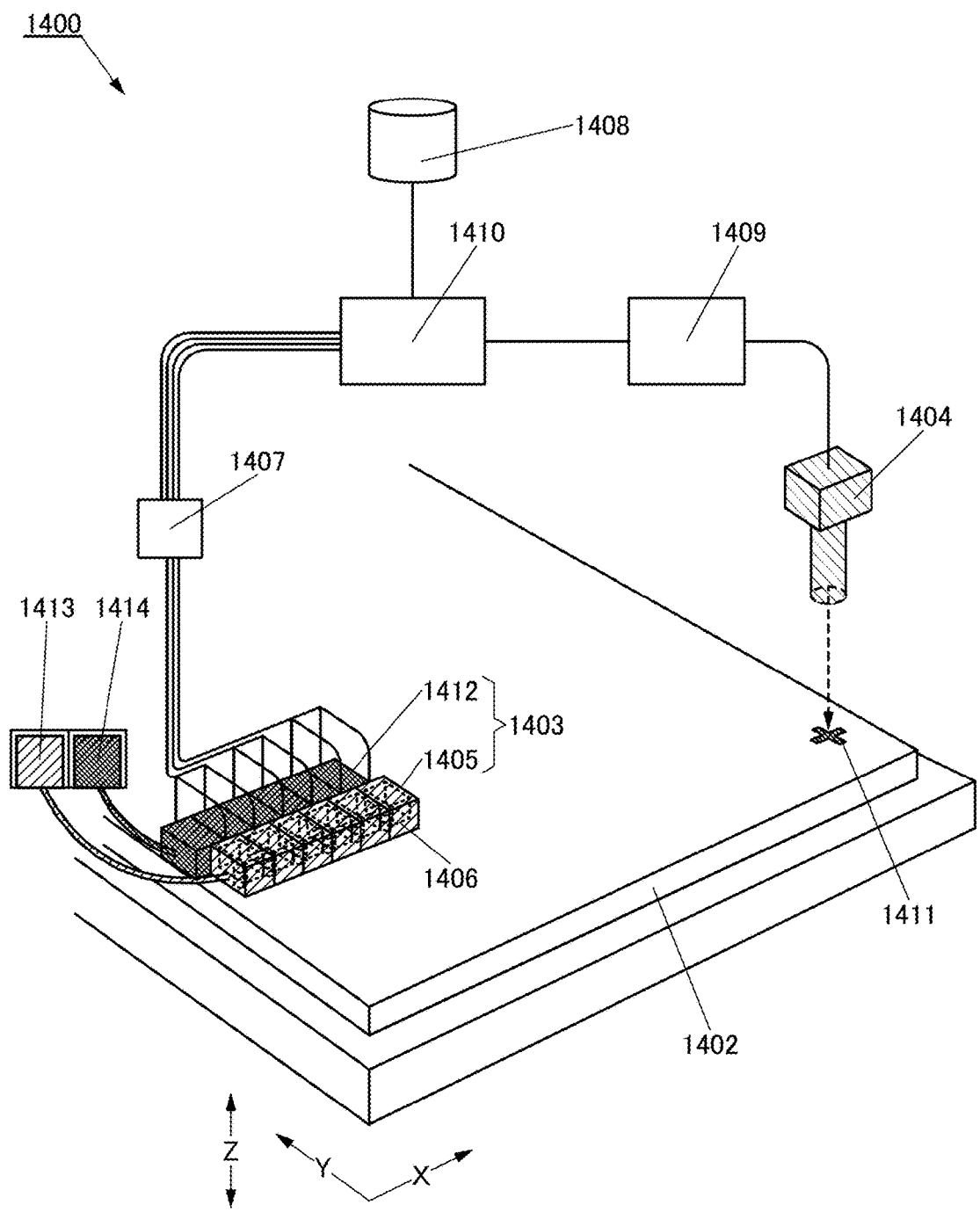
FIG. 56 is a conceptual diagram illustrating a droplet discharge apparatus.

Next, a droplet discharge apparatus used for the droplet discharge method is described with reference to FIG. 56. FIG. 56 is a conceptual diagram illustrating a droplet discharge apparatus 1400.

The droplet discharge apparatus 1400 includes a droplet discharge means 1403. In addition, the droplet discharge means 1403 is equipped with a head 1405 and a head 1412.

The heads 1405 and 1412 are connected to a control means 1407 that is controlled by a computer 1410 so that a preprogrammed pattern can be drawn.

The drawing may be conducted at a timing, for example, based on a marker 1411 formed over a substrate 1402. Alternatively, the reference point may be determined on the basis of an outer edge of the substrate 1402. Here, the marker 1411 is detected by an imaging means 1404 and converted into a digital signal by an image processing means 1409. Then, the digital signal is recognized by the computer 1410, and then, a control signal is generated and transmitted to the control means 1407.

An image sensor or the like using a charge coupled device (CCD) or a complementary metal oxide semiconductor (CMOS) can be used as the imaging means 1404. Note that information on a pattern to be formed over the substrate 1402 is stored in a storage medium 1408, and the control signal is transmitted to the control means 1407 on the basis of the information, whereby the head 1405 and the head 1412 of the droplet discharge means 1403 can be separately controlled. The heads 1405 and 1412 are supplied with a material to be discharged from material supply sources 1413 and 1414 through pipes, respectively.

Inside the head 1405, a space 1406 filled with a liquid material as indicated by a dotted line and a nozzle serving as a discharge opening are provided. Although it is not shown, an inside structure of the head 1412 is similar to that of the head 1405. When the nozzle sizes of the heads 1405 and 1412 are different from each other, different materials with different widths can be discharged simultaneously. Each head can discharge and draw a plurality of light emitting materials. In the case of drawing over a large area, the same material can be simultaneously discharged to be drawn from a plurality of nozzles in order to improve throughput. When a large substrate is used, the heads 1405 and 1412 can freely scan the substrate in directions indicated by arrows X, Y, and Z in FIG. 56, and a region in which a pattern is drawn can be freely set. Thus, a plurality of the same patterns can be drawn over one substrate.

A step of discharging the composition may be performed under reduced pressure. Also, a substrate may be heated when the composition is discharged. After discharging the composition, either drying or baking or the both is performed. Both the drying and baking steps are heat treatments but different in purpose, temperature, and time period. The steps of drying and baking are performed under normal pressure or under reduced pressure by laser irradiation, rapid thermal annealing, heating using a heating furnace, or the like. Note that the timing of the heat treatment and the number of times of the heat treatment are not particularly limited. The temperature for performing each of the steps of drying and baking in a favorable manner depends on the materials of the substrate and the properties of the composition.

As described above, the EL layer 142 can be formed using a droplet discharge apparatus.

Note that the structure described in this embodiment can be used in appropriate combination with any of the other embodiments.

Embodiment 6

In this embodiment, the composition and structure of an oxide semiconductor that can be used in one embodiment of the present invention are described with reference to FIGS. 57A to 57C to FIG. 64.

6-1. Composition of Oxide Semiconductor

The composition of an oxide semiconductor is described below.

An oxide semiconductor preferably contains at least indium or zinc. In particular, indium and zinc are preferably contained. In addition, aluminum, gallium, yttrium, tin, or the like is preferably contained. Furthermore, one or more elements selected from boron, silicon, titanium, iron, nickel, germanium, zirconium, molybdenum, lanthanum, cerium, neodymium, hafnium, tantalum, tungsten, magnesium, or the like may be contained.

Here, the case where an oxide semiconductor contains indium, an element M, and zinc is considered. The element M is aluminum, gallium, yttrium, tin, or the like. Alternatively, the element M can be boron, silicon, titanium, iron, nickel, germanium, zirconium, molybdenum, lanthanum, cerium, neodymium, hafnium, tantalum, tungsten, magnesium, or the like. Note that two or more of the above elements may be used in combination as the element M.

First, preferred ranges of the atomic ratio of indium, the element M, and zinc contained in an oxide semiconductor according to an embodiment of the present invention are described with reference to FIGS. 57A to 57C. Note that the proportion of oxygen atoms is not shown. The terms of the atomic ratio of indium, the element M, and zinc contained in the oxide semiconductor are denoted by [In], [M], and [Zn], respectively.

Figure 57A:
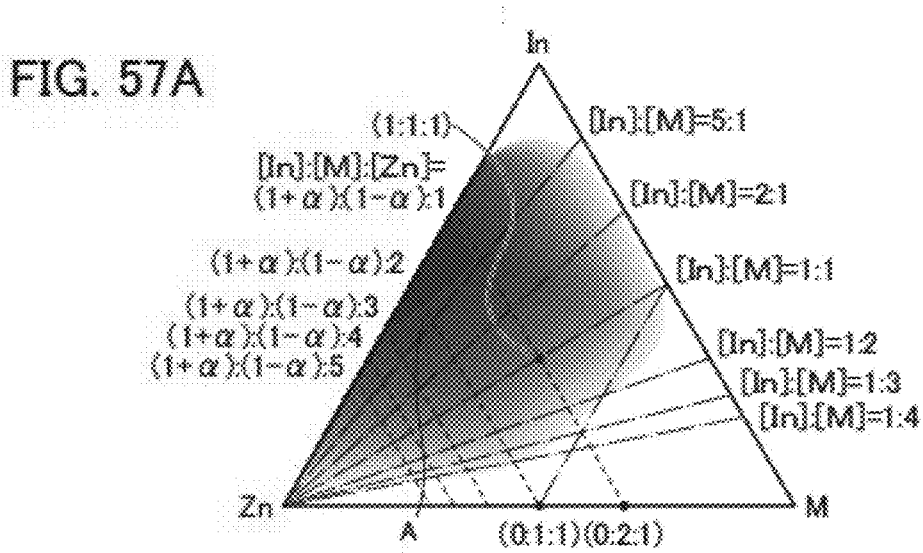
FIGS. 57A to 57C each show the range of the atomic ratio of an oxide semiconductor.
Figure 57B:
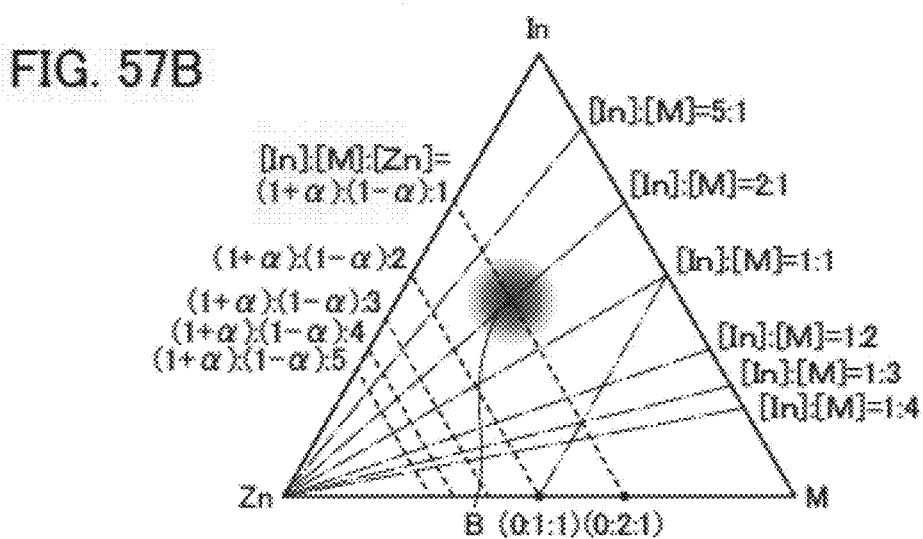
Figure 57C:
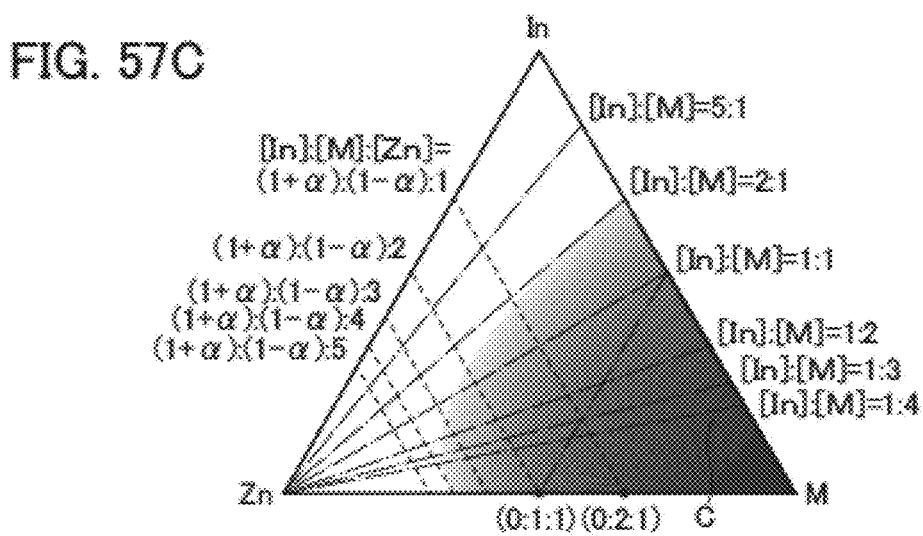

In FIGS. 57A to 57C, broken lines indicate a line where the atomic ratio [In]:[M]:[Zn] is $(1+\alpha):(1-\alpha):1$, where $-1\leq\alpha\leq1$, a line where the atomic ratio [In]:[M]:[Zn] is $(1+\alpha):(1-\alpha):2$, a line where the atomic ratio [In]:[M]:[Zn] is $(1+\alpha):(1-\alpha):3$, a line where the atomic ratio [In]:[M]:[Zn] is $(1+\alpha):(1-\alpha):4$, and a line where the atomic ratio [In]:[M]:[Zn] is $(1+\alpha):(1-\alpha):5$.

Dashed-dotted lines indicate a line where the atomic ratio [In]:[M]:[Zn] is $1:1:\beta$, where $\beta\geq0$, a line where the atomic ratio [In]:[M]:[Zn] is $1:2:\beta$, a line where the atomic ratio [In]:[M]:[Zn] is $1:3:\beta$, a line where the atomic ratio [In]:[M]:[Zn] is $1:4:\beta$, a line where the atomic ratio [In]:[M]:[Zn] is $2:1:\beta$, and a line where the atomic ratio [In]:[M]:[Zn] is $5:1:\beta$.

Dashed-double dotted lines is a line indicating the atomic ratio [In]:[M]:[Zn]=$(1+\gamma):2:(1-\gamma)$ $(-1\leq\gamma\leq1)$. The oxide semiconductor shown in FIGS. 57A to 57C with an atomic ratio of [In]:[M]:[Zn]=0:2:1 or an atomic ratio that is in the neighborhood thereof is likely to have a spinel crystal structure.

FIGS. 57A and 57B show examples of the preferred ranges of the atomic ratio of indium, the element M, and zinc contained in an oxide semiconductor in one embodiment of the present invention.

Figure 58:
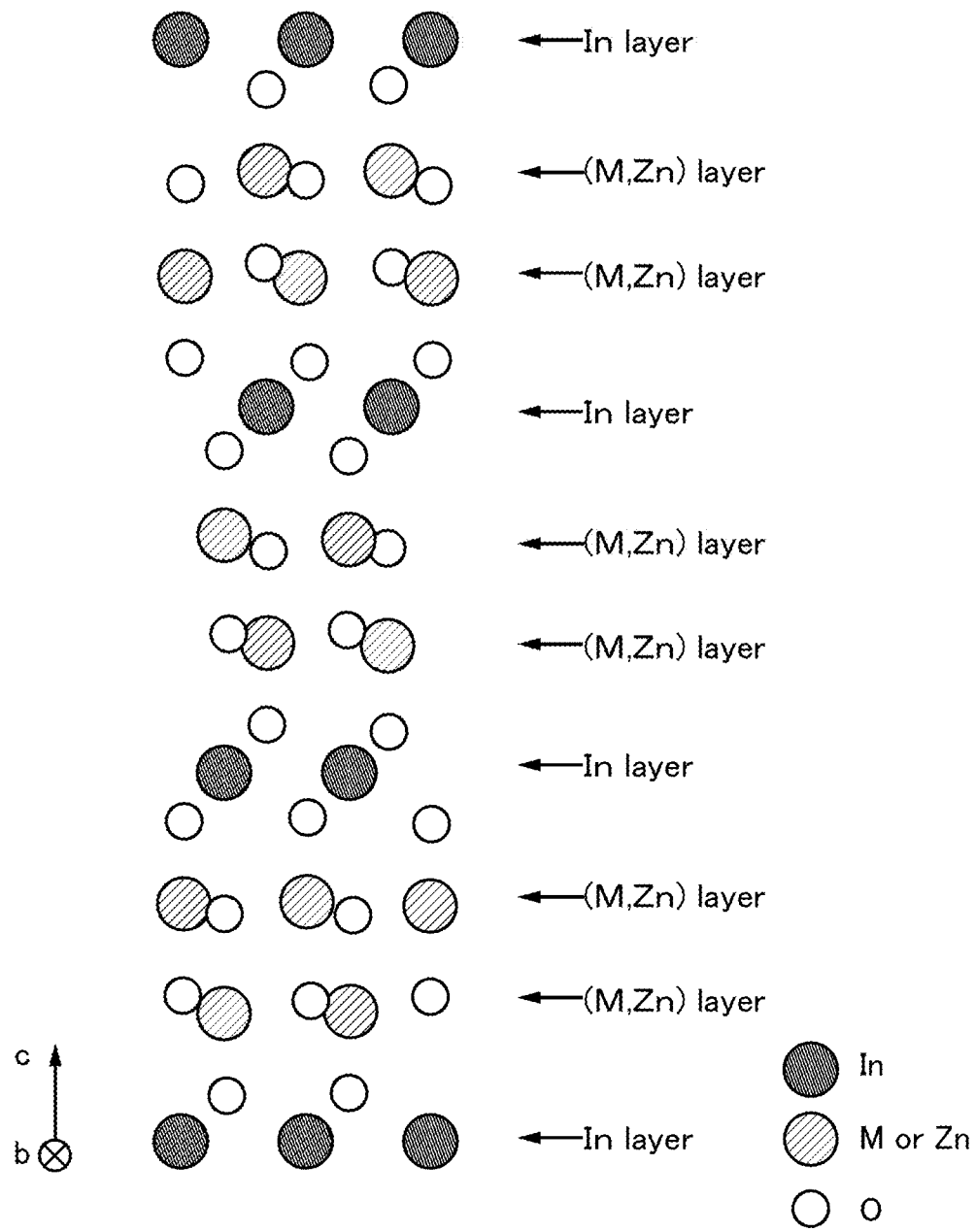
FIG. 58 is a figure illustrating a crystal structure of $InMZnO_4$.

FIG. 58 shows an example of the crystal structure of $InMZnO_4$ whose atomic ratio [In]:[M]:[Zn] is 1:1:1. The crystal structure shown in FIG. 58 is $InMZnO_4$ observed from a direction parallel to a b-axis. Note that a metal element in a layer that contains M, Zn, and oxygen (hereinafter, this layer is referred to as an "(M,Zn) layer") in FIG. 58 represents the element M or zinc. In that case, the proportion of the element M is the same as the proportion of zinc. The element M and zinc can be replaced with each other, and their arrangement is random.

$InMZnO_4$ has a layered crystal structure (also referred to as a layered structure) and includes one layer that contains indium and oxygen (hereinafter referred to as an In layer) for every two (M,Zn) layers that contain the element M, zinc, and oxygen, as shown in FIG. 58.

Indium and the element M can be replaced with each other. Thus, when the element M in the (M,Zn) layer is replaced with indium, the layer can also be referred to as an (In,M,Zn) layer. In that case, a layered structure that contains one In layer for every two (In,M,Zn) layers is obtained.

An oxide whose atomic ratio [In]:[M]:[Zn] is 1:1:2 has a layered structure that contains one In layer for every three (M,Zn) layers. In other words, if [Zn] is higher than [In] and [M], the proportion of the (M,Zn) layer to the In layer becomes higher when the oxide is crystallized.

Note that in the case where the number of (M,Zn) layers with respect to one In layer is not an integer in the oxide, the oxide might have a plurality of kinds of layered structures where the number of (M,Zn) layers with respect to one In layer is an integer. For example, in the case of [In]:[M]:[Zn] =1:1:1.5, the oxide may have a mix of a layered structure including one In layer for every two (M,Zn) layers and a layered structure including one In layer for every three (M,Zn) layers.

For example, in the case where the oxide is formed with a sputtering apparatus, a film having an atomic ratio deviated from the atomic ratio of a target is formed. In particular, [Zn] in the film might be smaller than [Zn] in the target depending on the substrate temperature in deposition.

A plurality of phases (e.g., two phases or three phases) exist in the oxide in some cases. For example, with an atomic ratio [In]:[M]:[Zn] that is close to 0:2:1, two phases of a spinel crystal structure and a layered crystal structure are likely to exist. In addition, with an atomic ratio [In]:[M]:[Zn] that is close to 1:0:0, two phases of a bixbyite crystal structure and a layered crystal structure are likely to exist. In the case where a plurality of phases exist in the oxide, a grain boundary might be formed between different crystal structures.

In addition, the oxide semiconductor containing indium in a higher proportion can have high carrier mobility (electron mobility). This is because in an oxide semiconductor containing indium, the element M, and zinc, the s orbital of heavy metal mainly contributes to carrier transfer, and when the indium content in the oxide semiconductor is increased, overlaps of the s orbitals of indium atoms are increased; Thus, an oxide semiconductor having a high content of indium has higher carrier mobility than an oxide semiconductor having a low content of indium.

In contrast, when the indium content and the zinc content in an oxide become lower, carrier mobility becomes lower. Thus, with atomic ratios of [In]:[M]:[Zn]=0:1:0 and in the vicinity thereof (e.g., a region C in FIG. 57C), insulation performance becomes better.

Accordingly, an oxide in one embodiment of the present invention preferably has an atomic ratio represented by a region A in FIG. 57A. With the atomic ratio, a layered structure with high carrier mobility and a few grain boundaries is easily obtained.

A region B in FIG. 57B represents an atomic ratio of [In]:[M]:[Zn]=4:2:3 or 4:2:4.1 and the vicinity thereof. The vicinity includes an atomic ratio of [In]:[M]:[Zn]=5:3:4. An oxide with an atomic ratio represented by the region B is an excellent oxide that has particularly high crystallinity and high carrier mobility.

Note that a condition where an oxide forms a layered structure is not uniquely determined by an atomic ratio. There is a difference in the degree of difficulty in forming a layered structure among atomic ratios. Even with the same atomic ratio, whether a layered structure is formed or not depends on a formation condition. Thus, the illustrated regions each represent an atomic ratio with which an oxide has a layered structure, and boundaries of the regions A to C are not clear.

6-2. Carrier Density of Oxide Semiconductor

Next, the carrier density of an oxide semiconductor will be described below.

Examples of a factor affecting the carrier density of an oxide semiconductor include oxygen vacancy ($V_O$) and impurities in the oxide semiconductor.

As the amount of oxygen vacancy in the oxide semiconductor increases, the density of defect states increases when hydrogen is bonded to the oxygen vacancy (this state is also referred to as $V_O H$). The density of defect states also increases with an increase in the amount of impurity in the oxide semiconductor. Hence, the carrier density of an oxide semiconductor can be controlled by controlling the density of defect states in the oxide semiconductor.

A transistor using the oxide semiconductor in a channel region will be described below.

The carrier density of the oxide semiconductor is preferably reduced in order to inhibit the negative shift of the threshold voltage of the transistor or reduce the off-state current of the transistor. In order to reduce the carrier density of the oxide semiconductor, the impurity concentration in the oxide semiconductor is reduced so that the density of defect states can be reduced. In this specification and the like, a state with a low impurity concentration and a low density of defect states is referred to as a highly purified intrinsic or substantially highly purified intrinsic state. The carrier density of a highly purified intrinsic oxide semiconductor is lower than $8 \times 10^{15}$ cm$^{-3}$, preferably lower than $1 \times 10^{11}$ cm$^{-3}$, and further preferably lower than $1 \times 10^{10}$ cm$^{-3}$ and is higher than or equal to $1 \times 10^{-9}$ cm$^{-3}$.

In contrast, the carrier density of the oxide semiconductor is preferably increased in order to improve the on-state current of the transistor or improve the field-effect mobility of the transistor. In order to increase the carrier density of the oxide semiconductor, the impurity concentration or the density of defect states in the oxide semiconductor is slightly increased. Alternatively, the bandgap of the oxide semiconductor is preferably narrowed. For example, an oxide semiconductor that has a slightly high impurity concentration or a slightly high density of defect states in the range where a favorable on/off ratio is obtained in the $I_d$-$V_g$ characteristics of the transistor can be regarded as substantially intrinsic. Furthermore, an oxide semiconductor that has a high electron affinity and thus has a narrow bandgap so as to increase the density of thermally excited electrons (carriers) can be regarded as substantially intrinsic. Note that a transistor using an oxide semiconductor with higher electron affinity has lower threshold voltage.

The oxide semiconductor with an increased carrier density has somewhat n-type conductivity; thus, it can be referred to as a "slightly-n" oxide semiconductor.

The carrier density of a substantially intrinsic oxide semiconductor is preferably higher than or equal to $1 \times 10^5$ cm$^{-3}$ and lower than $1 \times 10^{18}$ cm$^{-3}$, further preferably higher than or equal to $1 \times 10^7$ cm$^{-3}$ and lower than or equal to $1 \times 10^{17}$ cm$^{-3}$, still further preferably higher than or equal to $1 \times 10^9$ cm$^{-3}$ and lower than or equal to $5 \times 10^{16}$ cm$^{-3}$, yet further preferably higher than or equal to $1 \times 10^{10}$ cm$^{-3}$ and lower than or equal to $1 \times 10^{16}$ cm$^{-3}$, and yet still preferably higher than or equal to $1 \times 10^{11}$ cm$^{-3}$ and lower than or equal to $1 \times 10^{15}$ cm$^{-3}$.

Figure 59:
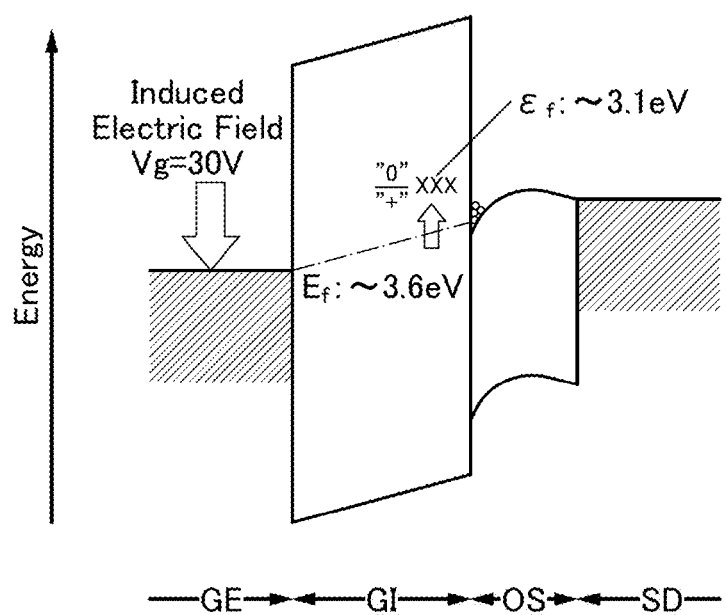
FIG. 59 is a diagram illustrating energy bands in a transistor in which an oxide semiconductor is used for a channel region.

The use of the substantially intrinsic oxide semiconductor may improve the reliability of a transistor. Here, the reason why the reliability of a transistor in which the oxide semiconductor is used for a channel region is described with reference to FIG. 59. FIG. 59 is an energy band diagram of the transistor in which the oxide semiconductor is used for the channel region.

In FIG. 59, GE, GI, OS, and SD refer to a gate electrode, a gate insulating film, an oxide semiconductor, and a source/drain electrode, respectively. In other words, FIG. 59 shows an example of energy bands of the gate electrode, the gate insulating film, the oxide semiconductor, and the source/drain electrode in contact with the oxide semiconductor.

In FIG. 59, a silicon oxide film and an In—Ga—Zn oxide are used for the gate insulating film and the oxide semiconductor, respectively. The transition level ($\in$f) of a defect that might be formed in the silicon oxide film is assumed to be formed at a position approximately 3.1 eV away from the conduction band minimum of the gate insulating film. Furthermore, the Fermi level (Ef) of the silicon oxide film at the interface between the oxide semiconductor and the silicon oxide film when the gate voltage (Vg) is assumed to be formed at a position approximately 3.6 eV away from the conduction band minimum of the gate insulating film. Note that the Fermi level of the silicon oxide film changes depending on the gate voltage. For example, the Fermi level (Ef) of the silicon oxide film at the interface between the oxide semiconductor and the silicon oxide film is lowered as the gate voltage is increased. A white circle and x in FIG. 59 represent an electron (carrier) and a defect state in the silicon oxide film, respectively.

As shown in FIG. 59, when thermal excitation of carriers occurs during the application of a gate voltage, the carriers are trapped by the defect states (x in the diagram) and the charge state of the defect states is changed from positive ("+") to neutral ("0"). In other words, when the value obtained by adding the thermal excitation energy to the Fermi level (Ef) of the silicon oxide film becomes greater than the transition level ($\in$f) of a defect, the charge state of the defect states in the silicon oxide film is changed from positive to neutral, so that the threshold voltage of the transistor shifts in the positive direction.

When the oxide semiconductor is replaced with another oxide semiconductor with higher electron affinity, the Fermi level of the interface between the gate insulating film and the oxide semiconductor might be changed. When an oxide semiconductor with different electron affinity is used as described above, the conduction band minimum of the gate insulating film becomes relatively high at the interface between the gate insulating film and the oxide semiconductor or in the vicinity of the interface. In that case, the defect state (x in FIG. 59) which might be formed in the gate insulating film also becomes relatively high, so that the energy difference between the Fermi level of the gate insulating film and the Fermi level of the oxide semiconductor is increased. The increase in energy difference leads to a reduction in the amount of charge trapped in the gate insulating film. For example, a change in the charge state of the defect state which might be formed in the silicon oxide film becomes smaller, so that to change in the threshold voltage of the transistor by gate bias temperature (GBT) stress can be reduced.

Note that when the oxide semiconductor is used for a channel region of a transistor, carrier scattering or the like at a grain boundary can be reduced; thus, the transistor can have high field-effect mobility. In addition, the transistor can have high reliability.

Charge trapped by the defect states in the oxide semiconductor takes a long time to be released and may behave like fixed charge. Thus, the transistor in which a channel region is formed in the oxide semiconductor and which has a high impurity concentration and a high density of defect states might have unstable electrical characteristics.

To obtain stable electrical characteristics of the transistor, it is effective to reduce the concentration of impurities in the oxide semiconductor. In order to reduce the concentration of impurities in the oxide semiconductor, the concentration of impurities in a film which is adjacent to the oxide semiconductor is preferably reduced. As examples of the impurities, hydrogen, nitrogen, alkali metal, alkaline earth metal, iron, nickel, silicon, and the like are given.

6-3. Structure of Oxide Semiconductor

Next, the structure of an oxide semiconductor is described.

An oxide semiconductor is classified into a single-crystal oxide semiconductor and a non-single-crystal oxide semiconductor. Examples of the non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of the crystalline oxide semiconductor include a single-crystal oxide semiconductor, a CAAC-OS, a polycrystalline oxide semiconductor, and an nc-OS.

An amorphous structure is generally thought to be isotropic and have no non-uniform structure, to be metastable and have no fixed atomic arrangement, to have a flexible bond angle, and to have a short-range order but have no long-range order, for example.

In other words, a stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. In contrast, an a-like OS, which is not isotropic, has an unstable structure that contains a void. Because of its instability, an a-like OS has physical properties similar to those of an amorphous oxide semiconductor.

[CAAC-OS]

First, a CAAC-OS is described.

A CAAC-OS is one of oxide semiconductors and has a plurality of c-axis aligned crystal parts (also referred to as pellets).

Figure 60A:
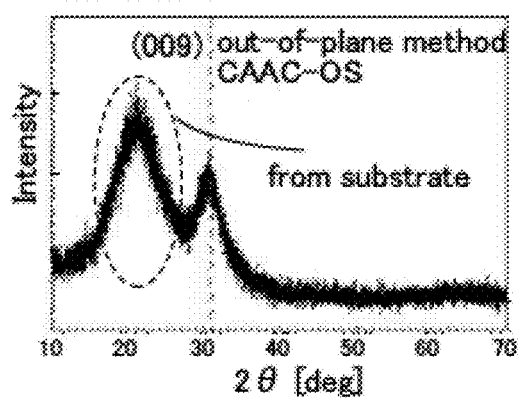
FIGS. 60A to 60E show structural analysis of a CAAC-OS and a single crystal oxide semiconductor by XRD and selected-area electron diffraction patterns of a CAAC-OS.

Analysis of a CAAC-OS by X-ray diffraction (XRD) is described. For example, when the structure of a CAAC-OS including an $InGaZnO_4$ crystal, which is classified into the space group R-3m, is analyzed by an out-of-plane method, a peak appears at a diffraction angle (2θ) of around 31° as shown in FIG. 60A. This peak is derived from the (009) plane of the $InGaZnO_4$ crystal, which indicates that crystals in the CAAC-OS have c-axis alignment and that the c-axes are aligned in the direction substantially perpendicular to a surface over which the CAAC-OS film is formed (also referred to as a formation surface) or a top surface of the CAAC-OS film. A peak sometimes appears at 2θ of around 36° in addition to the peak at 2θ of around 31°. The peak at 2θ of around 36° is attributed to a crystal structure classified into the space group Fd-3m; thus, this peak is preferably not exhibited in the CAAC-OS.

Figure 60B:
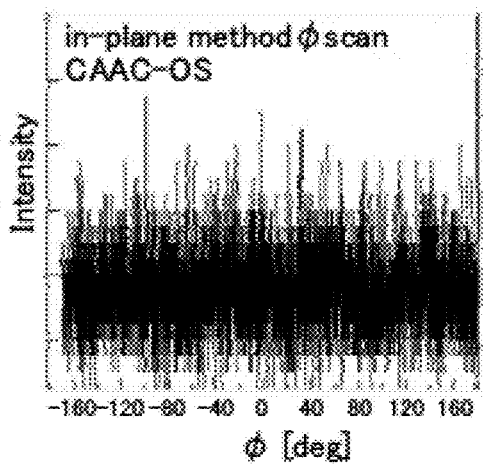
Figure 60C:
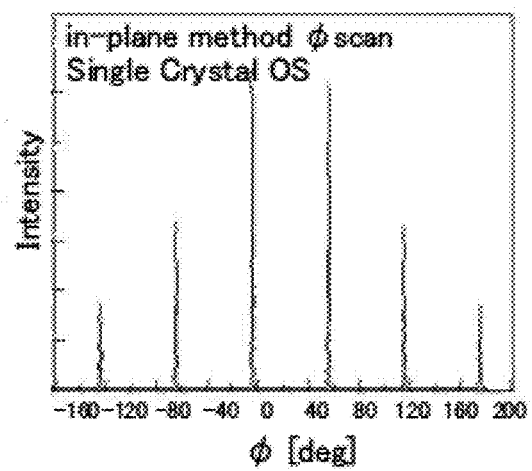

On the other hand, in structural analysis of the CAAC-OS by an in-plane method in which an X-ray is incident on the CAAC-OS in the direction parallel to the formation surface, a peak appears at 2θ of around 56°. This peak is derived from the (110) plane of the $InGaZnO_4$ crystal. When analysis (φ scan) is performed with 2θ fixed at around 56° while the sample is rotated around a normal vector to the sample surface as an axis (φ axis), as shown in FIG. 60B, a peak is not clearly observed. In contrast, in the case where single-crystal $InGaZnO_4$ is subjected to φ scan with 2θ fixed at around 56°, as shown in FIG. 60C, six peaks which are derived from crystal planes equivalent to the (110) plane are observed. Accordingly, the structural analysis using XRD shows that the directions of the a-axes and b-axes are irregularly oriented in the CAAC-OS.

Figure 60D:
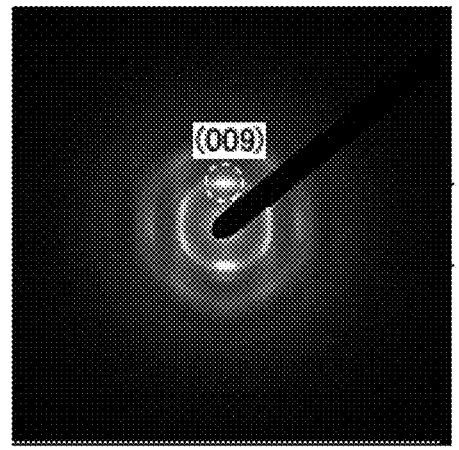
Figure 60E:
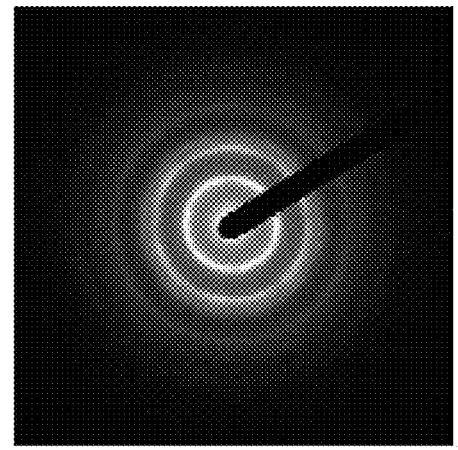

Next, a CAAC-OS analyzed by electron diffraction is described. For example, when an electron beam with a probe diameter of 300 nm is incident on a CAAC-OS including an $InGaZnO_4$ crystal in the direction parallel to the formation surface of the CAAC-OS, a diffraction pattern (also referred to as a selected-area electron diffraction pattern) in FIG. 60D can be obtained. This diffraction pattern includes spots derived from the (009) plane of the $InGaZnO_4$ crystal. Thus, the results of electron diffraction also indicate that pellets included in the CAAC-OS have c-axis alignment and that the c-axes are aligned in the direction substantially perpendicular to the formation surface or the top surface of the CAAC-OS. Meanwhile, FIG. 60E shows a diffraction pattern obtained in such a manner that an electron beam with a probe diameter of 300 nm is incident on the same sample in the direction perpendicular to the sample surface. In FIG. 60E, a ring-like diffraction pattern is observed. Thus, the results of electron diffraction using an electron beam with a probe diameter of 300 nm also indicate that the a-axes and b-axes of the pellets included in the CAAC-OS do not have regular alignment. The first ring in FIG. 60E is derived from the (010) plane, the (100) plane, and the like of the $InGaZnO_4$ crystal. The second ring in FIG. 60E is derived from the (110) plane and the like.

In a combined analysis image (also referred to as a high-resolution transmission electron microscope (TEM) image) of a bright-field image and a diffraction pattern of a CAAC-OS, which is obtained using a TEM, a plurality of pellets can be observed. However, even in the high-resolution TEM image, a boundary between pellets, that is, a grain boundary is not clearly observed in some cases. Thus, in the CAAC-OS, a reduction in electron mobility due to the grain boundary is less likely to occur.

Figure 61A:
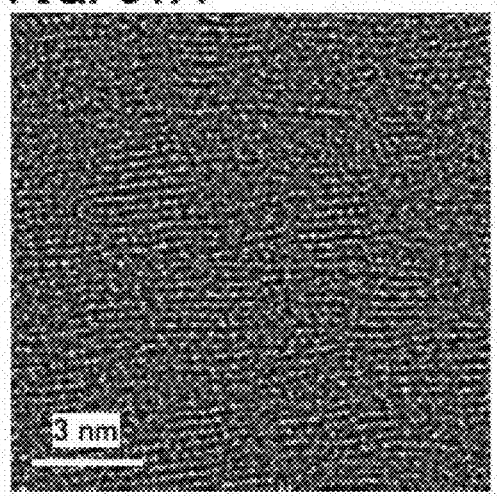
FIGS. 61A to 61E show a cross-sectional TEM image and plan-view TEM images of a CAAC-OS and images obtained through analysis thereof.

FIG. 61A shows a high-resolution TEM image of a cross section of the CAAC-OS which is observed in the direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be observed with, for example, an atomic resolution analytical electron microscope JEM-ARM200F manufactured by JEOL Ltd.

FIG. 61A shows pellets in which metal atoms are arranged in a layered manner. FIG. 61A proves that the size of a pellet is greater than or equal to 1 nm or greater than or equal to 3 nm. Therefore, the pellet can also be referred to as a nanocrystal (nc). Furthermore, the CAAC-OS can also be referred to as an oxide semiconductor including c-axis aligned nanocrystals (CANC). A pellet reflects unevenness of a formation surface or a top surface of the CAAC-OS and is parallel to the formation surface or the top surface of the CAAC-OS.

Figure 61B:
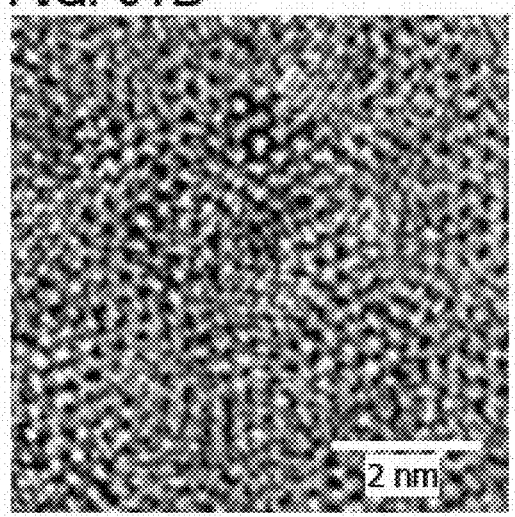
Figure 61C:
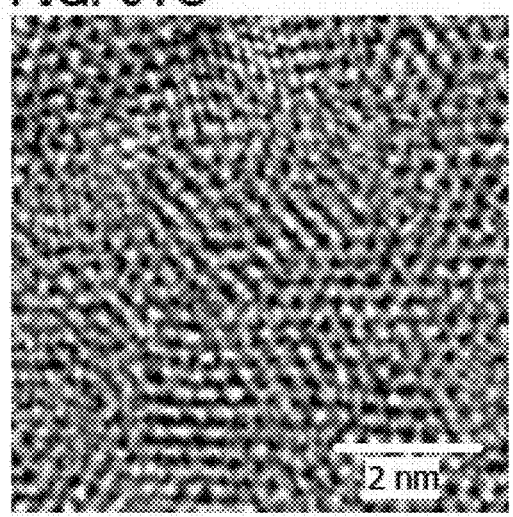
Figure 61D:
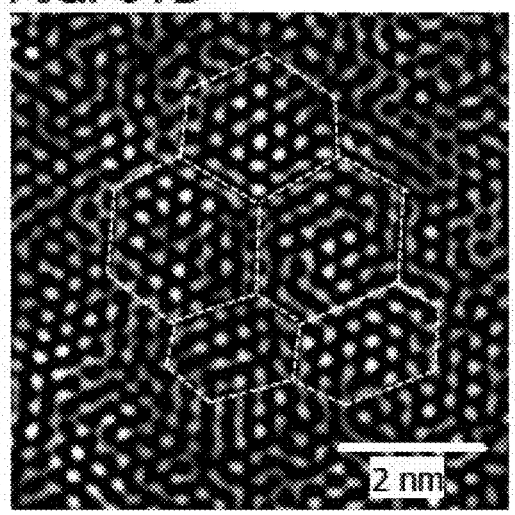
Figure 61E:
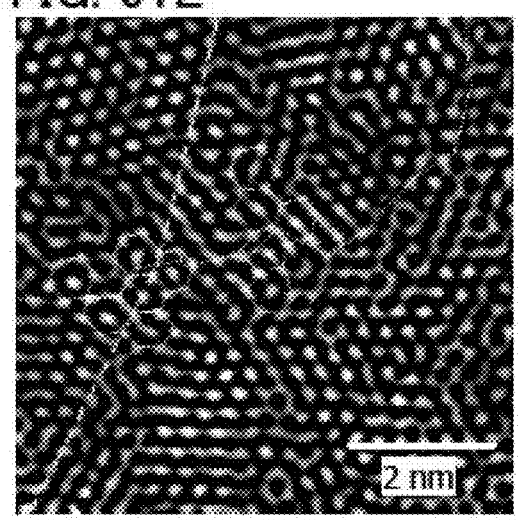

FIGS. 61B and 61C show Cs-corrected high-resolution TEM images of a plane of the CAAC-OS observed in the direction substantially perpendicular to the sample surface. FIGS. 61D and 61E are images obtained by image processing of FIGS. 61B and 61C. The method of image processing is as follows. The image in FIG. 61B is subjected to fast Fourier transform (FFT) to obtain an FFT image. Then, mask processing is performed on the obtained FFT image such that part in the range of 2.8 $nm^{-1}$ to 5.0 $nm^{-1}$ from the reference point is left. After the mask processing, the FFT image is subjected to inverse fast Fourier transform (IFFT) to obtain a processed image. The image obtained in this manner is referred to as an FFT filtering image. The FFT filtering image is a Cs-corrected high-resolution TEM image from which a periodic component is extracted and shows a lattice arrangement.

In FIG. 61D, a portion in which the lattice arrangement is broken is shown by dashed lines. A region surrounded by dashed lines corresponds to one pellet. The portion denoted by the dashed lines is a junction of pellets. The dashed lines draw a hexagon, which means that the pellet has a hexagonal shape. Note that the shape of the pellet is not always a regular hexagon but is a non-regular hexagon in many cases.

In FIG. 61E, a dotted line denotes a portion between a region where a lattice arrangement is well aligned and another region where a lattice arrangement is well aligned, and dashed lines denote the directions of the lattice arrangements. A clear crystal grain boundary cannot be observed even in the vicinity of the dotted line. When a lattice point in the vicinity of the dotted line is regarded as a center and surrounding lattice points are joined, a distorted hexagon, a distorted pentagon, or a distorted heptagon can be formed, for example. That is, a lattice arrangement is distorted so that formation of a crystal grain boundary is inhibited. This is probably because the CAAC-OS can tolerate distortion owing to a low density of the atomic arrangement in an a-b plane direction, the interatomic bond distance changed by substitution of a metal element, and the like.

As described above, the CAAC-OS has c-axis alignment, its pellets (nanocrystals) are connected in the a-b plane direction, and its crystal structure has distortion. For this reason, the CAAC-OS can also be referred to as an oxide semiconductor including a c-axis-aligned a-b-plane-anchored (CAA) crystal.

The CAAC-OS is an oxide semiconductor with high crystallinity. Entry of impurities, formation of defects, or the like might decrease the crystallinity of an oxide semiconductor. This means that the CAAC-OS has few impurities and defects (e.g., oxygen vacancies).

Note that an impurity means an element other than the main components of an oxide semiconductor, such as hydrogen, carbon, silicon, or a transition metal element. For example, an element (e.g., silicon) having stronger bonding force to oxygen than a metal element constituting a part of an oxide semiconductor extracts oxygen from the oxide semiconductor, which results in a disordered atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

[nc-OS]

Next, an nc-OS is described.

Analysis of an nc-OS by XRD is described. When the structure of an nc-OS is analyzed by an out-of-plane method, a peak indicating orientation does not appear. That is, a crystal of an nc-OS does not have orientation.

Figure 62A:
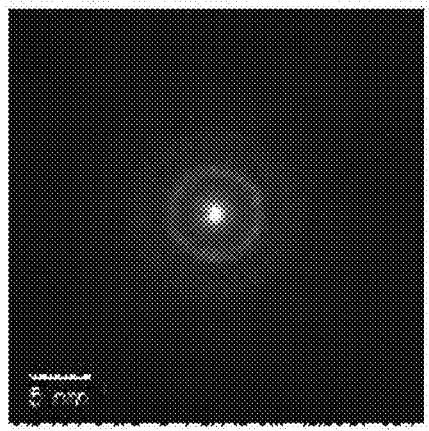
FIGS. 62A to 62D show electron diffraction patterns and a cross-sectional TEM image of an nc-OS.
Figure 62B:
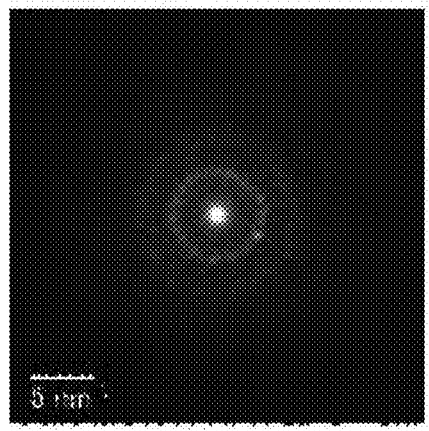

For example, when an electron beam with a probe diameter of 50 nm is incident on a 34-nm-thick region of a thinned nc-OS including an $InGaZnO_4$ crystal in the direction parallel to the formation surface, a ring-like diffraction pattern (nanobeam electron diffraction pattern) shown in FIG. 62A is observed. FIG. 62B shows a diffraction pattern (nanobeam electron diffraction pattern) obtained when an electron beam with a probe diameter of 1 nm is incident on the same sample. In FIG. 62B, a plurality of spots are observed in a ring-like region. Thus, ordering in an nc-OS is not observed with an electron beam with a probe diameter of 50 nm but is observed with an electron beam with a probe diameter of 1 nm.

Figure 62C:
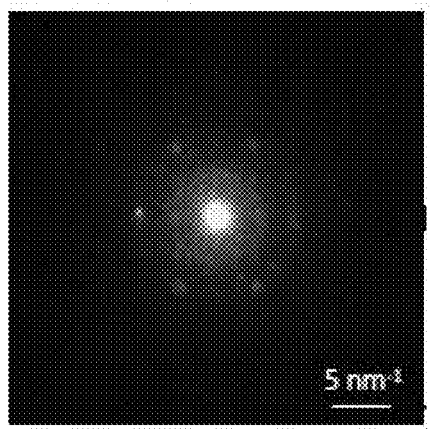

When an electron beam with a probe diameter of 1 nm is incident on a region with a thickness less than 10 nm, an electron diffraction pattern in which spots are arranged in an approximately regular hexagonal shape as shown in FIG. 62C is observed in some cases. This means that an nc-OS has a well-ordered region, that is, a crystal, in the thickness range of less than 10 nm. Note that an electron diffraction pattern having regularity is not observed in some regions because crystals are aligned in various directions.

Figure 62D:
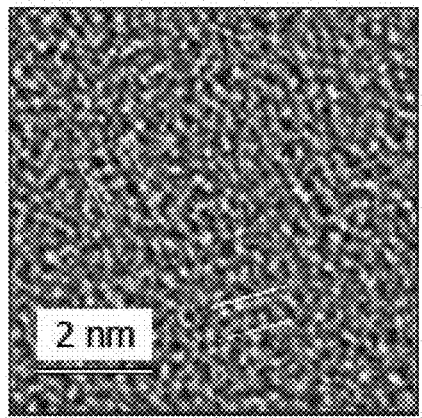

FIG. 62D shows a Cs-corrected high-resolution TEM image of a cross section of an nc-OS observed in the direction substantially parallel to the formation surface. In the high-resolution TEM image, the nc-OS has a region in which a crystal part is observed as indicated by additional lines and a region in which a crystal part is not clearly observed. In most cases, the size of a crystal part included in the nc-OS is greater than or equal to 1 nm and less than or equal to 10 nm, specifically greater than or equal to 1 nm and less than or equal to 3 nm. Note that an oxide semiconductor including a crystal part whose size is greater than 10 nm and less than or equal to 100 nm may be referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

As described above, in the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not observed. Accordingly, in some cases, the nc-OS cannot be distinguished from an a-like OS or an amorphous oxide semiconductor, depending on an analysis method.

Since there is no regularity of crystal orientation between the pellets (nanocrystals), the nc-OS can also be referred to as an oxide semiconductor including random aligned nanocrystals (RANC) or an oxide semiconductor including non-aligned nanocrystals (NANC).

The nc-OS is an oxide semiconductor that has higher regularity than an amorphous oxide semiconductor. Therefore, the nc-OS has a lower density of defect states than the a-like OS and the amorphous oxide semiconductor. Note that there is no regularity of crystal orientation between different pellets in the nc-OS. Therefore, the nc-OS has a higher density of defect states than the CAAC-OS.

[a-Like OS]

An a-like OS has a structure between the structure of an nc-OS and the structure of an amorphous oxide semiconductor.

FIGS. 63A and 63B show high-resolution cross-sectional TEM images of an a-like OS. The high-resolution cross-sectional TEM image of the a-like OS in FIG. 63A is taken at the start of the electron irradiation. The high-resolution cross-sectional TEM image of the a-like OS in FIG. 63B is taken after the irradiation with electrons ($e^-$) at $4.3 \times 10^8$ $e^-/nm^2$. FIGS. 63A and 63B show that striped bright regions extending vertically are observed in the a-like OS from the start of the electron irradiation. It can be also found that the shape of the bright region changes after the electron irradiation. Note that the bright region is presumably a void or a low-density region.

The a-like OS has an unstable structure because it contains a void. To verify that an a-like OS has an unstable structure as compared with a CAAC-OS and an nc-OS, a change in structure caused by electron irradiation is described below.

An a-like OS, an nc-OS, and a CAAC-OS are prepared as samples. Each of the samples is an In—Ga—Zn oxide.

First, a high-resolution cross-sectional TEM image of each sample is obtained. The high-resolution cross-sectional TEM images show that all the samples have crystal parts.

It is known that a unit cell of an InGaZnO$_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion in which the spacing between lattice fringes is greater than or equal to 0.28 nm and less than or equal to 0.30 nm is regarded as a crystal part of InGaZnO$_4$ in the following description. Each lattice fringe corresponds to the a-b plane of the InGaZnO$_4$ crystal.

Figure 64:
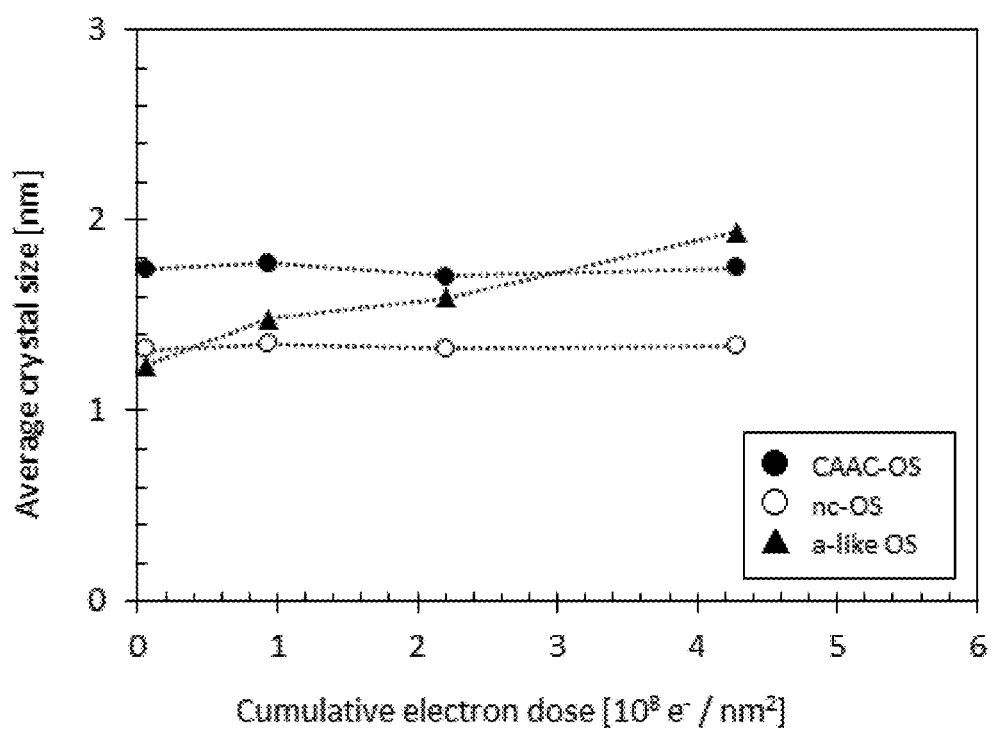
FIG. 64 shows a change of crystal parts of an In—Ga—Zn oxide owing to electron irradiation.

FIG. 64 shows a change in the average size of crystal parts (at 22 points to 30 points) in each sample. Note that the crystal part size corresponds to the length of a lattice fringe. FIG. 64 indicates that the crystal part size in the a-like OS increases with an increase in the cumulative electron dose in obtaining TEM images, for example. As shown in FIG. 64, a crystal part with a size of approximately 1.2 nm (also referred to as an initial nucleus) at the start of TEM observation grows to a size of approximately 1.9 nm at a cumulative electron ($e^-$) dose of $4.2 \times 10^8$ $e^-/nm^2$. In contrast, the crystal part sizes in the nc-OS and the CAAC-OS show few changes from the start of electron irradiation to a cumulative electron dose of $4.2 \times 10^8$ $e^-/nm^2$. As shown in FIG. 64, the crystal part sizes in the nc-OS and the CAAC-OS are approximately 1.3 nm and approximately 1.8 nm, respectively, regardless of the cumulative electron dose. For the electron beam irradiation and TEM observation, a Hitachi H-9000NAR transmission electron microscope was used. The conditions of the electron beam irradiation were as follows: the accelerating voltage was 300 kV; the current density was $6.7 \times 10^5$ $e^-/(nm^2 \cdot s)$; and the diameter of an irradiation region was 230 nm.

In this manner, growth of the crystal part in the a-like OS may be induced by electron irradiation. In contrast, in the nc-OS and the CAAC-OS, growth of the crystal part is hardly induced by electron irradiation. That is, the a-like OS has an unstable structure as compared with the nc-OS and the CAAC-OS.

The a-like OS has a lower density than the nc-OS and the CAAC-OS because it contains a void. Specifically, the density of the a-like OS is higher than or equal to 78.6% and lower than 92.3% of the density of the single-crystal oxide semiconductor having the same composition. The density of the nc-OS and the density of the CAAC-OS are each higher than or equal to 92.3% and lower than 100% of the density of the single-crystal oxide semiconductor having the same composition. It is difficult to deposit an oxide semiconductor having a density lower than 78% of the density of the single-crystal oxide semiconductor.

For example, in the case of an oxide semiconductor whose atomic ratio of In to Ga to Zn is 1:1:1, the density of single-crystal InGaZnO$_4$ with a rhombohedral crystal structure is 6.357 g/cm$^3$. Accordingly, in the case of the oxide semiconductor whose atomic ratio of In to Ga to Zn is 1:1:1, the density of the a-like OS is higher than or equal to 5.0 g/cm$^3$ and lower than 5.9 g/cm$^3$, for example. In the case of the oxide semiconductor whose atomic ratio of In to Ga to Zn is 1:1:1, the density of the nc-OS and the density of the CAAC-OS are each higher than or equal to 5.9 g/cm$^3$ and lower than 6.3 g/cm$^3$, for example.

In the case where an oxide semiconductor having a certain composition does not exist in a single-crystal state, single-crystal oxide semiconductors with different compositions are combined at an adequate ratio, which makes it possible to calculate a density equivalent to that of a single-crystal oxide semiconductor with the desired composition. The density of a single-crystal oxide semiconductor having the desired composition may be calculated using a weighted average with respect to the combination ratio of the single-crystal oxide semiconductors with different compositions. Note that it is preferable to use as few kinds of single-crystal oxide semiconductors as possible to calculate the density.

As described above, oxide semiconductors have various structures and various properties. Note that an oxide semiconductor may be a stacked film including two or more of an amorphous oxide semiconductor, an a-like OS, an nc-OS, and a CAAC-OS, for example.

The structure described in this embodiment can be used in appropriate combination with any of the structures described in the other embodiments.

Embodiment 7

In this embodiment, examples of a display device that includes the transistor described in the above embodiments are described below with reference to FIG. 65 to FIG. 67.

7-1. Top View of Display Device

Figure 65:
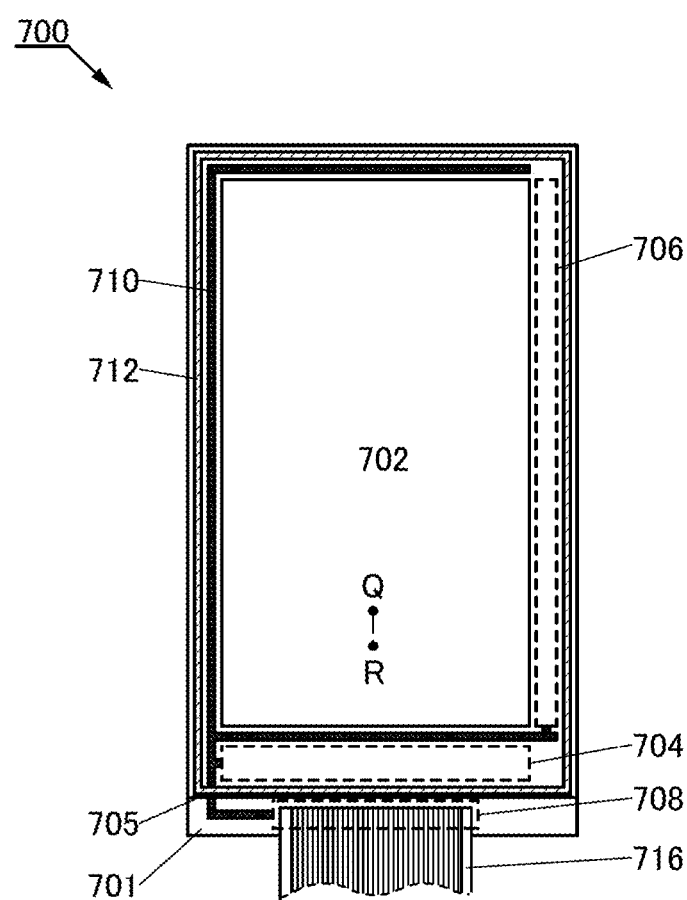
FIG. 65 is a top view illustrating one embodiment of a display device.

FIG. 65 is a top view illustrating an example of a display device. A display device 700 in FIG. 65 includes a pixel portion 702 provided over a first substrate 701, a source driver circuit portion 704 and a gate driver circuit portion 706 that are provided over the first substrate 701, a sealant 712 provided to surround the pixel portion 702, the source driver circuit portion 704, and the gate driver circuit portion 706, and a second substrate 705 provided to face the first substrate 701. The first substrate 701 and the second substrate 705 are sealed with the sealant 712. That is, the pixel portion 702, the source driver circuit portion 704, and the gate driver circuit portion 706 are enclosed by the first substrate 701, the sealant 712, and the second substrate 705. Although not illustrated in FIG. 65, a display element is provided between the first substrate 701 and the second substrate 705.

In the display device 700, a flexible printed circuit (FPC) terminal portion 708 that is electrically connected to the pixel portion 702, the source driver circuit portion 704, and the gate driver circuit portion 706 is provided in a region different from the region that is over the first substrate 701 and surrounded by the sealant 712. Furthermore, an FPC 716 is connected to the FPC terminal portion 708, and a variety of signals and the like are supplied from the FPC 716 to the pixel portion 702, the source driver circuit portion 704, and the gate driver circuit portion 706. Furthermore, a signal line 710 is connected to the pixel portion 702, the source driver circuit portion 704, the gate driver circuit portion 706, and the FPC terminal portion 708. Through the signal line 710, a variety of signals and the like are supplied from the FPC 716 to the pixel portion 702, the source driver circuit portion 704, the gate driver circuit portion 706, and the FPC terminal portion 708.

A plurality of gate driver circuit portions 706 may be provided in the display device 700. The structure of the display device 700 is not limited to the example shown here, in which the source driver circuit portion 704 and the gate driver circuit portion 706 as well as the pixel portion 702 are formed over the first substrate 701. For example, only the gate driver circuit portion 706 may be formed over the first substrate 701, or only the source driver circuit portion 704 may be formed over the first substrate 701. In this case, a substrate over which a source driver circuit, a gate driver circuit, or the like is formed (e.g., a driver circuit board formed using a single-crystal semiconductor film or a poly-crystalline semiconductor film) may be formed on the first substrate 701. Note that there is no particular limitation on the method for connecting the separately prepared driver circuit board, and a chip on glass (COG) method, a wire bonding method, or the like can be used.

The pixel portion 702, the source driver circuit portion 704, and the gate driver circuit portion 706 included in the display device 700 include a plurality of transistors.

The display device 700 can include a variety of elements. As examples of the elements, electroluminescent (EL) element (e.g., an EL element containing organic and inorganic materials, an organic EL element, an inorganic EL element, or an LED), a light-emitting transistor element (a transistor that emits light depending on current), an electron emitter, a liquid crystal element, an electronic ink display, an electro-phoretic element, an electrowetting element, a plasma display panel (PDP), micro electro mechanical systems (MEMS) display (e.g., a grating light valve (GLV), a digital micromirror device (DMD), a digital micro shutter (DMS) element, or an interferometric modulator display (IMOD) element), and a piezoelectric ceramic display can be given.

An example of a display device including an EL element is an EL display. Examples of a display device including an electron emitter include a field emission display (FED) and an SED-type flat panel display (SED: surface-conduction electron-emitter display). An example of a display device including a liquid crystal element is a liquid crystal display (a transmissive liquid crystal display, a transflective liquid crystal display, a reflective liquid crystal display, a direct-view liquid crystal display, or a projection liquid crystal display). An example of a display device including an electronic ink display or an electrophoretic element is electronic paper. In a transflective liquid crystal display or a reflective liquid crystal display, some or all of pixel electrodes may function as reflective electrodes. For example, some or all of pixel electrodes may contain aluminum, silver, or the like. In this case, a memory circuit such as an SRAM can be provided under the reflective electrodes, leading to lower power consumption.

As a display system of the display device 700, a progressive system, an interlace system, or the like can be employed. Furthermore, color elements controlled in pixels at the time of color display are not limited to three colors: R, G, and B (R, G, and B correspond to red, green, and blue, respectively). For example, four pixels of an R pixel, a G pixel, a B pixel, and a W (white) pixel may be used. Alternatively, a color element may be composed of two colors of R, G, and B as in PenTile layout. The two colors may differ depending on the color elements. Alternatively, one or more colors of yellow, cyan, magenta, and the like may be added to RGB. Note that the size of a display region may differ between dots of color elements. One embodiment of the disclosed invention is not limited to a color display device; the disclosed invention can also be applied to a monochrome display device.

A coloring layer (also referred to as a color filter) may be used to obtain a full-color display device in which white light (W) is used for a backlight (e.g., an organic EL element, an inorganic EL element, an LED, or a fluorescent lamp). For example, a red (R) coloring layer, a green (G) coloring layer, a blue (B) coloring layer, and a yellow (Y) coloring layer can be combined as appropriate. With the use of the coloring layer, high color reproducibility can be obtained as compared with the case without the coloring layer. Here, by providing a region with a coloring layer and a region without a coloring layer, white light in the region without the coloring layer may be directly utilized for display. By partly providing the region without a coloring layer, a decrease in the luminance of a bright image due to the coloring layer can be suppressed, and approximately 20% to 30% of power consumption can be reduced in some cases. In the case where full-color display is performed using a self-luminous element such as an organic EL element or an inorganic EL element, elements may emit light in their respective colors R, G, B, Y, and W. By using a self-luminous element, power consumption may be further reduced as compared with the case of using a coloring layer.

As a coloring system, any of the following systems may be used: the above-described color filter system in which part of white light is converted into red light, green light, and blue light through color filters; a three-color system in which red light, green light, and blue light are used; and a color conversion system or a quantum dot system in which part of blue light is converted into red light or green light.

7-2. Cross-Sectional View of Display Device

Next, a structure of a display device including the semiconductor device 100 in Embodiment 1 is described with reference to FIG. 66. Note that FIG. 66 is a cross-sectional view corresponding to a cross section taken along dashed-dotted line Q-R in FIG. 65.

Figure 66:
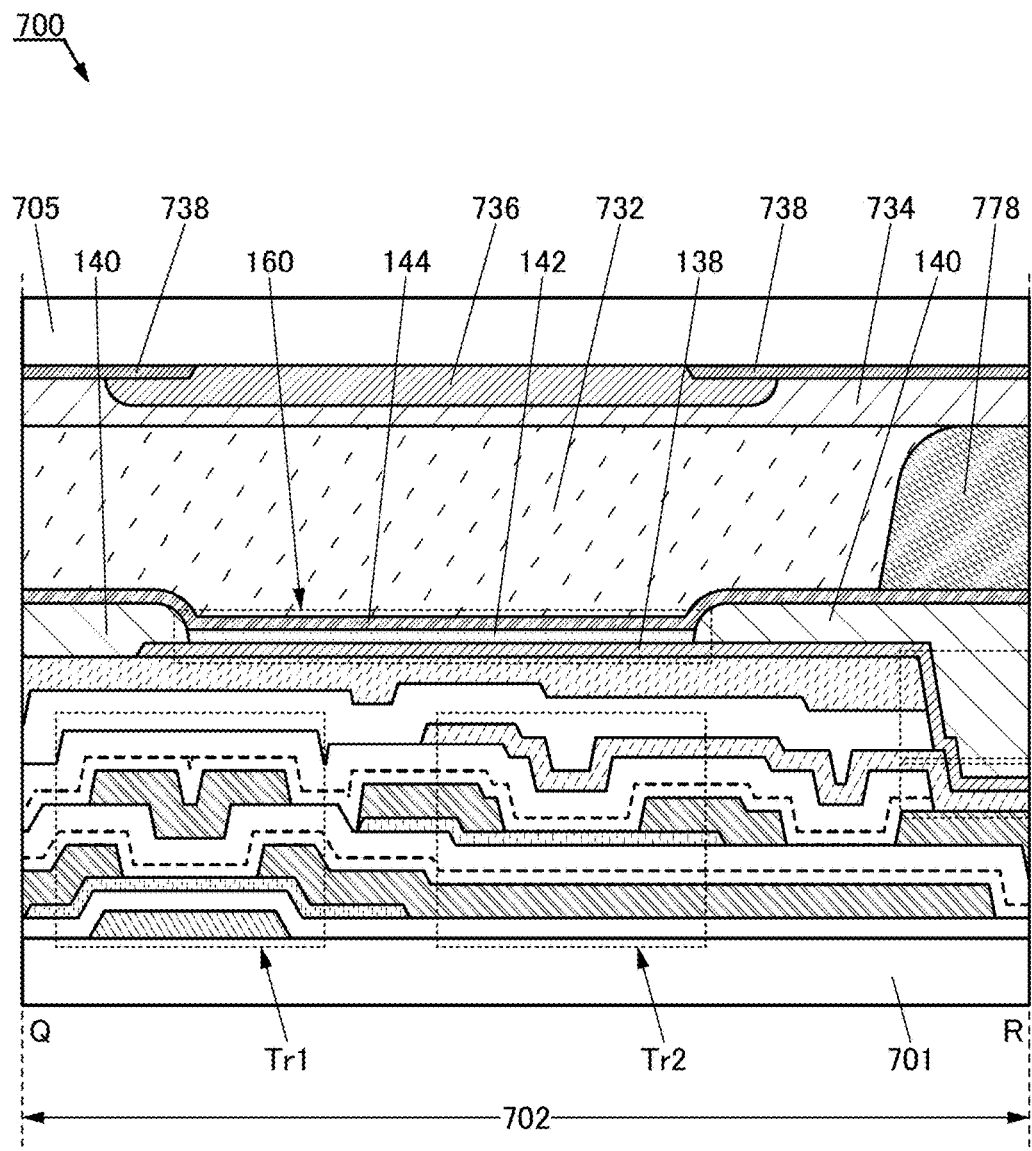
FIG. 66 is a cross-sectional view illustrating one embodiment of a display device.

A display device 700 shown in FIG. 66 includes the transistor Tr1, the transistor Tr2, and the light-emitting element 160 between the first substrate 701 and the second substrate 705.

For example, a glass substrate can be used as the first substrate 701 and the second substrate 705. A flexible substrate may be used as the first substrate 701 and the second substrate 705. Examples of the flexible substrate include a plastic substrate.

A structure body 778 is provided between the first substrate 701 and the second substrate 705. The structure body 778 is a columnar spacer obtained by selective etching of an insulating film and provided to control the distance (cell gap) between the first substrate 701 and the second substrate 705. Note that a spherical spacer may be used as the structure body 778.

In addition, the transistor Tr1 and the transistor Tr2 that are described in Embodiment 1 are provided over the first substrate 701.

The transistor Tr1 and the transistor Tr2 each include an oxide semiconductor which is highly purified and in which formation of an oxygen vacancy is suppressed. This can significantly reduce the off-state current of each of the transistor Tr1 and the transistor Tr2; thus, an electric signal such as an image signal can be held for a longer period and a writing interval can be set longer in a power-on state. As a result, the frequency of refresh operation can be reduced, so that power consumption of the display device can be reduced.

In addition, the transistors Tr1 and Tr2 can have relatively high field-effect mobility and is thus capable of high-speed operation. For example, with such a transistor which can operate at high speed used for a display device, a switching transistor in a pixel portion and a driver transistor in a driver circuit portion can be formed over one substrate. That is, a semiconductor device formed using a silicon wafer or the like is not additionally needed as a driver circuit, by which the number of components of the semiconductor device can be reduced. In addition, the transistor which can operate at high speed can be used also in the pixel portion, whereby a high-quality image can be provided.

Furthermore, a light-blocking film 738 functioning as a black matrix, a coloring film 736 functioning as a color filter, and an insulating film 734 in contact with the light-blocking film 738 and the coloring film 736 are provided on the second substrate 705 side.

The light-emitting element 160 in this embodiment has a top emission structure. Therefore, the conductive film 144 has a light-transmitting property and transmits light emitted from the EL layer 142. Although the top-emission structure is described as an example in this embodiment, one embodiment of the present invention is not limited thereto. A bottom-emission structure in which light is emitted to the conductive film 138 side, or a dual-emission structure in which light is emitted to both the conductive film 138 side and the conductive film 144 side may be employed.

The coloring film 736 is provided to overlap with the light-emitting element 160, and the light-blocking film 738 is provided to overlap with the insulating film 140. The coloring film 736 and the light-blocking film 738 are covered with the insulating film 734. A space between the light-emitting element 160 and the insulating film 734 is filled with a sealing film 732. Although a structure with the coloring film 736 is described as the display device 700 shown in FIG. 66, the structure is not limited thereto. In the case where the EL layer 142 is formed by a separate coloring method, the coloring film 736 is not necessarily provided.

7-3. Structure Example of Display Device Provided with Input/Output Device

An input/output device may be provided in the display device 700 illustrated in FIG. 66. As an example of the input/output device, a touch panel or the like can be given.

Figure 67:
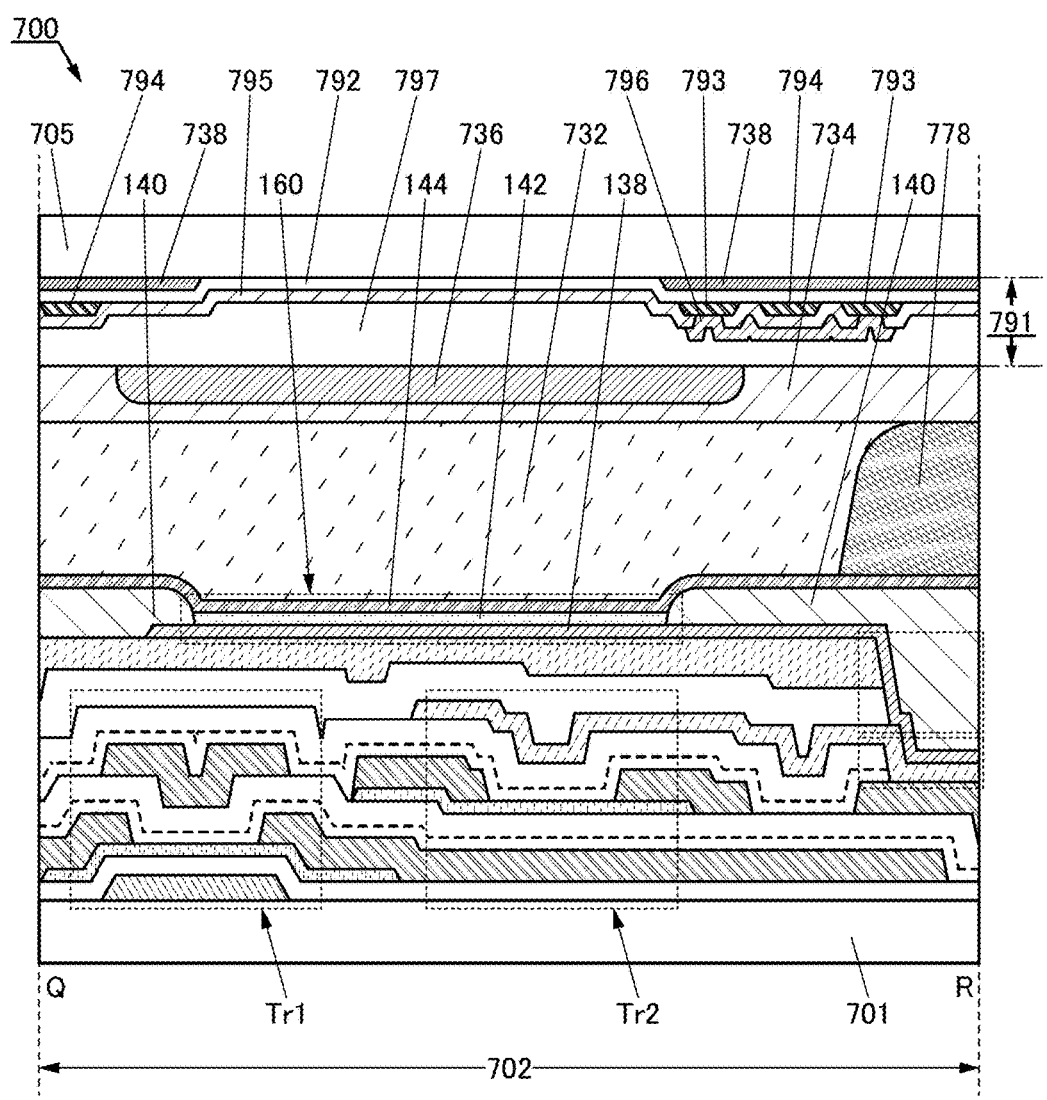
FIG. 67 shows a cross-sectional view of one embodiment of a display device.

FIG. 67 illustrates a structure in which the display device 700 shown in FIG. 66 includes a touch panel 791.

FIG. 67 is a cross-sectional view of the structure in which the display device 700 shown in FIG. 66 includes a touch panel 791.

The touch panel 791 is an in-cell touch panel provided between the substrate 705 and the coloring film 736. The touch panel 791 is formed on the substrate 705 side before the light-blocking film 738 and the coloring film 736 are formed.

The touch panel 791 includes the light-blocking film 738, an insulating film 792, an electrode 793, an electrode 794, an insulating film 795, an electrode 796, and an insulating film 797. A change in the mutual capacitance between the electrode 793 and the electrode 794 can be sensed when an object such as a finger or a stylus approaches, for example.

A portion in which the electrode 793 intersects with the electrode 794 is illustrated in the upper portion of the insulating film 140. Through openings in the insulating film 795, the electrode 796 is electrically connected to the two electrodes 793 between which the electrode 794 is positioned. Although the electrode 796 is formed in the pixel portion 702 in FIG. 67, this embodiment is not limited to this example, and the electrode 796 may be formed in a gate driver circuit portion or a source driver circuit portion, for example.

The electrodes 793 and 794 are provided in a region overlapping with the light-blocking film 738. It is preferable that the electrode 793 and the electrode 794 do not overlap with the light-emitting element 160. In other words, the electrode 793 and the electrode 794 each has an opening in a region overlapping with the light-emitting element 160. That is, the electrode 793 and the electrode 794 each have a mesh shape. Since the electrode 793 and the electrode 794 each have a mesh shape, light emitted from the light-emitting element 160 can be transmitted.

In addition, since the electrodes 793 and 794 do not overlap with the light-emitting element 160, the electrodes 793 and 794 can be formed using a metal material with low visible light transmittance.

Thus, as compared with the case of using an oxide material whose transmittance of visible light is high, resistance of the electrodes 793 and 794 can be reduced, whereby sensitivity of the sensor of the touch panel 791 can be increased.

For example, a conductive nanowire may be used for the electrodes 793, 794, and 796. The nanowire may have a mean diameter of greater than or equal to 1 nm and less than or equal to 100 nm, preferably greater than or equal to 5 nm and less than or equal to 50 nm, further preferably greater than or equal to 5 nm and less than or equal to 25 nm. As the nanowire, a carbon nanotube or a metal nanowire such as an Ag nanowire, a Cu nanowire, or an Al nanowire may be used. For example, in the case where an Ag nanowire is used for any one of or all of electrodes 664, 665, and 667, the transmittance of visible light can be greater than or equal to 89% and the sheet resistance can be greater than or equal to 40 $\Omega$/sq. and less than or equal to 100 $\Omega$/sq.

Although the structure of the in-cell touch panel is illustrated in FIG. 66, one embodiment of the present invention is not limited thereto. For example, a touch panel formed over the display device 700, what is called an on-cell touch panel, or a touch panel attached to the display device 700, what is called an out-cell touch panel may be used.

In this manner, the display device of one embodiment of the present invention can be combined with various types of touch panels.

Note that the structures described in this embodiment can be combined as appropriate with any of the structures described in the other embodiments.

Embodiment 5

In this embodiment, a display device including a semiconductor device of one embodiment of the present invention is described with reference to FIG. 68.

8-1. Structure Example of Display Device

Figure 68:
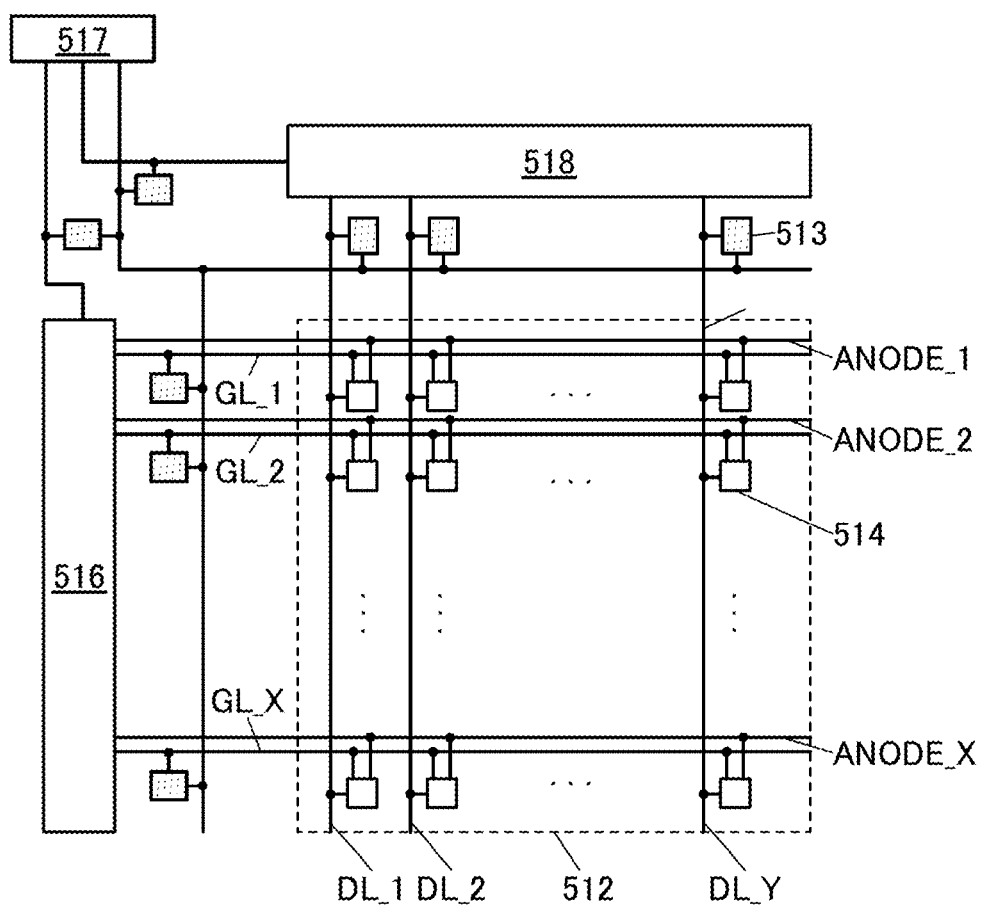
FIG. 68 is a block diagram illustrating a display device.

FIG. 68 is a block diagram showing an example of a display device including a semiconductor device of one embodiment of the present invention.

A display device illustrated in FIG. 68 includes a pixel portion 512, a gate line driver circuit 516 on the periphery of the pixel portion 512, and a signal line driver circuit 518 on the periphery of the pixel portion 512. Note that the pixel portion 512 includes a plurality of pixel circuits 514.

A semiconductor device illustrated in FIG. 68 includes a terminal portion 517 and a protection circuit 513. Note that the terminal portion 517 and the protection circuit 513 are not necessarily provided.

8-2. Pixel Portion and Pixel Circuit

The pixel portion 512 includes a plurality of circuits (pixel circuits 514) for driving display elements arranged in X rows (X is a natural number of 2 or more) and Y columns (Y is a natural number of 2 or more). The gate line driver circuit 516 has a function of outputting a signal (a scan signal) for selecting the pixel circuit 514. The signal line driver circuit 518 has a function of supplying a signal (a data signal) for driving a display element in the pixel circuit 514.

Note that the configuration is not limited to the example in FIG. 68, in which the plurality of pixel circuits 514 are arranged in a matrix (a stripe arrangement); for example, delta arrangement or pentile arrangement may be employed for the pixel circuits 514. Further, as color elements controlled in the pixel circuits 514 at the time of color display, three colors of R (red), G (green), and B (blue) can be given. Note that color elements controlled in the pixel circuits 514 at the time of color display are not limited to such colors, and color elements of more than three colors may be employed, for example, R, G, B, and W (white); or R, G, B, and one or more of Y (yellow), C (cyan), M (magenta), and the like. The size of a display region may be different depending on respective dots of the color components.

The plurality of pixel circuits 514 each include a light-emitting element and a driving transistor for controlling the amount of current flowing to the light-emitting element. In the light-emitting element, by application of voltage to the light-emitting element, electrons are injected from one of a pair of electrodes included in the light-emitting element and holes are injected from the other of the pair of electrodes, into a layer containing a light-emitting organic compound; thus, current flows. The electrons and holes are recombined, and thus, the light-emitting organic compound is excited. The light-emitting organic compound returns to a ground state from the excited state, thereby emitting light. Owing to such a mechanism, this light-emitting element is referred to as a current-excitation light-emitting element.

The pixel circuit 514 can have the structure shown in FIG. 2 described in Embodiment 1. This structure is preferable because the pixel density of the display device can be increased.

8-3. Gate Line Driver Circuit and Signal Line Driver Circuit

One or both of the gate line driver circuit 516 and the signal line driver circuit 518 are preferably formed over the substrate over which the pixel portion 512 is formed. Thus, the number of components and the number of terminals can be reduced. When one or both of the gate line driver circuit 516 and the signal line driver circuit 518 are not formed over the substrate over which the pixel portion 512 is formed, one or both of the gate line driver circuit 516 and the signal line driver circuit 518 can be mounted COG or tape automated bonding (TAB).

A pulse signal and a data signal are input to each of the plurality of pixel circuits 514 through one of the plurality of scan lines GL supplied with scan signals and one of the plurality of data lines DL supplied with data signals, respectively. Writing and holding of the data signal to and in each of the plurality of pixel circuits 514 are controlled by the gate line driver circuit 516. For example, to the pixel circuit 514 in the m-th row and the n-th column (m is a natural number of less than or equal to X, and n is a natural number of less than or equal to 1), a pulse signal is input from the gate line driver circuit 516 through the scan line GL_m, and a data signal is input from the signal line driver circuit 518 through the data line DL_n in accordance with the potential of the scan line GL_m.

The gate line driver circuit 516 includes a shift register or the like. The gate line driver circuit 516 receives a signal for driving the shift register through the terminal portion 517 and outputs a signal. For example, the gate line driver circuit 516 receives a start pulse signal, a clock signal, or the like and outputs a pulse signal. The gate line driver circuit 516 has a function of controlling the potentials of wirings supplied with scan signals (hereinafter such wirings are referred to as scan lines GL_1 to GL_X). Note that a plurality of gate line driver circuits 516 may be provided to control the scan lines GL_1 to GL_X separately. Alternatively, the gate line driver circuit 516 has a function of supplying an initialization signal. Without being limited thereto, the gate line driver circuit 516 can supply another signal. For example, as illustrated in FIG. 68, the gate line driver circuit 516 is electrically connected to wirings for controlling the potential of the light-emitting element (hereinafter such wirings are referred to as ANODE_1 to ANODE_X).

The signal line driver circuit 518 includes a shift register or the like. The signal line driver circuit 518 receives a signal (image signal) from which a data signal is derived, as well as a signal for driving the shift register, through the terminal portion 517. The signal line driver circuit 518 has a function of generating a data signal to be written to the pixel circuit 514 which is based on the image signal. In addition, the signal line driver circuit 518 has a function of controlling output of a data signal in response to a pulse signal produced by input of a start pulse signal, a clock signal, or the like. Furthermore, the signal line driver circuit 518 has a function of controlling the potentials of wirings supplied with data signals (hereinafter such wirings are referred to as data lines DL_1 to DL_Y). Alternatively, the signal line driver circuit 518 has a function of supplying an initialization signal. Without being limited thereto, the signal line driver circuit 518 can supply another signal. The signal line driver circuit 518 includes a plurality of analog switches or the like, for example. The signal line driver circuit 518 can output, as the data signals, signals obtained by time-dividing the image signal by sequentially turning on the plurality of analog switches.

8-4. Protection Circuit

The protection circuit 513 is connected to, for example, the scan line GL between the gate line driver circuit 516 and the pixel circuit 514. Alternatively, the protection circuit 513 is connected to the data line DL between the signal line driver circuit 518 and the pixel circuit 514. Alternatively, the protection circuit 513 can be connected to a wiring between the gate line driver circuit 516 and the terminal portion 517. Alternatively, the protection circuit 513 can be connected to a wiring between the signal line driver circuit 518 and the terminal portion 517. Note that the terminal portion 517 includes terminals for inputting power, control signals, and image signals to the display device from external circuits.

The protection circuit 513 has a function of electrically connecting a wiring connected to the protection circuit 513 to another wiring when a potential out of a certain range is applied to the wiring connected to the protection circuit 513. The protection circuits 513 are provided, so that the resistance of the display device to overcurrent generated by electrostatic discharge (ESD) or the like can be improved. A configuration in which the protection circuits 513 are connected to the gate line driver circuit 516 or a configuration in which the protection circuits 513 are connected to the signal line driver circuit 518 may be employed. Alternatively, the protection circuits 513 may be connected to the terminal portion 517.

The structure described above in this embodiment can be combined with any of the structures described in the other embodiments as appropriate.

Embodiment 9

In this embodiment, a display module and electronic devices, each of which includes a semiconductor device of one embodiment of the present invention, are described with reference to FIG. 69 to FIG. 72.

9-1. Display Module

Figure 69:
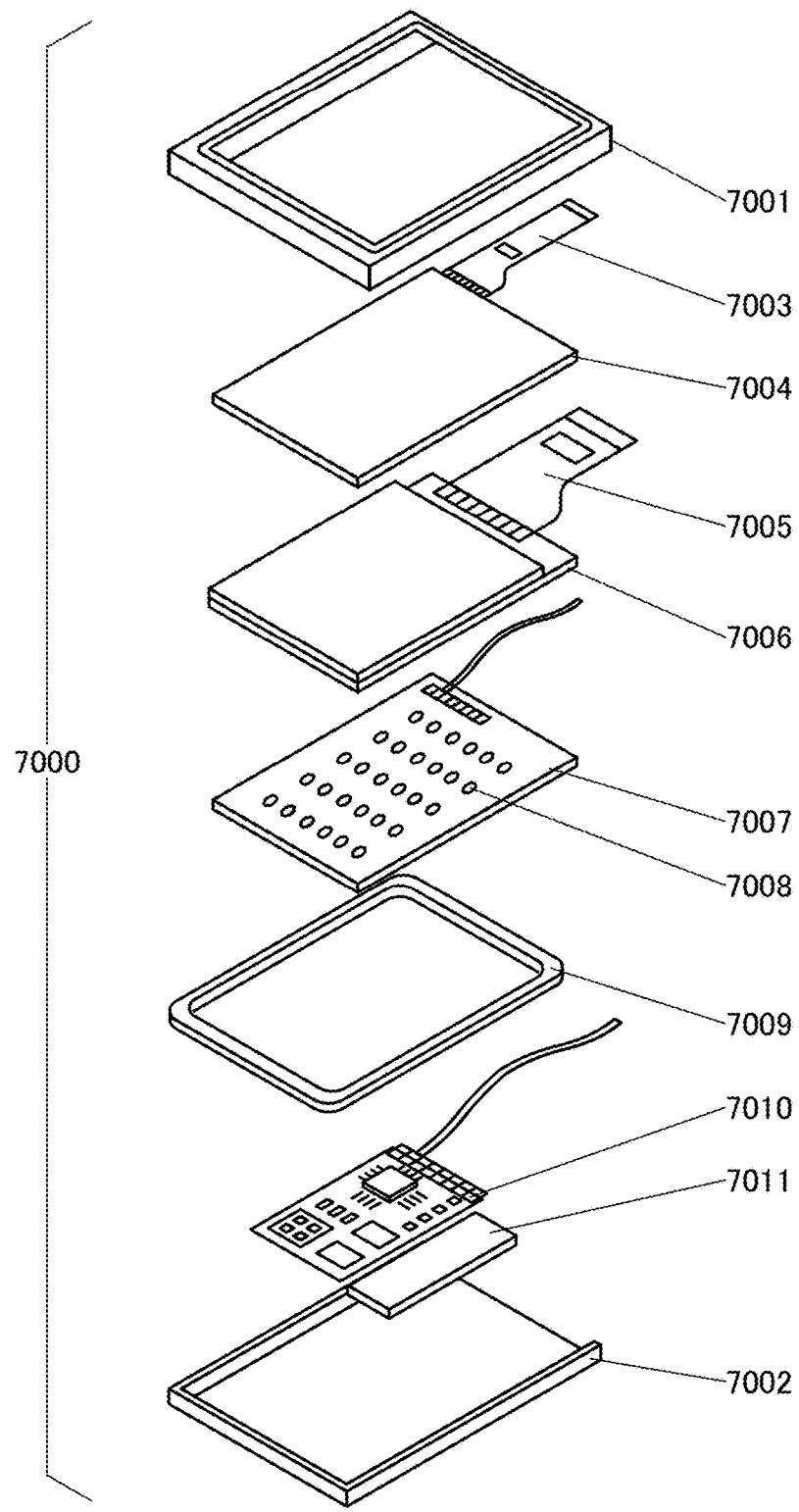
FIG. 69 illustrates a display module.

In a display module 7000 illustrated in FIG. 69, a touch panel 7004 connected to an FPC 7003, a display panel 7006 connected to an FPC 7005, a backlight 7007, a frame 7009, a printed board 7010, and a battery 7011 are provided between an upper cover 7001 and a lower cover 7002.

The semiconductor device of one embodiment of the present invention can be used for the display panel 7006, for example.

The shapes and sizes of the upper cover 7001 and the lower cover 7002 can be changed as appropriate in accordance with the sizes of the touch panel 7004 and the display panel 7006.

The touch panel 7004 can be a resistive touch panel or a capacitive touch panel and overlap with the display panel 7006. Alternatively, a counter substrate (sealing substrate) of the display panel 7006 can have a touch panel function. Alternatively, a photosensor may be provided in each pixel of the display panel 7006 to form an optical touch panel.

The backlight 7007 includes a light source 7008. One embodiment of the present invention is not limited to the structure in FIG. 69, in which the light source 7008 is provided over the backlight 7007. For example, a structure in which the light source 7008 is provided at an end portion of the backlight 7007 and a light diffusion plate is further provided may be employed. Note that the backlight 7007 need not be provided in the case where a self-luminous light-emitting element such as an organic EL element is used or in the case where a reflective panel or the like is employed.

The frame 7009 protects the display panel 7006 and functions as an electromagnetic shield for blocking electromagnetic waves generated by the operation of the printed board 7010. The frame 7009 may also function as a radiator plate.

The printed board 7010 includes a power supply circuit and a signal processing circuit for outputting a video signal and a clock signal. As a power source for supplying power to the power supply circuit, an external commercial power source or the separate battery 7011 may be used. The battery 7011 can be omitted in the case where a commercial power source is used.

The display module 7000 may be additionally provided with a member such as a polarizing plate, a retardation plate, or a prism sheet.

9-2. Electronic Device 1

Next, FIGS. 70A to 70E illustrate examples of electronic devices.

Figure 70A:
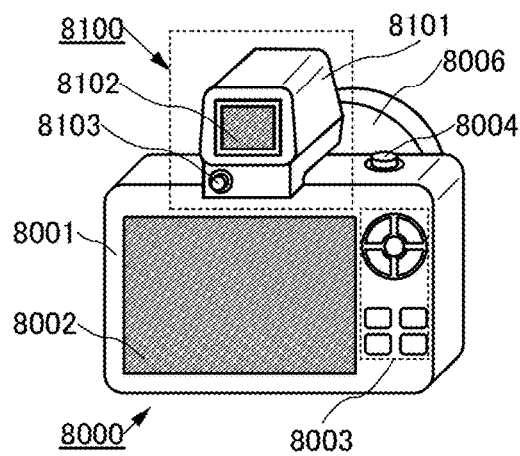
FIGS. 70A to 70E each show an electronic device.

FIG. 70A is an external view of a camera 8000 to which a finder 8100 is attached.

The camera 8000 includes a housing 8001, a display portion 8002, an operation button 8003, a shutter button 8004, and the like. Furthermore, an attachable lens 8006 is attached to the camera 8000.

Although the lens 8006 of the camera 8000 here is detachable from the housing 8001 for replacement, the lens 8006 may be included in the housing 8001.

Images can be taken with the camera 8000 at the press of the shutter button 8004. In addition, images can be taken at the touch of the display portion 8002 that serves as a touch panel.

The housing 8001 of the camera 8000 includes a mount including an electrode, so that the finder 8100, a stroboscope, or the like can be connected to the housing 8001.

The finder 8100 includes a housing 8101, a display portion 8102, a button 8103, and the like.

The housing 8101 includes a mount for engagement with the mount of the camera 8000 so that the finder 8100 can be connected to the camera 8000. The mount includes an electrode, and an image or the like received from the camera 8000 through the electrode can be displayed on the display portion 8102.

The button 8103 serves as a power button. The on/off state of the display portion 8102 can be turned on and off with the button 8103.

A display device of one embodiment of the present invention can be used in the display portion 8002 of the camera 8000 and the display portion 8102 of the finder 8100.

Although the camera 8000 and the finder 8100 are separate and detachable electronic devices in FIG. 70A, the housing 8001 of the camera 8000 may include a finder having a display device.

Figure 70B:
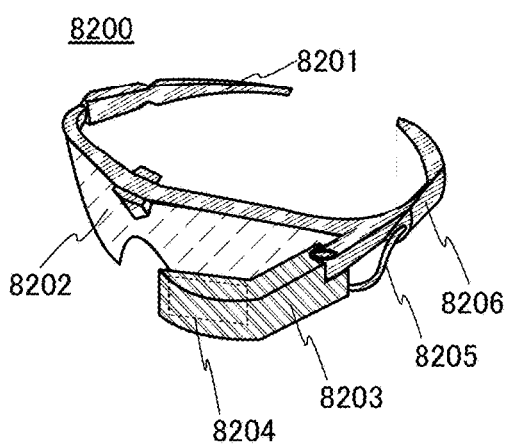

FIG. 70B is an external view of a head-mounted display 8200.

The head-mounted display 8200 includes a mounting portion 8201, a lens 8202, a main body 8203, a display portion 8204, a cable 8205, and the like. The mounting portion 8201 includes a battery 8206.

Power is supplied from the battery 8206 to the main body 8203 through the cable 8205. The main body 8203 includes a wireless receiver or the like to receive video data, such as image data, and display it on the display portion 8204. The movement of the eyeball and the eyelid of a user is captured by a camera in the main body 8203 and then coordinates of the points the user looks at are calculated using the captured data to utilize the eye of the user as an input means.

The mounting portion 8201 may include a plurality of electrodes so as to be in contact with the user. The main body 8203 may be configured to sense current flowing through the electrodes with the movement of the user's eyeball to recognize the direction of his or her eyes. The main body 8203 may be configured to sense current flowing through the electrodes to monitor the user's pulse. The mounting portion 8201 may include sensors, such as a temperature sensor, a pressure sensor, or an acceleration sensor so that the user's biological information can be displayed on the display portion 8204. The main body 8203 may be configured to sense the movement of the user's head or the like to move an image displayed on the display portion 8204 in synchronization with the movement of the user's head or the like.

The display device of one embodiment of the present invention can be used in the display portion 8204.

Figure 70C:
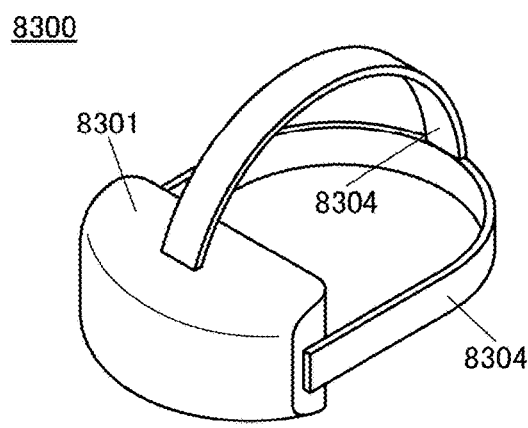
Figure 70D:
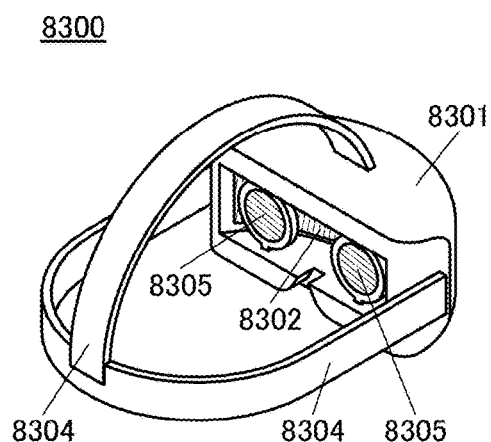
Figure 70E:
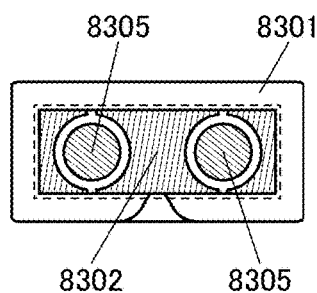

FIGS. 70C to 70E are external views of a head-mounted display 8300. The head-mounted display 8300 includes a housing 8301, a display portion 8302, a fixing band 8304, and a pair of lenses 8305.

A user can see display on the display portion 8302 through the lenses 8305. It is favorable that the display portion 8302 be curved. When the display portion 8302 is curved, a user can feel high realistic sensation of images. Although the structure described in this embodiment as an example has one display portion 8302, the number of display portions 8302 provided is not limited to one. For example, two display portions 8302 may be provided, in which case one display portion is provided for one corresponding user's eye, so that three-dimensional display using parallax or the like is possible.

The display device of one embodiment of the present invention can be used in the display portion 8302. The display device including the semiconductor device of one embodiment of the present invention has an extremely high resolution; thus, even when an image is magnified using the lenses 8305 as illustrated in FIG. 70E, the user does not perceive pixels, and thus a more realistic image can be displayed.

9-3. Electronic Device 2

Next, FIGS. 70A to 70G illustrate examples of electronic devices that are different from those illustrated in FIGS. 70A to 70E.

Electronic devices illustrated in FIGS. 71A to 71G include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 9008, and the like.

The electronic devices in FIGS. 71A to 71G have a variety of functions such as a function of displaying a variety of information (e.g., a still image, a moving image, and a text image) on the display portion, a touch panel function, a function of displaying a calendar, date, time, and the like, a function of controlling processing with a variety of software (programs), a wireless communication function, a function of being connected to a variety of computer networks with a wireless communication function, a function of transmitting and receiving a variety of data with a wireless communication function, and a function of reading out a program or data stored in a recording medium and displaying it on the display portion. Note that functions of the electronic devices in FIGS. 71A to 71G are not limited thereto, and the electronic devices can have a variety of functions. Although not illustrated in FIGS. 71A to 71G, the electronic devices may each have a plurality of display portions. Furthermore, the electronic devices may each be provided with a camera and the like to have a function of taking a still image, a function of taking a moving image, a function of storing the taken image in a memory medium (an external memory medium or a memory medium incorporated in the camera), a function of displaying the taken image on the display portion, or the like.

The electronic devices in FIGS. 71A to 71G are described in detail below.

Figure 71A:
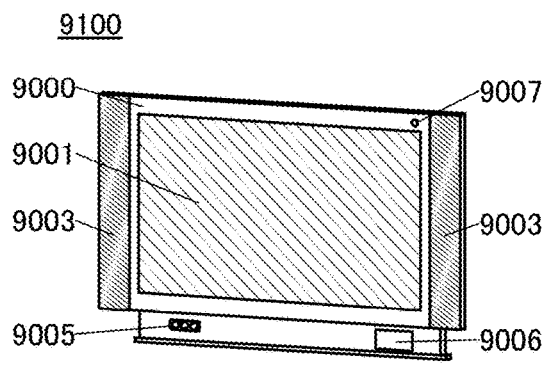
FIGS. 71A to 71G each show an electronic device.

FIG. 71A is a perspective view illustrating a television device 9100. The television device 9100 can include the display portion 9001 having a large screen size of, for example, 50 inches or more, or 100 inches or more.

Figure 71D:
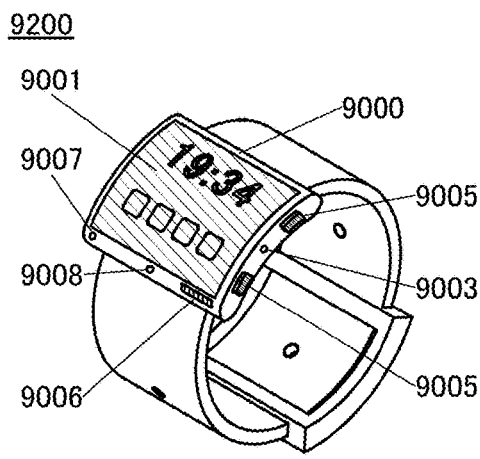
Figure 71B:
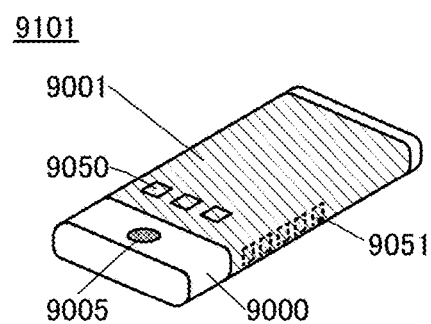

FIG. 71B is a perspective view of a portable information terminal 9101. The portable information terminal 9101 functions as, for example, one or more of a telephone set, a notebook, and an information browsing system. Specifically, the portable information terminal 9101 can be used as a smartphone. Note that the portable information terminal 9101 may include a speaker 9003, a connection terminal 9006, a sensor 9007, or the like. The portable information terminal 9101 can display text and image information on its plurality of surfaces. For example, three operation buttons 9050 (also referred to as operation icons or simply as icons) can be displayed on one surface of the display portion 9001. Furthermore, information 9051 indicated by dashed rectangles can be displayed on another surface of the display portion 9001. Examples of the information 9051 include display indicating reception of an e-mail, a social networking service (SNS) message, or a telephone call, the title and sender of an e-mail or an SNS message, date, time, remaining battery, and reception strength of an antenna. Alternatively, the operation buttons 9050 or the like may be displayed in place of the information 9051.

Figure 71E:
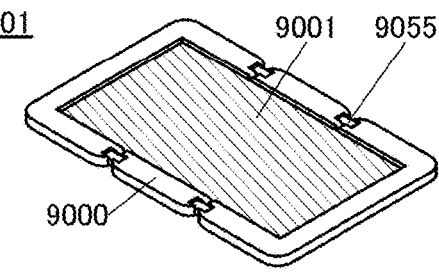
Figure 71C:
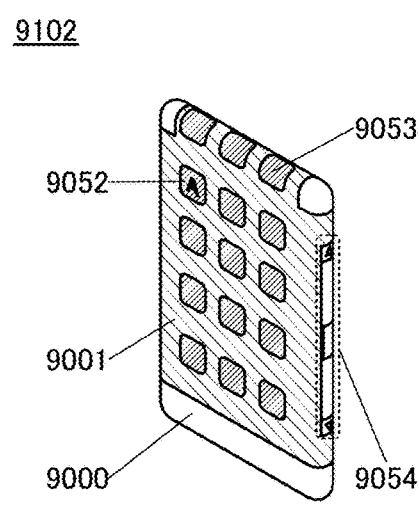

FIG. 71C is a perspective view of a portable information terminal 9102. The portable information terminal 9102 has a function of displaying information on three or more surfaces of the display portion 9001. Here, information 9052, information 9053, and information 9054 are displayed on different surfaces. For example, a user of the portable information terminal 9102 can see the display (here, the information 9053) on the portable information terminal 9102 put in a breast pocket of his/her clothes. Specifically, a caller's phone number, name, or the like of an incoming call is displayed in a position that can be seen from above the portable information terminal 9102. The user can see the display without taking out the portable information terminal 9102 from the pocket and decide whether to answer the call.

FIG. 71D is a perspective view of a watch-type portable information terminal 9200. The portable information terminal 9200 is capable of executing a variety of applications such as mobile phone calls, e-mailing, reading and editing texts, music reproduction, Internet communication, and a computer game. The display surface of the display portion 9001 is curved, and display can be performed on the curved display surface. The portable information terminal 9200 can employ near field communication conformable to a communication standard. For example, hands-free calling can be achieved by mutual communication between the portable information terminal 9200 and a headset capable of wireless communication. Moreover, the portable information terminal 9200 includes the connection terminal 9006 and can perform direct data communication with another information terminal via a connector. Charging through the connection terminal 9006 is also possible. Note that the charging operation may be performed by wireless power feeding without using the connection terminal 9006.

Figure 71F:
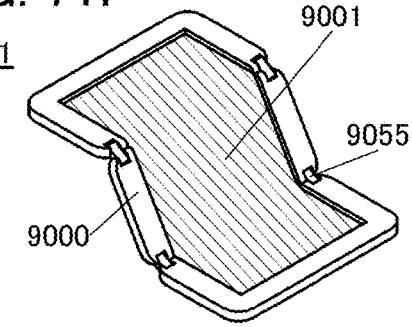
Figure 71G:
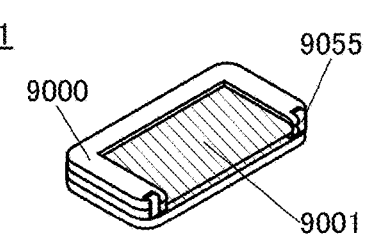

FIGS. 71E, 71F, and 71G are perspective views of a foldable portable information terminal 9201 that is opened, that is shifted from the opened state to the folded state or from the folded state to the opened state, and that is folded, respectively. The portable information terminal 9201 is highly portable when folded. When the portable information terminal 9201 is opened, a seamless large display region is highly browsable. The display portion 9001 of the portable information terminal 9201 is supported by three housings 9000 joined by hinges 9055. By being folded at the hinges 9055 between the two adjacent housings 9000, the portable information terminal 9201 can be reversibly changed in shape from the opened state to the folded state. For example, the portable information terminal 9201 can be bent with a radius of curvature greater than or equal to 1 mm and less than or equal to 150 mm.

Figure 72A:
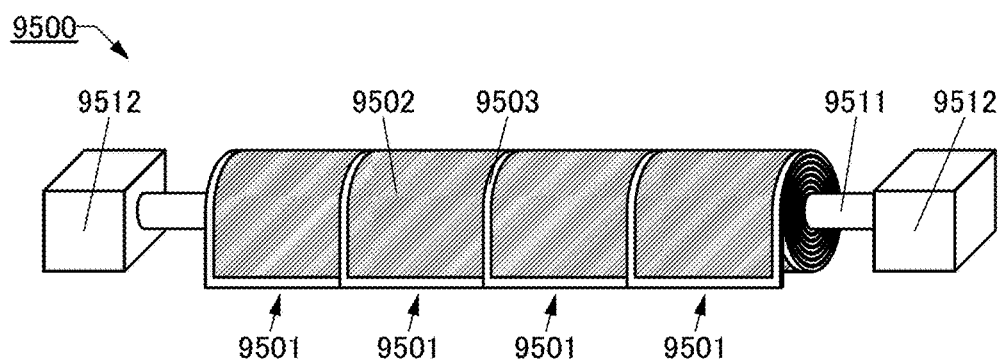
FIGS. 72A and 72B are perspective views illustrating a display device.
Figure 72B:
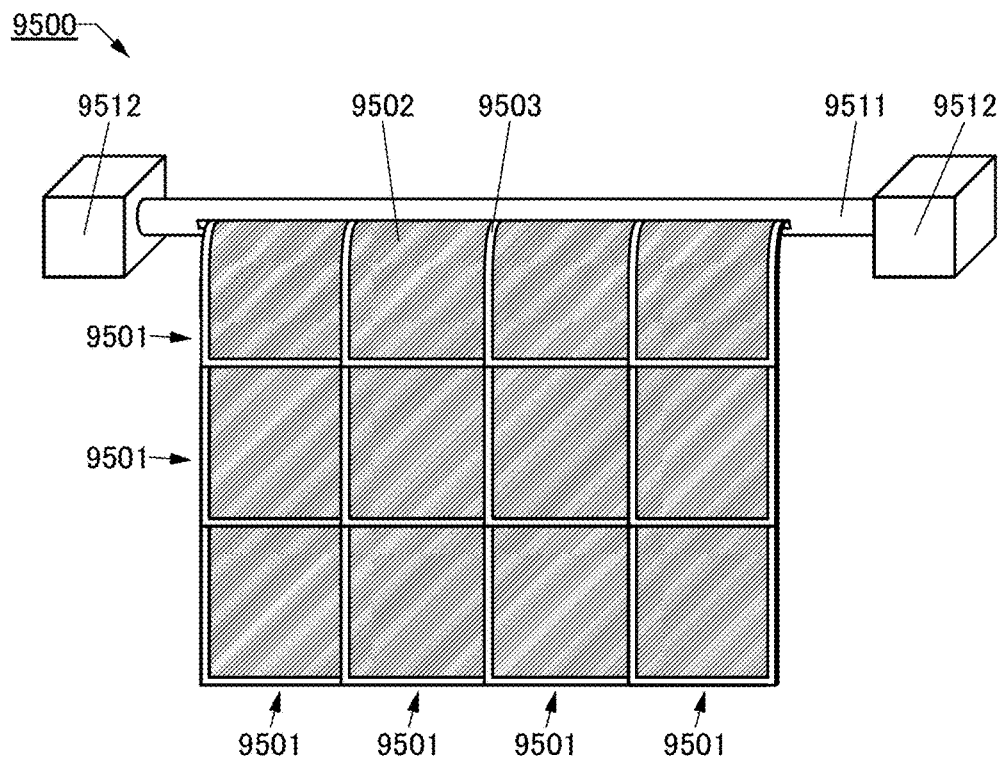

Next, an example of an electronic device that is different from the electronic devices illustrated in FIGS. 70A to 70E and FIGS. 71A to 71G is illustrated in FIGS. 72A and 72B. FIGS. 72A and 72B are perspective views of a display device including a plurality of display panels. The plurality of display panels are wound in the perspective view in FIG. 72A and are unwound in the perspective view in FIG. 72B.

A display device 9500 illustrated in FIGS. 72A and 72B includes a plurality of display panels 9501, a hinge 9511, and a bearing 9512. The plurality of display panels 9501 each include a display region 9502 and a light-transmitting region 9503.

Each of the plurality of display panels 9501 is flexible. Two adjacent display panels 9501 are provided so as to partly overlap with each other. For example, the light-transmitting regions 9503 of the two adjacent display panels 9501 can overlap with each other. A display device having a large screen can be obtained with the plurality of display panels 9501. The display device is highly versatile because the display panels 9501 can be wound depending on its use.

Although the display regions 9502 of the adjacent display panels 9501 are separated from each other in FIGS. 72A and 72B, without limitation to this structure, the display regions 9502 of the adjacent display panels 9501 may overlap with each other without any space so that a continuous display region 9502 is obtained, for example.

Electronic devices described in this embodiment are characterized by having a display portion for displaying some sort of information. Note that the semiconductor device of one embodiment of the present invention can also be used for an electronic device that does not have a display portion.

Note that the structures described in this embodiment can be combined as appropriate with any of the structures described in the other embodiments.

EXPLANATION OF REFERENCE

100: semiconductor device, 102: substrate, 104: conductive film, 106: insulating film, 108: oxide semiconductor film, 108a: oxide semiconductor film, 108b: oxide semiconductor film, 108c: oxide semiconductor film, 112a: conductive film, 112b: conductive film, 112c: conductive film, 114: insulating film, 116: insulating film, 118: insulating film, 119: insulating film, 120: oxide semiconductor film, 122a: conductive film, 122b: conductive film, 122c: conductive film, 124: insulating film, 126: insulating film, 128: oxide semiconductor film, 130: conductive film, 134: insulating film, 136: insulating film, 138: conductive film, 140: insulating film, 142: EL layer, 144: conductive film, 150: light-emitting layer, 151: hole-injection layer, 152: hole-transport layer, 153: electron-transport layer, 154: electron-injection layer, 160: light-emitting element, 180b: oxide semiconductor film, 181: opening, 182: opening, 183: opening, 184: opening, 186: opening, 200: semiconductor device, 208: oxide semiconductor film, 210a: insulating film, 210b: insulating film, 212a: conductive film, 212b: conductive film, 214: insulating film, 216: insulating film, 218a: conductive film, 218b: conductive film, 282a: opening, 282b: opening, 300: semiconductor device, 302: substrate, 306: insulating film, 308: oxide semiconductor film, 308d: drain region, 308i: channel region, 308s: source region, 310: insulating film, 312a: conductive film, 312b: conductive film, 314: insulating film, 316: insulating film, 318: insulating film, 320: conductive film, 322a: conductive film, 322b: conductive film, 324: insulating film, 326: insulating film, 328: oxide semiconductor film, 328a: oxide semiconductor film, 328b: oxide semiconductor film, 328c: oxide semiconductor film, 330: conductive film, 334: insulating film, 336: insulating film, 338: conductive film, 340: insulating film, 341a: opening, 341b: opening, 342: EL layer, 344: conductive film, 360: light-emitting element, 382: opening, 383: opening, 384: opening, 386: opening, 400: semiconductor device, 408: oxide semiconductor film, 408d: drain region, 408i: channel region, 408s: source region, 410b: insulating film, 412b: conductive film, 414: insulating film, 416: insulating film, 418a: conductive film, 418b: conductive film, 482a: opening, 482b: opening, 512: pixel portion, 513: protection circuit, 514: pixel circuit, 516: gate line driver circuit, 517: terminal portion, 518: signal line driver circuit, 664: electrode, 665: electrode, 667: electrode, 683: droplet discharge apparatus, 684: droplet, 685: layer, 700: display device, 701: substrate, 702: pixel portion, 704: source driver circuit portion, 705: substrate, 706: gate driver circuit portion, 708: FPC terminal portion, 710: signal line, 712: sealant, 716: FPC, 732: sealing film, 734: insulating film, 736: coloring film, 738: light-blocking film, 778: structure body, 791: touch panel, 792: insulating film, 793: electrode, 794: electrode, 795: insulating film, 796: electrode, 797: insulating film, 1400: droplet discharge apparatus, 1402: substrate, 1403: droplet discharge means, 1404: imaging means, 1405: head, 1406: space, 1407: control means, 1408: storage medium, 1409: image processing means, 1410: computer, 1411: marker, 1412: head, 1413: material supply source, 1414: material supply source, 7000: display module, 7001: upper cover, 7002: lower cover, 7003: FPC, 7004: touch panel, 7005: FPC, 7006: display panel, 7007: backlight, 7008: light source, 7009: frame, 7010: printed substrate, 7011: battery, 8000: camera, 8001: housing, 8002: display portion, 8003: operation button, 8004: shutter button, 8006: lens, 8100: finder, 8101: housing, 8102: display portion, 8103: button, 8200: head-mounted display, 8201: mounting portion, 8202: lens, 8203: main body, 8204: display portion, 8205: cable, 8206: battery, 8300: head-mounted display, 8301: housing, 8302: display portion, 8304: fixing band, 8305: lens, 9000: housing, 9001: display portion, 9003: speaker, 9005: operation key, 9006: connection terminal, 9007: sensor, 9008: microphone, 9050: operation button, 9051: information, 9052: information, 9053: information, 9054: information, 9055: hinge, 9100: television device, 9101: portable information terminal, 9102: portable information terminal, 9200: portable information terminal, 9201: portable information terminal, 9500: display device, 9501: display panel, 9502: display region, 9503: region, 9511: hinge, 9512: bearing.

This application is based on Japanese Patent Application serial No. 2015-256694 filed with Japan Patent Office on Dec. 28, 2015 and Japanese Patent Application serial No. 2015-256849 filed with Japan Patent Office on Dec. 28, 2015, the entire contents of which are hereby incorporated by reference.

The invention claimed is:

1. A semiconductor device comprising:
a first transistor; and
a second transistor,
wherein the first transistor comprises:
 a first gate electrode;
 a first insulating film over the first gate electrode;
 a first oxide semiconductor film over the first insulating film;
 a first source electrode over the first oxide semiconductor film;
 a first drain electrode over the first oxide semiconductor film;
 a second insulating film over the first oxide semiconductor film, the first source electrode, and the first drain electrode; and
 a second gate electrode over the second insulating film, and
wherein the second transistor comprises:
 one of the first source electrode and the first drain electrode;
 the second insulating film over the one of the first source electrode and the first drain electrode;
 a second oxide semiconductor film over the second insulating film;
 a second source electrode over the second oxide semiconductor film;
 a second drain electrode over the second oxide semiconductor film;
 a third insulating film over the second oxide semiconductor film, the second source electrode, and the second drain electrode; and
 a third gate electrode over the third insulating film.

2. The semiconductor device according to claim 1, wherein the first oxide semiconductor film partly overlaps with the second oxide semiconductor film.

3. The semiconductor device according to claim 1, wherein the first gate electrode and the second gate electrode are connected to each other in an opening of the first insulating film and the second insulating film, and include a region located outward from a side end portion of the first oxide semiconductor film.

4. The semiconductor device according to claim 1, wherein one or both of the first oxide semiconductor film and the second oxide semiconductor film include In, M, and Zn, and
wherein M is Al, Ga, Y, or Sn.

5. The semiconductor device according to claim 4, wherein an atomic ratio is in a neighborhood of In:M:Zn=4:2:3, and
wherein when In is 4, M is greater than or equal to 1.5 and less than or equal to 2.5 and Zn is greater than or equal to 2 and less than or equal to 4.

6. The semiconductor device according to claim 1, wherein one or both of the first oxide semiconductor film and the second oxide semiconductor film includes a crystal part, and
wherein the crystal part has a c-axis alignment.

7. A display device comprising:
the semiconductor device according to claim 1, and
a light-emitting element.

8. The display device according to claim 7,
wherein the light-emitting element includes an organic compound, and
wherein the organic compound includes a high molecular compound.

9. The display device according to claim 7,
wherein the light-emitting element includes an organic compound, and
wherein the organic compound includes a phenylenevinylene derivative.

10. An electronic device comprising:
the semiconductor device according to claim 1;
a display device comprising a light-emitting element; and
an operation key or a battery.

11. A semiconductor device comprising:
a first transistor; and
a second transistor,
wherein the first transistor comprises:
 a first gate electrode;
 a first insulating film over the first gate electrode;
 a first oxide semiconductor film over the first insulating film;
 a first source electrode over the first oxide semiconductor film;
 a first drain electrode over the first oxide semiconductor film;
 a second insulating film over the first oxide semiconductor film, the first source electrode, and the first drain electrode; and
 a second gate electrode over the second insulating film, and
wherein the second transistor comprises:
 a third gate electrode over the first insulating film;
 the second insulating film over the third gate electrode;
 a second oxide semiconductor film over the second insulating film and including a channel region, a source region, and a drain region;
 a third insulating film in contact with the channel region;
 a fourth gate electrode in contact with the third insulating film;
 a fourth insulating film in contact with the source region, the drain region, and the fourth gate electrode;
 a second source electrode electrically connected to the source region; and
 a second drain electrode electrically connected to the drain region.

12. The semiconductor device according to claim 11, wherein the first oxide semiconductor film partly overlaps with the second oxide semiconductor film.

13. The semiconductor device according to claim 11, wherein the first gate electrode and the second gate electrode are connected to each other in an opening of the first insulating film and the second insulating film, and include a region located outward from a side end portion of the first oxide semiconductor film.

14. The semiconductor device according to claim 11,
wherein one or both of the first oxide semiconductor film and the second oxide semiconductor film include In, M, and Zn, and
wherein M is Al, Ga, Y, or Sn.

15. The semiconductor device according to claim 14,
wherein an atomic ratio is in a neighborhood of In:M:Zn=4:2:3, and
wherein when In is 4, M is greater than or equal to 1.5 and less than or equal to 2.5 and Zn is greater than or equal to 2 and less than or equal to 4.

16. The semiconductor device according to claim 11,
wherein one or both of the first oxide semiconductor film and the second oxide semiconductor film includes a crystal part, and
wherein the crystal part has a c-axis alignment.

17. A semiconductor device comprising:
a first transistor; and
a second transistor,
wherein the first transistor comprises:
 a first oxide semiconductor film;
 a first insulating film over the first oxide semiconductor film;
 a first conductive film including a region overlapping with the first oxide semiconductor film with the first insulating film therebetween;
 a second insulating film over the first oxide semiconductor film and the first conductive film;
 a second conductive film over the first oxide semiconductor film;
 a third conductive film over the first oxide semiconductor film; and
 a third insulating film over the first oxide semiconductor film, the second conductive film, and the third conductive film, and
wherein the second transistor comprises:
 the third conductive film;
 the third insulating film over the third conductive film;
 a second oxide semiconductor film over the third insulating film;
 a fourth conductive film over the second oxide semiconductor film; and
 a fifth conductive film over the second oxide semiconductor film,
wherein the first oxide semiconductor film includes a channel region in contact with the first insulating film, a source region in contact with the second insulating film, and a drain region in contact with the second insulating film.

18. The semiconductor device according to claim 17,
wherein the first oxide semiconductor film partly overlaps with the second oxide semiconductor film.

19. The semiconductor device according to claim 17,
wherein one or both of the first oxide semiconductor film and the second oxide semiconductor film include In, M, and Zn, and
wherein M is Al, Ga, Y, or Sn.

20. The semiconductor device according to claim 19,
wherein an atomic ratio is in a neighborhood of In:M:Zn=4:2:3, and
wherein when In is 4, M is greater than or equal to 1.5 and less than or equal to 2.5 and Zn is greater than or equal to 2 and less than or equal to 4.

21. The semiconductor device according to claim 17,
wherein one or both of the first oxide semiconductor film and the second oxide semiconductor film includes a crystal part, and
wherein the crystal part has a c-axis alignment.

22. The semiconductor device according to claim 17,
further comprising:
 a fourth insulating film over the second oxide semiconductor film, the fourth conductive film, and the fifth conductive film; and
 a sixth conductive film including a region overlapping with the second oxide semiconductor film with the fourth insulating film therebetween.

23. A semiconductor device comprising:
a first transistor; and
a second transistor,
wherein the first transistor comprises:
 a first oxide semiconductor film;
 a first insulating film over the first oxide semiconductor film;
 a first conductive film including a region overlapping with the first oxide semiconductor film with the first insulating film therebetween;
 a second insulating film over the first oxide semiconductor film and the first conductive film;
 a second conductive film over the first oxide semiconductor film;
 a third conductive film over the first oxide semiconductor film; and
 a third insulating film over the first oxide semiconductor film, the second conductive film, and the third conductive film,
wherein the first oxide semiconductor film includes a channel region in contact with the first insulating film, a source region in contact with the second insulating film, and a drain region in contact with the second insulating film,
wherein the second transistor comprises:
 the third conductive film;
 the third insulating film over the third conductive film;
 a second oxide semiconductor film over the third insulating film;
 a fourth conductive film over the second oxide semiconductor film;
 a fifth conductive film over the second oxide semiconductor film;
 a fourth insulating film over the second oxide semiconductor film;
 a sixth conductive film including a region overlapping with the second oxide semiconductor film with the fourth insulating film therebetween; and
 a fifth insulating film over the second oxide semiconductor film and the sixth conductive film, and
wherein the second oxide semiconductor film includes a channel region in contact with the fourth insulating film, a source region in contact with the fifth insulating film, and a drain region in contact with the fifth insulating film.

24. The semiconductor device according to claim 23,
wherein the first oxide semiconductor film partly overlaps with the second oxide semiconductor film.

25. The semiconductor device according to claim 23,
wherein one or both of the first oxide semiconductor film and the second oxide semiconductor film include In, M, and Zn, and
wherein M is Al, Ga, Y, or Sn.

26. The semiconductor device according to claim 25,
wherein an atomic ratio is in a neighborhood of In:M:Zn=4:2:3, and wherein when In is 4, M is greater than or equal to 1.5 and less than or equal to 2.5 and Zn is greater than or equal to 2 and less than or equal to 4.

27. The semiconductor device according to claim 23, wherein one or both of the first oxide semiconductor film and the second oxide semiconductor film includes a crystal part, and wherein the crystal part has a c-axis alignment.

* * * * *